US011952390B2

(12) United States Patent
Cai et al.

(10) Patent No.: US 11,952,390 B2
(45) Date of Patent: Apr. 9, 2024

(54) PHOSPHORESCENT ORGANIC METAL COMPLEX AND USE THEREOF

(71) Applicant: BEIJING SUMMER SPROUT TECHNOLOGY CO., LTD., Beijing (CN)

(72) Inventors: Wei Cai, Beijing (CN); Ming Sang, Beijing (CN); Chi Yuen Raymond Kwong, Beijing (CN); Chuanjun Xia, Beijing (CN); Zhen Wang, Beijing (CN); Tao Wang, Beijing (CN); Hongbo Li, Beijing (CN)

(73) Assignee: Beijing Summer Sprout Technology Co., Ltd. (CN)

( * ) Notice: Subject to any disclaimer, the term of this patent is extended or adjusted under 35 U.S.C. 154(b) by 929 days.

(21) Appl. No.: 16/937,864

(22) Filed: Jul. 24, 2020

(65) Prior Publication Data

US 2022/0002329 A1 Jan. 6, 2022

(30) Foreign Application Priority Data

Jun. 20, 2020 (CN) ......................... 202010569837.3

(51) Int. Cl.
*C07F 15/00* (2006.01)
*H10K 85/30* (2023.01)
(Continued)

(52) U.S. Cl.
CPC ....... *C07F 15/0033* (2013.01); *H10K 85/342* (2023.02); *H10K 50/11* (2023.02); *H10K 2101/10* (2023.02); *H10K 2101/90* (2023.02)

(58) Field of Classification Search
CPC ... C07F 15/0033; H10K 85/342; H10K 50/11; H10K 2101/10; H10K 2101/90;
(Continued)

(56) References Cited

U.S. PATENT DOCUMENTS

| | | | |
|---|---|---|---|
| 5,703,436 | A | 12/1997 | Forrest et al. |
| 5,707,745 | A | 1/1998 | Forrest et al. |

(Continued)

FOREIGN PATENT DOCUMENTS

| | | | |
|---|---|---|---|
| CN | 102439019 | A | 5/2012 |
| CN | 105367606 | A | 3/2016 |

(Continued)

OTHER PUBLICATIONS

German first Office Action, dated Jan. 29, 2021, for German Application No. 10 2020 209 377.6, for and its English translation.

(Continued)

*Primary Examiner* — Ermias T Woldegeorgis
(74) *Attorney, Agent, or Firm* — BARNES & THORNBURG LLP; Jeffrey R. Stone

(57) ABSTRACT

Provided are a phosphorescent organometallic complex and a use thereof. The metal complex has a ligand with a structure represented by Formula 1 and may be used as a light-emitting material in an electroluminescent device. These novel metal complexes can not only maintain low voltage and improve device efficiency in electroluminescent devices but also greatly reduce the half-peak width of light emitted by these devices so as to greatly improve color saturation of the light emitted by these devices, thereby providing better device performance. Further provided are an electroluminescent device and a compound formulation.

39 Claims, 2 Drawing Sheets

(51) Int. Cl.
*H10K 50/11* (2023.01)
*H10K 101/00* (2023.01)
*H10K 101/10* (2023.01)

(58) Field of Classification Search
CPC ............ H10K 85/654; H10K 85/6572; H10K 85/6574; H10K 50/12; Y02E 10/549; C07B 59/002; C09K 11/06; C09K 2211/1029; C09K 2211/1048; C09K 2211/185; C09K 2211/1033
See application file for complete search history.

(56) References Cited

U.S. PATENT DOCUMENTS

| | | | |
|---|---|---|---|
| 5,844,363 A | 12/1998 | Gu et al. | |
| 6,097,147 A | 8/2000 | Baldo et al. | |
| 6,303,238 B1 | 10/2001 | Thompson et al. | |
| 6,921,915 B2 * | 7/2005 | Takiguchi | C07F 15/0033 313/504 |
| 7,279,704 B2 | 10/2007 | Walters et al. | |
| 7,968,146 B2 | 6/2011 | Wagner et al. | |
| 8,946,697 B1 | 2/2015 | Ma et al. | |
| 2003/0230980 A1 | 12/2003 | Forrest et al. | |
| 2004/0121184 A1 | 6/2004 | Thompson et al. | |
| 2004/0174116 A1 | 9/2004 | Lu et al. | |
| 2012/0292601 A1 | 11/2012 | Kottas et al. | |
| 2013/0181190 A1 | 7/2013 | Ma et al. | |
| 2014/0014922 A1 * | 1/2014 | Lin | H10K 85/322 546/4 |
| 2014/0175408 A1 | 6/2014 | Lin et al. | |
| 2014/0252333 A1 | 9/2014 | Watanabe et al. | |
| 2015/0137096 A1 | 5/2015 | Xia et al. | |
| 2015/0236276 A1 | 8/2015 | Boudreault et al. | |
| 2015/0315222 A1 | 11/2015 | Boudreault et al. | |
| 2015/0349273 A1 | 12/2015 | Hung et al. | |
| 2016/0049599 A1 | 2/2016 | Ma et al. | |
| 2016/0079546 A1 | 3/2016 | Park et al. | |
| 2016/0133860 A1 | 5/2016 | Boudreault et al. | |
| 2016/0141522 A1 | 5/2016 | Ma et al. | |
| 2016/0155963 A1 | 6/2016 | Dwang et al. | |
| 2016/0233440 A1 | 8/2016 | Bae et al. | |
| 2016/0359122 A1 | 12/2016 | Boudreault et al. | |
| 2018/0019406 A1 | 1/2018 | Lee et al. | |
| 2019/0245153 A1 | 8/2019 | Kottas et al. | |
| 2019/0280221 A1 | 9/2019 | Ma et al. | |
| 2020/0091442 A1 | 3/2020 | Cai et al. | |
| 2020/0106028 A1 | 4/2020 | Yen et al. | |
| 2020/0251666 A1 | 8/2020 | Cai et al. | |
| 2021/0054010 A1 | 2/2021 | Tsai et al. | |

FOREIGN PATENT DOCUMENTS

| | | | |
|---|---|---|---|
| CN | 105384782 | A | 3/2016 |
| CN | 105531349 | A | 4/2016 |
| CN | 105636971 | A | 6/2016 |
| CN | 108164564 | A | 6/2018 |
| CN | 108864195 | A | 11/2018 |
| CN | 109970802 | A | 7/2019 |
| CN | 109970804 | A | 7/2019 |
| CN | 110330531 | A | 10/2019 |
| CN | 110818741 | A | 2/2020 |
| CN | 110845543 | A | 2/2020 |
| CN | 110903321 | A | 3/2020 |
| CN | 111116674 | A | 5/2020 |
| CN | 111518139 | A | 8/2020 |
| CN | 111808142 | A | 10/2020 |
| CN | 111875640 | A | 11/2020 |
| CN | 112175017 | A | 1/2021 |
| DE | 102020101561 | A1 | 8/2020 |
| EP | 1238981 | A2 | 9/2002 |
| EP | 3663308 | A1 | 6/2020 |
| JP | 2020066622 | A | 4/2020 |
| JP | 2020125289 | A | 8/2020 |
| JP | 202001564 | A | 1/2022 |
| JP | 2022001564 | | 1/2022 |
| KR | 1020160064951 | A | 6/2016 |
| KR | 1020180020878 | A | 2/2018 |
| KR | 1020180110607 | A | 10/2018 |
| KR | 20190012063 | A | 2/2019 |
| KR | 1020190106807 | A | 9/2019 |
| KR | 1020200096423 | A | 8/2020 |
| WO | 2009069442 | A1 | 6/2009 |

OTHER PUBLICATIONS

Japanese first Office Action , dated Jul. 1, 2021 for Japanese Patent Application No. 2020-126868 and its English translation.
Japanese second Office Action dated Feb. 1, 2022 for Japanese Patent Application No. 2020-126868 and its English translation.
Joyama, et al., "Highly efficient organic light-emitting diodes from delayed fluorescence", Nature, vol. 492, Dec. 13, 2012, 7 pages.
Tang, et al., "Organic electroluminescent diodes", Applied Physics Letteres, 51, 913 (1987), 4 pages.
The Chinese First Office Action, dated Jul. 25, 2023, in Chinese Application No. 202010569837.3.
English translation of the Chinese First Office Action, dated Jul. 25, 2023, in Chinese Application No. 202010569837.3.
Search Report, issued together with Office Action, in Chinese Application No. 202010569837.3.
English translation of Search Report, issued together with Chinese Office Action, in Chinese Application No. 202010569837.3.
Japanese Third Office Action, dated Jun. 28, 2022, in Japanese Application No. 2020-126872.
English translation of Japanese Third Office Action, dated Jun. 28, 2022, in Japanese Application No. 2020-126872.
Japanese Decision to Grant a Petition, dated Jan. 31, 2023, in Japanese Application No. 2020-126872.
English translation of Japanese Decision to Grant a Petition, dated Jan. 31, 2023, in Japanese Application No. 2020-126872.
Korean Decision to Grant a Patent, dated Feb. 3, 2023, in Korean Application No. 10-2020-0092672.
English translation of Korean Decision to Grant a Patent, dated Feb. 3, 2023, in Korean Application No. 10-2020-0092672.
Lin, Cing-Fong, et al., "Synthesis and characterization of cyclometaled iridium (III) complexes containing pyrimidine-based ligands", Journal of Organic Chemistry, 2009, 694, pp. 2757-2769.

* cited by examiner

PHOSPHORESCENT ORGANIC METAL COMPLEX AND USE THEREOF

CROSS-REFERENCE TO RELATED APPLICATION(S)

This application claims priority to Chinese Patent Application No. CN 202010569837.3 filed Jun. 20, 2020, the disclosure of which is incorporated herein by reference in its entirety.

TECHNICAL FIELD

The present disclosure relates to compounds for organic electronic devices, for example, organic light-emitting devices. More particularly, the present disclosure relates to an organometallic complex comprising a ligand with a structure represented by Formula 1, and an organic electroluminescent device and a compound formulation including the metal complex.

BACKGROUND

Organic electronic devices include, but are not limited to, the following types: organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which comprises an arylamine hole transporting layer and a tris-8-hydroxyquinolato-aluminum layer as the electron and emitting layer (Applied Physics Letters, 1987, 51 (12): 913-915). Once a bias is applied to the device, green light was emitted from the device. This device laid the foundation for the development of modern organic light-emitting diodes (OLEDs). State-of-the-art OLEDs may comprise multiple layers such as charge injection and transporting layers, charge and exciton blocking layers, and one or multiple emissive layers between the cathode and anode. Since the OLED is a self-emitting solid state device, it offers tremendous potential for display and lighting applications. In addition, the inherent properties of organic materials, such as their flexibility, may make them well suited for particular applications such as fabrication on flexible substrates.

The OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of the fluorescent OLED is only 25%. This limitation hindered the commercialization of OLED. In 1997, Forrest and Thompson reported phosphorescent OLED, which uses triplet emission from heavy metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. A small molecule refers to any organic or organometallic material that is not a polymer. The molecular weight of the small molecule can be large as long as it has well defined structure. Dendrimers with well-defined structures are considered as small molecules. Polymer OLEDs include conjugated polymers and non-conjugated polymers with pendant emitting groups. Small molecule OLED can become the polymer OLED if post polymerization occurred during the fabrication process.

There are various methods for OLED fabrication. Small molecule OLEDs are generally fabricated by vacuum thermal evaporation. Polymer OLEDs are fabricated by solution process such as spin-coating, inkjet printing, and slit printing. If the material can be dissolved or dispersed in a solvent, the small molecule OLED can also be produced by solution process.

The emitting color of the OLED can be achieved by emitter structural design. An OLED may comprise one emitting layer or a plurality of emitting layers to achieve desired spectrum. In the case of green, yellow, and red OLEDs, phosphorescent emitters have successfully reached commercialization. Blue phosphorescent device still suffers from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

Cyano substituents are not often introduced into phosphorescent metal complexes, such as iridium complexes. US20140252333A1 disclosed a series of cyano-phenyl-substituted iridium complexes, which did not clearly show an effect of cyano groups. In addition, since cyano is a substituent having excellent electron-withdrawing ability, cyano is also used to blue-shift the emission spectrum of phosphorescent metal complex, such as that disclosed in US20040121184A1.

SUMMARY

The present disclosure aims to provide a series of metal complexes containing a ligand with a structure represented by Formula 1 to solve at least part of the above-mentioned problems. The metal complexes may be used as light-emitting materials in organic electroluminescent devices. These novel compounds can not only maintain low voltage and improve device efficiency in electroluminescent devices but also greatly reduce the half-peak width of light emitted by the devices so as to greatly improve color saturation of the light emitted by the devices, thereby providing better device performance.

According to an embodiment of the present disclosure, disclosed is a metal complex, which comprises a metal M and a ligand $L_a$ coordinated to the metal M, where $L_a$ has a structure represented by Formula 1:

Formula 1

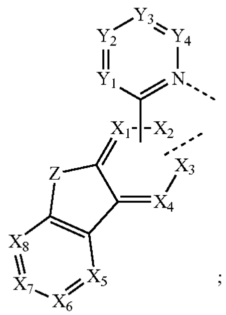

wherein, the metal M is selected from a metal with a relative atomic mass greater than 40;

Z is selected from the group consisting of O, S, Se, NR, CRR, and SiRR, where when two R are present, the two R are the same or different;

$X_1$ to $X_8$ are, at each occurrence identically or differently, selected from C, $CR_x$, or N;

$Y_1$ to $Y_4$ are, at each occurrence identically or differently, selected from $CR_y$ or N;

at least one of $X_1$ to $X_8$ is selected from $CR_x$, and the $R_x$ is cyano;

at least two of $Y_1$ to $Y_4$ are selected from $CR_y$, and wherein at least one of the $R_y$ is deuterium, and at least one of the $R_y$ has a structure of $-L-R_d$;

L is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms, or combinations thereof;

$R_d$ is, at each occurrence identically or differently, selected from substituted alkyl having 1 to 20 carbon atoms, substituted cycloalkyl having 3 to 20 ring carbon atoms, substituted heteroalkyl having 1 to 20 carbon atoms, a substituted heterocyclic group having 3 to 20 ring atoms, substituted arylalkyl having 7 to 30 carbon atoms, substituted alkoxy having 1 to 20 carbon atoms, substituted aryloxy having 6 to 30 carbon atoms, substituted alkenyl having 2 to carbon atoms, substituted aryl having 6 to 30 carbon atoms, substituted heteroaryl having 3 to 30 carbon atoms, substituted alkylsilyl having 3 to 20 carbon atoms, substituted arylsilyl having 6 to 20 carbon atoms, substituted amino having 0 to 20 carbon atoms, or combinations thereof; the substitution in the above-mentioned group of $R_d$ contains at least one deuterium atom;

R, $R_x$, and $R_y$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof; and adjacent substituents R, $R_x$, $R_y$, L, and $R_d$ can be optionally joined to form a ring.

According to another embodiment of the present disclosure, further disclosed is an electroluminescent device, including an anode, a cathode, and an organic layer disposed between the anode and the cathode, wherein the organic layer comprises a metal complex comprising a metal M and a ligand $L_a$ coordinated to the metal M, and $L_a$ has a structure represented by Formula 1:

Formula 1

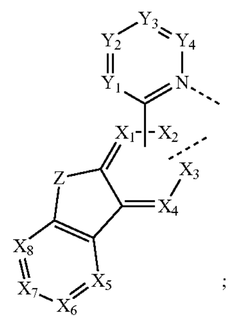

wherein the metal M is selected from a metal with a relative atomic mass greater than 40;

Z is selected from the group consisting of O, S, Se, NR, CRR, and SiRR, where when two R are present, the two R are the same or different;

$X_1$ to $X_8$ are, at each occurrence identically or differently, selected from C, $CR_x$, or N;

$Y_1$ to $Y_4$ are, at each occurrence identically or differently, selected from $CR_y$ or N;

at least one of $X_1$ to $X_8$ is selected from $CR_x$, and the $R_x$ is cyano;

at least two of $Y_1$ to $Y_4$ are selected from $CR_y$, and wherein at least one of the $R_y$ is deuterium, and at least one of the $R_y$ has a structure of $-L-R_d$;

L is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms, or combinations thereof;

$R_d$ is, at each occurrence identically or differently, selected from substituted alkyl having 1 to 20 carbon atoms, substituted cycloalkyl having 3 to 20 ring carbon atoms, substituted heteroalkyl having 1 to 20 carbon atoms, a substituted heterocyclic group having 3 to 20 ring atoms, substituted arylalkyl having 7 to 30 carbon atoms, substituted alkoxy having 1 to 20 carbon atoms, substituted aryloxy having 6 to 30 carbon atoms, substituted alkenyl having 2 to carbon atoms, substituted aryl having 6 to 30 carbon atoms, substituted heteroaryl having 3 to 30 carbon atoms, substituted alkylsilyl having 3 to 20 carbon atoms, substituted arylsilyl having 6 to 20 carbon atoms, substituted amino having 0 to 20 carbon atoms, or combinations thereof; the substitution in the above-mentioned group of $R_d$ contains at least one deuterium atom;

R, $R_x$, and $R_y$, are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof; and adjacent substituents R, $R_x$, $R_y$, L, and $R_d$ can be optionally joined to form a ring.

According to another embodiment of the present disclosure, further disclosed is a compound formulation which includes the metal complex described above.

The novel metal complex comprising a ligand with a structure represented by Formula 1, as disclosed by the present disclosure, may be used as a light-emitting material in an electroluminescent device. These novel compounds can not only maintain low voltage and improve device efficiency in electroluminescent devices but also greatly reduce the half-peak width of light emitted by the devices so as to greatly improve color saturation of the light emitted by the devices, thereby providing better device performance. The present disclosure discloses a series of novel cyano-substituted metal complexes. The introduction of deuterium and deuterated groups at specific positions can allow the metal complex to unexpectedly exhibit many characteristics, such as high efficiency, low voltage, and emission finely tunable in a small range. The most unexpected characteristic is a very narrow peak width of the emitted light. These advantages are of great help to improve the levels and color saturation of devices emitting green/white light.

DETAILED DESCRIPTION

Figure 1:
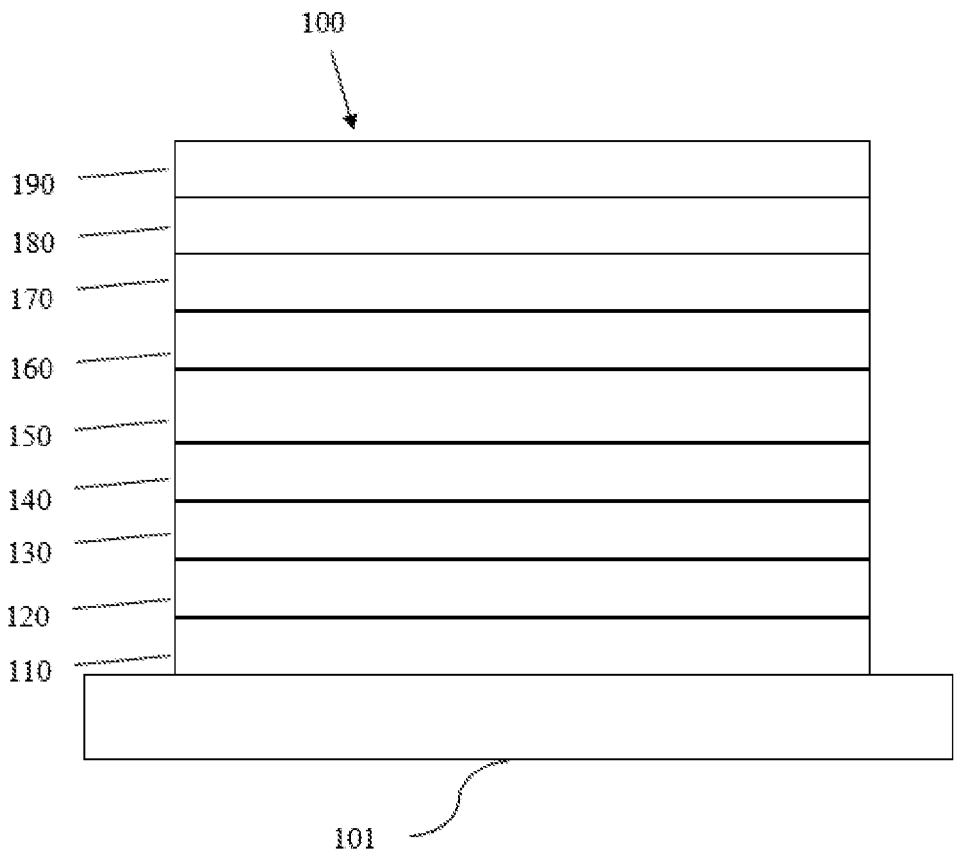
FIG. 1 is a schematic diagram of an organic light-emitting apparatus that may include a metal complex and a compound formulation disclosed herein.

OLEDs can be fabricated on various types of substrates such as glass, plastic, and metal foil. FIG. 1 schematically shows an organic light emitting device 100 without limitation. The figures are not necessarily drawn to scale. Some of the layers in the figures can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, the contents of which are incorporated by reference herein in its entirety.

More examples for each of these layers are available. For example, a flexible and transparent substrate-anode combination is disclosed in U.S. Pat. No. 5,844,363, which is incorporated by reference herein in its entirety. An example of a p-doped hole transport layer is m-MTDATA doped with F4-TCNQ at a molar ratio of 50:1, as disclosed in U.S. Patent Application Publication No. 2003/0230980, which is incorporated by reference herein in its entirety. Examples of host materials are disclosed in U.S. Pat. No. 6,303,238 to Thompson et al., which is incorporated by reference herein in its entirety. An example of an n-doped electron transport layer is BPhen doped with Li at a molar ratio of 1:1, as disclosed in U.S. Patent Application Publication No. 2003/0230980, which is incorporated by reference herein in its entirety. U.S. Pat. Nos. 5,703,436 and 5,707,745, which are incorporated by reference herein in their entireties, disclose examples of cathodes including composite cathodes having a thin layer of metal such as Mg:Ag with an overlying transparent, electrically-conductive, sputter-deposited ITO layer. The theory and use of blocking layers are described in more detail in U.S. Pat. No. 6,097,147 and U.S. Patent Application Publication No. 2003/0230980, which are incorporated by reference herein in their entireties. Examples of injection layers are provided in U.S. Patent Application Publication No. 2004/0174116, which is incorporated by reference herein in its entirety. A description of protective layers may be found in U.S. Patent Application Publication No. 2004/0174116, which is incorporated by reference herein in its entirety.

The layered structure described above is provided by way of non-limiting examples. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have two layers of different emitting materials to achieve desired emission spectrum.

In one embodiment, an OLED may be described as having an "organic layer" disposed between a cathode and an anode. This organic layer may comprise a single layer or multiple layers.

Figure 2:
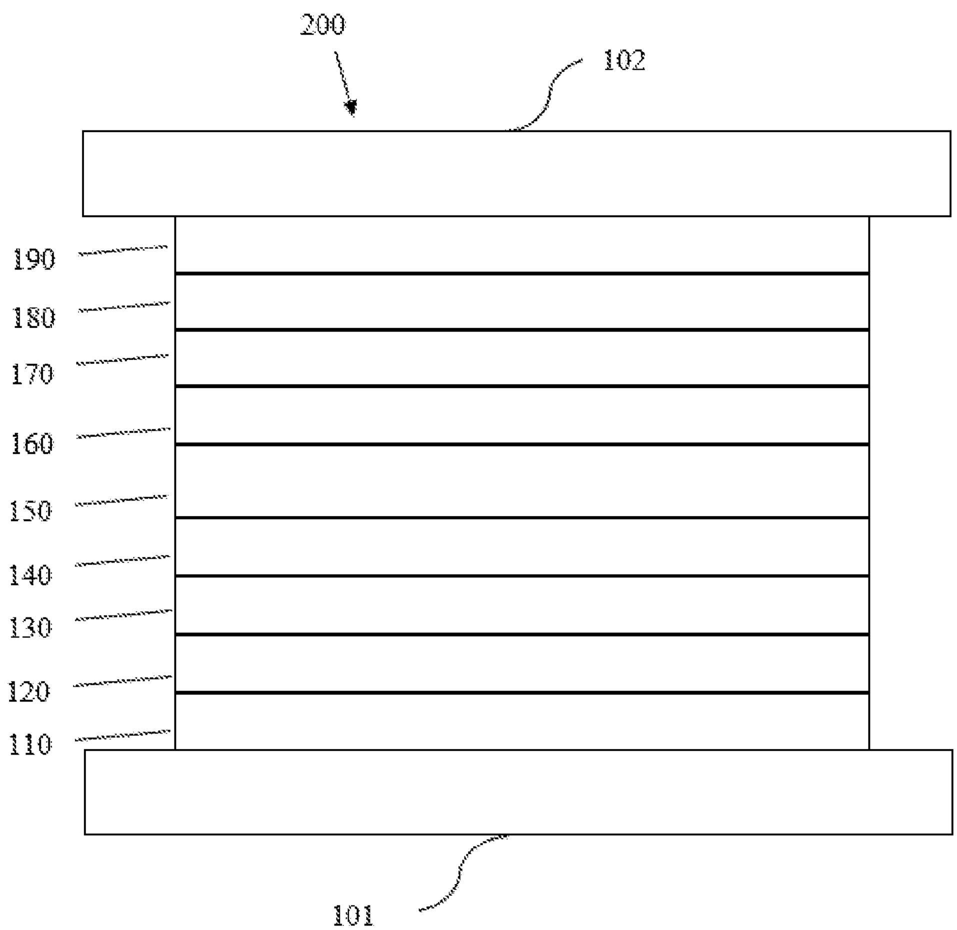
FIG. 2 is a schematic diagram of another organic light-emitting apparatus that may include a metal complex and a compound formulation disclosed herein.

An OLED can be encapsulated by a barrier layer. FIG. 2 schematically shows an organic light emitting device 200 without limitation. FIG. 2 differs from FIG. 1 in that the organic light emitting device include a barrier layer 102, which is above the cathode 190, to protect it from harmful species from the environment such as moisture and oxygen. Any material that can provide the barrier function can be used as the barrier layer such as glass or organic-inorganic hybrid layers. The barrier layer should be placed directly or indirectly outside of the OLED device. Multilayer thin film encapsulation was described in U.S. Pat. No. 7,968,146, which is incorporated by reference herein in its entirety.

Devices fabricated in accordance with embodiments of the present disclosure can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from the substrate. There may be other layers between the first and second layers, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing (RISC) rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta$ES-T). Organic, non-metal containing, donor-acceptor luminescent materials may be able to achieve this. The emission in these materials is generally characterized as a donor-acceptor charge-transfer (CT) type emission. The spatial separation of the HOMO and LUMO in these donor-acceptor type compounds generally results in small $\Delta$ES-T. These states may involve CT states. Generally, donor-acceptor luminescent materials are constructed by connecting an electron donor moiety such as amino- or carbazole-derivatives and an electron acceptor moiety such as N-containing six-membered aromatic rings.

Definition of Terms of Substituents

Halogen or halide—as used herein includes fluorine, chlorine, bromine, and iodine.

Alkyl—as used herein includes both straight and branched chain alkyl groups. Alkyl may be alkyl having 1 to 20 carbon atoms, preferably alkyl having 1 to 12 carbon atoms, and more preferably alkyl having 1 to 6 carbon atoms. Examples of alkyl groups include a methyl group, an ethyl group, a propyl group, an isopropyl group, a n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neopentyl group, a 1-methylpentyl group, a 2-methylpentyl group, a 1-pentylhexyl group, a 1-butylpentyl group, a 1-heptyloctyl group, and a 3-methylpentyl group. Of the above, preferred are a methyl group, an ethyl group, a propyl group, an isopropyl group, a n-butyl group, an s-butyl group, an isobutyl group, a t-butyl group, an n-pentyl group, a neopentyl group, and an n-hexyl group. Additionally, the alkyl group may be optionally substituted.

Cycloalkyl—as used herein includes cyclic alkyl groups. The cycloalkyl groups may be those having 3 to 20 ring carbon atoms, preferably those having 4 to 10 carbon atoms. Examples of cycloalkyl include cyclobutyl, cyclopentyl, cyclohexyl, 4-methylcyclohexyl, 4,4-dimethylcylcohexyl, 1-adamantyl, 2-adamantyl, 1-norbomyl, 2-norbomyl, and the like. Of the above, preferred are cyclopentyl, cyclohexyl, 4-methylcyclohexyl, and 4,4-dimethylcylcohexyl. Additionally, the cycloalkyl group may be optionally substituted.

Heteroalkyl—as used herein, includes a group formed by replacing one or more carbons in an alkyl chain with a hetero-atom(s) selected from the group consisting of a nitrogen atom, an oxygen atom, a sulfur atom, a selenium atom, a phosphorus atom, a silicon atom, a germanium atom, and a boron atom. Heteroalkyl may be those having 1 to 20 carbon atoms, preferably those having 1 to 10 carbon atoms, and more preferably those having 1 to 6 carbon atoms. Examples of heteroalkyl include methoxymethyl, ethoxymethyl, ethoxyethyl, methylthiomethyl, ethylthiomethyl, ethylthioethyl, methoxymethoxymethyl, ethoxymethoxymethyl, ethoxyethoxyethyl, hydroxymethyl, hydroxyethyl, hydroxypropyl, mercaptomethyl, mercaptoethyl, mercaptopropyl, aminomethyl, aminoethyl, aminopropyl, dimethylaminomethyl, trimethylsilyl, dimethylethylsilyl, dimethylisopropylsilyl, t-butyldimethylsilyl, triethylsilyl, triisopropylsilyl, trimethylsilylmethyl, trimethylsilylethyl, and trimethylsilylisopropyl. Additionally, the heteroalkyl group may be optionally substituted.

Alkenyl—as used herein includes straight chain, branched chain, and cyclic alkene groups. Alkenyl may be those having 2 to 20 carbon atoms, preferably those having 2 to 10 carbon atoms. Examples of alkenyl include vinyl, 1-propenyl group, 1-butenyl, 2-butenyl, 3-butenyl, 1,3-butandienyl, 1-methyl vinyl, styryl, 2,2-diphenylvinyl, 1,2-diphenylvinyl, 1-methylallyl, 1,1-dimethylallyl, 2-methylallyl, 1-phenylallyl, 2-phenylallyl, 3-phenylallyl, 3,3-diphenylallyl, 1,2-dimethylallyl, 1-phenyl-1-butenyl, 3-phenyl-1-butenyl, cyclopentenyl, cyclopentadienyl, cyclohexenyl, cycloheptenyl, cycloheptatrienyl, cyclooctenyl, cyclooctatetraenyl, and norbomenyl. Additionally, the alkenyl group may be optionally substituted.

Alkynyl—as used herein includes straight chain alkynyl groups. Alkynyl may be those having 2 to 20 carbon atoms, preferably those having 2 to 10 carbon atoms. Examples of alkynyl groups include ethynyl, propynyl, propargyl, 1-butynyl, 2-butynyl, 3-butynyl, 1-pentynyl, 2-pentynyl, 3,3-dimethyl-1-butynyl, 3-ethyl-3-methyl-1-pentynyl, 3,3-diisopropyl-1-pentynyl, phenylethynyl, phenylpropynyl, etc. Of the above, preferred are ethynyl, propynyl, propargyl, 1-butynyl, 2-butynyl, 3-butynyl, 1-pentynyl, and phenylethynyl. Additionally, the alkynyl group may be optionally substituted.

Aryl or an aromatic group—as used herein includes non-condensed and condensed systems. Aryl may be those having 6 to 30 carbon atoms, preferably those having 6 to 20 carbon atoms, and more preferably those having 6 to 12 carbon atoms. Examples of aryl groups include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Examples of non-condensed aryl groups include phenyl, biphenyl-2-yl, biphenyl-3-yl, biphenyl-4-yl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-(2-phenylpropyl)phenyl, 4'-methylbiphenylyl, 4"-t-butyl-p-terphenyl-4-yl, o-cumenyl, m-cumenyl, p-cumenyl, 2,3-xylyl, 3,4-xylyl, 2,5-xylyl, mesityl, and m-quarterphenyl. Additionally, the aryl group may be optionally substituted.

Heterocyclic groups or heterocycle—as used herein include non-aromatic cyclic groups. Non-aromatic heterocyclic groups includes saturated heterocyclic groups having 3 to 20 ring atoms and unsaturated non-aromatic heterocyclic groups having 3 to 20 ring atoms, where at least one ring atom is selected from the group consisting of a nitrogen atom, an oxygen atom, a sulfur atom, a selenium atom, a silicon atom, a phosphorus atom, a germanium atom, and a boron atom. Preferred non-aromatic heterocyclic groups are those having 3 to 7 ring atoms, each of which includes at least one hetero-atom such as nitrogen, oxygen, silicon, or sulfur. Examples of non-aromatic heterocyclic groups include oxiranyl, oxetanyl, tetrahydrofuranyl, tetrahydropyranyl, dioxolanyl, dioxanyl, aziridinyl, dihydropyrrolyl, tetrahydropyrrolyl, piperidinyl, oxazolidinyl, morpholinyl, piperazinyl, oxepinyl, thiepinyl, azepinyl, and tetrahydrosilolyl. Additionally, the heterocyclic group may be optionally substituted.

Heteroaryl—as used herein, includes non-condensed and condensed hetero-aromatic groups having 1 to 5 hetero-atoms, where at least one hetero-atom is selected from the group consisting of a nitrogen atom, an oxygen atom, a sulfur atom, a selenium atom, a silicon atom, a phosphorus atom, a germanium atom, and a boron atom. A hetero-aromatic group is also referred to as heteroaryl. Heteroaryl may be those having 3 to 30 carbon atoms, preferably those having 3 to 20 carbon atoms, and more preferably those having 3 to 12 carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridoindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—as used herein, is represented by —O-alkyl, —O-cycloalkyl, —O-heteroalkyl, or —O-heterocyclic group. Examples and preferred examples of alkyl, cycloalkyl, heteroalkyl, and heterocyclic groups are the same as those described above. Alkoxy groups may be those having 1 to 20 carbon atoms, preferably those having 1 to 6 carbon atoms. Examples of alkoxy groups include methoxy, ethoxy, propoxy, butoxy, pentyloxy, hexyloxy, cyclopropyloxy, cyclobutyloxy, cyclopentyloxy, cyclohexyloxy, tetrahydrofuranyloxy, tetrahydropyranyloxy, methoxypropyloxy, ethoxyethyloxy, methoxymethyloxy, and ethoxymethyloxy. Additionally, the alkoxy group may be optionally substituted.

Aryloxy—as used herein, is represented by —O-aryl or —O-heteroaryl. Examples and preferred examples of aryl and heteroaryl are the same as those described above. Aryloxy groups may be those having 6 to 30 carbon atoms, preferably those having 6 to 20 carbon atoms. Examples of aryloxy groups include phenoxy and biphenyloxy. Additionally, the aryloxy group may be optionally substituted.

Arylalkyl—as used herein, contemplates alkyl substituted with an aryl group. Arylalkyl may be those having 7 to 30 carbon atoms, preferably those having 7 to 20 carbon atoms, and more preferably those having 7 to 13 carbon atoms. Examples of arylalkyl groups include benzyl, 1-phenylethyl, 2-phenylethyl, 1-phenylisopropyl, 2-phenylisopropyl, phenyl-t-butyl, alpha-naphthylmethyl, 1-alpha-naphthylethyl, 2-alpha-naphthylethyl, 1-alpha-naphthylisopropyl, 2-alpha-naphthylisopropyl, beta-naphthylmethyl, 1-beta-naphthylethyl, 2-beta-naphthylethyl, 1-beta-naphthylisopropyl, 2-beta-naphthylisopropyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, and 1-chloro-2-phenylisopropyl. Of the above, preferred are benzyl, p-cyanobenzyl, m-cyanobenzyl, o-cyanobenzyl, 1-phenylethyl, 2-phenylethyl, 1-phenylisopropyl, and 2-phenylisopropyl. Additionally, the arylalkyl group may be optionally substituted.

Alkylsilyl—as used herein, contemplates a silyl group substituted with an alkyl group. Alkylsilyl groups may be those having 3 to 20 carbon atoms, preferably those having 3 to 10 carbon atoms. Examples of alkylsilyl groups include trimethylsilyl, triethylsilyl, methyldiethylsilyl, ethyldimethylsilyl, tripropylsilyl, tributylsilyl, triisopropylsilyl, methyldiisopropylsilyl, dimethylisopropylsilyl, tri-t-butylsilyl, triisobutylsilyl, dimethyl t-butylsilyl, and methyldi-t-butylsilyl. Additionally, the alkylsilyl group may be optionally substituted.

Arylsilyl—as used herein, contemplates a silyl group substituted with an aryl group. Arylsilyl groups may be those having 6 to 30 carbon atoms, preferably those having 8 to 20 carbon atoms. Examples of arylsilyl groups include triphenylsilyl, phenyldibiphenylylsilyl, diphenylbiphenylsilyl, phenyldiethylsilyl, diphenylethylsilyl, phenyldimethylsilyl, diphenylmethylsilyl, phenyldiisopropylsilyl, diphenylisopropylsilyl, diphenylbutylsilyl, diphenylisobutylsilyl, diphenyl t-butylsilyl. Additionally, the arylsilyl group may be optionally substituted.

The term "aza" in azadibenzofuran, azadibenzothiophene, etc. means that one or more of C—H groups in the respective aromatic fragment are replaced by a nitrogen atom. For example, azatriphenylene encompasses dibenzo[f,h]quinoxaline, dibenzo[f,h]quinoline and other analogs with two or more nitrogens in the ring system. One of ordinary skill in the art can readily envision other nitrogen analogs of the aza-derivatives described above, and all such analogs are intended to be encompassed by the terms as set forth herein.

In the present disclosure, unless otherwise defined, when any term of the group consisting of substituted alkyl, substituted cycloalkyl, substituted heteroalkyl, substituted heterocyclic group, substituted arylalkyl, substituted alkoxy, substituted aryloxy, substituted alkenyl, substituted alkynyl, substituted aryl, substituted heteroaryl, substituted alkylsilyl, substituted arylsilyl, substituted amino, substituted acyl, substituted carbonyl, a substituted carboxylic acid group, a substituted ester group, substituted sulfinyl, substituted sulfonyl, and substituted phosphino is used, it means that any group of alkyl, cycloalkyl, heteroalkyl, heterocyclic group, arylalkyl, alkoxy, aryloxy, alkenyl, alkynyl, aryl, heteroaryl, alkylsilyl, arylsilyl, amino, acyl, carbonyl, a carboxylic acid group, an ester group, sulfinyl, sulfonyl, and phosphino may be substituted with one or more moieties selected from the group consisting of deuterium, halogen, unsubstituted alkyl having 1 to 20 carbon atoms, unsubstituted cycloalkyl having 3 to 20 ring carbon atoms, unsubstituted heteroalkyl having 1 to 20 carbon atoms, an unsubstituted heterocyclic group having 3 to 20 ring atoms, unsubstituted arylalkyl having 7 to carbon atoms, unsubstituted alkoxy having 1 to 20 carbon atoms, unsubstituted aryloxy having 6 to 30 carbon atoms, unsubstituted alkenyl having 2 to 20 carbon atoms, unsubstituted alkynyl having 2 to 20 carbon atoms, unsubstituted aryl having 6 to 30 carbon atoms, unsubstituted heteroaryl having 3 to 30 carbon atoms, unsubstituted alkylsilyl having 3 to 20 carbon atoms, unsubstituted arylsilyl group having 6 to 20 carbon atoms, unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or an attached fragment are considered to be equivalent.

In the compounds mentioned in the present disclosure, hydrogen atoms may be partially or fully replaced by deuterium. Other atoms such as carbon and nitrogen may also be replaced by their other stable isotopes. The replacement by other stable isotopes in the compounds may be preferred due to its enhancements of device efficiency and stability.

In the compounds mentioned in the present disclosure, multiple substitution refers to a range that includes a di-substitution, up to the maximum available substitution. When substitution in the compounds mentioned in the present disclosure represents multiple substitution (including di-, tri-, and tetra-substitutions etc.), that means the substituent may exist at a plurality of available substitution positions on its linking structure, the substituents present at a plurality of available substitution positions may have the same structure or different structures.

In the compounds mentioned in the present disclosure, adjacent substituents in the compounds cannot be joined to form a ring unless otherwise explicitly defined, for example, adjacent substituents can be optionally joined to form a ring. In the compounds mentioned in the present disclosure, the expression that adjacent substituents can be optionally joined to form a ring includes a case where adjacent substituents may be joined to form a ring and a case where adjacent substituents are not joined to form a ring. When adjacent substituents can be optionally joined to form a ring, the ring formed may be monocyclic or polycyclic, as well as alicyclic, heteroalicyclic, aromatic, or heteroaromatic. In such expression, adjacent substituents may refer to substituents bonded to the same atom, substituents bonded to carbon atoms which are directly bonded to each other, or substituents bonded to carbon atoms which are more distant from each other. Preferably, adjacent substituents refer to substituents bonded to the same carbon atom and substituents bonded to carbon atoms which are directly bonded to each other.

The expression that adjacent substituents can be optionally joined to form a ring is also intended to mean that two substituents bonded to the same carbon atom are joined to each other via a chemical bond to form a ring, which can be exemplified by the following formula:

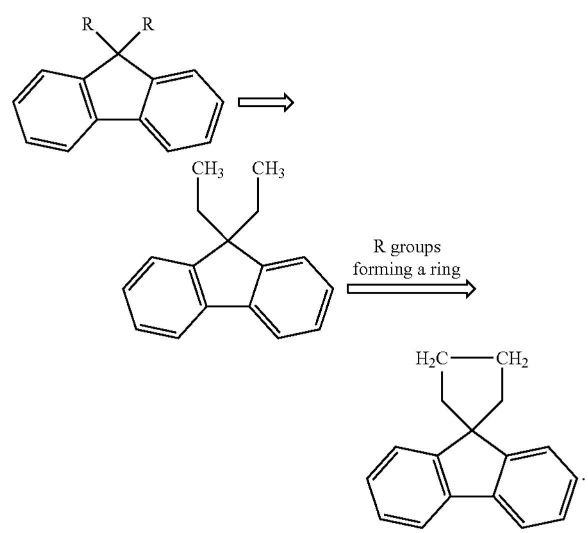

The expression that adjacent substituents can be optionally joined to form a ring is also intended to mean that two substituents bonded to carbon atoms which are directly bonded to each other are joined to each other via a chemical bond to form a ring, which can be exemplified by the following formula:

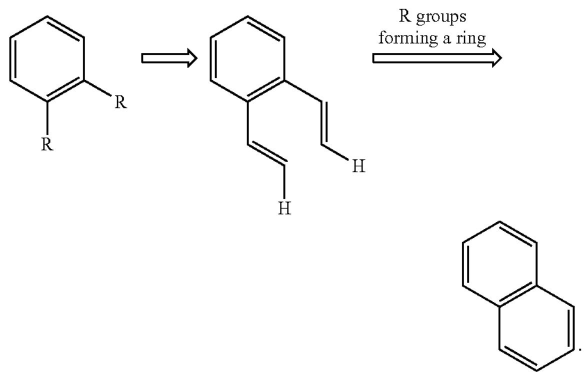

Furthermore, the expression that adjacent substituents can be optionally joined to form a ring is also intended to mean that, in the case where one of the two substituents bonded to carbon atoms which are directly bonded to each other represents hydrogen, the second substituent is bonded at a position at which the hydrogen atom is bonded, thereby forming a ring. This is exemplified by the following formula:

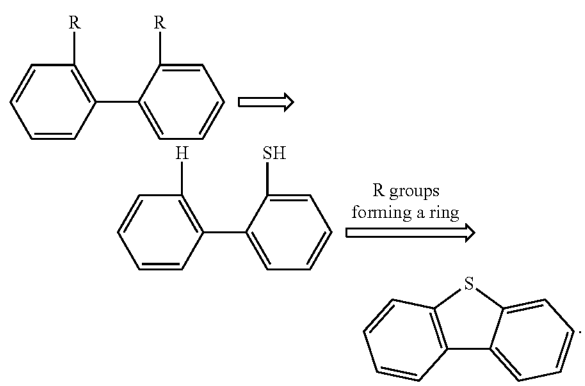

According to an embodiment of the present disclosure, disclosed is a metal complex, which includes a metal M and a ligand $L_a$ coordinated to the metal M, where $L_a$ has a structure represented by Formula 1:

Formula 1

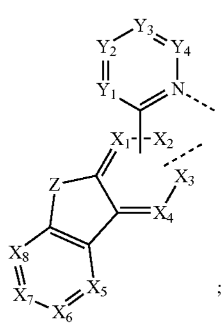

;

wherein the metal M is selected from a metal with a relative atomic mass greater than 40;

Z is selected from the group consisting of O, S, Se, NR, CRR, and SiRR, where when two R are present, the two R are the same or different; for example, when Z is selected from CRR, the two R may be the same or different; in another example, when Z is selected from SiRR, the two R may be the same or different;

$X_1$ to $X_8$ are, at each occurrence identically or differently, selected from C, $CR_x$, or N;

$Y_1$ to $Y_4$ are, at each occurrence identically or differently, selected from $CR_y$, or N;

at least one of $X_1$ to $X_8$ is selected from $CR_x$, and the $R_x$ is cyano;

at least two of $Y_1$ to $Y_4$ are selected from $CR_y$, and wherein at least one of the $R_y$ is deuterium, and at least one of the $R_y$ has a structure of $-L-R_d$;

L is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms, or combinations thereof;

$R_d$ is, at each occurrence identically or differently, selected from substituted alkyl having 1 to 20 carbon atoms, substituted cycloalkyl having 3 to 20 ring carbon atoms, substituted heteroalkyl having 1 to 20 carbon atoms, a substituted heterocyclic group having 3 to 20 ring atoms, substituted arylalkyl having 7 to 30 carbon atoms, substituted alkoxy having 1 to 20 carbon atoms, substituted aryloxy having 6 to 30 carbon atoms, substituted alkenyl having 2 to carbon atoms, substituted aryl having 6 to 30 carbon atoms, substituted heteroaryl having 3 to 30 carbon atoms, substituted alkylsilyl having 3 to 20 carbon atoms, substituted arylsilyl having 6 to 20 carbon atoms, substituted amino having 0 to 20 carbon atoms, or combinations thereof; the substitution in the above-mentioned group of $R_d$ contains at least one deuterium atom;

R, $R_x$ (referring to remaining $R_x$ present in $X_1$ to $X_8$ other than the $R_x$ selected from cyano), and $R_y$ (referring to remaining $R_y$ present in $Y_1$ to $Y_4$ other than the $R_y$ selected from deuterium or the $R_y$ having the structure of $-L-R_d$) are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof; and adjacent substituents R, $R_x$, $R_y$, L, and $R_d$ can be optionally joined to form a ring.

In the present disclosure, the expression that adjacent substituents R, $R_x$, $R_y$, L, and $R_d$ can be optionally joined to form a ring is intended to mean that any one or more of the group of adjacent substituents, such as adjacent substituents R, adjacent substituents $R_x$, adjacent substituents $R_y$, adjacent substituents $R_d$, adjacent substituents $R_y$ and L, substituents R and $R_d$, substituents $R_x$ and $R_d$, substituents $R_y$ and $R_d$, and substituents R and $R_y$, can be joined to form a ring. Obviously, any of these groups of substituents may not be joined to form a ring.

According to an embodiment of the present disclosure, the metal complex has a general formula of $M(L_a)_m(L_b)_n(L_c)_q$; wherein, M is, at each occurrence identically or differently, selected from the group consisting of Cu, Ag, Au, Ru, Rh, Pd, Os, Ir, and Pt; preferably, M is, at each occurrence identically or differently, selected from Pt or Ir;

$L_a$, $L_b$, and $L_c$ are the first ligand, the second ligand, and the third ligand coordinated to the metal M, respectively; $L_a$, $L_b$, and $L_c$ can be optionally joined to form a multidentate ligand; for example, any two of $L_a$, $L_b$, and $L_c$ may be joined to form a tetradentate ligand; in another example, $L_a$, $L_b$, and $L_c$ may be joined to each other to form a hexadentate ligand; in another example, none of $L_a$, $L_b$, and $L_c$ are joined, so that no multidentate ligand is formed;

m is 1, 2, or 3, n is 0, 1, or 2, q is 0, 1, or 2, and m+n+q equals the oxidation state of the metal M; where when m is greater than or equal to 2, the multiple $L_a$ are the same or different; when n is equal to 2, the two $L_b$ are the same or different; when q is equal to 2, the two $L_c$ are the same or different;

$L_b$ and $L_c$ are, at each occurrence identically or differently, selected from the structure represented by any of the group consisting of following structures:

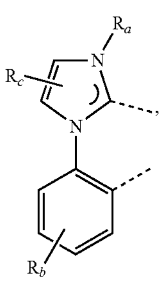
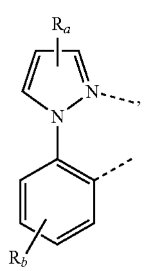
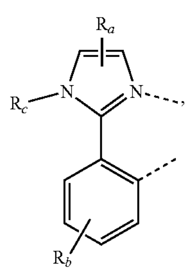
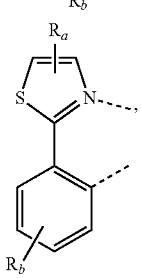
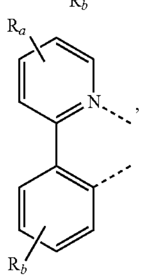
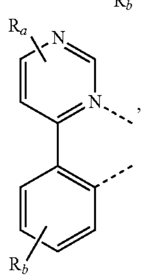
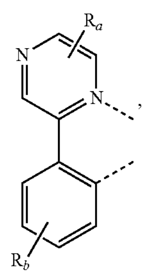
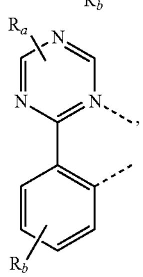
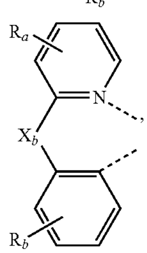
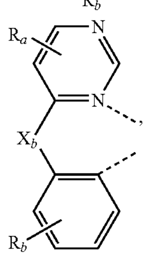

-continued

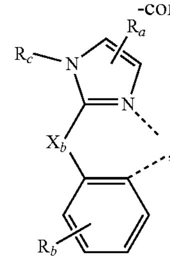
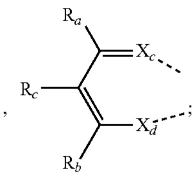

wherein, $R_a$, $R_b$, and $R_c$ are, at each occurrence identically or differently, represent mono-substitution, multi-substitution, or non-substitution;

$X_b$ is, at each occurrence identically or differently, selected from the group consisting of: O, S, Se, $NR_{N1}$, and $CR_{C1}R_{C2}$;

$X_c$ and $X_d$ are, at each occurrence identically or differently, selected from the group consisting of: O, S, Se, and $NR_{N2}$;

$R_a$, $R_b$, $R_c$, $R_{N1}$, $R_{N2}$, $R_{C1}$, and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof; and in structures of $L_b$ and $L_c$, adjacent substituents $R_a$, $R_b$, $R_c$, $R_{N1}$, $R_{N2}$, $R_{C1}$ and $R_{C2}$ can be optionally joined to form a ring.

In the present disclosure, the expression that in the structures of $L_b$ and $L_c$, adjacent substituents $R_a$, $R_b$, $R_c$, $R_{N1}$, $R_{N2}$, $R_{C1}$, and $R_{C2}$ can be optionally joined to form a ring is intended to mean that any one or more of the group of adjacent substituents, such as two substituents $R_a$, two substituents $R_b$, two substituents $R_c$, substituents $R_a$ and $R_b$, substituents $R_a$ and $R_c$, substituents $R_b$ and $R_c$, substituents $R_a$ and $R_{N1}$, substituents $R_b$ and $R_{N1}$, substituents $R_a$ and $R_{C1}$, substituents $R_a$ and $R_{C2}$, substituents $R_b$ and $R_{C1}$, substituents $R_b$ and $R_{C2}$, substituents $R_a$ and $R_{N2}$, substituents $R_b$ and $R_{N2}$, and substituents $R_{C1}$ and $R_{C2}$, may be joined to form a ring. Obviously, any of these groups of substituents may not be joined to form a ring.

According to an embodiment of the present disclosure, $L_a$ has a structure represented by any one of Formula 1a to Formula 1d:

Formula 1a

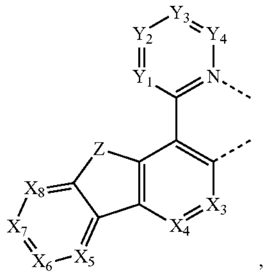

Formula 1b

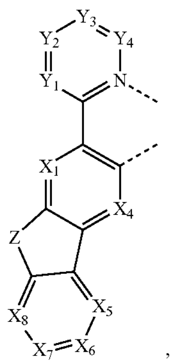

Formula 1c

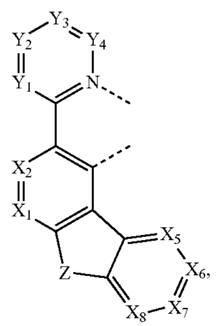

Formula 1d

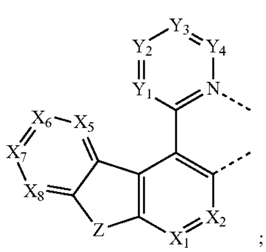

where

Z is selected from the group consisting of O, S, Se, NR, CRR, and SiRR, where when two R are present, the two R are the same or different; for example, when Z is selected from CRR, the two R may be the same or different; in another example, when Z is selected from SiRR, the two R may be the same or different;

in Formula 1a, $X_3$ to $X_8$ are, at each occurrence identically or differently, selected from $CR_x$ or N;

in Formula 1b, $X_1$ and $X_4$ to $X_8$ are, at each occurrence identically or differently, selected from $CR_x$ or N;

in Formula 1c, $X_1$, $X_2$, and $X_5$ to $X_8$ are, at each occurrence identically or differently, selected from $CR_x$ or N;

in Formula 1d, $X_1$, $X_2$, and $X_5$ to $X_8$ are, at each occurrence identically or differently, selected from $CR_x$ or N;

$Y_1$ to $Y_4$ are, at each occurrence identically or differently, selected from $CR_y$ or N;

in Formula 1a, at least one of $X_3$ to $X_8$ is selected from $CR_x$, and the $R_x$ is cyano;

in Formula 1b, at least one of $X_1$ and $X_4$ to $X_8$ is selected from $CR_x$, and the $R_x$ is cyano;

in Formula 1c, at least one of $X_1$, $X_2$, and $X_5$ to $X_8$ is selected from $CR_x$, and the $R_x$ is cyano;

in Formula 1d, at least one of $X_1$, $X_2$, and $X_5$ to $X_8$ is selected from $CR_x$, and the $R_x$ is cyano;

at least two of $Y_1$ to $Y_4$ are selected from $CR_y$, and wherein at least one of the $R_y$ is deuterium, and at least one of the $R_y$ has a structure of $-L-R_d$;

L is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms, or combinations thereof;

$R_d$ is, at each occurrence identically or differently, selected from substituted alkyl having 1 to 20 carbon atoms, substituted cycloalkyl having 3 to 20 ring carbon atoms, substituted heteroalkyl having 1 to 20 carbon atoms, a substituted heterocyclic group having 3 to 20 ring atoms, substituted arylalkyl having 7 to 30 carbon atoms, substituted alkoxy having 1 to 20 carbon atoms, substituted aryloxy having 6 to 30 carbon atoms, substituted alkenyl having 2 to carbon atoms, substituted aryl having 6 to 30 carbon atoms, substituted heteroaryl having 3 to 30 carbon atoms, substituted alkylsilyl having 3 to 20 carbon atoms, substituted arylsilyl having 6 to 20 carbon atoms, substituted amino having 0 to 20 carbon atoms, or combinations thereof; the substitution in the above-mentioned group of $R_d$ contains at least one deuterium atom;

R, $R_x$, and $R_y$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof; and adjacent substituents R, $R_x$, $R_y$, L, and $R_d$ can be optionally joined to form a ring.

According to an embodiment of the present disclosure, the metal complex has a general formula of $Ir(L_a)_m(L_b)_{3-m}$ and a structure represented by Formula 2:

Formula 2

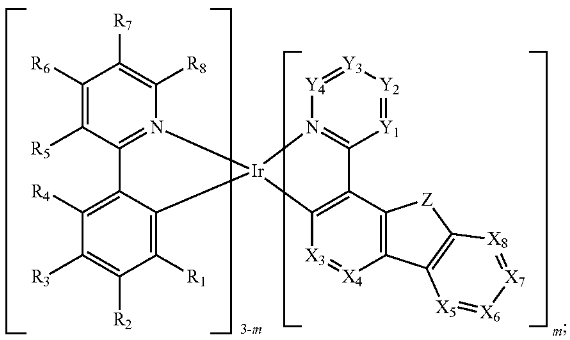

wherein, m is selected from 1 or 2; where when m is equal to 2, the two $L_a$ are the same or different; when m is equal to 1, the two $L_b$ are the same or different;

Z is selected from the group consisting of O, S, Se, NR, CRR, and SiRR, where when two R are present, the two R are the same or different; for example, when Z is selected from CRR, the two R may be the same or different; in another example, when Z is selected from SiRR, the two R may be the same or different;

$X_3$ to $X_8$ are, at each occurrence identically or differently, selected from $CR_x$ or N;

$Y_1$ to $Y_4$ are, at each occurrence identically or differently, selected from $CR_y$ or N;

at least one of $X_3$ to $X_8$ is selected from $CR_x$, and the $R_x$ is cyano;

at least two of $Y_1$ to $Y_4$ are selected from $CR_y$, and wherein at least one of the $R_y$ is deuterium, and at least one of the $R_y$ has a structure of $-L-R_d$;

L is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms, or combinations thereof;

$R_d$ is, at each occurrence identically or differently, selected from substituted alkyl having 1 to 20 carbon atoms, substituted cycloalkyl having 3 to 20 ring carbon atoms, substituted heteroalkyl having 1 to 20 carbon atoms, a substituted heterocyclic group having 3 to 20 ring atoms, substituted arylalkyl having 7 to 30 carbon atoms, substituted alkoxy having 1 to 20 carbon atoms, substituted aryloxy having 6 to 30 carbon atoms, substituted alkenyl having 2 to 20 carbon atoms, substituted aryl having 6 to 30 carbon atoms, substituted heteroaryl having 3 to 30 carbon atoms, substituted alkylsilyl having 3 to 20 carbon atoms, substituted arylsilyl having 6 to 20 carbon atoms, substituted amino having 0 to 20 carbon atoms, or combinations thereof; the substitution in the above-mentioned group of $R_d$ contains at least one deuterium atom;

R, $R_x$, $R_y$, and $R_1$ to $R_8$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof; and adjacent substituents R, $R_x$, $R_y$, $R_1$ to $R_8$, L, and $R_d$ can be optionally joined to form a ring.

In the present disclosure, the expression that adjacent substituents R, $R_x$, $R_y$, $R_1$ to $R_8$, and $R_d$ can be optionally joined to form a ring is intended to mean that any one or more of the group of adjacent substituents, such as adjacent substituents R, adjacent substituents $R_x$, adjacent substituents $R_y$, adjacent substituents $R_d$, substituents $R_x$ and $R_y$, substituents $R_x$ and R, substituents $R_x$ and $R_d$, substituents $R_y$ and R, substituents $R_y$ and $R_d$, adjacent substituents $R_y$ and L, substituents $R_1$ and $R_2$, substituents $R_2$ and $R_3$, substituents $R_3$ and $R_4$, substituents $R_4$ and $R_5$, substituents $R_5$ and $R_6$, substituents $R_6$ and $R_7$, and substituents $R_7$ and $R_8$, can be joined to form a ring. Obviously, any of these groups of adjacent substituents may not be joined to form a ring.

According to an embodiment of the present disclosure, in Formula 1, Formula 1a to Formula 1d, and Formula 2, Z is selected from the group consisting of: O and S.

According to an embodiment of the present disclosure, in Formula 1, Formula 1a to Formula 1d, and Formula 2, Z is O.

According to an embodiment of the present disclosure, in Formula 1, $X_1$ to $X_8$ are, at each occurrence identically or differently, selected from C or $CR_x$.

According to an embodiment of the present disclosure, in Formula 1, $X_1$ to $X_8$ are, at each occurrence identically or differently, selected from C, $CR_x$, or N, and at least one of $X_1$ to $X_8$ is N.

According to an embodiment of the present disclosure, in Formula 1a to Formula 1d and Formula 2, $X_1$ to $X_8$ are, at each occurrence identically or differently, selected from $CR_x$.

According to an embodiment of the present disclosure, in Formula 1a to Formula 1d and Formula 2, $X_1$ to $X_8$ are, at each occurrence identically or differently, selected from $CR_x$ or N, and at least one of $X_1$ to $X_8$ is N.

According to an embodiment of the present disclosure, in Formula 1, Formula 1a to Formula 1d, and Formula 2, $X_8$ is N.

According to an embodiment of the present disclosure, in Formula 1, Formula 1a to Formula 1d, and Formula 2, at least two of $X_1$ to $X_8$ are selected from $CR_x$, and wherein at least one of the $R_x$ is cyano, and at least one of the $R_x$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

According to an embodiment of the present disclosure, in Formula 1, Formula 1a to Formula 1d, and Formula 2, at least two of $X_1$ to $X_8$ are selected from $CR_x$, and wherein at least one of the $R_x$ is cyano, and at least one of the $R_x$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, a cyano group, a hydroxyl group, a sulfanyl group, and combinations thereof.

According to an embodiment of the present disclosure, in Formula 1, Formula 1a to Formula 1d, and Formula 2, at least two of $X_1$ to $X_8$ are selected from $CR_x$, and wherein at least one of the $R_x$ is cyano, and at least one of the $R_x$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, and combinations thereof.

According to an embodiment of the present disclosure, in Formula 1, Formula 1a to Formula 1d, and Formula 2, at least two of $X_1$ to $X_8$ are selected from $CR_x$, and wherein at least one of the $R_x$ is cyano, and at least one of the $R_x$ is, at each occurrence identically or differently, selected from the group consisting of: deuterium, halogen, substituted or unsubstituted alkyl having 1 to 10 carbon atoms, substituted or unsubstituted cycloalkyl having 3 to 10 ring carbon atoms, substituted or unsubstituted aryl having 6 to 15 carbon atoms, substituted or unsubstituted heteroaryl having 3 to 15 carbon atoms, and combinations thereof.

According to an embodiment of the present disclosure, in Formula 1, Formula 1a to Formula 1d, and Formula 2, at least one of $X_5$ to $X_8$ is selected from $CR_x$, and the $R_x$ is cyano.

According to an embodiment of the present disclosure, in Formula 1, Formula 1a to Formula 1d, and Formula 2, at least one of $X_6$ to $X_8$ is selected from $CR_x$, and the $R_x$ is cyano.

According to an embodiment of the present disclosure, in Formula 1, Formula 1a to Formula 1d, and Formula 2, $X_7$ or $X_8$ is selected from $CR_x$, and the $R_x$ is cyano.

According to an embodiment of the present disclosure, in Formula 1, Formula 1a to Formula 1d, and Formula 2, $X_7$ is selected from $CR_x$, and the $R_x$ is not fluorine.

According to an embodiment of the present disclosure, in Formula 1, Formula 1a to Formula 1d, and Formula 2, $Y_1$ to $Y_4$ are, at each occurrence identically or differently, selected from $CR_y$.

According to an embodiment of the present disclosure, in Formula 1, Formula 1a to Formula 1d, and Formula 2, $Y_1$ to $Y_4$ are, at each occurrence identically or differently, selected from $CR_y$ or N, and at least one of $Y_1$ to $Y_4$ is N; preferably, $Y_3$ is N.

According to an embodiment of the present disclosure, in Formula 1, Formula 1a to Formula 1d, and Formula 2, L is, at each occurrence identically or differently, selected from a single bond, substituted or unsubstituted alkylene having 1 to 20 carbon atoms, substituted or unsubstituted cycloalkylene having 3 to 20 carbon atoms, or combinations thereof.

According to an embodiment of the present disclosure, in Formula 1, Formula 1a to Formula 1d, and Formula 2, L is selected from a single bond.

According to an embodiment of the present disclosure, in Formula 1, Formula 1a to Formula 1d, and Formula 2, $R_d$ is, at each occurrence identically or differently, selected from the group consisting of: substituted alkyl having 1 to 20 carbon atoms, substituted cycloalkyl having 3 to 20 ring carbon atoms, substituted aryl having 6 to 30 carbon atoms, substituted heteroaryl having 3 to 30 carbon atoms, and combinations thereof; and at least one substitution in the above groups of $R_d$ is a deuterium atom.

According to an embodiment of the present disclosure, in Formula 1, Formula 1a to Formula 1d, and Formula 2, $R_d$ is, at each occurrence identically or differently, selected from the group consisting of: substituted alkyl having 1 to 20 carbon atoms, substituted cycloalkyl having 3 to 20 ring carbon atoms, substituted aryl having 6 to 30 carbon atoms, and combinations thereof; and at least one substitution in the above groups of $R_d$ is a deuterium atom.

According to an embodiment of the present disclosure, in Formula 1, Formula 1a to Formula 1d, and Formula 2, $R_d$ is, at each occurrence identically or differently, selected from the group consisting of: substituted alkyl having 1 to 20 carbon atoms, substituted cycloalkyl having 3 to 20 ring carbon atoms, substituted aryl having 6 to 30 carbon atoms, and combinations thereof; and a substitution in the above groups of $R_d$ is a deuterium atom.

According to an embodiment of the present disclosure, in Formula 1, Formula 1a to Formula 1d, and Formula 2, $R_d$ is, at each occurrence identically or differently, selected from the group consisting of: partially or fully deuterated alkyl having 1 to 20 carbon atoms, partially or fully deuterated cycloalkyl having 3 to 20 ring carbon atoms, and combinations thereof.

According to an embodiment of the present disclosure, in Formula 1, Formula 1a to Formula 1d, and Formula 2, $R_d$ is, at each occurrence identically or differently, selected from the group consisting of: partially or fully deuterated alkyl having 1 to 20 carbon atoms, partially or fully deuterated cycloalkyl having 3 to 20 ring carbon atoms, and combinations thereof; when a carbon atom at a benzylic position in the deuterated group is a primary carbon atom, a secondary carbon atom, or a tertiary carbon atom, the carbon atom at the benzylic position in the deuterated group is joined to at least one deuterium atom.

In the present disclosure, the carbon atom at the benzylic position in the deuterated group refers to a carbon atom directly joined to an aromatic or heteroaromatic ring in the deuterated group. When the carbon atom at the benzylic position in the deuterated group is merely joined directly to one carbon atom, the carbon atom is a primary carbon atom; when the carbon atom at the benzylic position is merely joined directly to two carbon atoms, the carbon atom is a secondary carbon atom; when the carbon atom at the benzylic position is merely joined directly to three carbon atoms, the carbon atom is a tertiary carbon atom; and when the carbon atom at the benzylic position is joined directly to four carbon atoms, the carbon atom is a quaternary carbon atom.

According to an embodiment of the present disclosure, in Formula 1, Formula 1a to Formula 1d, and Formula 2, $R_d$ is, at each occurrence identically or differently, selected from the group consisting of: partially or fully deuterated alkyl having 1 to 20 carbon atoms, partially or fully deuterated cycloalkyl having 3 to 20 ring carbon atoms, and combinations thereof; and the benzylic position in the deuterated group is fully deuterated.

According to an embodiment of the present disclosure, in Formula 1, Formula 1a to Formula 1d, and Formula 2, $R_d$ is, at each occurrence identically or differently, selected from the group consisting of: $CD_3$, $CD_2CH_3$, $CD_2CD_3$, $CD(CH_3)_2$, $CD(CD_3)_2$, $CD_2CH(CH_3)_2$, $CD_2C(CH_3)_3$,

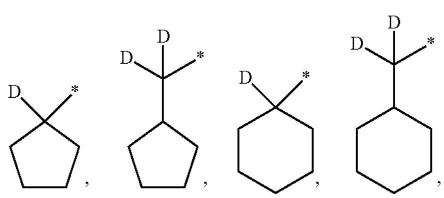

and combinations thereof.

According to an embodiment of the present disclosure, in Formula 1, Formula 1a to Formula 1d, and Formula 2, $Y_2$ and/or $Y_3$ are(is) selected from $CR_y$, and the $R_y$ has a structure of $-L-R_d$.

According to an embodiment of the present disclosure, in Formula 1, Formula 1a to Formula 1d, and Formula 2, $Y_2$ and/or $Y_3$ are(is) selected from $CR_y$, and the $R_y$ has a structure of $-L-R_d$; and $Y_1$ and/or $Y_4$ are(is) selected from $CR_y$, and the $R_y$ is deuterium.

According to an embodiment of the present disclosure, in Formula 1, Formula 1a to Formula 1d, and Formula 2, $Y_1$ to $Y_4$ are, at each occurrence identically or differently, selected from $CR_y$, and one or two of $R_y$ is (are) deuterium; another one or two of $R_y$ has (have) the structure of $-L-R_d$; the selection range of L and $R_d$ are as defined in the foregoing embodiment.

According to an embodiment of the present disclosure, in Formula 1, Formula 1a to Formula 1d, and Formula 2, $Y_1$ to $Y_4$ are, at each occurrence identically or differently, selected from $CR_y$, and one of $R_y$ is deuterium; another one of $R_y$ has the structure of $-L-R_d$; the selection range of L and $R_d$ are as defined in the foregoing embodiment.

According to an embodiment of the present disclosure, in Formula 1, Formula 1a to Formula 1d, and Formula 2, $Y_2$ and $Y_3$ are selected from $CR_y$, and one of $R_y$ has the structure of $-L-R_d$, the other $R_y$ is deuterium; for example, $Y_2$ is selected from $CR_y$, and the $R_y$ has the structure of $-L-R_d$, then $Y_3$ is selected from CD; for another example, $Y_3$ is selected from $CR_y$, and the $R_y$ has the structure of $-L-R_d$, then $Y_2$ is selected from CD; the selection range of L and $R_d$ are as defined in the foregoing embodiment.

According to an embodiment of the present disclosure, in Formula 1, Formula 1a to Formula 1d, and Formula 2, $Y_2$ and $Y_3$ are selected from $CR_y$, and one of $R_y$ has the structure of $-L-R_d$, the other $R_y$ is deuterium; $Y_1$ and $Y_4$ are selected from CH; for example, $Y_2$ is selected from $CR_y$, and the $R_y$ has the structure of $-L-R_d$, then $Y_3$ is selected from CD; for another example, $Y_3$ is selected from $CR_y$, and the $R_y$ has the structure of $-L-R_d$, then $Y_2$ is selected from CD; the selection range of L and $R_d$ are as defined in the foregoing embodiment.

According to an embodiment of the present disclosure, in Formula 1, Formula 1a to Formula 1d, and Formula 2, $Y_1$ to $Y_4$ are each independently selected from $CR_y$ or N, and the $R_y$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, a cyano group, a hydroxyl group, a sulfanyl group, and combinations thereof.

According to an embodiment of the present disclosure, in Formula 1, Formula 1a to Formula 1d, and Formula 2, at least one of $Y_1$ or $Y_2$ is selected from $CR_y$, and the $R_y$ is, at each occurrence identically or differently, selected from the group consisting of: hydrogen, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, a cyano group, a hydroxyl group, a sulfanyl group, and combinations thereof.

According to an embodiment of the present disclosure, in Formula 1, Formula 1a to Formula 1d, and Formula 2, $X_1$ to $X_8$ are, at each occurrence identically or differently, selected from $CR_x$ or N, and the $R_x$ is, at each occurrence identically or differently, selected from the group consisting of: hydrogen, deuterium, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof; and when the $R_x$ is selected from substituted alkyl having 1 to 20 carbon atoms or substituted cycloalkyl having 3 to 20 ring carbon atoms, the substituent in the alkyl and cycloalkyl is selected from the group consisting of: unsubstituted alkyl having 1 to 20 carbon atoms, unsubstituted cycloalkyl having 3 to 20 ring carbon atoms, unsubstituted heteroalkyl having 1 to 20 carbon atoms, an unsubstituted heterocyclic group having 3 to 20 ring atoms, unsubstituted arylalkyl having 7 to 30 carbon atoms, unsubstituted alkoxy having 1 to 20 carbon atoms, unsubstituted aryloxy having 6 to 30 carbon atoms, unsubstituted alkenyl having 2 to 20 carbon atoms, unsubstituted alkynyl having 2 to 20 carbon atoms, unsubstituted aryl having 6 to 30 carbon atoms, unsubstituted heteroaryl having 3 to 30 carbon atoms, unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof; and adjacent substituents $R_x$ are not joined to form a ring.

According to an embodiment of the present disclosure, the metal complex has the structure represented by Formula 2, and when both $Y_1$ and $Y_4$ are CH, $Y_2$ and $Y_3$ are each independently selected from $CR_y$, and the $R_y$ is each independently selected from the group consisting of: hydrogen, deuterium, halogen, substituted or unsubstituted alkyl having 1 to 20 carbon atoms, substituted or unsubstituted heteroalkyl having 1 to 20 carbon atoms, a substituted or unsubstituted heterocyclic group having 3 to 20 ring atoms, substituted or unsubstituted alkoxy having 1 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof; and the sum of the number of carbon atoms in the substituents $R_y$ in $Y_2$ and $Y_3$ is less than or equal to 1; or when at least one of $Y_1$ to $Y_4$ is not CH, $Y_2$ and $Y_3$ are each independently selected from $CR_y$, and the $R_y$ is each independently selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

According to an embodiment of the present disclosure, in Formula 2, $X_3$ and $X_4$ are each independently selected from $CR_x$, and the $R_x$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, a cyano group, and combinations thereof.

According to an embodiment of the present disclosure, in Formula 2, at least one of $X_3$ or $X_4$ is selected from $CR_x$, and the $R_x$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, a cyano group, and combinations thereof.

According to an embodiment of the present disclosure, in Formula 2, at least one or two of $R_1$ to $R_8$ is(are), at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

According to an embodiment of the present disclosure, in Formula 2, at least one or two of $R_1$ to $R_8$ is(are) selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, a cyano group, and combinations thereof.

According to an embodiment of the present disclosure, in Formula 2, one, two, three, or all of $R_2$, $R_3$, $R_6$, and $R_7$ is(are) selected from the group consisting of: deuterium, fluorine, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, and combinations thereof.

According to an embodiment of the present disclosure, in Formula 2, one, two, three, or all of $R_2$, $R_3$, $R_6$, and $R_7$ is(are) selected from the group consisting of: deuterium, substituted or unsubstituted alkyl having 1 to 20 carbon atoms, substituted or unsubstituted cycloalkyl having 3 to 20 ring carbon atoms, and combinations thereof.

According to an embodiment of the present disclosure, in Formula 2, one, two, three, or all of $R_2$, $R_3$, $R_6$, and $R_7$ is(are) selected from the group consisting of: deuterium, methyl, ethyl, propyl, isopropyl, n-butyl, isobutyl, t-butyl, cyclopentyl, cyclohexyl, and combinations thereof; optionally, hydrogen in the above groups can be partially or fully deuterated.

According to an embodiment of the present disclosure, in Formula 2, $R_2$ is selected from hydrogen, deuterium, or fluorine; at least one, two, or three of $R_3$, $R_6$, and $R_7$ is(are) selected from the group consisting of: deuterium, fluorine, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, and combinations thereof.

According to an embodiment of the present disclosure, in Formula 1, Formula 1a to Formula 1d, and Formula 2, $Y_1$ to $Y_4$ are, at each occurrence identically or differently, selected from $CR_y$ or N, and the $R_y$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

According to an embodiment of the present disclosure, the ligand $L_a$ is, at each occurrence identically or differently, any one selected from the group consisting of $L_{a1}$ to $L_{a1089}$ whose specific structures are referred to claim 20.

According to an embodiment of the present disclosure, the ligand $L_b$ is, at each occurrence identically or differently, any one selected from the group consisting of $L_{b1}$ to $L_{b87}$ whose specific structures are referred to claim 21.

According to an embodiment of the present disclosure, the ligand $L_c$ is, at each occurrence identically or differently, any one selected from the group consisting of $L_{c1}$ to $L_{c360}$ whose specific structures are referred to claim 21.

According to an embodiment of the present disclosure, the metal complex has a structure represented by any one of $Ir(L_a)_2(L_b)$, $Ir(L_a)(L_b)_2$, $Ir(L_a)(L_b)(L_c)$, or $Ir(L_a)_2(L_c)$; where when the metal complex has the structure of $Ir(L_a)_2(L_b)$, $L_a$ is, at each occurrence identically or differently, selected from any one or any two of the group consisting of $L_{a1}$ to $L_{a1089}$, and $L_b$ is selected from any one of the group consisting of $L_{b1}$ to $L_{b87}$; when the metal complex has the structure of $Ir(L_a)(L_b)_2$, $L_a$ is selected from any one of the group consisting of $L_{a1}$ to $L_{a1089}$, and $L_b$ is, at each occurrence identically or differently, selected from any one or any two of the group consisting of $L_{b1}$ to $L_{b87}$; when the metal complex has the structure of $Ir(L_a)(L_b)(L_c)$, $L_a$ is selected from any one of the group consisting of $L_{a1}$ to $L_{a1089}$, $L_b$ is selected from any one of the group consisting of $L_{b1}$ to $L_{b87}$, and $L_c$ is selected from any one of the group consisting of $L_{c1}$ to $L_{c360}$; when the metal complex has the structure of $Ir(L_a)_2(L_c)$, $L_a$ is, at each occurrence identically or differently, selected from any one or any two of the group consisting of $L_{a1}$ to $L_{a1089}$, and $L_c$ is selected from any one of the group consisting of $L_{c1}$ to $L_{c360}$.

According to an embodiment of the present disclosure, the metal complex is selected from the group consisting of metal complex 1 to metal complex 530, whose specific structures are referred to claim 22.

According to an embodiment of the present disclosure, further disclosed is an electroluminescent device, comprising:

an anode, a cathode, and an organic layer disposed between the anode and the cathode, where the organic layer comprises a metal complex which comprising a metal M and a ligand $L_a$ coordinated to the metal M, where $L_a$ has a structure represented by Formula 1:

Formula 1

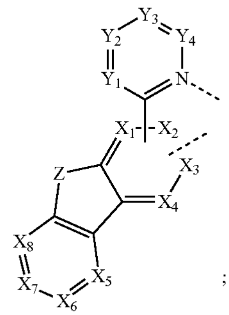

;

wherein, the metal M is selected from a metal with a relative atomic mass greater than 40;

Z is selected from the group consisting of O, S, Se, NR, CRR, and SiRR, where when two R are present, the two R are the same or different;

$X_1$ to $X_3$ are, at each occurrence identically or differently, selected from C, $CR_x$, or N;

$Y_1$ to $Y_4$ are, at each occurrence identically or differently, selected from $CR_y$ or N;

R, $R_x$, and $R_y$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

at least one of $X_1$ to $X_8$ is selected from $CR_x$, and the $R_x$ is cyano;

at least two of $Y_1$ to $Y_4$ are selected from $CR_y$, and wherein at least one of the $R_y$ is deuterium, and at least one of the $R_y$ has a structure of $-L-R_d$;

L is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms, or combinations thereof;

$R_d$ is, at each occurrence identically or differently, selected from substituted alkyl having 1 to 20 carbon atoms, substituted cycloalkyl having 3 to 20 ring carbon atoms, substituted heteroalkyl having 1 to 20 carbon atoms, substituted heterocyclic groups having 3 to 20 ring atoms, substituted arylalkyl having 7 to 30 carbon atoms, substituted alkoxy having 1 to 20 carbon atoms, substituted aryloxy having 6 to 30 carbon atoms, substituted alkenyl having 2 to carbon atoms, substituted aryl having 6 to 30 carbon atoms, substituted heteroaryl having 3 to 30 carbon atoms, substituted alkylsilyl having 3 to 20 carbon atoms, substituted arylsilyl having 6 to 20 carbon atoms, substituted amino having 0 to 20 carbon atoms, or combinations thereof; the substitution in the above-mentioned group of $R_d$ contains at least one deuterium atom; and adjacent substituents R, $R_x$, $R_y$, L, and $R_d$ can be optionally joined to form a ring.

According to an embodiment of the present disclosure, in the device, the organic layer is a light-emitting layer.

According to an embodiment of the present disclosure, in the device, the organic layer is a light-emitting layer, and the metal complex is a light-emitting material.

According to an embodiment of the present disclosure, the device emits green light.

According to an embodiment of the present disclosure, the device emits white light.

According to an embodiment of the present disclosure, in the device, the light-emitting layer further includes at least one host compound.

According to an embodiment of the present disclosure, in the device, the light-emitting layer further includes at least two host compounds.

According to an embodiment of the present disclosure, in the device, at least one of the host compounds comprises at least one chemical group selected from the group consisting of: benzene, pyridine, pyrimidine, triazine, carbazole, azacarbazole, indolocarbazole, dibenzothiophene, aza-dibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene, azaphenanthrene, and combinations thereof.

According to another embodiment of the present disclosure, further disclosed is a compound formulation which includes a metal complex whose specific structure is as shown in any one of the embodiments described above.

Combination with Other Materials

The materials described in the present disclosure for a particular layer in an organic light emitting device can be used in combination with various other materials present in the device. The combinations of these materials are described in more detail in U.S. Pat. App. No. 20160359122 at paragraphs 0132-0161, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light emitting device may be used in combination with a variety of other materials present in the device. For example, dopants disclosed herein may be used in combination with a wide variety of hosts, transport layers, blocking layers, injection layers, electrodes and other layers that may be present. The combination of these materials is described in detail in paragraphs 0080-0101 of U.S. Pat. App. No. 20150349273, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatograph-mass spectrometry produced by SHIMADZU, gas chromatograph-mass spectrometry produced by SHIMADZU, differential Scanning calorimeters produced by SHIMADZU, fluorescence spectrophotometer produced by SHANGHAI LENGGUANG TECH., electrochemical workstation produced by WUHAN CORRTEST, and sublimation apparatus produced by ANHUI BEQ, etc.) by methods well known to the persons skilled in the art. In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this patent.

Material Synthesis Example

The method for preparing a compound in the present disclosure is not limited herein. Typically, the following compounds are taken as examples without limitations, and synthesis routes and preparation methods thereof are described below.

Synthesis Example 1: Synthesis of Metal Complex 66

Step 1:

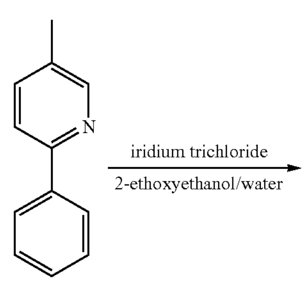

-continued

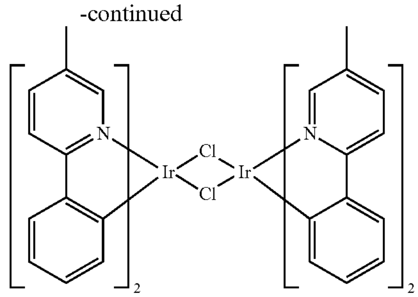

Intermediate 1

5-methyl-2-phenylpyridine (5.0 g, 29.6 mmol), iridium trichloride (2.6 g, 7.4 mmol), 2-ethoxyethanol (60 mL), and water (20 mL) were sequentially added into a dry 250 mL round-bottom flask, and heated to reflux and stirred for 24 h under nitrogen protection. The reaction product was cooled, filtered by means of suction under reduced pressure, and washed three times with methanol and n-hexane respectively to obtain Intermediate 1 as a yellow solid (3.9 g with a yield of 96.0%).

Step 2:

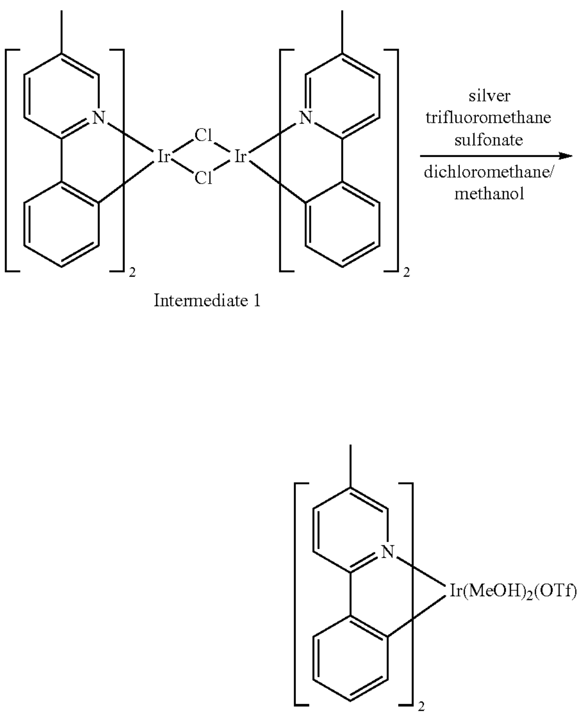

Intermediate 1

Iridium complex 1

Intermediate 1 (3.9 g, 3.5 mmol), anhydrous dichloromethane (250 mL), methanol (10 mL), and silver trifluoromethanesulfonate (1.9 g, 7.6 mmol) were sequentially added into a dry 500 mL round-bottom flask, purged with nitrogen three times, and stirred overnight at room temperature under nitrogen protection. The reaction product was filtered through Celite and washed twice with dichloromethane. The organic phase below was collected and concentrated under reduced pressure to obtain iridium complex 1 (5.0 g with a yield of 96.9%).

Step 3:

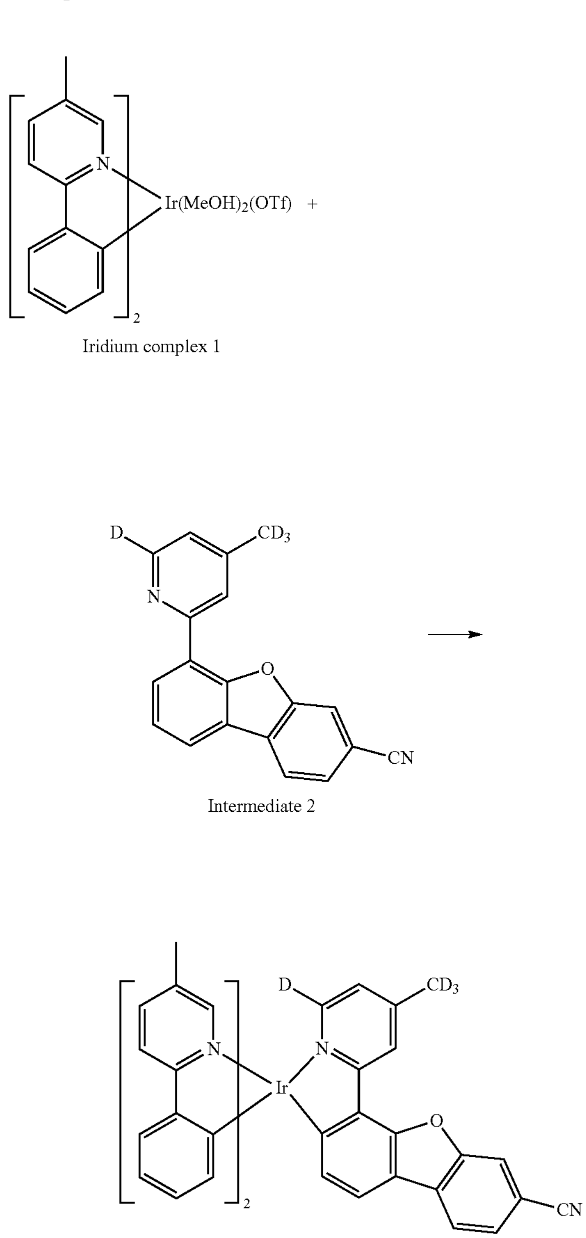

Iridium complex 1

Intermediate 2

Metal Complex 66

Intermediate 2 (0.8 g, 2.8 mmol), iridium complex 1 (1.7 g, 2.4 mmol), and 50 mL of ethanol were sequentially added into a dry 250 mL round-bottom flask and heated to reflux to react for 36 h under $N_2$ protection. The reaction was cooled, filtered through Celite, and washed twice with methanol and n-hexane respectively. Yellow solids on the Celite were dissolved with dichloromethane. The organic phases were collected, concentrated under reduced pressure, and purified by column chromatography to obtain metal complex 66 as a yellow solid (0.3 g with a yield of 15.8%). The product structure was confirmed as the target product with a molecular weight of 816.

Synthesis Example 2: Synthesis of Metal Complex 70

Step 1:

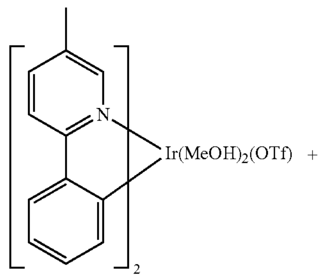

Iridium complex 1

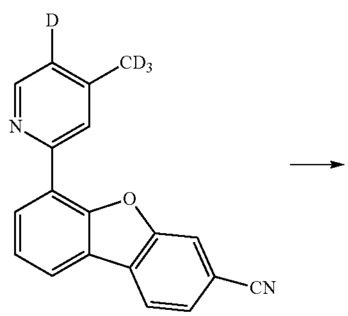

Intermediate 3

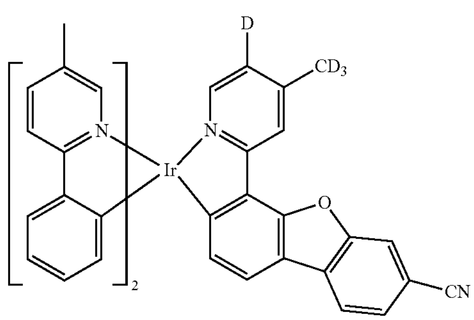

Metal Complex 70

Intermediate 3 (2.4 g, 8.4 mmol), iridium complex 1 (4.0 g, 5.4 mmol), and 100 mL of ethanol were sequentially added into a dry 250 mL round-bottom flask and heated to reflux to react for 36 h under $N_2$ protection. The reaction was cooled, filtered through Celite, and washed twice with methanol and n-hexane respectively. Yellow solids on the Celite were dissolved with dichloromethane. The organic phases were collected, concentrated under reduced pressure, and purified by column chromatography to obtain metal complex 70 as a yellow solid (1.7 g with a yield of 38.6%). The product structure was confirmed as the target product with a molecular weight of 816.

Synthesis Example 3: Synthesis of Metal Complex 518

Step 1:

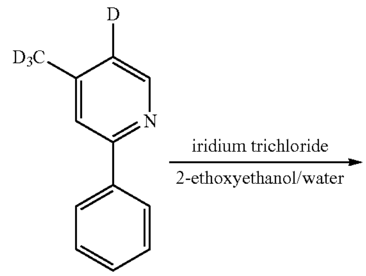

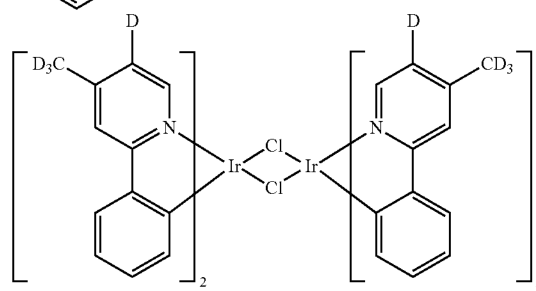

Intermediate 4

4-(methyl-$d_3$)-2-phenylpyridine (5.0 g, 28.9 mmol), iridium trichloride (2.6 g, 7.4 mmol), 2-ethoxyethanol (60 mL), and water (20 mL) were sequentially added into a dry 250 mL round-bottom flask, and heated to reflux and stirred for 24 h under nitrogen protection. The reaction product was cooled, filtered by means of suction under reduced pressure, and washed three times with methanol and n-hexane respectively to obtain Intermediate 4 as a yellow solid (4.0 g with a yield of 94.8%).

Step 2:

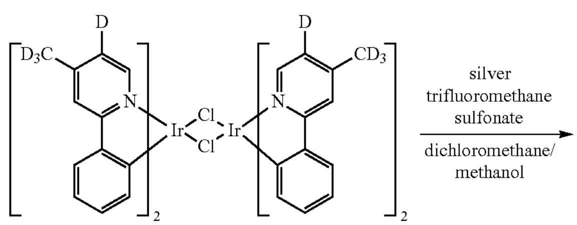

Intermediate 4

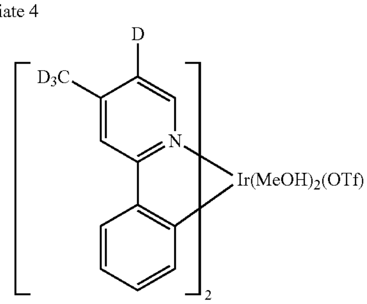

Iridium complex 2

Intermediate 4 (4.0 g, 3.5 mmol), anhydrous dichloromethane (250 mL), methanol (10 mL), and silver trifluoromethanesulfonate (1.9 g, 7.6 mmol) were sequentially added into a dry 500 mL round-bottom flask, purged with nitrogen three times, and stirred overnight at room temperature under nitrogen protection. The reaction product was filtered through Celite and washed twice with dichloromethane. The organic phase below was collected and concentrated under reduced pressure to obtain iridium complex 2 (5.1 g with a yield of 97.4%).

Step 3:

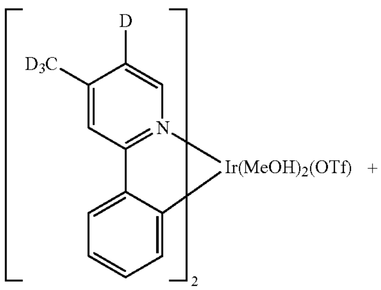

Iridium complex 2

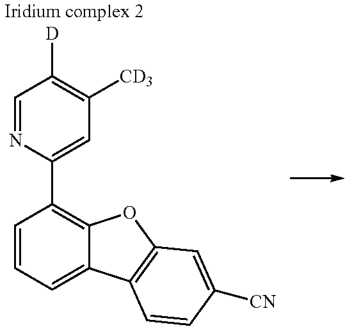

Intermediate 3

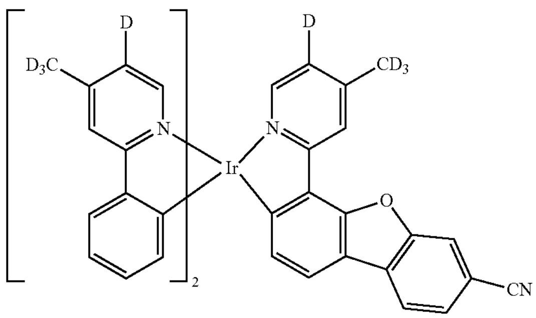

Metal Complex 518

Intermediate 3 (1.5 g, 5.2 mmol), iridium complex 2 (2.7 g, 3.6 mmol), and 50 mL of N,N-dimethylformamide, 50 mL of 2-ethoxyethanol were sequentially added into a dry 250 mL round-bottom flask and heated to reflux to react for 72 h under $N_2$ protection. The reaction was cooled, filtered through Celite, and washed twice with methanol and n-hexane respectively. Yellow solids on the Celite were dissolved with dichloromethane. The organic phases were collected, concentrated under reduced pressure, and purified by column chromatography to obtain metal complex 518 as a yellow solid (1.4 g with a yield of 49.3%). The product structure was confirmed as the target product with a molecular weight of 824.

Synthesis Example 4: Synthesis of Metal Complex 423

Step 1:

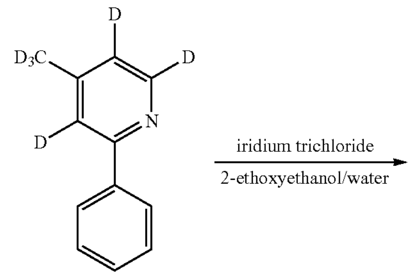

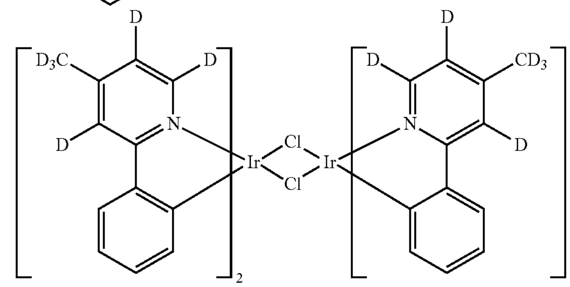

Intermediate 5

4-(methyl-$d_3$)-2-phenylpyridine-3,5,6-$d_3$ (8.4 g, 47.9 mmol), iridium trichloride (5.6 g, 15.9 mmol), 2-ethoxyethanol (150 mL), and water (500 mL) were sequentially added into a dry 500 mL round-bottom flask, and heated to reflux and stirred for 24 h under nitrogen protection. The reaction product was cooled, filtered by means of suction under reduced pressure, and washed three times with methanol and n-hexane respectively to obtain Intermediate 5 as a yellow solid (8.8 g with a yield of 96.7%).

Step 2:

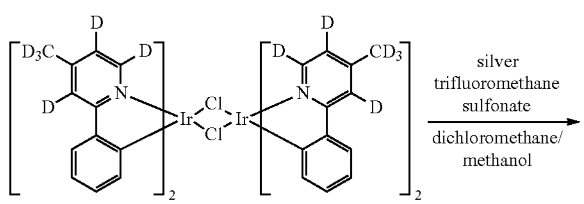

Intermediate 5

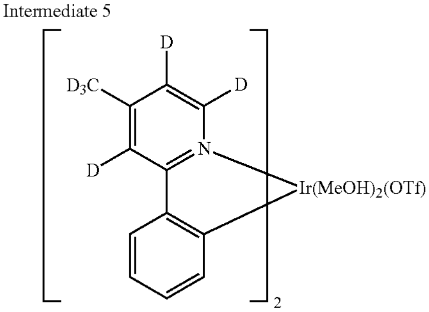

Iridium complex 3

Intermediate 5 (8.8 g, 7.6 mmol), anhydrous dichloromethane (250 mL), methanol (10 mL), and silver trifluoromethanesulfonate (4.3 g, 16.7 mmol) were sequentially added into a dry 500 mL round-bottom flask, purged with nitrogen three times, and stirred overnight at room temperature under nitrogen protection. The reaction product was filtered through Celite and washed twice with dichloromethane. The organic phase below was collected and concentrated under reduced pressure to obtain iridium complex 3 (11.2 g with a yield of 98.2%).

Step 3:

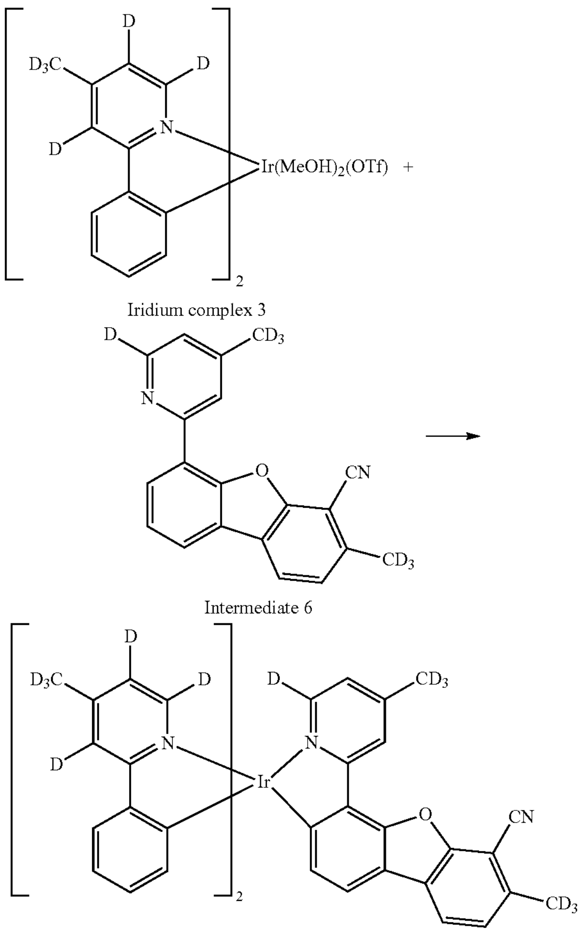

Iridium complex 3

Intermediate 6

Metal Complex 423

Intermediate 6 (1.8 g, 5.9 mmol), iridium complex 2 (3.2 g, 4.2 mmol), and 30 mL of N,N-dimethylformamide, 30 mL of 2-ethoxyethanol were sequentially added into a dry 250 mL round-bottom flask and heated to 90° C. to react for 120 h under $N_2$ protection. The reaction was cooled, filtered through Celite, and washed twice with methanol and n-hexane respectively. Yellow solids on the Celite were dissolved with dichloromethane. The organic phases were collected, concentrated under reduced pressure, and purified by column chromatography to obtain metal complex 423 as a yellow solid (0.99 g with a yield of 27.9%). The product structure was confirmed as the target product with a molecular weight of 845.

Those skilled in the art will appreciate that the above preparation method is merely illustrative example. Those skilled in the art can obtain other compound structures of the present disclosure through the modification of the preparation method.

Device Example 1

First, a glass substrate having an Indium Tin Oxide (ITO) anode with a thickness of 80 nm was cleaned, and then treated with oxygen plasma and UV ozone. After the treatment, the substrate was dried in a glovebox to remove water. The substrate was mounted on a substrate support and placed in a vacuum chamber. Organic layers specified below were sequentially deposited through vacuum thermal evaporation on the ITO anode at a rate of 0.2 to 2 Angstroms per second at a vacuum degree of about $10^{-8}$ torr. Compound HI was used as a hole injection layer (HIL). Compound HT was used as a hole transporting layer (HTL). Compound H1 was used as an electron blocking layer (EBL). The metal complex 66 of the present disclosure was doped in Compound H1 and Compound H2, and the resulting mixture was co-deposited for use as an emissive layer (EML). On the EML, Compound ET and 8-hydroxyquinolinolato-lithium (Liq) were co-deposited for use as an electron transporting layer (ETL). Finally, 8-hydroxyquinolinolato-lithium (Liq) with a thickness of 1 nm was deposited for use as an electron injection layer, and A1 with a thickness of 120 nm was deposited for use as a cathode. The device was transferred back to the glovebox and encapsulated with a glass lid and a moisture getter to complete the device.

Device Example 2

The implementation mode in Device Example 2 was the same as that in Device Example 1, except that the metal complex 66 of the present disclosure in the emissive layer (EML) was replaced with the metal complex 70 of the present disclosure.

Device Comparative Example 1

The implementation mode in Device Comparative Example 1 was the same as that in Device Example 1, except that the metal complex 66 of the present disclosure in the emissive layer (EML) was replaced with a compound GD1.

Device Comparative Example 2

The implementation mode in Device Comparative Example 2 was the same as that in Device Example 1, except that the metal complex 66 of the present disclosure in the emissive layer (EML) was replaced with a compound GD2.

Device Comparative Example 3

The implementation mode in Device Comparative Example 3 was the same as that in Device Example 1, except that the metal complex 66 of the present disclosure in the emissive layer (EML) was replaced with a compound GD3.

Device Comparative Example 4

The implementation mode in Device Comparative Example 4 was the same as that in Device Example 1, except that the metal complex 66 of the present disclosure in the emissive layer (EML) was replaced with a compound GD4.

Device Comparative Example 5

The implementation mode in Device Comparative Example 5 was the same as that in Device Example 1, except that the metal complex 66 of the present disclosure in the emissive layer (EML) was replaced with a compound GD5.

Detailed structures and thicknesses of layers of the device are shown in the following table. A layer using more than one material is obtained by doping different compounds in their weight ratio as described.

TABLE 1

| Device structures in device examples | | | | | |
|---|---|---|---|---|---|
| Device ID | HIL | HTL | EBL | EML | ETL |
| Example 1 | Compound HI (100 Å) | Compound HT (350 Å) | Compound H1 (50 Å) | Compound H1: compound H2: metal complex 66 (46:46:8) (400 Å) | Compound ET: Liq (40:60) (350 Å) |
| Example 2 | Compound HI (100 Å) | Compound HT (350 Å) | Compound H1 (50 Å) | Compound H1: compound H2: metal complex 70 (46:46:8) (400 Å) | Compound ET: Liq (40:60) (350 Å) |
| Comparative Example 1 | Compound HI (100 Å) | Compound HT (350 Å) | Compound H1 (50 Å) | Compound H1: compound H2: compound GD1 (46:46:8) (400 Å) | Compound ET: Liq (40:60) (350 Å) |
| Comparative Example 2 | Compound HI (100 Å) | Compound HT (350 Å) | Compound H1 (50 Å) | Compound H1: compound H2: compound GD2 (46:46:8) (400 Å) | Compound ET: Liq (40:60) (350 Å) |
| Comparative Example 3 | Compound HI (100 Å) | Compound HT (350 Å) | Compound H1 (50 Å) | Compound H1: compound H2: compound GD3 (46:46:8) (400 Å) | Compound ET: Liq (40:60) (350 Å) |
| Comparative Example 4 | Compound HI (100 Å) | Compound HT (350 Å) | Compound H1 (50 Å) | Compound H1: compound H2: compound GD4 (46:46:8) (400 Å) | Compound ET: Liq (40:60) (350 Å) |
| Comparative Example 5 | Compound HI (100 Å) | Compound HT (350 Å) | Compound H1 (50 Å) | Compound H1: compound H2: compound GD5 (46:46:8) (400 Å) | Compound ET: Liq (40:60) (350 Å) |

Structures of the materials used in the devices are shown as follows:

Compound HI

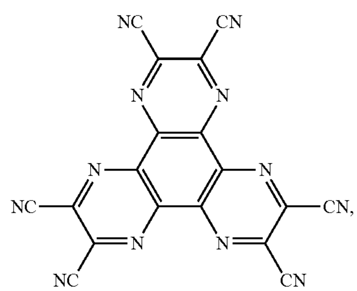

Compound HT

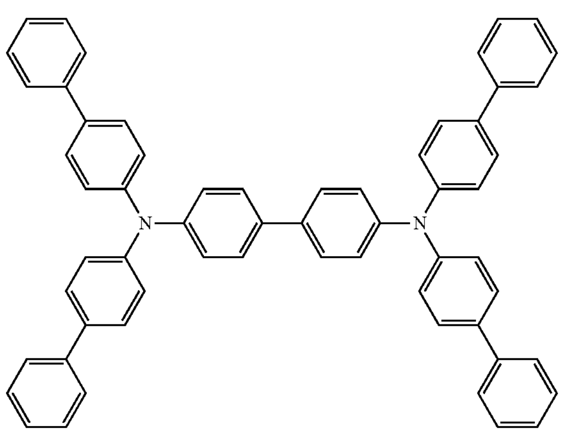

-continued

Compound H1

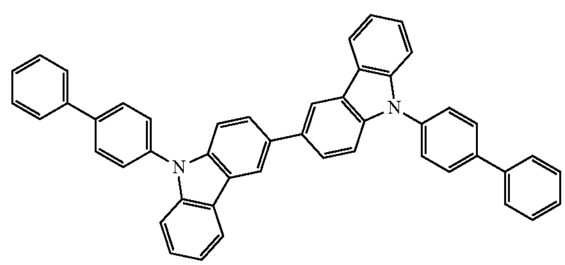

Compound H2

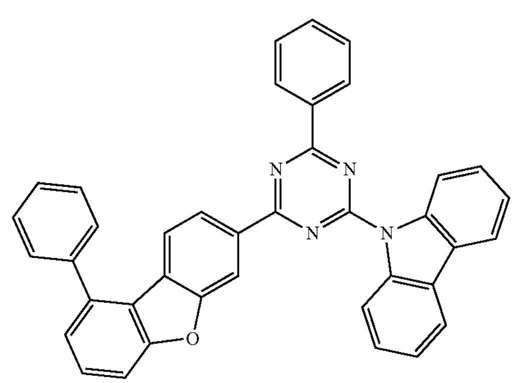

-continued

Metal complex 66

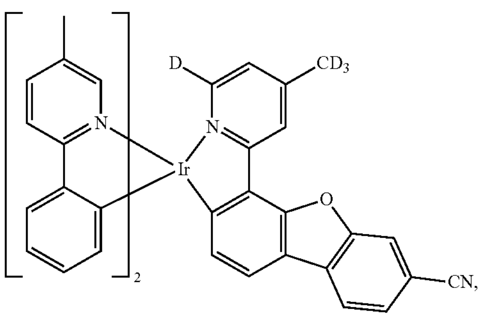

Metal complex 70

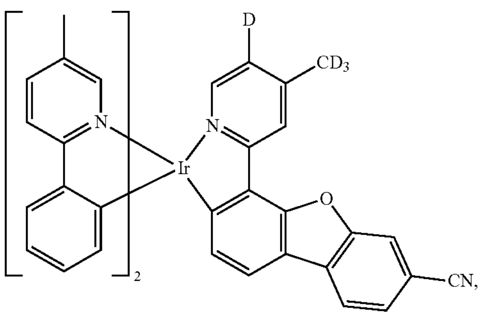

GD1

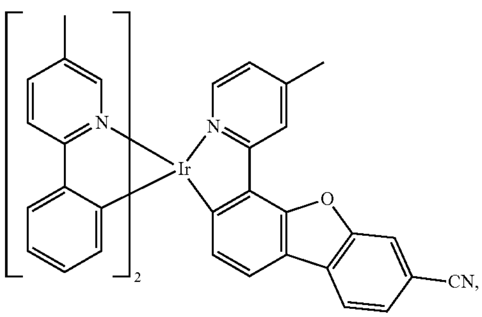

GD2

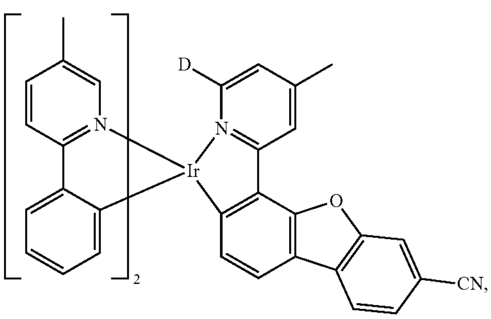

GD3

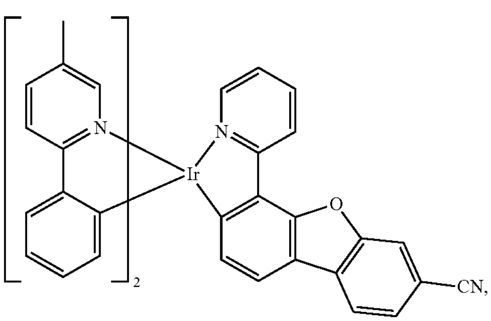

-continued

GD4

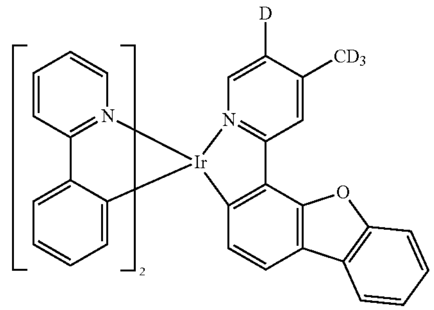

GD5

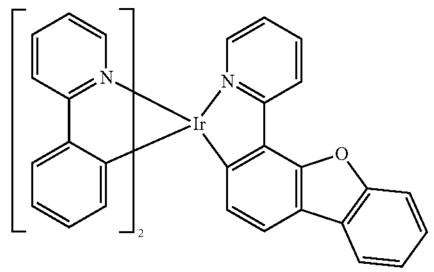

Compound ET

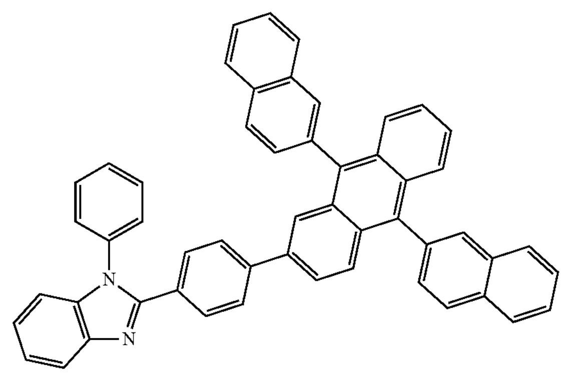

Liq

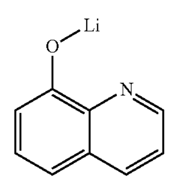

Current-voltage-luminance (IVL) characteristics of the devices were measured. Under 1000 cd/m$^2$, CIE data, maximum emission wavelength ($\lambda_{max}$), full width at half maximum (FWHM), voltage (V), current efficiency (CE), power efficiency (PE), and external quantum efficiency (EQE) of the devices were measured. The data was recorded and shown in Table 2.

TABLE 2

| Device data | | | | | | | |
|---|---|---|---|---|---|---|---|
| Device ID | CIE (x, y) | $\lambda_{max}$ (nm) | FWHM (nm) | Voltage (V) | CE (cd/A) | PE (lm/W) | EQE (%) |
| Example 1 | (0.319, 0.647) | 526 | 37.5 | 2.74 | 93 | 106 | 23.85 |
| Example 2 | (0.320, 0.646) | 525 | 38.4 | 2.74 | 98 | 113 | 25.34 |
| Comparative Example 1 | (0.322, 0.645) | 526 | 39.3 | 2.75 | 93 | 106 | 23.99 |
| Comparative Example 2 | (0.320, 0.646) | 526 | 38.1 | 2.75 | 92 | 105 | 23.72 |
| Comparative Example 3 | (0.342, 0.634) | 530 | 43.6 | 2.70 | 96 | 112 | 24.49 |
| Comparative Example 4 | (0.324, 0.633) | 521 | 62.1 | 3.28 | 73 | 70 | 19.70 |
| Comparative Example 5 | (0.343, 0.627) | 528 | 60.4 | 3.52 | 68 | 61 | 17.98 |

Discussion

From the data shown in Table 2, device efficiency of Device Example 1 is basically equivalent to that of Device Comparative Examples 1 and 2, and the half-peak width of Device Example 1 is narrowed by 1.8 nm compared with that of Device Comparative Example 1, which is very rare. Moreover, it is more rare to further narrow the half-peak width to 37.5 nm based on 38.1 nm of Device Comparative Example 2 which is a very narrow level in the industry. This indicates that the metal complex disclosed by the present disclosure can bring the excellent effect of narrowing the half-peak width of light emitted by the device through the introduction of both deuterium substitution and deuterated alkyl substitution into the ligand structure. In addition, compared with Device Comparative Example 3, the device efficiency of Device Example 1 is slightly lower, but it is still at a relatively high level in the industry like that of Device Comparative Example 3. More importantly, the half-peak width of Device Example 1 is greatly narrowed by as much as 6.1 nm compared with that of Device Comparative Example 3, which is rare. In addition, the maximum emission wavelength of Device Example 1 is blue-shifted from 530 nm in Device Comparative Example 3 to 526 nm, effectively regulating the color of the light emitted by the device. This indicates that the metal complex disclosed by the present disclosure can not only bring the excellent effect of narrowing the half-peak width of the light emitted by the device but also effectively regulate the color of the light emitted by the device through the introduction of both deuterium substitution and deuterated alkyl substitution into the ligand structure.

On the other hand, it can be seen from the comparison between Device Example 2 and Device Comparative Example 1 that the peak width of Device Example 2 is further narrowed to 38.4 nm based on the relatively narrow peak width in the industry of Comparative Example 1, and it is more rare that the efficiency of Device Example 2 is further improved significantly based on the relatively high level in the industry of Device Comparative Example 1, where the EQE reaches 25.34% which is at a very high level in the industry. Compared with Device Comparative Example 3, Device Example 2 not only improves the device efficiency to a certain degree (the EQE is increased from 24.49% to 25.34%), but also significantly narrows the half-peak width by as much as 5.2 nm which is very rare. It proves again that the metal complex disclosed by the present disclosure can bring the excellent effect of narrowing the half-peak width of the light emitted by the device through the introduction of both deuterium substitution and deuterated alkyl substitution into the ligand structure.

Compared with Comparative Examples 4 and 5 in which light-emitting dopants in the related art are used in the emissive layer, Examples 1 and 2 both have much narrower half-peak widths (which are narrowed by more than 20 nm compared with those of Comparative Examples 4 and 5), lower operating voltage (0.54 V lower than that of Comparative Example 4 and 0.78 V lower than that of Comparative Example 5), and higher efficiency (the EQE is increased by more than 20% compared with that of Comparative Example 4 and increased by more than 30% compared with that of Comparative Example 5), indicating that the metal complex disclosed by the present disclosure brings the excellent effect of greatly improving related device performance through the design of the ligand structure. More surprisingly, the compound GD4 used in Device Comparative Example 4 has one deuterium atom and a deuterated methyl group added compared with the compound GD5 in Device Comparative Example 5, and the half-peak width of Device Comparative Example 4 is increased by 1.7 nm compared with that of Device Comparative Example 5. However, in the present disclosure, the metal complex 70 used in Device Example 2 has one deuterium atom and a deuterated methyl group added compared with the GD3 in Device Comparative Example 3, but the half-peak width of the device is significantly narrowed by as much as 5.2 nm, which proves that the structural design of the disclosed metal complex in which deuterium substitution and deuterated alkyl substitution are introduced into a pyridine ring and cyano substitution is introduced into a dibenzofuran ring in a ligand with a structure of a pyridine-dibenzofuran structure has unexpectedly excellent effects and can greatly increase the color saturation level of the light emitted by the device.

Device Example 3

First, a glass substrate having an Indium Tin Oxide (ITO) anode with a thickness of 80 nm was cleaned, and then treated with oxygen plasma and UV ozone. After the treatment, the substrate was dried in a glovebox to remove water. The substrate was mounted on a substrate support and placed in a vacuum chamber. Organic layers specified below were sequentially deposited through vacuum thermal evaporation on the ITO anode at a rate of 0.2 to 2 Angstroms per second at a vacuum degree of about $10^{-8}$ torr. Compound HI was used as a hole injection layer (HIL). Compound HT was used as a hole transporting layer (HTL). Compound H1 was used as an electron blocking layer (EBL). The metal complex 518 of the present disclosure was doped in Compound H1 and Compound H2, and the resulting mixture was co-deposited for use as an emissive layer (EML). Compound H3 was used as an hole blocking layer (HBL). On the HBL, Compound ET and 8-hydroxyquinolinolato-lithium (Liq) were co-deposited for use as an electron transporting layer (ETL). Finally, 8-hydroxyquinolinolato-lithium (Liq) with a thickness of 1 nm was deposited for use as an electron injection layer, and A1 with a thickness of 120 nm was deposited for use as a cathode. The device was transferred back to the glovebox and encapsulated with a glass lid and a moisture getter to complete the device.

Detailed structures and thicknesses of layers of the device are shown in the following table 3. A layer using more than one material is obtained by doping different compounds in their weight ratio as described.

TABLE 3

| Device structures in device examples | | | | | | |
|---|---|---|---|---|---|---|
| Device ID | HIL | HTL | EBL | EML | HBL | ETL |
| Example 3 | Compound HI (100 Å) | Compound HT (350 Å) | Compound H1 (50 Å) | Compound H1: compound H2: metal complex 518 (47:47:6) (400 Å) | Compound H3 (50 Å) | Compound ET: Liq (40:60) (350 Å) |

Structures of the new materials used in the devices are shown as follows:

Metal Complex 518

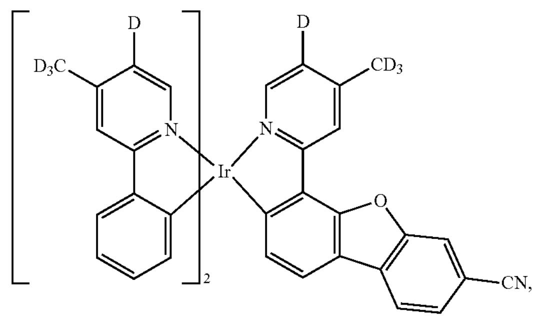

Compound H3

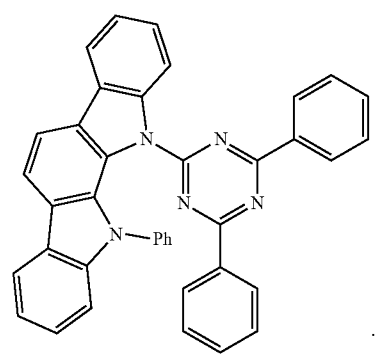

Current-voltage-luminance (IVL) characteristics of the devices were measured. Under 1000 cd/m$^2$, CIE data, maximum emission wavelength ($\lambda_{max}$ax), full width at half maximum (FWHM), voltage (V), current efficiency (CE), power efficiency (PE), and external quantum efficiency (EQE) of the devices were measured. The device lifetime (LT97) data of Example 3 is measured at a constant current of 80 mA/cm$^2$. The data was recorded and shown in Table 4.

TABLE 4

| Device data | | | | | | | | |
|---|---|---|---|---|---|---|---|---|
| Device ID | CIE (x, y) | $\lambda_{max}$ (nm) | FWHM (nm) | Voltage (V) | CE (cd/A) | PE (lm/W) | EQE (%) | LT97 (h) |
| Example 3 | (0.326, 0.642) | 526 | 38.6 | 2.86 | 99 | 109 | 25.63 | 48.0 |

From the data shown in Table 4, it can be seen that similar to Device Example 1 and Device Example 2, Device Example 3 also has a very narrow half-value width (38.6 nm), and a voltage of 2.86 V which is also at a very low level. At the same time, it is more surprising that the EQE of Device Example 3 is also very high, reaching 25.63%. In addition, the lifetime of Device Example 3 (LT97) has reached a very long device lifetime of 48 h. It proves once again the structural design of the present invention that introduction both deuterium substitution and deuterated alkyl substitution on the pyridine ring and cyano substitution on the dibenzofuran ring of the pyridine-dibenzofuran ligand in disclosed metal complex has superior effects.

In summary, the structural design of the metal complex disclosed by the present disclosure, introduction of specific $R_x$ and $R_y$ substituents at specific positions of the ligand structure, can bring the excellent effects of significantly improving the device efficiency, effectively narrowing the half-peak width, and greatly improving the color saturation of the light emitted by the device, which fully proves that the metal complex disclosed by the present disclosure has excellent application prospects.

It should be understood that various embodiments described herein are merely examples and not intended to limit the scope of the present disclosure. Therefore, it is apparent to those skilled in the art that the present disclosure as claimed may include variations from specific embodiments and preferred embodiments described herein. Many of materials and structures described herein may be substituted with other materials and structures without departing from the spirit of the present disclosure. It should be understood that various theories as to why the present disclosure works are not intended to be limitative.

What is claimed is:

1. A metal complex, having a general formula of $M(L_a)_m(L_b)_n(L_c)_q$, wherein M is, at each occurrence identically or differently, selected from the group consisting of Cu, Ag, Au, Ru, Rh, Pd, Os, Ir, and Pt;

m is 1, 2, or 3, n is 0, 1, or 2, q is 0, 1, or 2, and m+n+q equals the oxidation state of the metal M; wherein when m is greater than or equal to 2, the multiple $L_a$ are the same or different; when n is equal to 2, the two $L_b$ are the same or different; when q is equal to 2, the two $L_c$ are the same or different;

$L_a$, $L_b$, and $L_c$ are a first ligand, a second ligand, and a third ligand coordinated to the metal M, respectively; $L_a$, $L_b$, and $L_c$ can be optionally joined to form a multidentate ligand;

$L_a$ has a structure represented by Formula 1:

Formula 1

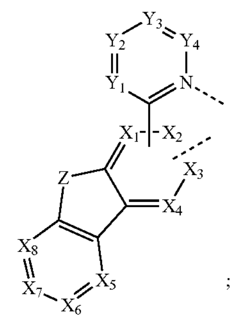

;

wherein,

Z is selected from the group consisting of O, S, Se, NR, CRR, and SiRR, wherein when two R are present, the two R are the same or different;

$X_1$ to $X_8$ are, at each occurrence identically or differently, selected from C, $CR_x$, or N;

$Y_1$ to $Y_4$ are, at each occurrence identically or differently, selected from $CR_y$ or N;

at least one of $X_1$ to $X_8$ is selected from $CR_x$, and the $R_x$ is cyano;

at least two of $Y_1$ to $Y_4$ are selected from $CR_y$, and wherein at least one of the $R_y$ is deuterium, and at least one of the $R_y$ has a structure of $-L-R_d$;

L is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms, or combinations thereof;

$R_d$ is, at each occurrence identically or differently, selected from substituted alkyl having 1 to 20 carbon atoms, substituted cycloalkyl having 3 to 20 ring carbon atoms, substituted heteroalkyl having 1 to 20 carbon atoms, a substituted heterocyclic group having 3 to 20 ring atoms, substituted arylalkyl having 7 to 30 carbon atoms, substituted alkoxy having 1 to 20 carbon atoms, substituted aryloxy having 6 to 30 carbon atoms, substituted alkenyl having 2 to 20 carbon atoms, substituted aryl having 6 to 30 carbon atoms, substituted heteroaryl having 3 to 30 carbon atoms, substituted alkylsilyl having 3 to 20 carbon atoms, substituted arylsilyl having 6 to 20 carbon atoms, substituted amino having 0 to 20 carbon atoms, or combinations thereof; the substitution in the above-mentioned group of $R_d$ contains at least one deuterium atom;

R, $R_x$, and $R_y$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof, and adjacent substituents R, $R_x$, $R_y$, L, and $R_d$ can be optionally joined to form a ring; and $L_b$ and $L_c$ are, at each occurrence identically or differently, selected from the group consisting of:

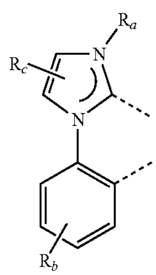
,
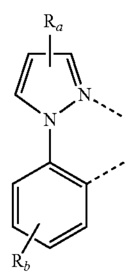
,
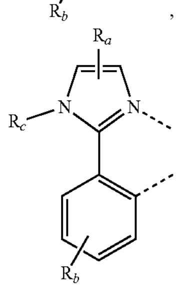
,
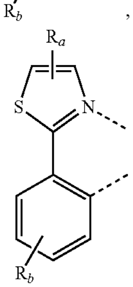
,
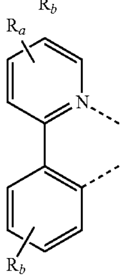
,
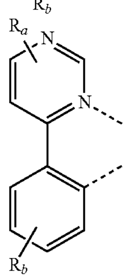
,
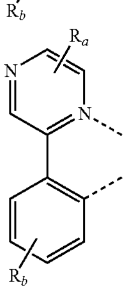
,
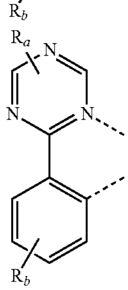
, -continued

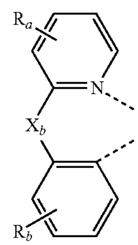
,
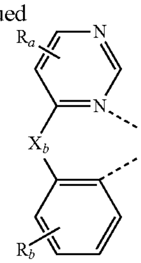
,
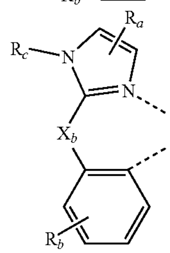
, and
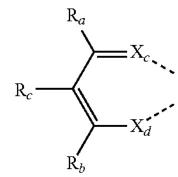
;

wherein, $R_a$, $R_b$, and $R_c$ are, at each occurrence identically or differently, represent mono-substitution, multi-substitution, or non-substitution;

$X_b$ is, at each occurrence identically or differently, selected from the group consisting of: O, S, Se, $NR_{N1}$, and $CR_{C1}R_{C2}$;

$X_c$ and $X_d$ are, at each occurrence identically or differently, selected from the group consisting of: O, S, Se, and $NR_{N2}$;

$R_a$, $R_b$, $R_c$, $R_{N1}$, $R_{N2}$, $R_{C1}$, and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof; and in structures of $L_b$ and $L_c$, adjacent substituents $R_a$, $R_b$, $R_c$, $R_{N1}$, $R_{N2}$, $R_{C1}$, and $R_{C2}$ can be optionally joined to form a ring.

2. The metal complex of claim 1, wherein the ligand $L_a$ is, at each occurrence identically or differently, any one selected from the group consisting of:

-continued
$L_{a1}$
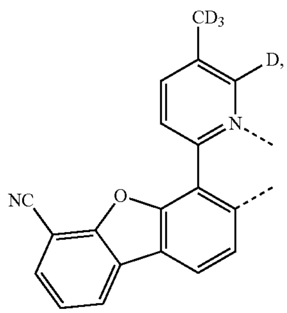
$L_{a2}$
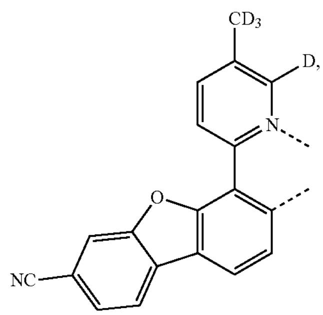
$L_{a3}$
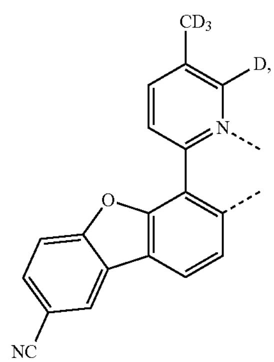
$L_{a4}$
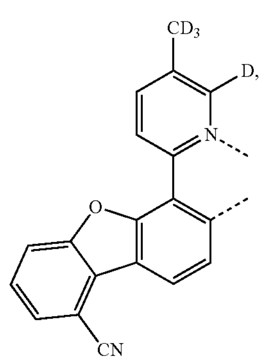
$L_{a5}$
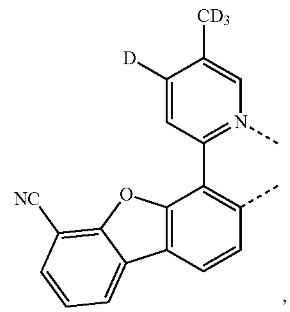
$L_{a6}$
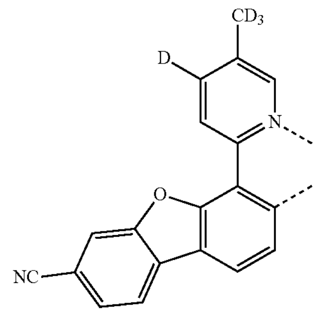
$L_{a7}$
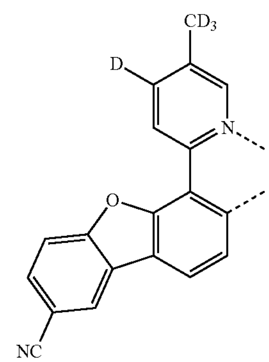
$L_{a8}$
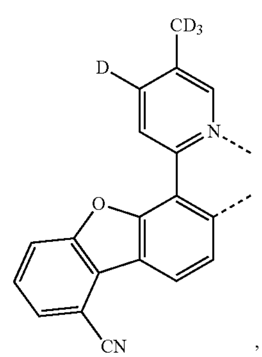
$L_{a9}$
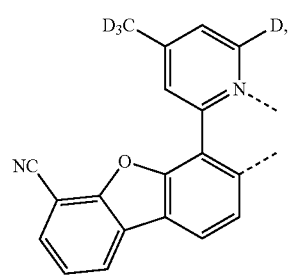

-continued
$L_{a10}$
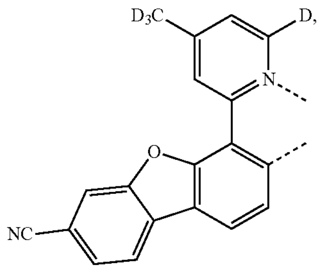
$L_{a11}$
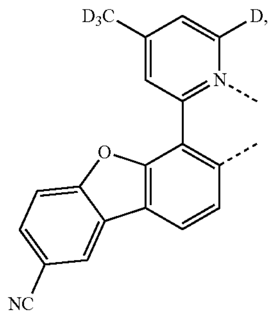
$L_{a12}$
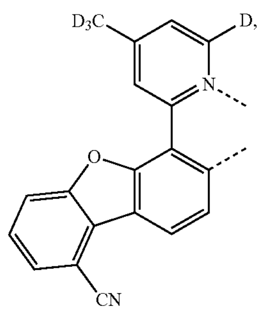
$L_{a13}$
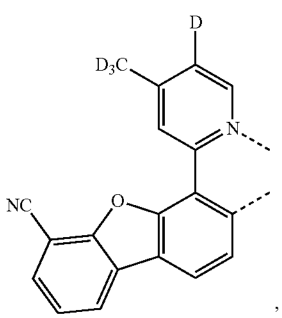
$L_{a14}$
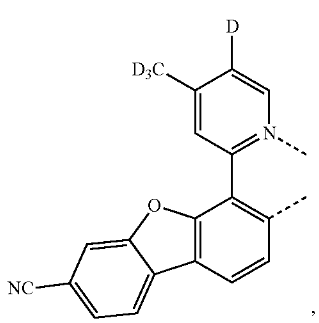
-continued
$L_{a15}$
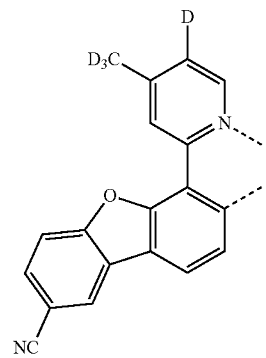
$L_{a16}$
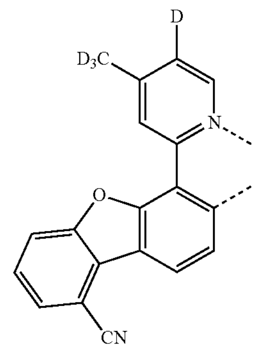
$L_{a17}$
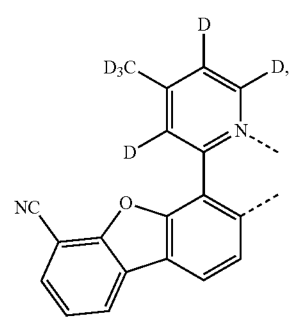
$L_{a18}$
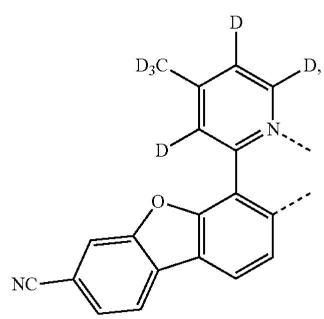

L$_{a19}$
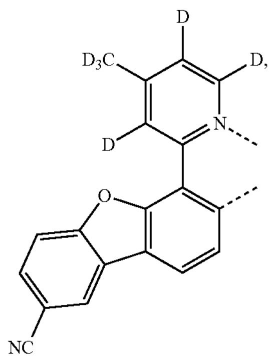
L$_{a20}$
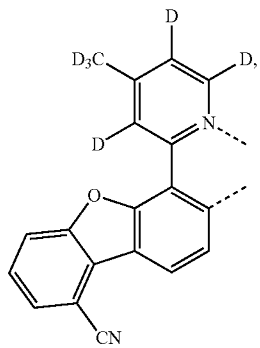
L$_{a21}$
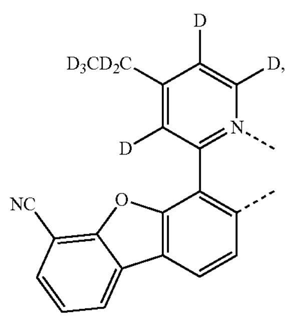
L$_{a22}$
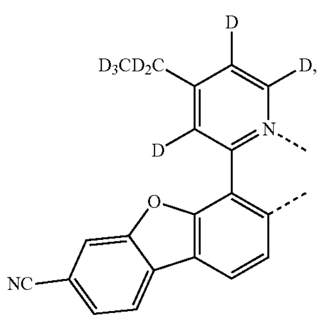
L$_{a23}$
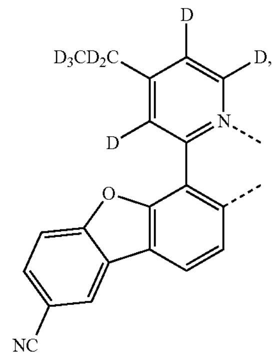
L$_{a24}$
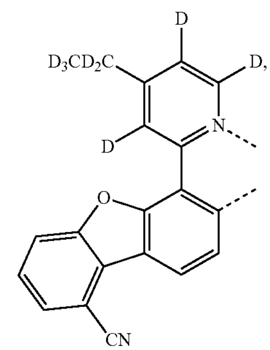
L$_{a25}$
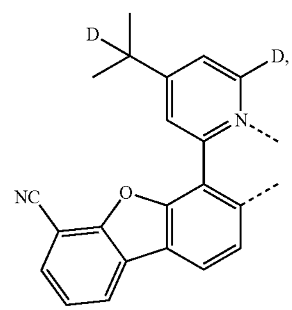
L$_{a26}$
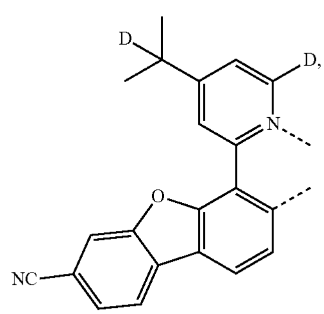

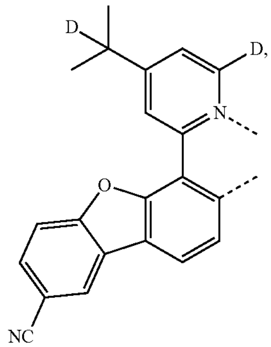
$L_{a27}$
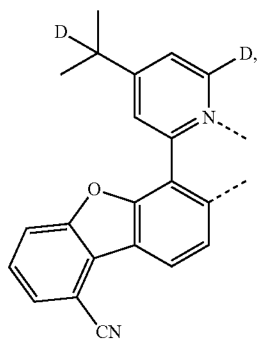
$L_{a28}$
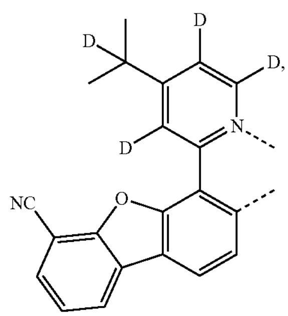
$L_{a29}$
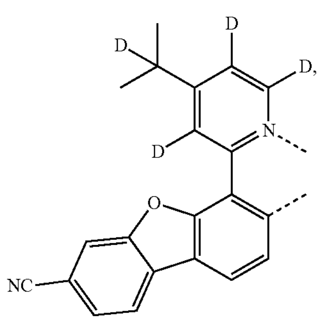
$L_{a30}$
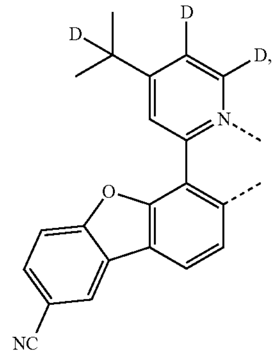
$L_{a31}$
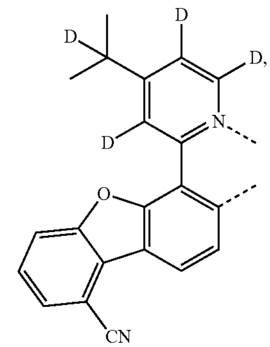
$L_{a32}$
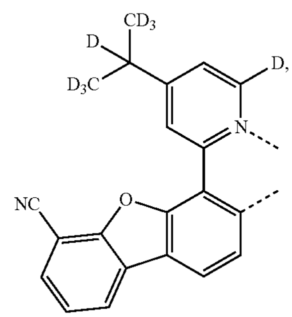
$L_{a33}$
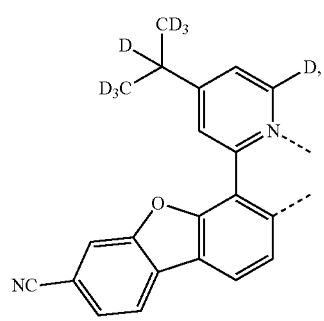
$L_{a34}$ $L_{a35}$
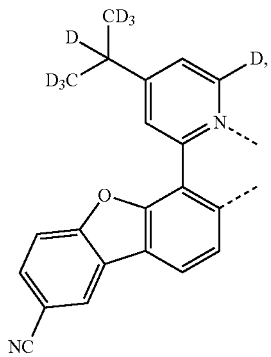
$L_{a36}$
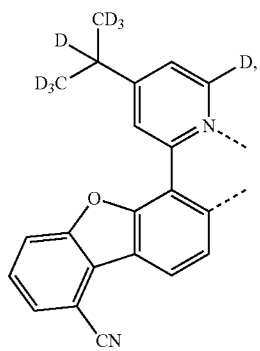
$L_{a37}$
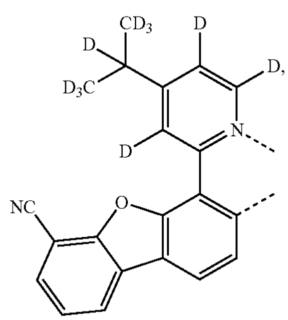
$L_{a38}$
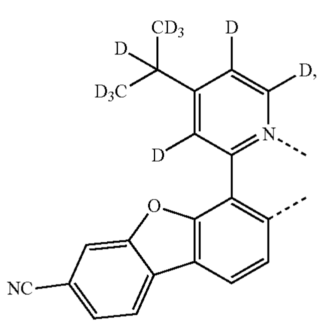
$L_{a39}$
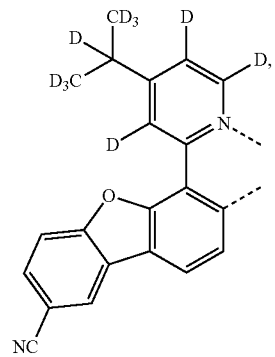
$L_{a40}$
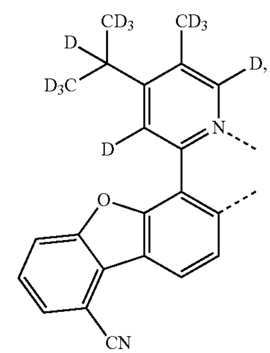
$L_{a41}$
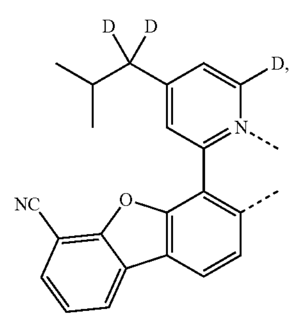
$L_{a42}$
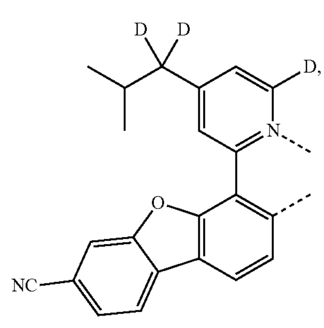

-continued
$L_{a43}$
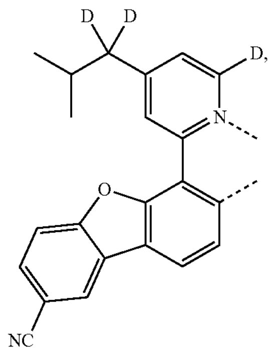
$L_{a44}$
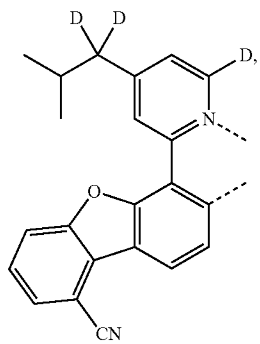
$L_{a45}$
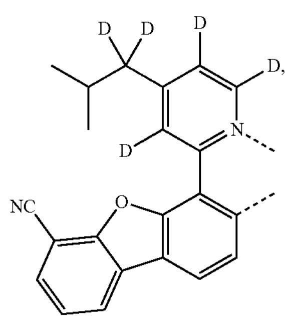
$L_{a46}$
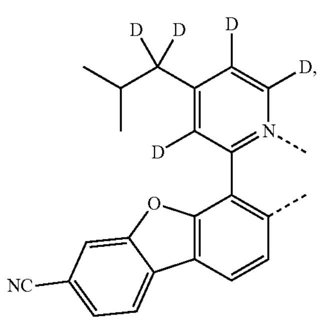
-continued
$L_{a47}$
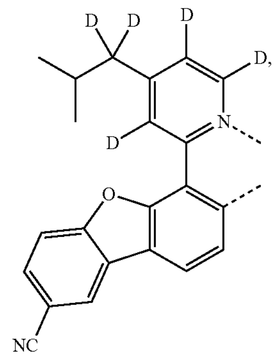
$L_{a48}$
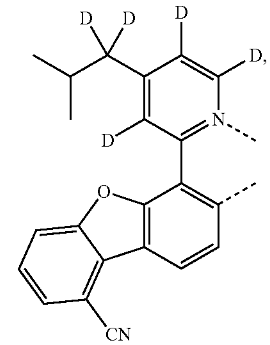
$L_{a49}$
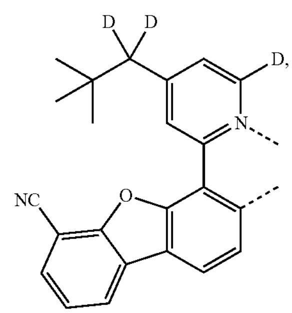
$L_{a50}$
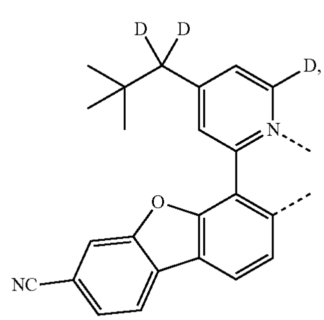

-continued
$L_{a51}$
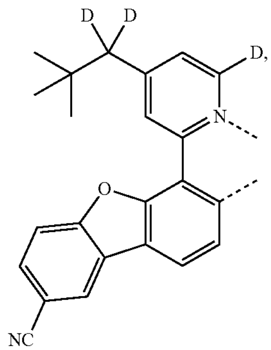
$L_{a52}$
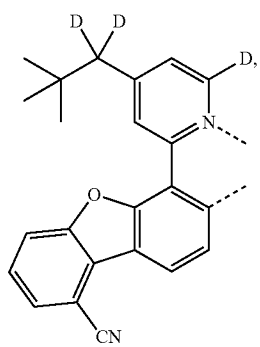
$L_{a53}$
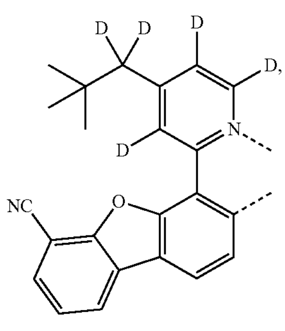
$L_{a54}$
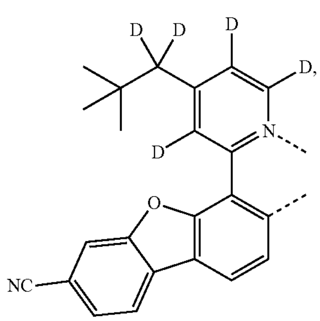
-continued
$L_{a55}$
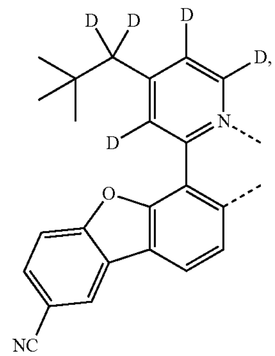
$L_{a56}$
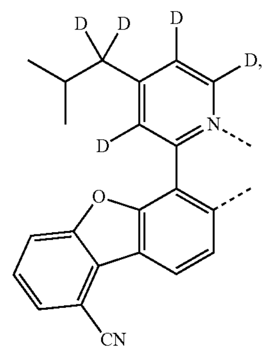
$L_{a57}$
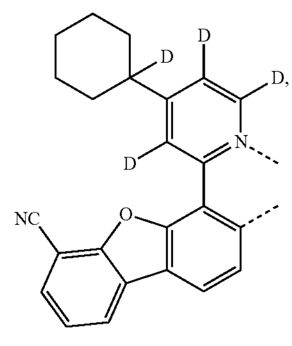
$L_{a58}$
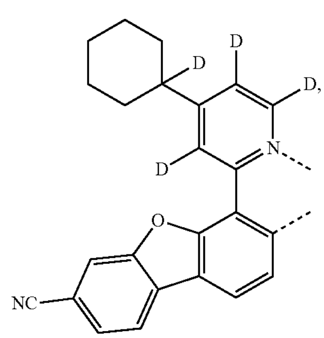

-continued
$L_{a59}$
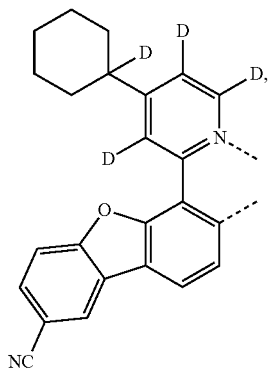
$L_{a60}$
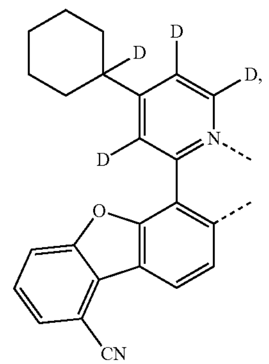
$L_{a61}$
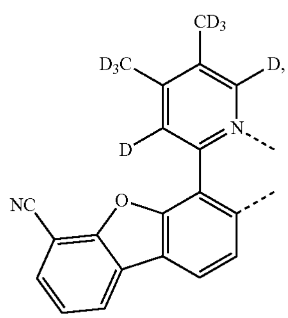
$L_{a62}$
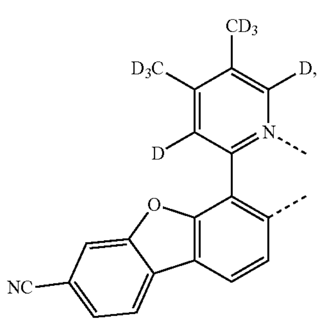
-continued
$L_{a63}$
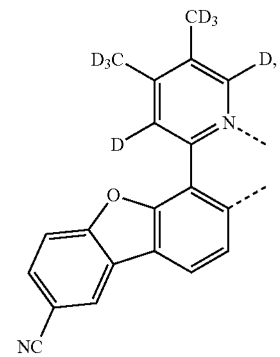
$L_{a64}$
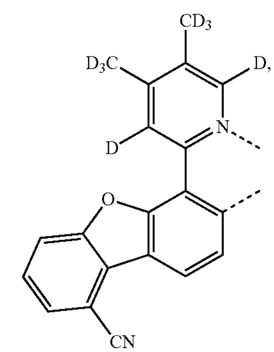
$L_{a65}$
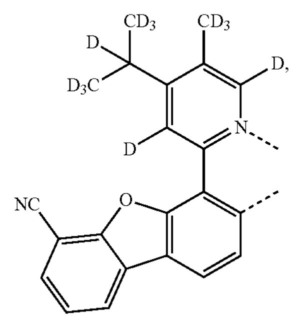
$L_{a66}$
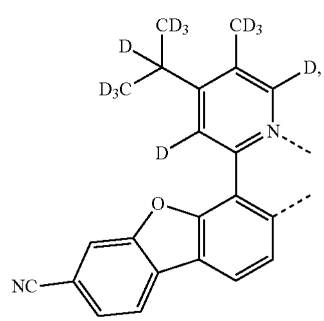

-continued
$L_{a67}$
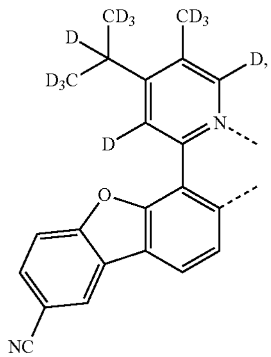
$L_{a68}$
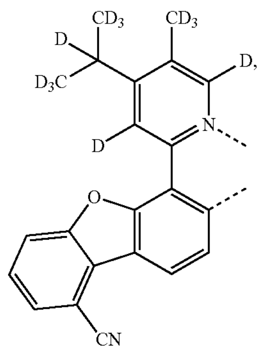
$L_{a69}$
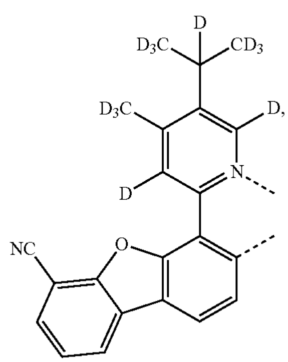
$L_{a70}$
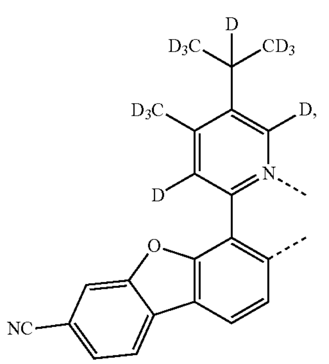
-continued
$L_{a71}$
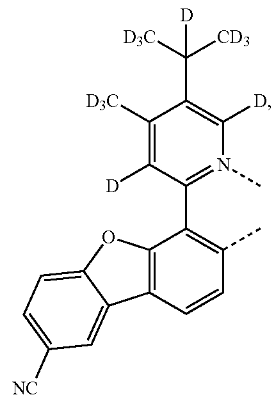
$L_{a72}$
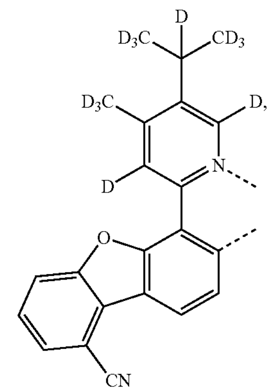
$L_{a73}$
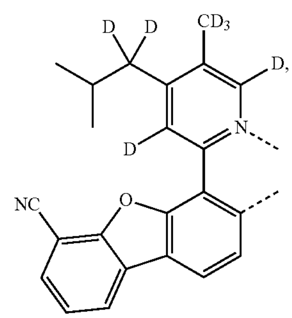
$L_{a74}$
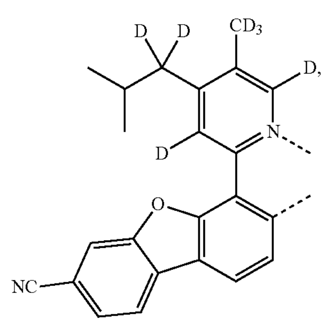

-continued
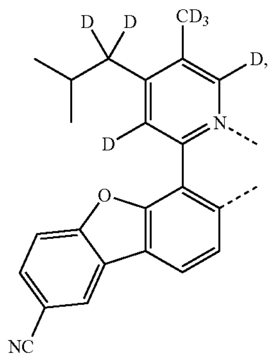
$L_{a75}$
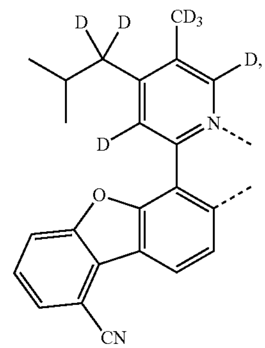
$L_{a76}$
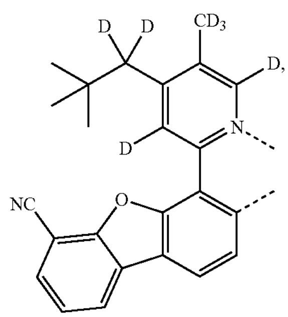
$L_{a77}$
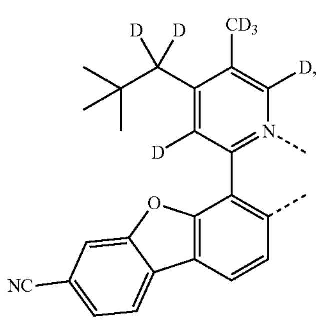
$L_{a78}$
-continued
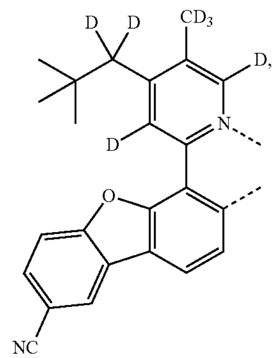
$L_{a79}$
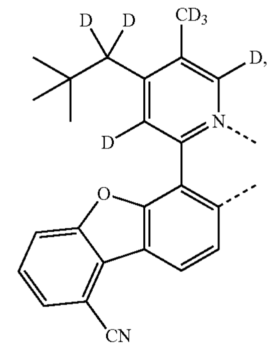
$L_{a80}$
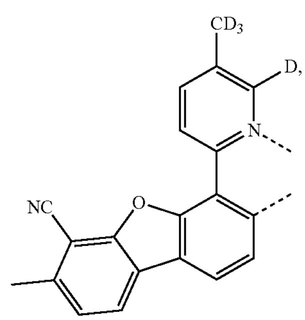
$L_{a81}$
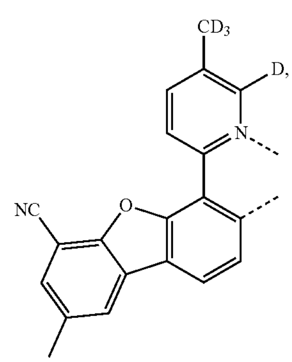
$L_{a82}$ -continued
$L_{a83}$
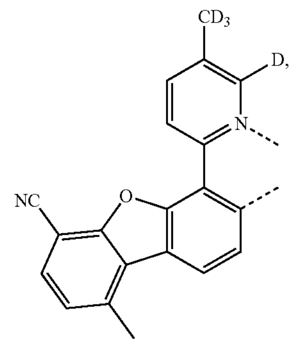
$L_{a84}$
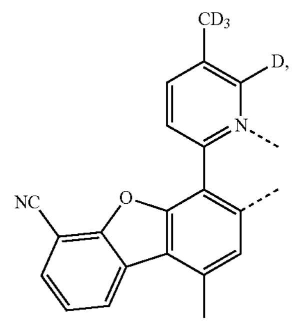
$L_{a85}$
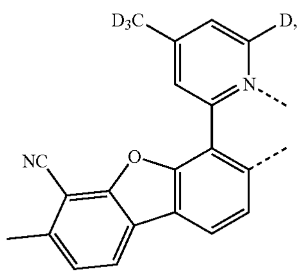
$L_{a86}$
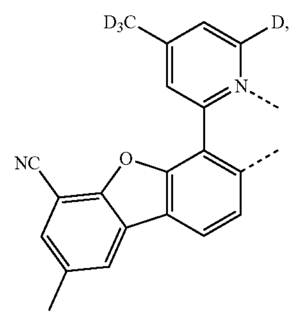
$L_{a87}$
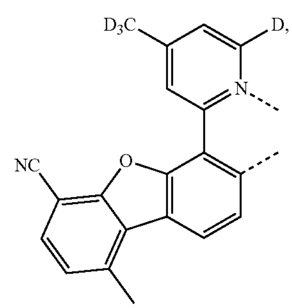
-continued
$L_{a88}$
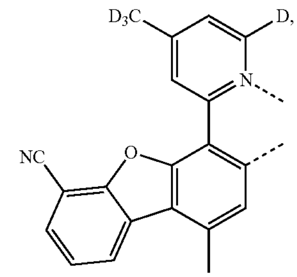
$L_{a89}$
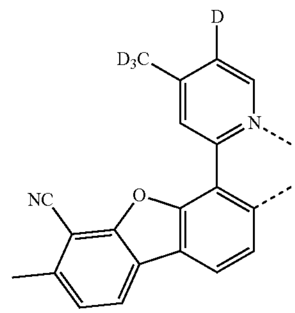
,
$L_{a90}$
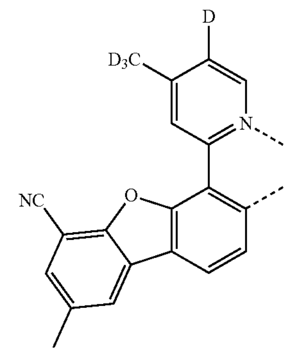
,
$L_{a91}$
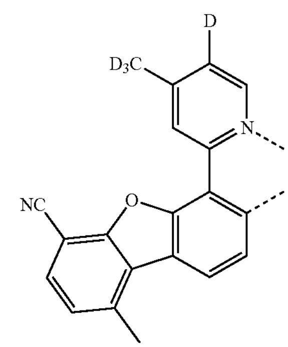
,
$L_{a92}$
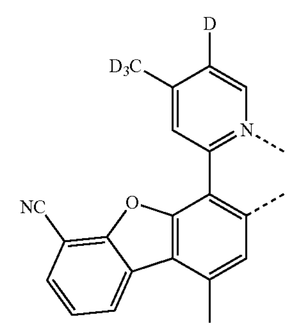
, -continued
$L_{a93}$
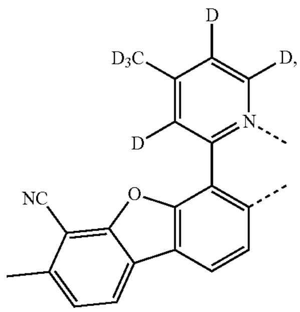
$L_{a94}$
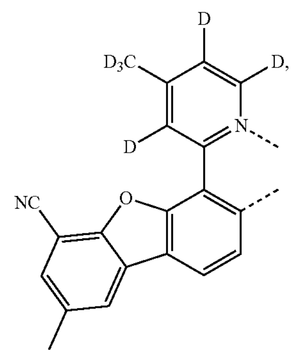
$L_{a95}$
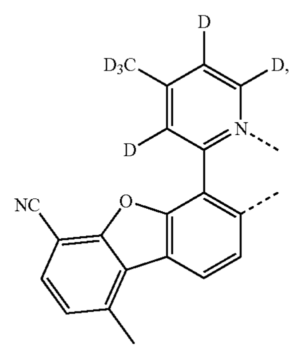
$L_{a96}$
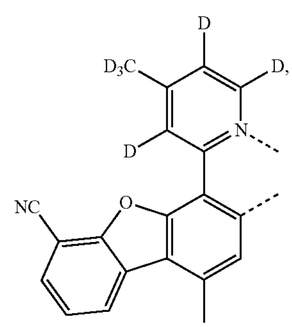
$L_{a97}$
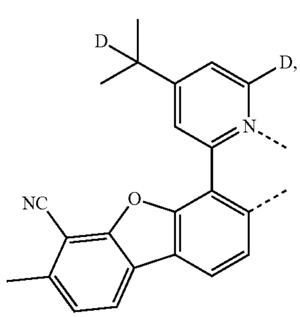
-continued
$L_{a98}$
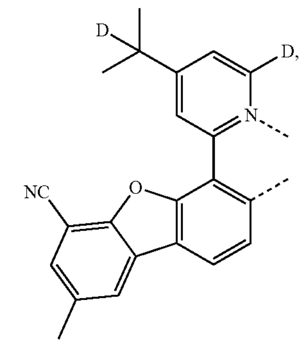
$L_{a99}$
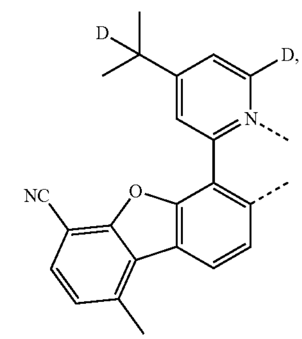
$L_{a100}$
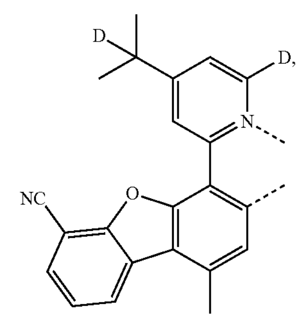
$L_{a101}$
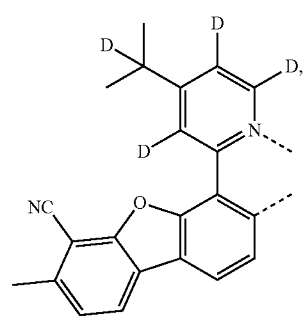

-continued
$L_{a102}$
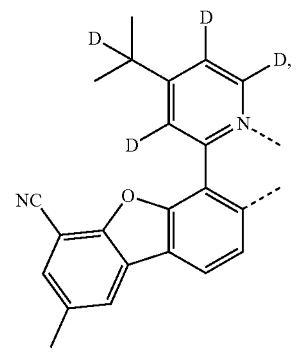
$L_{a103}$
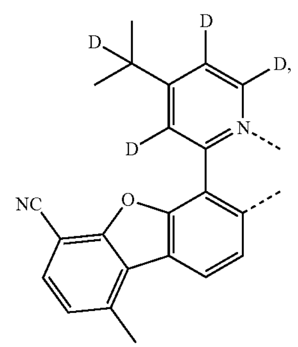
$L_{a104}$
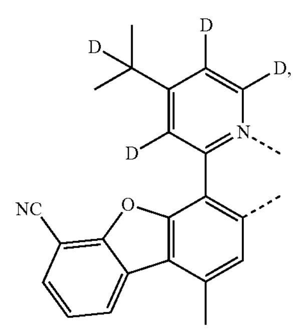
$L_{a105}$
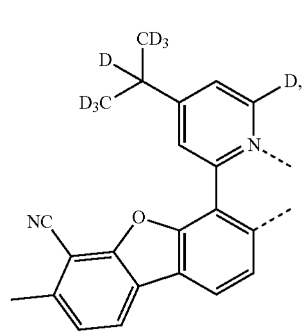
-continued
$L_{a106}$
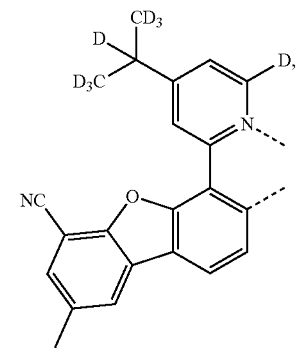
$L_{a107}$
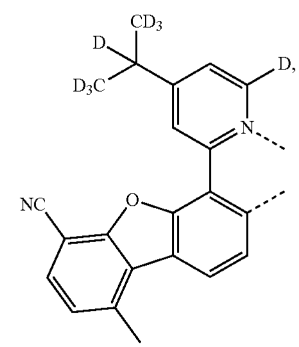
$L_{a108}$
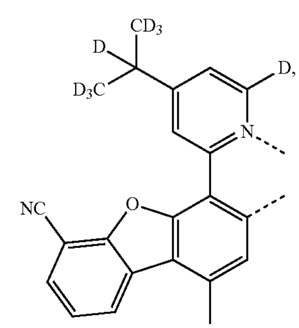
$L_{a109}$
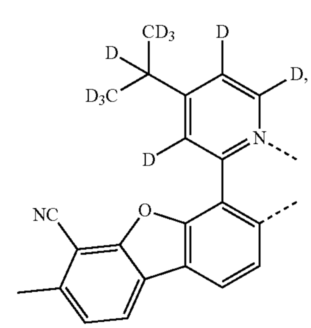

-continued
$L_{a110}$
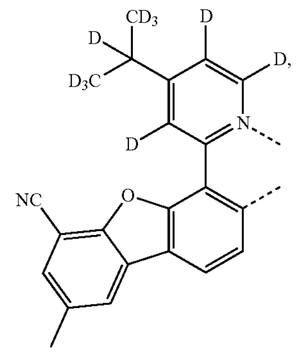
$L_{a111}$
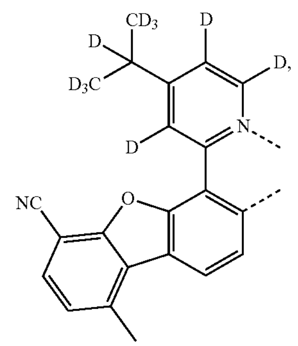
$L_{a112}$
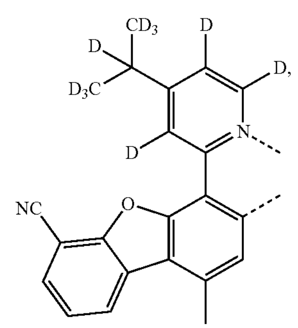
$L_{a113}$
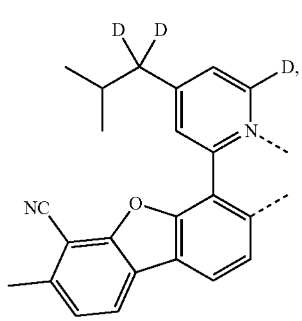
-continued
$L_{a114}$
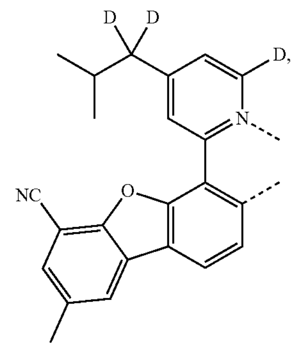
$L_{a115}$
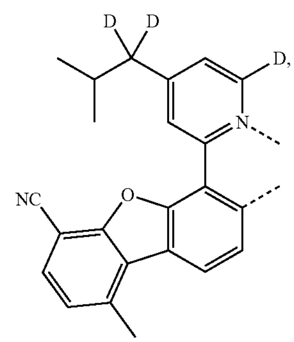
$L_{a116}$
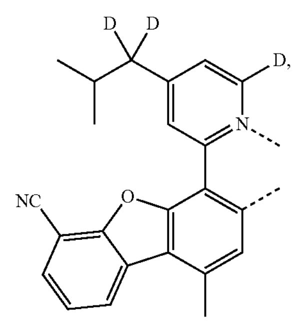
$L_{a117}$
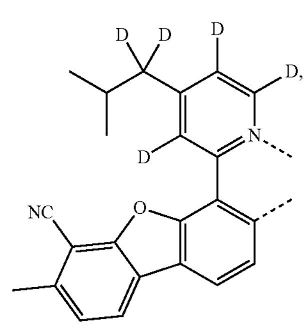

$L_{a118}$
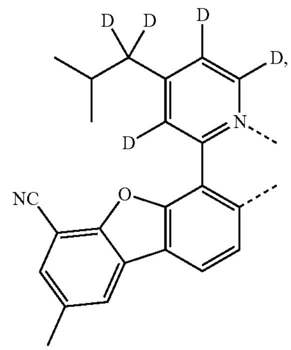
$L_{a119}$
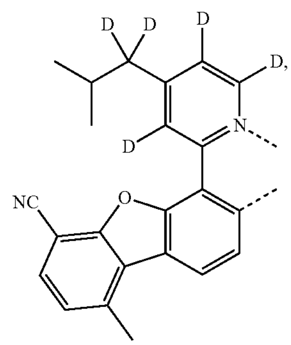
$L_{a120}$
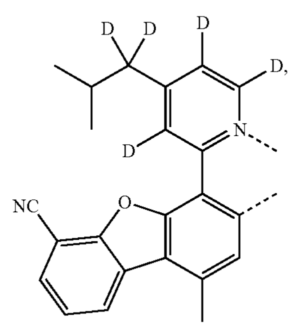
$L_{a121}$
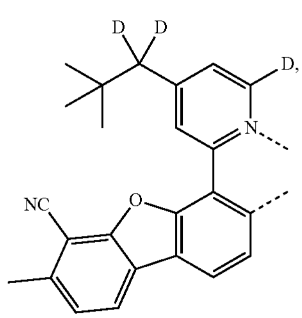
$L_{a122}$
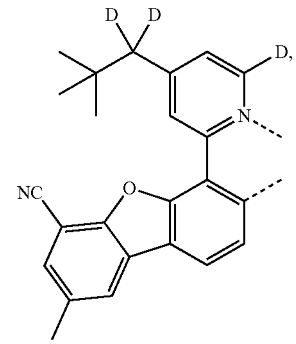
$L_{a123}$
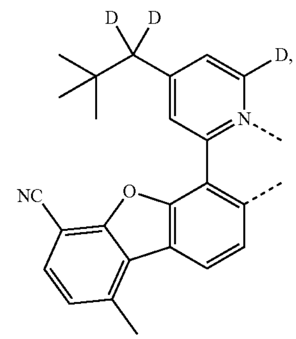
$L_{a124}$
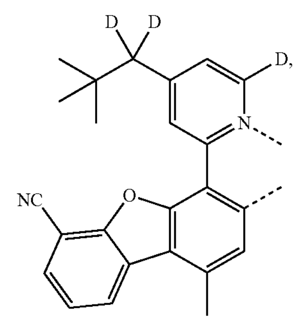
$L_{a125}$
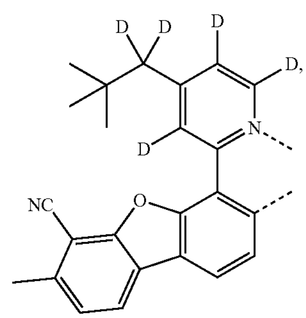

$L_{a126}$
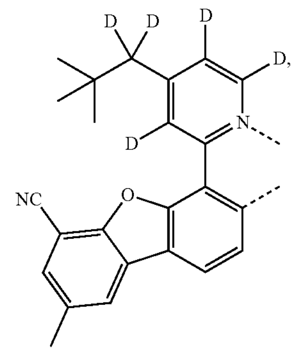
$L_{a127}$
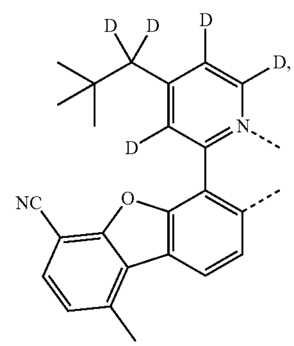
$L_{a128}$
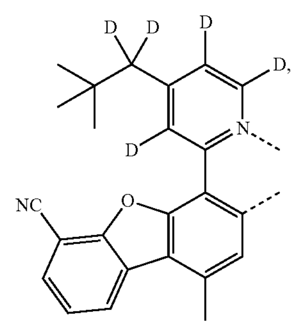
$L_{a129}$
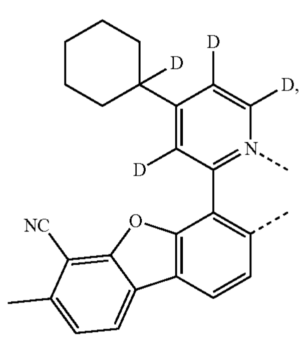
$L_{a130}$
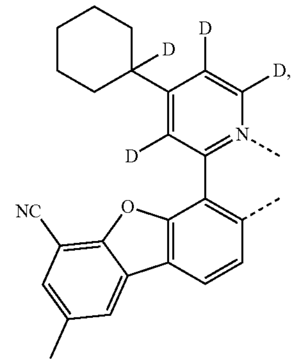
$L_{a131}$
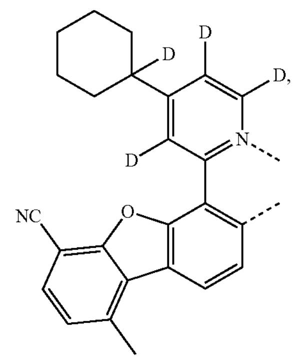
$L_{a132}$
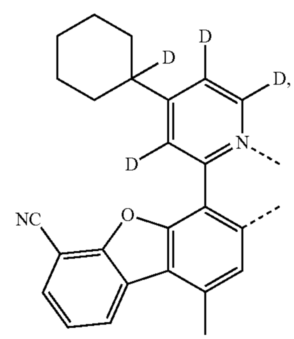
$L_{a133}$
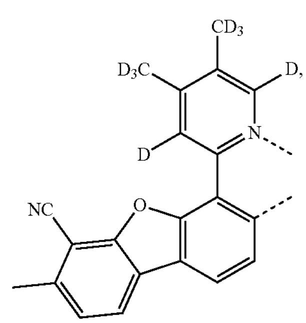

-continued
$L_{a134}$
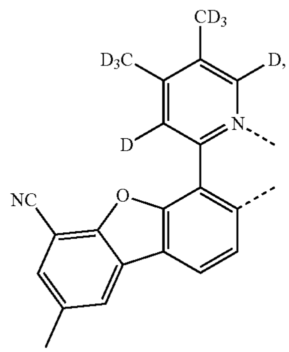
$L_{a135}$
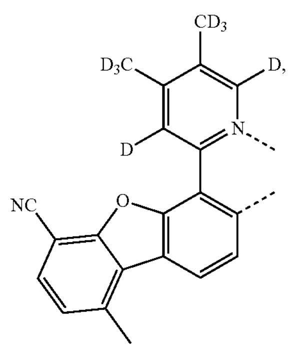
$L_{a136}$
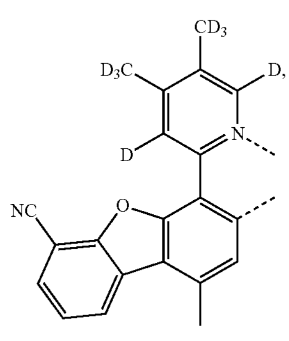
$L_{a137}$
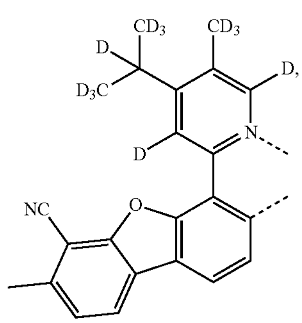
-continued
$L_{a138}$
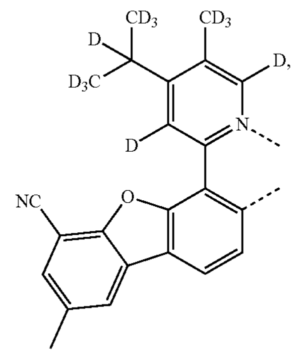
$L_{a139}$
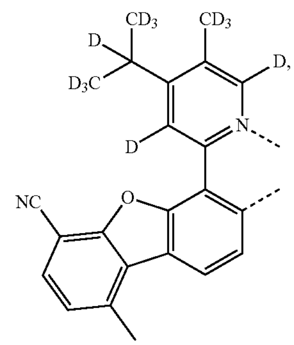
$L_{a140}$
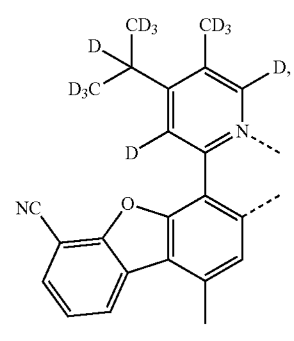
$L_{a141}$
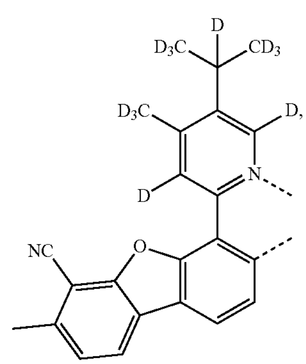

-continued
$L_{a142}$
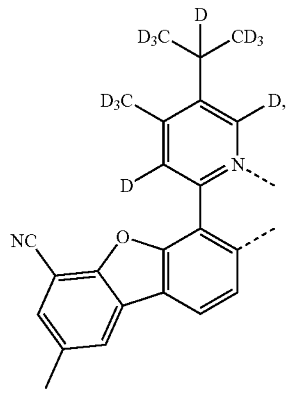
$L_{a143}$
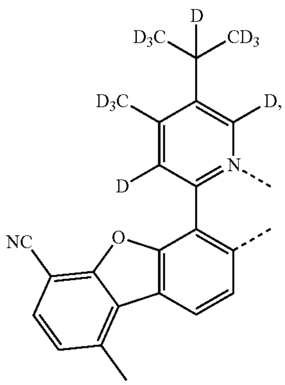
$L_{a144}$
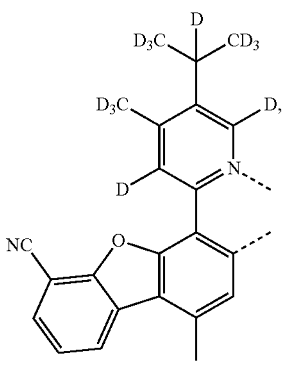
$L_{a145}$
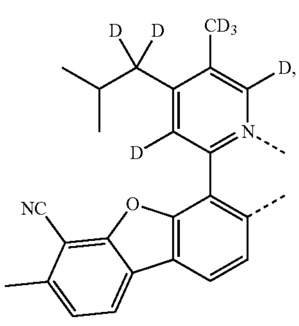
-continued
$L_{a146}$
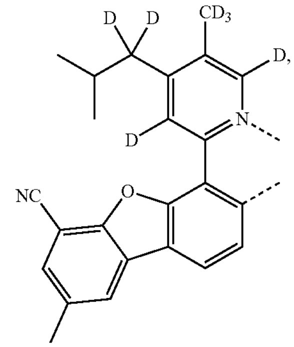
$L_{a147}$
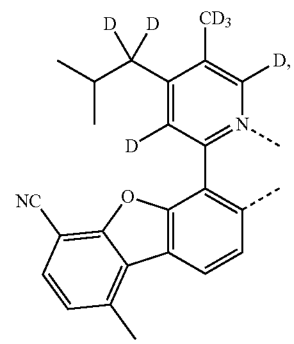
$L_{a148}$
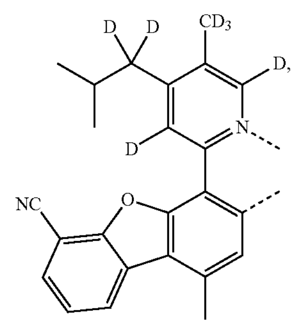
$L_{a149}$
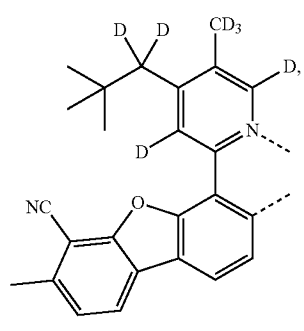

$L_{a150}$
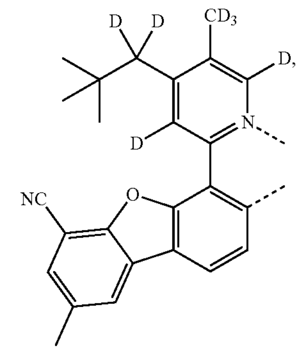
$L_{a151}$
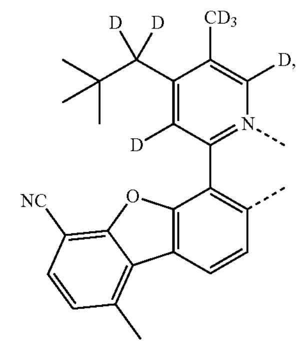
$L_{a152}$
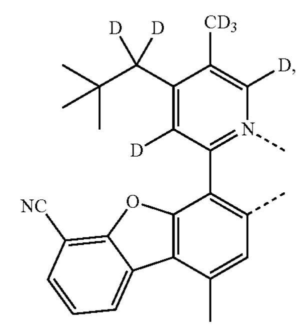
$L_{a153}$
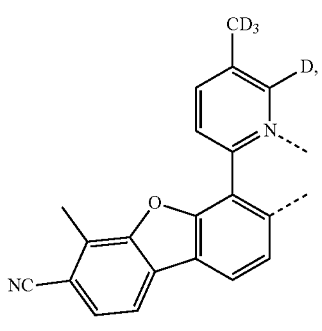
$L_{a154}$
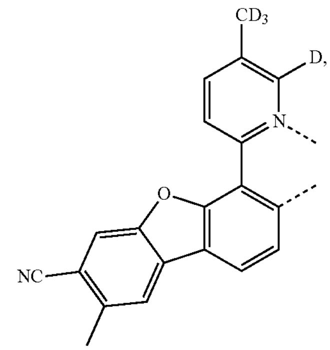
$L_{a155}$
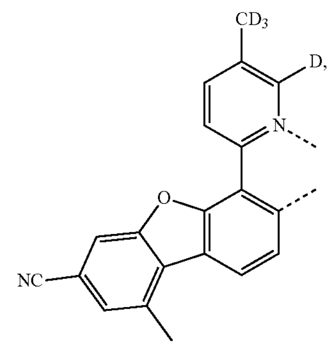
$L_{a156}$
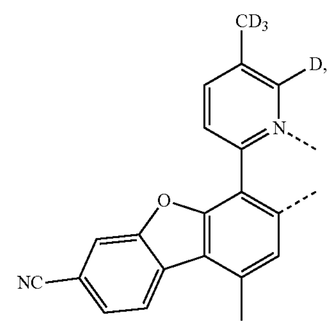
$L_{a157}$
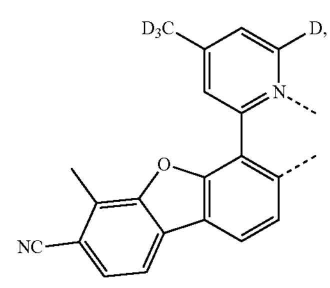
$L_{a158}$
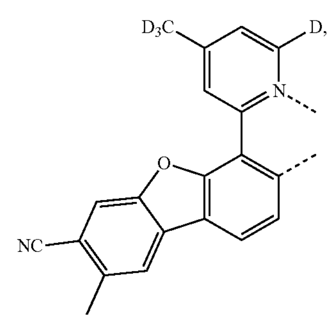

-continued
$L_{a159}$
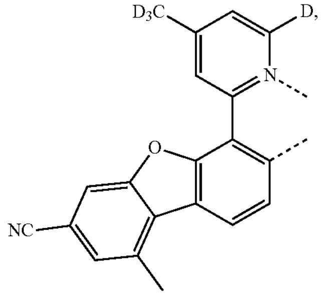
$L_{a160}$
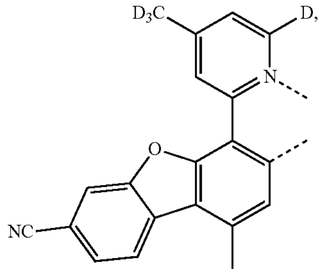
$L_{a161}$
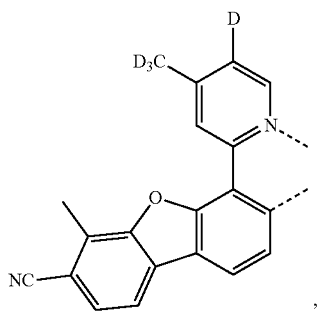
$L_{a162}$
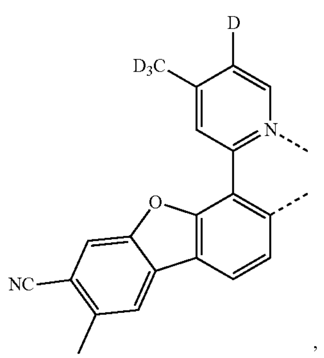
$L_{a163}$
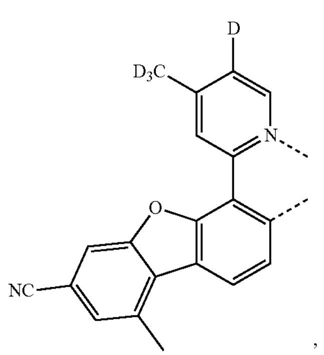
-continued
$L_{a164}$
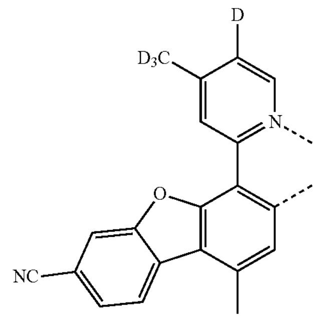
$L_{a165}$
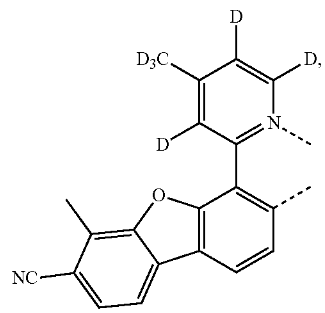
$L_{a166}$
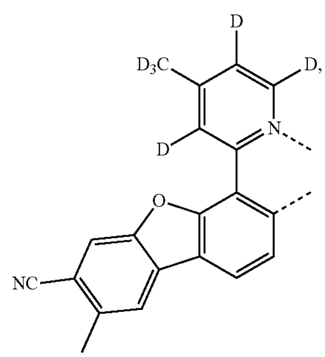
$L_{a167}$
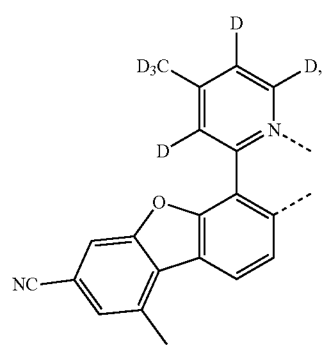

-continued
$L_{a168}$
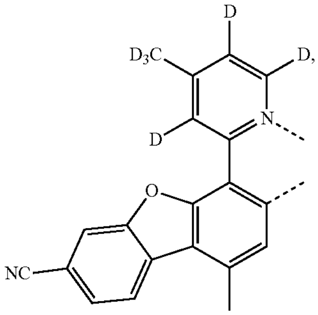
$L_{a169}$
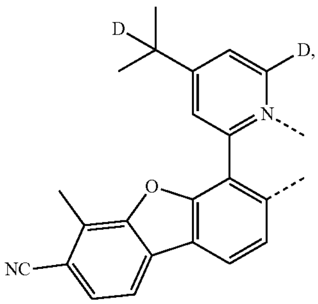
$L_{a170}$
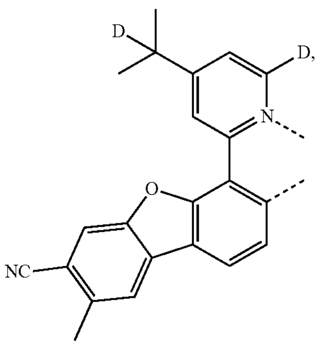
$L_{a171}$
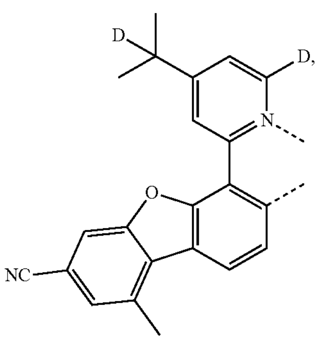
$L_{a172}$
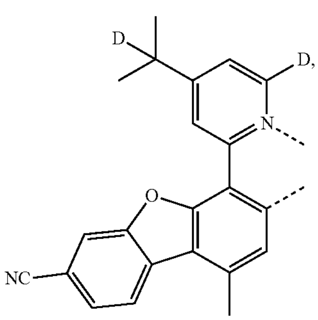
-continued
$L_{a173}$
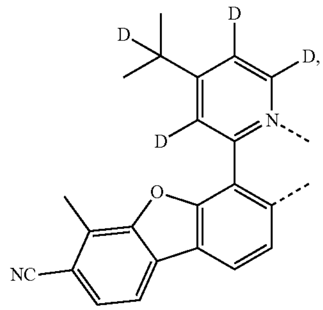
$L_{a174}$
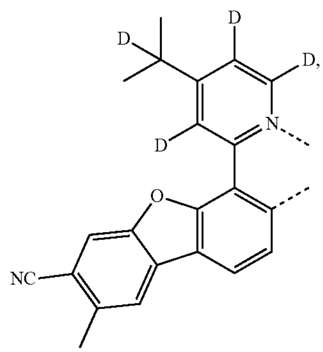
$L_{a175}$
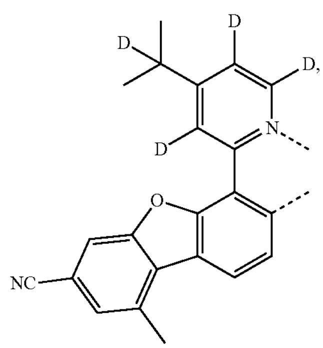
$L_{a176}$
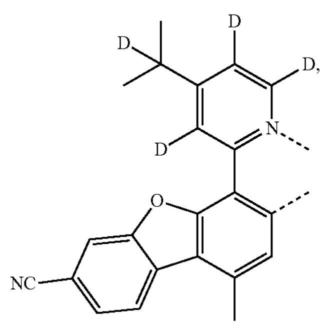

-continued
$L_{a177}$
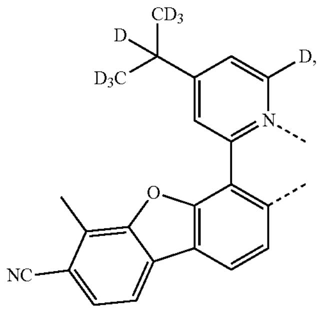
$L_{a178}$
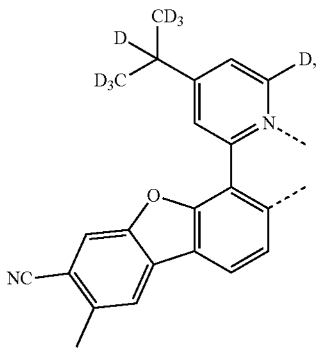
$L_{a179}$
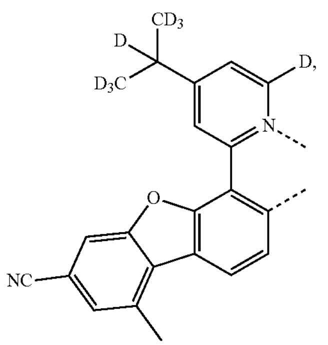
$L_{a180}$
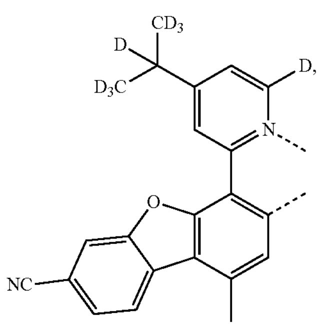
$L_{a181}$
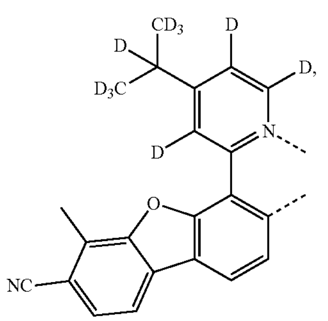
-continued
$L_{a182}$
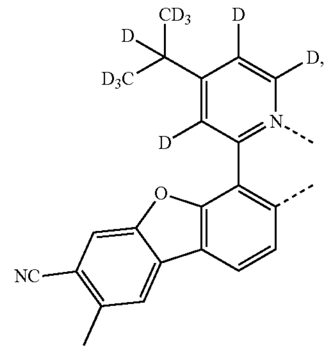
$L_{a183}$
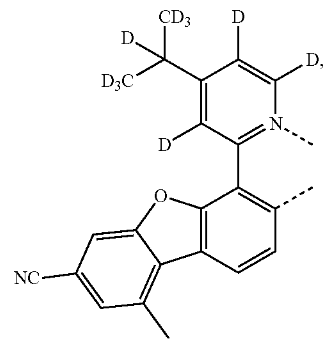
$L_{a184}$
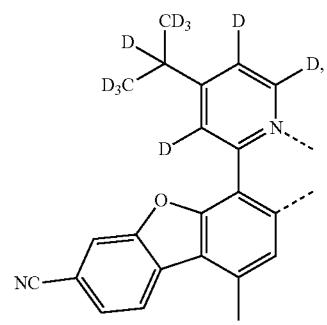
$L_{a185}$
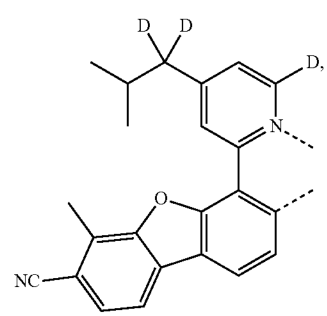

-continued
$L_{a186}$
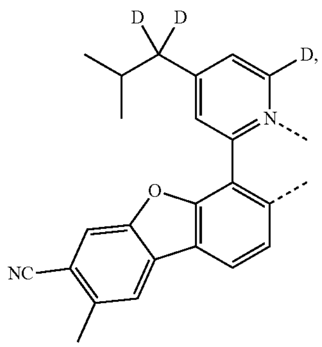
$L_{a187}$
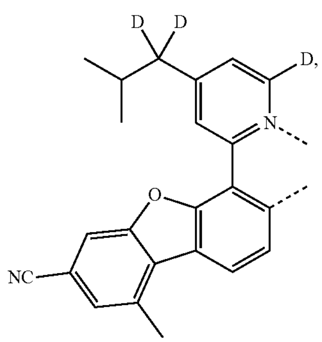
$L_{a188}$
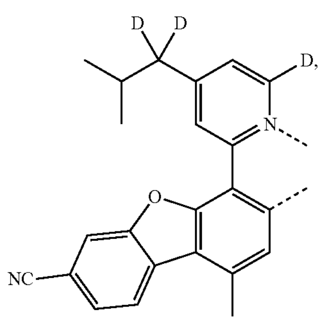
$L_{a189}$
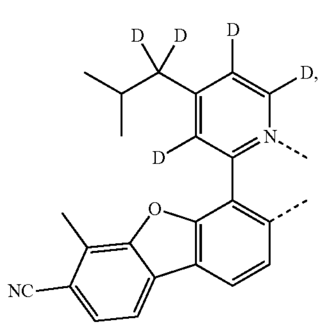
-continued
$L_{a190}$
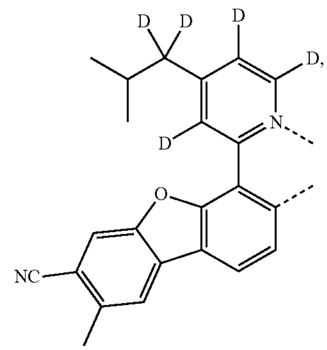
$L_{a191}$
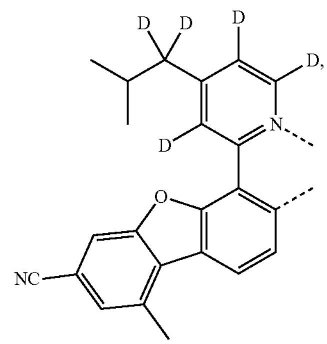
$L_{a192}$
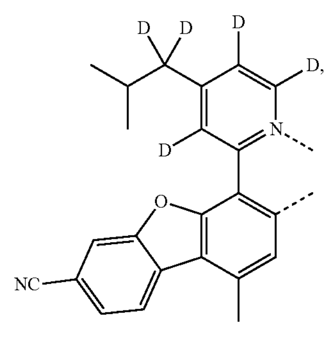
$L_{a193}$
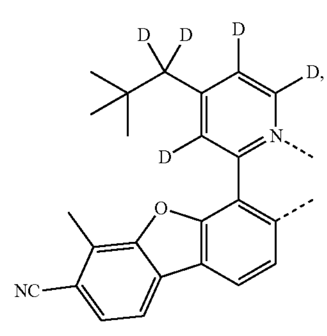

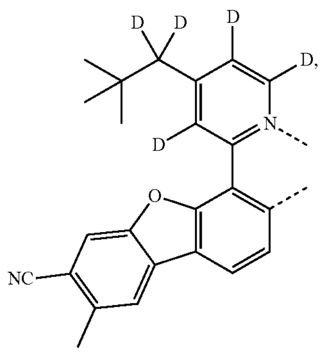
$L_{a194}$
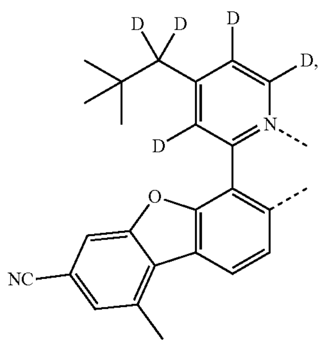
$L_{a195}$
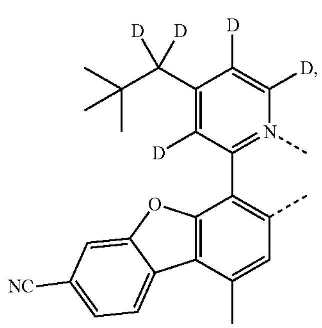
$L_{a196}$
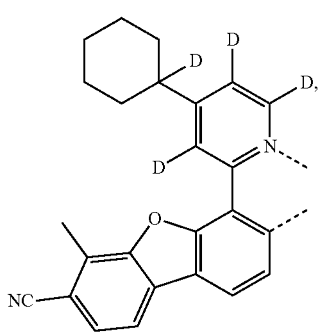
$L_{a197}$
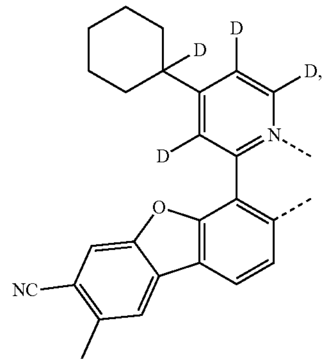
$L_{a198}$
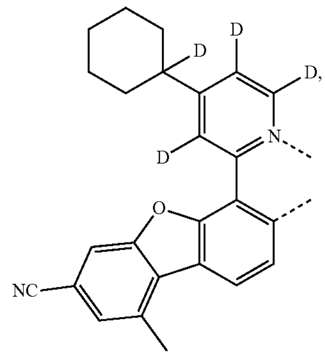
$L_{a199}$
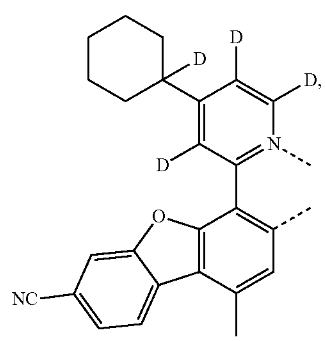
$L_{a200}$
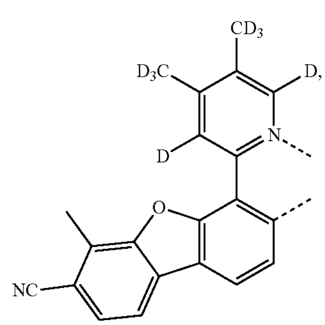
$L_{a201}$ $L_{a202}$
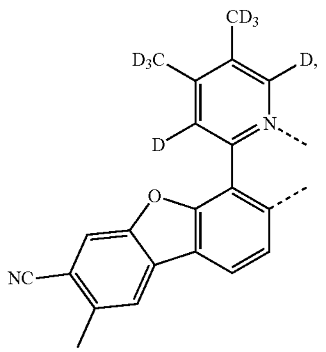
$L_{a203}$
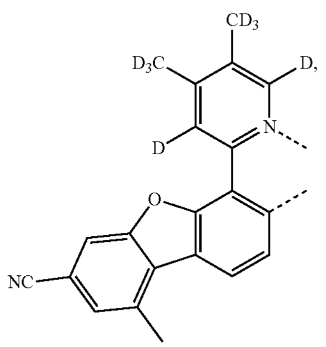
$L_{a204}$
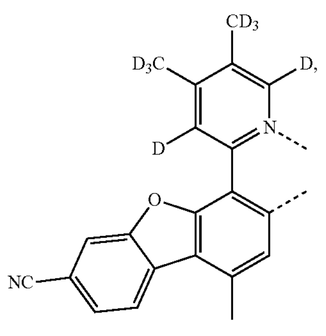
$L_{a205}$
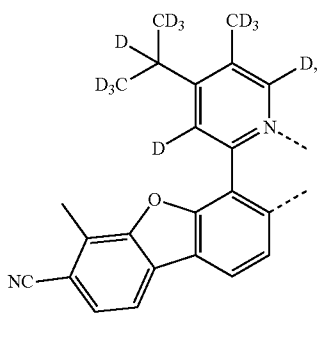
$L_{a206}$
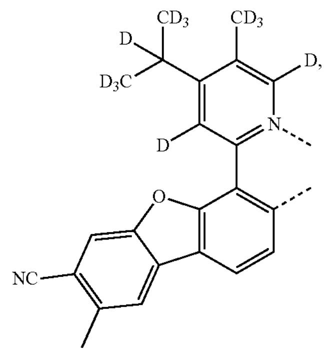
$L_{a207}$
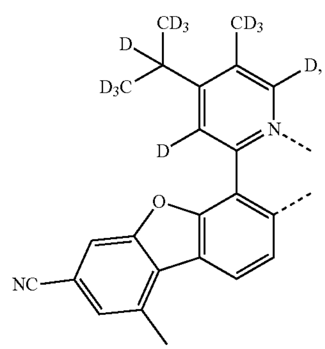
$L_{a208}$
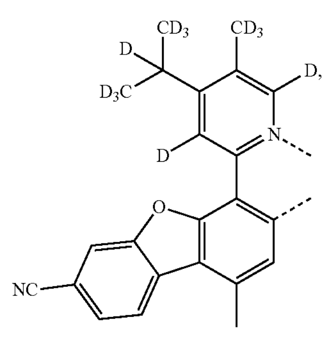
$L_{a209}$
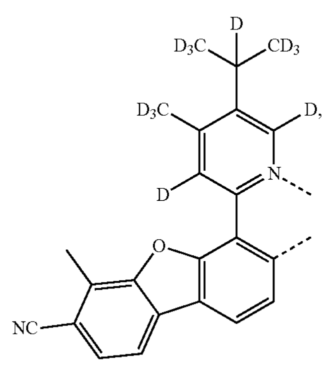

$L_{a210}$
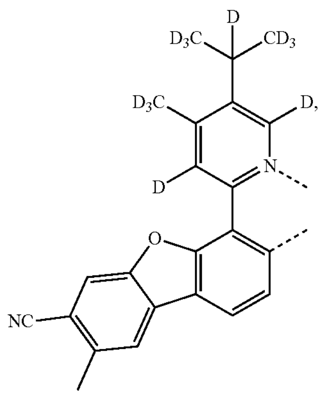
$L_{a211}$
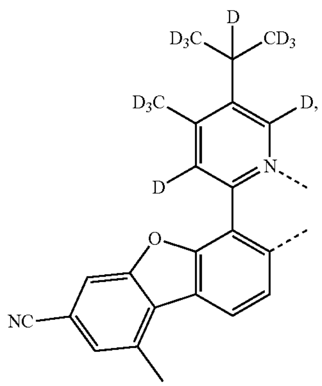
$L_{a212}$
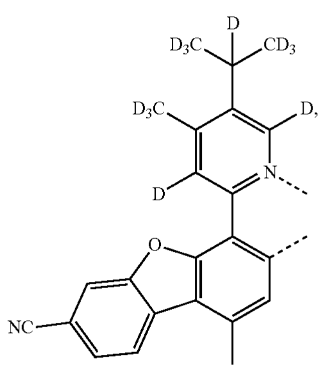
$L_{a213}$
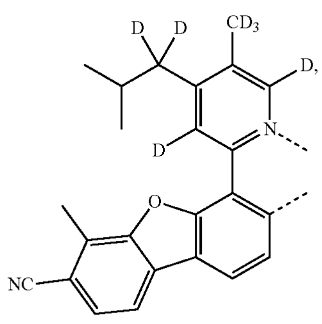
$L_{a214}$
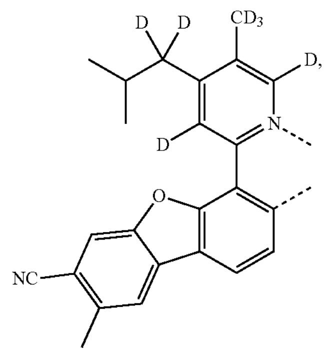
$L_{a215}$
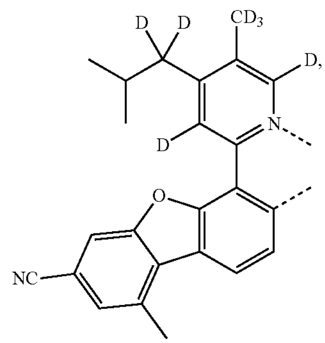
$L_{a216}$
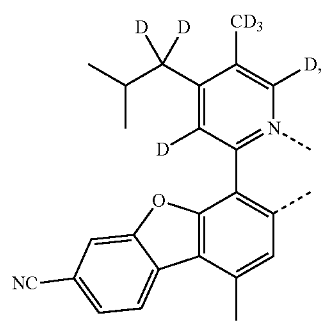
$L_{a217}$
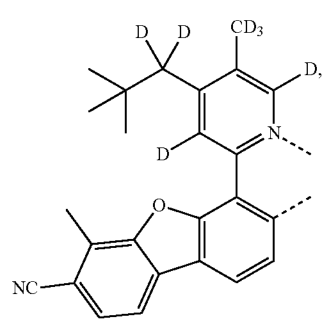

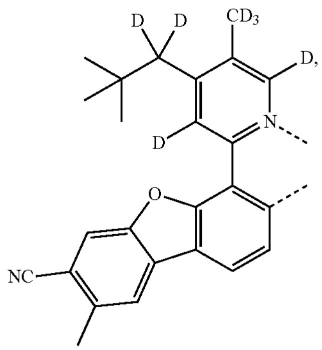
$L_{a218}$
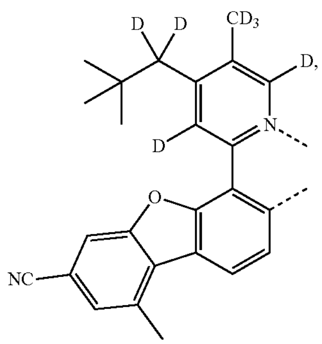
$L_{a219}$
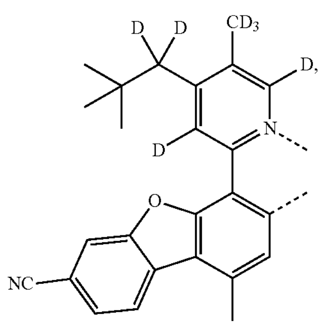
$L_{a220}$
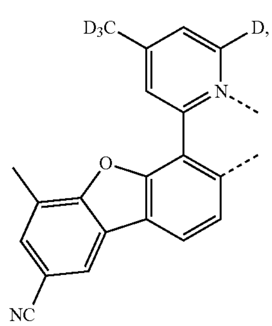
$L_{a221}$
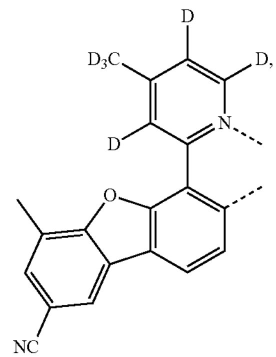
$L_{a222}$
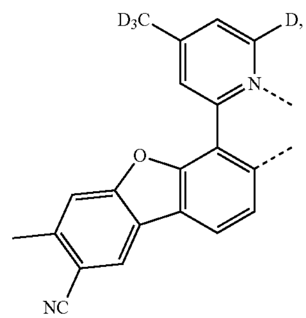
$L_{a223}$
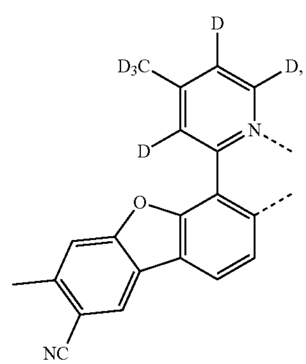
$L_{a224}$
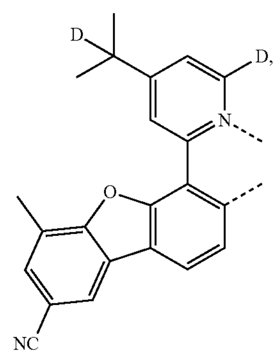
$L_{a225}$ -continued
$L_{a226}$
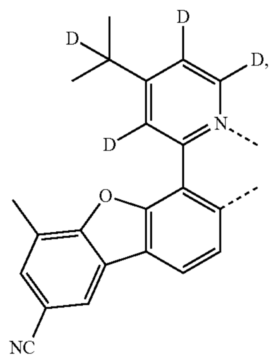
$L_{a227}$
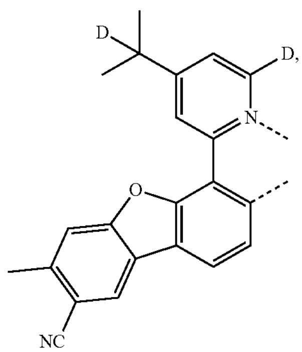
$L_{a228}$
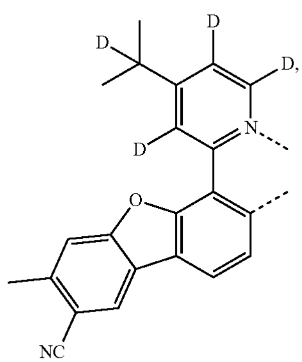
$L_{a229}$
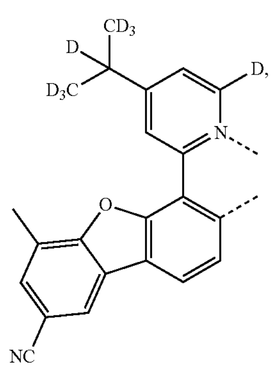
-continued
$L_{a230}$
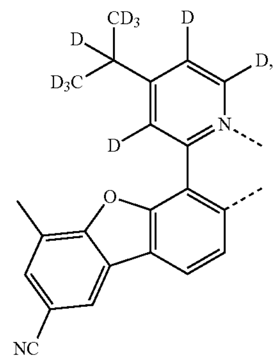
$L_{a231}$
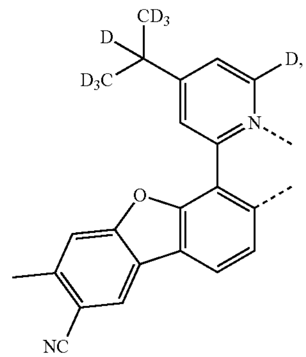
$L_{a232}$
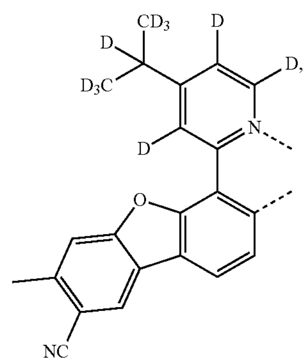
$L_{a233}$
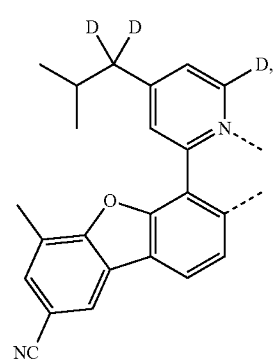

$L_{a234}$
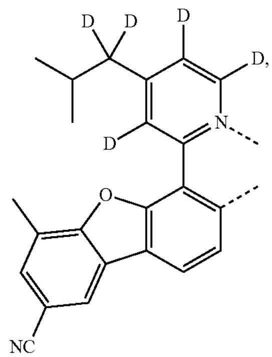
$L_{a235}$
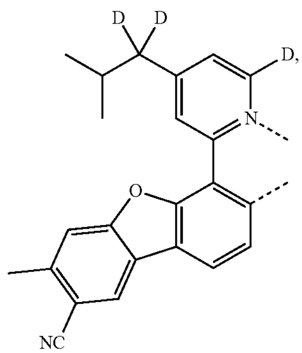
$L_{a236}$
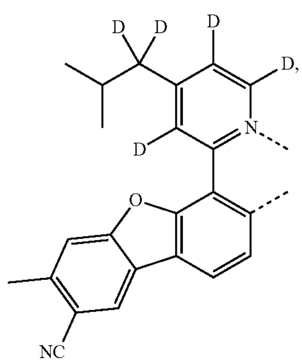
$L_{a237}$
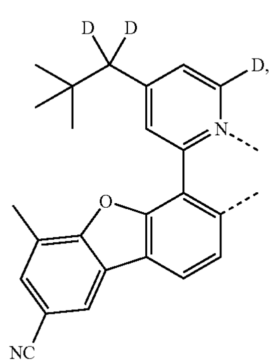
$L_{a238}$
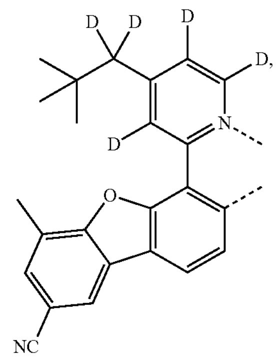
$L_{a239}$
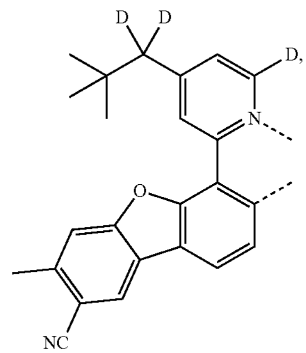
$L_{a240}$
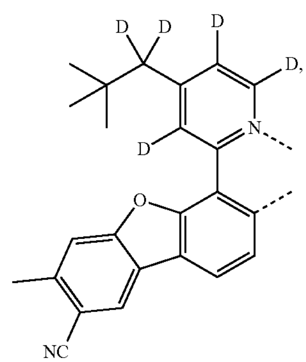
$L_{a241}$
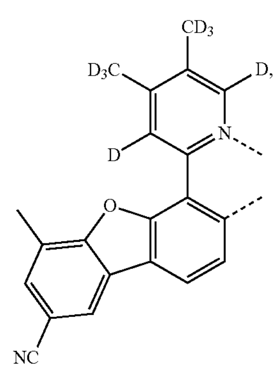

-continued
$L_{a242}$
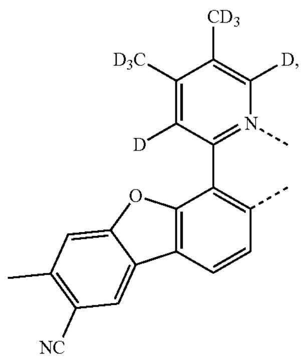
$L_{a243}$
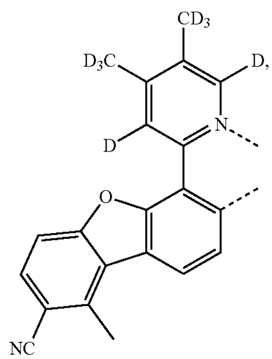
$L_{a244}$
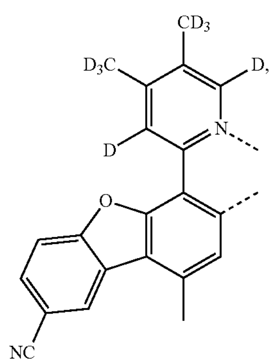
$L_{a245}$
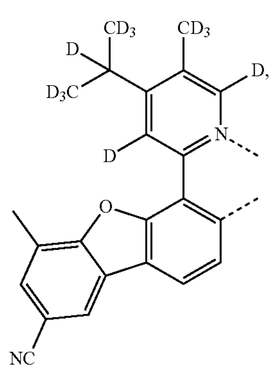
-continued
$L_{a246}$
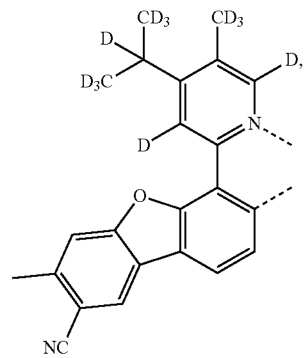
$L_{a247}$
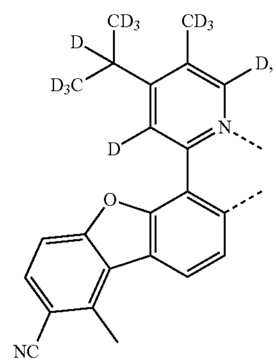
$L_{a248}$
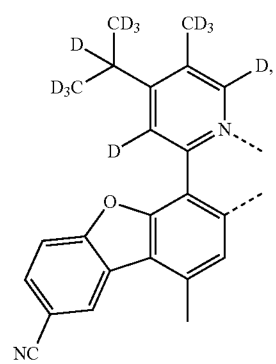
$L_{a249}$
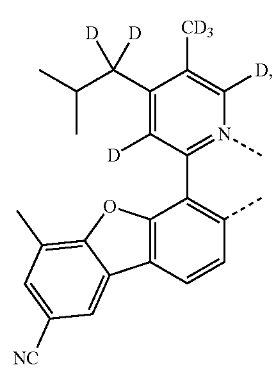

-continued
$L_{a250}$
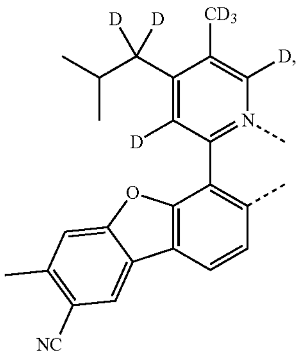
$L_{a251}$
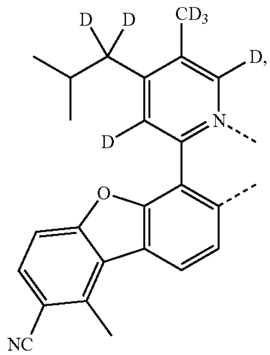
$L_{a252}$
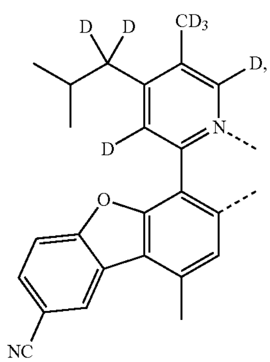
$L_{a253}$
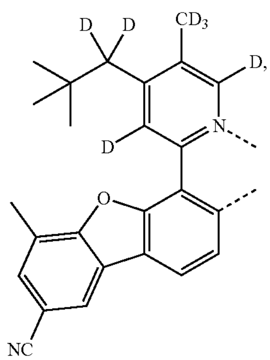
-continued
$L_{a254}$
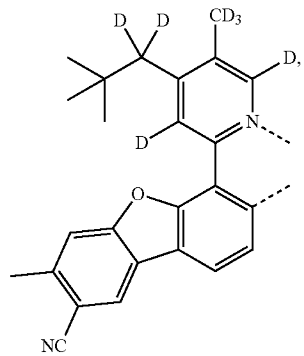
$L_{a255}$
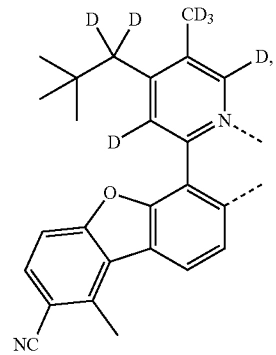
$L_{a256}$
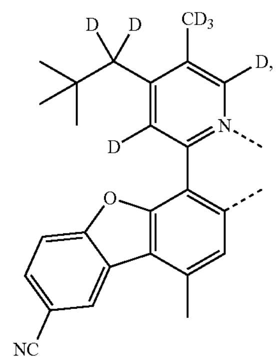
$L_{a257}$
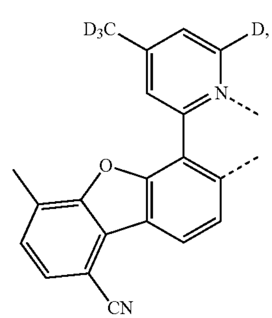

-continued
L$_{a258}$
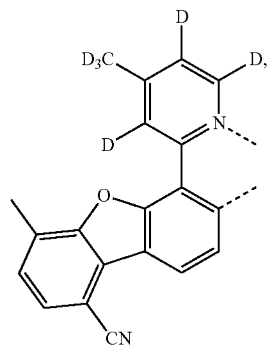
L$_{a259}$
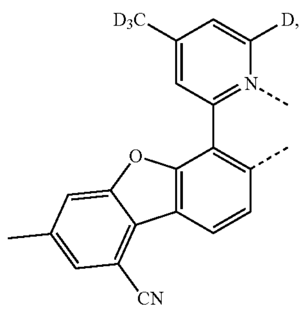
L$_{a260}$
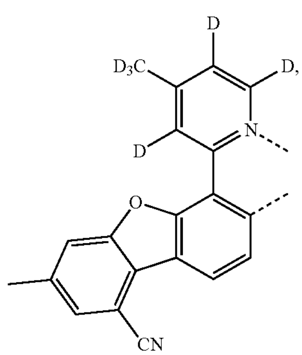
L$_{a261}$
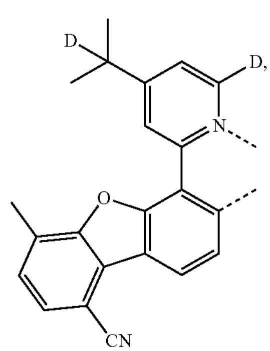
-continued
L$_{a262}$
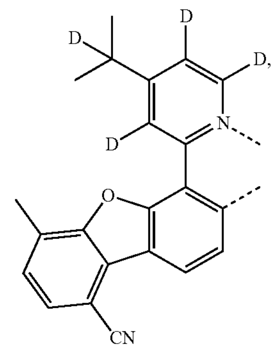
L$_{a263}$
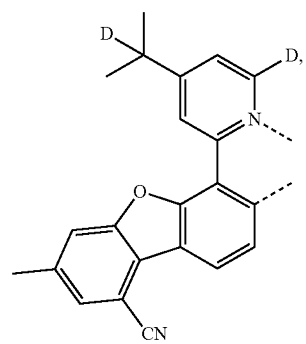
L$_{a264}$
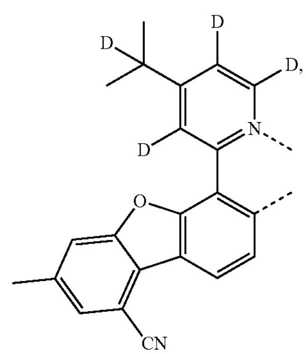
L$_{a265}$
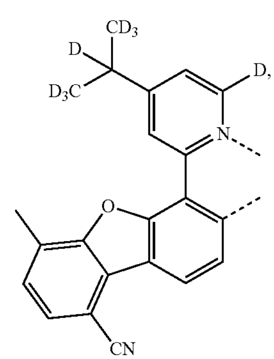

-continued
$L_{a266}$
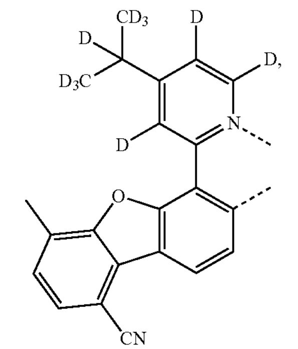
$L_{a267}$
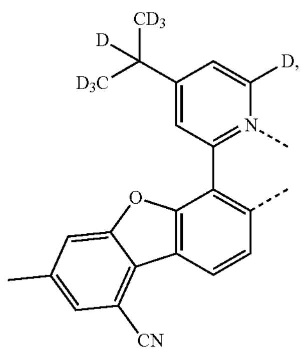
$L_{a268}$
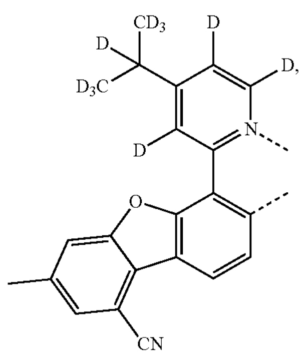
$L_{a269}$
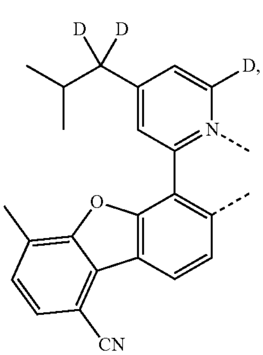
-continued
$L_{a270}$
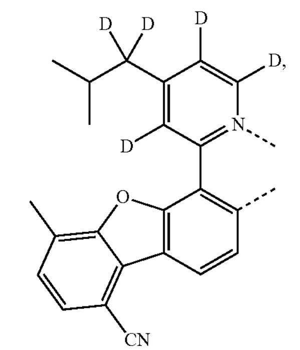
$L_{a271}$
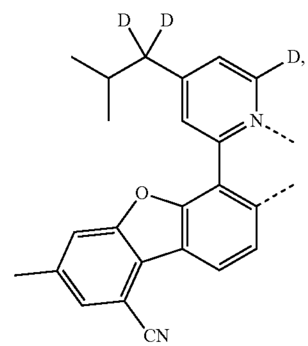
$L_{a272}$
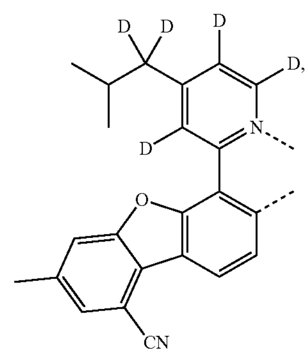
$L_{a273}$
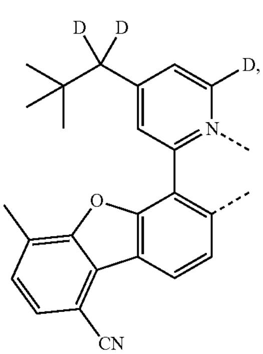

-continued
$L_{a274}$
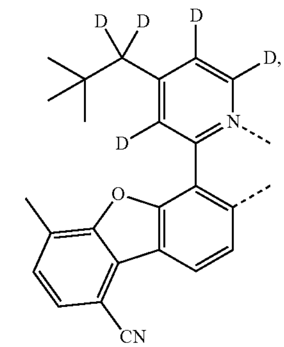
$L_{a275}$
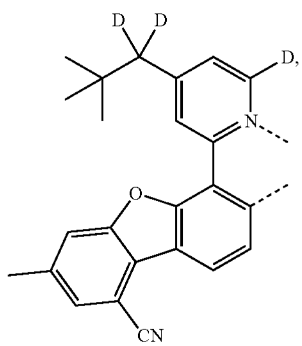
$L_{a276}$
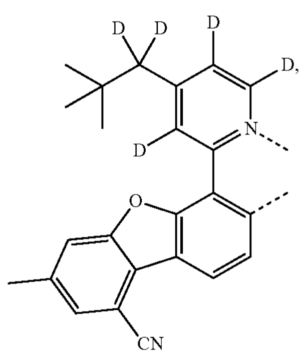
$L_{a277}$
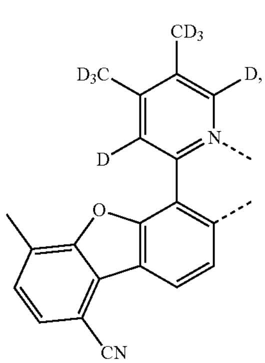
-continued
$L_{a278}$
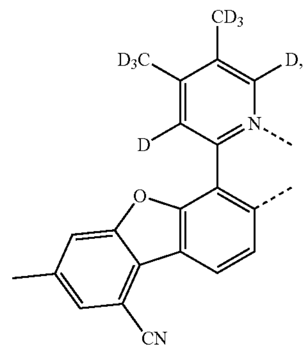
$L_{a279}$
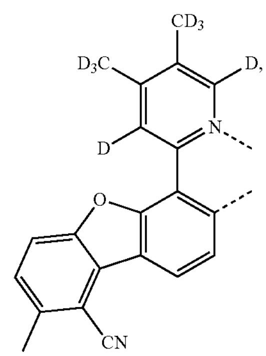
$L_{a280}$
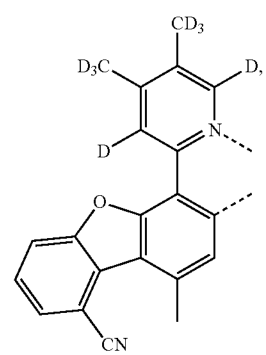
$L_{a281}$
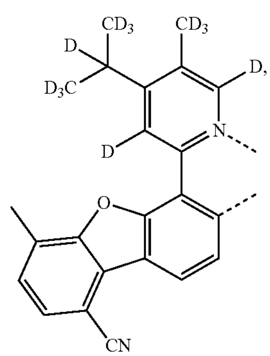

-continued
$L_{a282}$
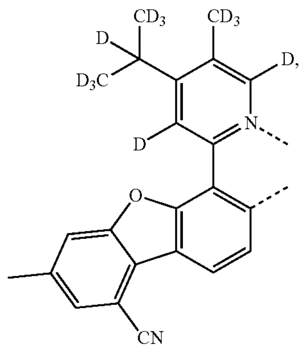
$L_{a283}$
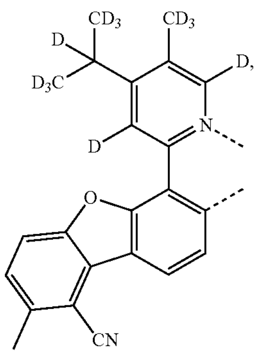
$L_{a284}$
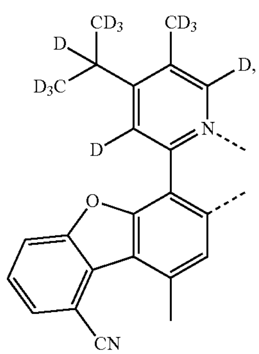
$L_{a285}$
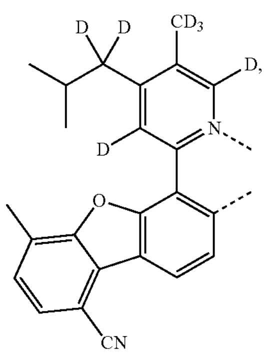
-continued
$L_{a286}$
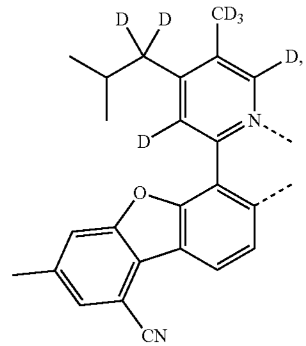
$L_{a287}$
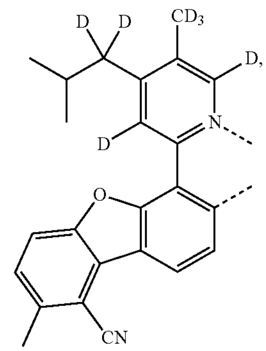
$L_{a288}$
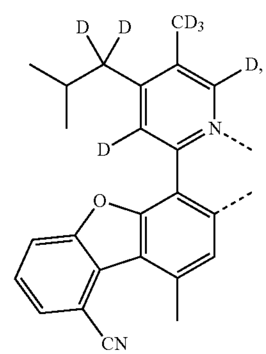
$L_{a289}$
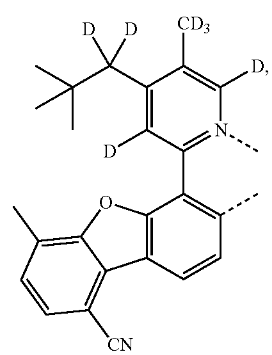

-continued
$L_{a290}$
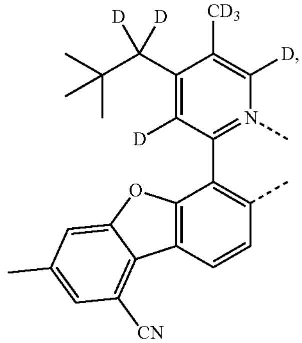
$L_{a291}$
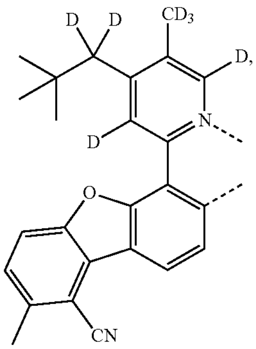
$L_{a292}$
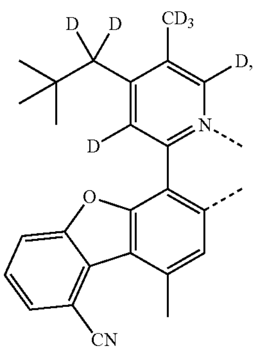
$L_{a293}$
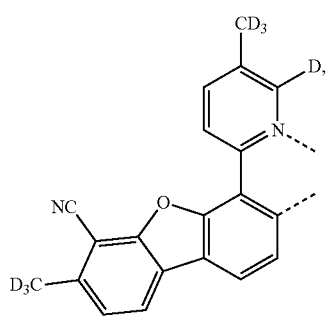
-continued
$L_{a294}$
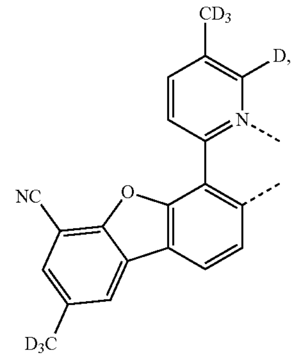
$L_{a295}$
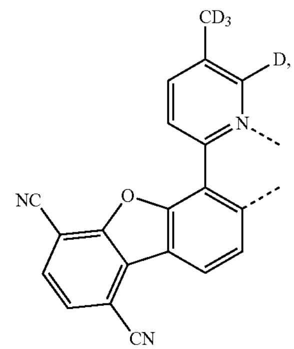
$L_{a296}$
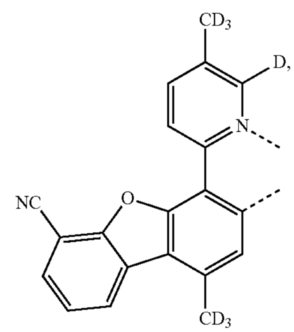
$L_{a297}$
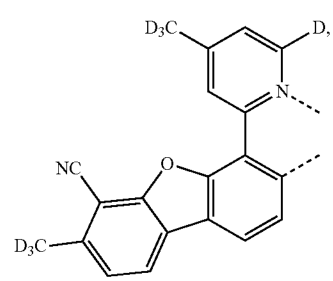
$L_{a298}$
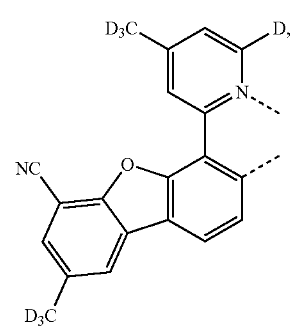

-continued
$L_{a299}$
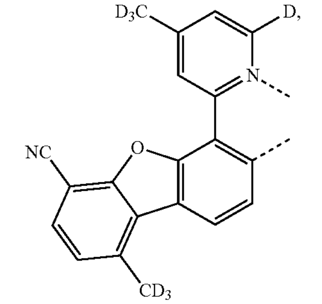
$L_{a300}$
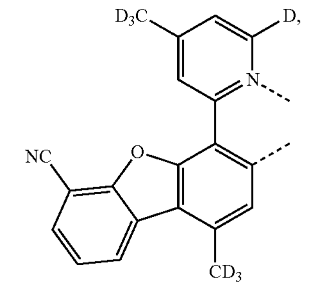
$L_{a301}$
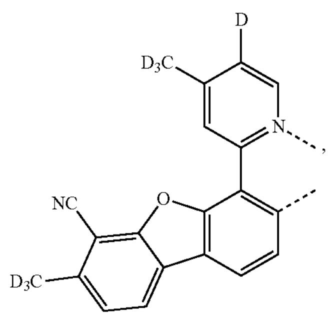
$L_{a302}$
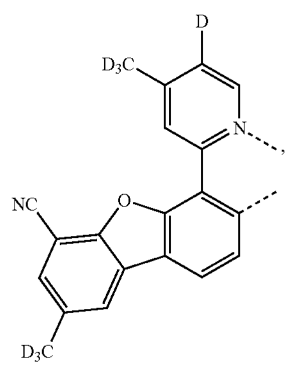
$L_{a303}$
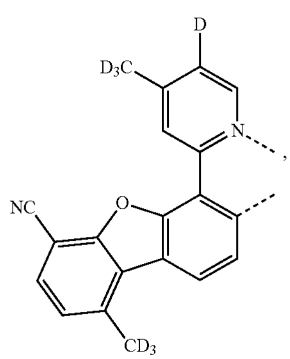
-continued
$L_{a304}$
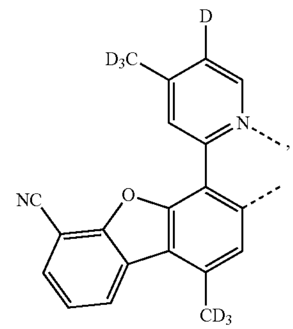
$L_{a305}$
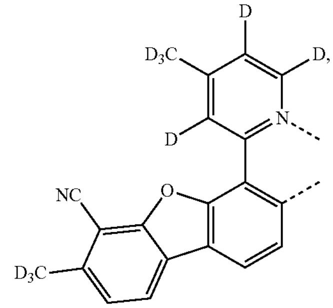
$L_{a306}$
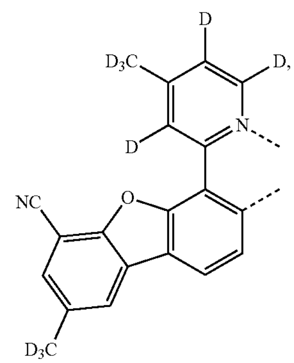
$L_{a307}$
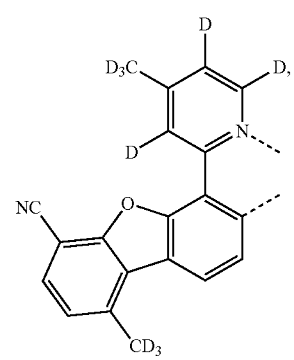

-continued
$L_{a308}$
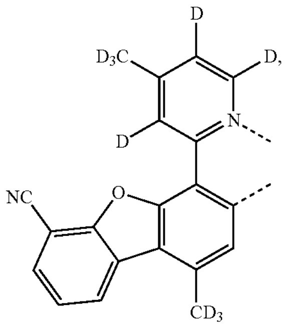
$L_{a309}$
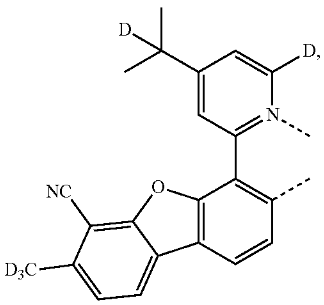
$L_{a310}$
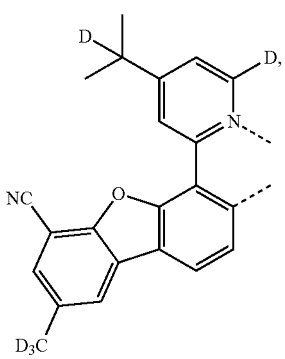
$L_{a311}$
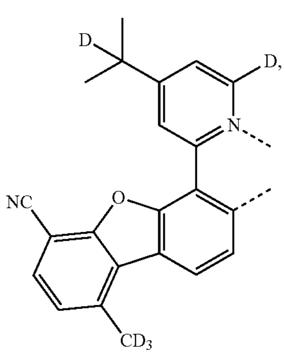
-continued
$L_{a312}$
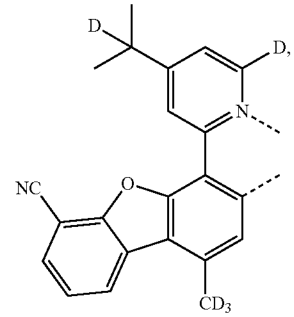
$L_{a313}$
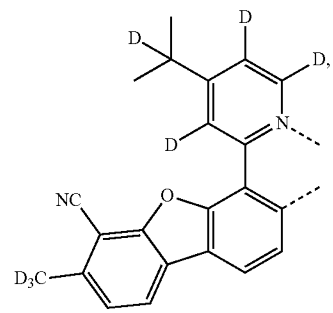
$L_{a314}$
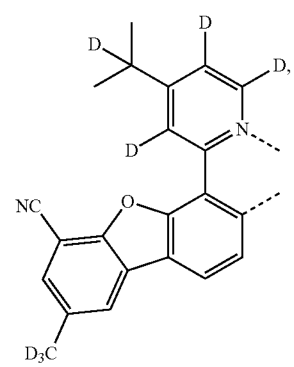
$L_{a315}$
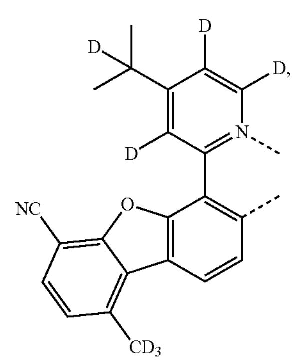

-continued
$L_{a316}$
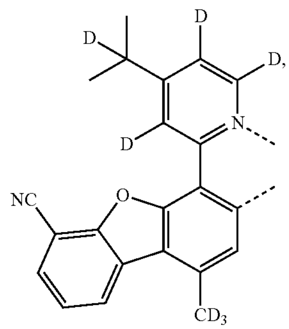
$L_{a317}$
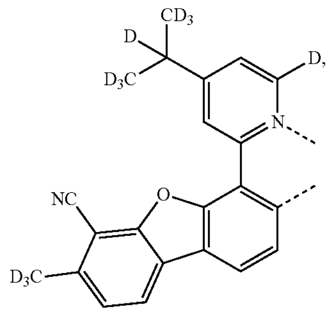
$L_{a318}$
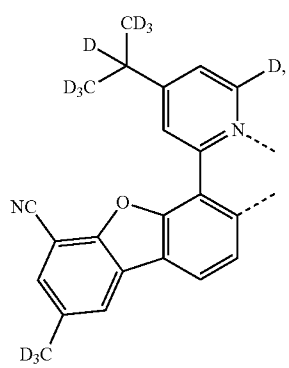
$L_{a319}$
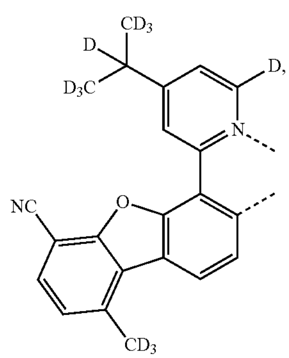
-continued
$L_{a320}$
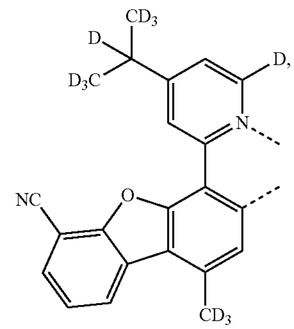
$L_{a321}$
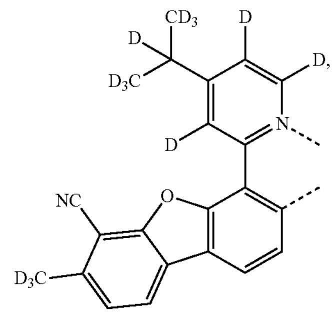
$L_{a322}$
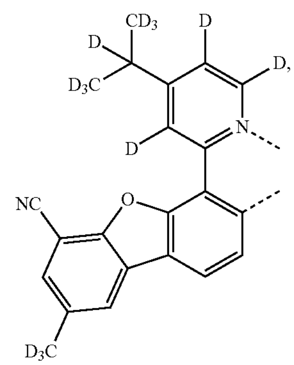
$L_{a323}$
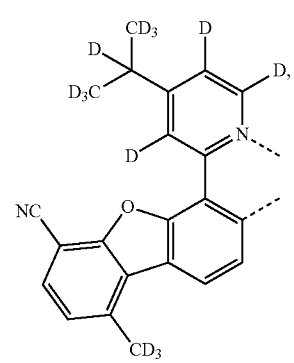

-continued
$L_{a324}$
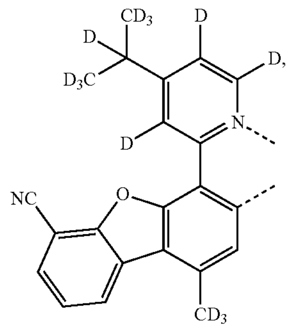
$L_{a325}$
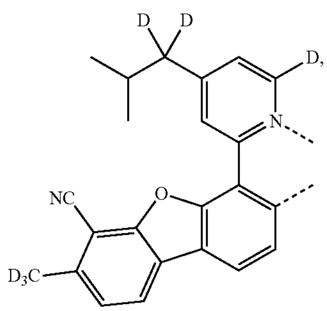
$L_{a326}$
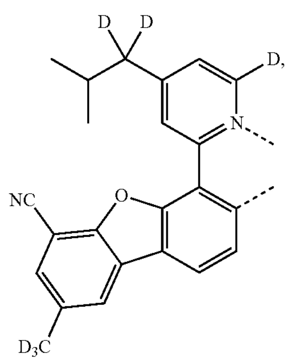
$L_{a327}$
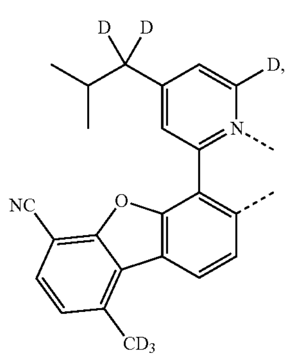
-continued
$L_{a328}$
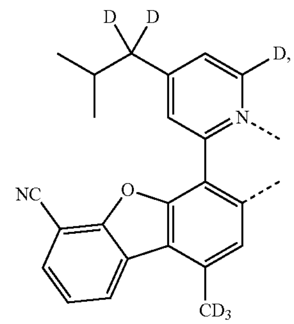
$L_{a329}$
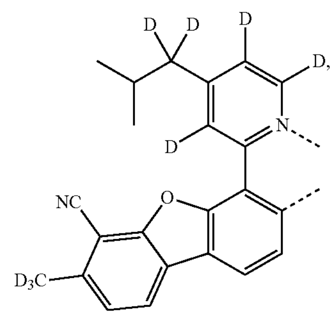
$L_{a330}$
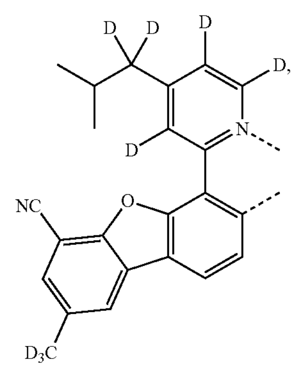
$L_{a331}$
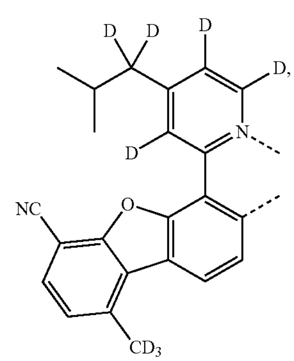

$L_{a332}$
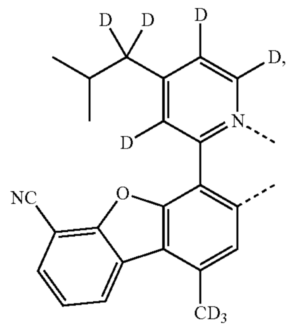
$L_{a333}$
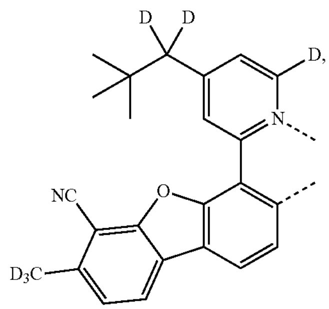
$L_{a334}$
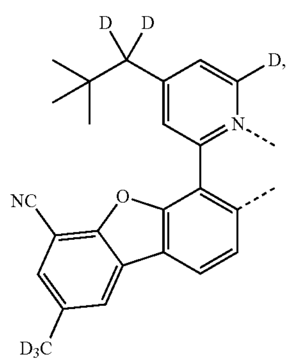
$L_{a335}$
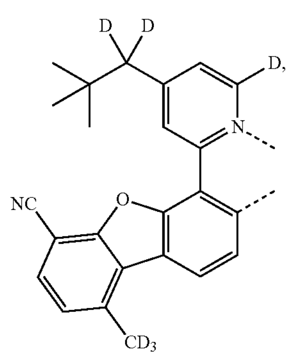
$L_{a336}$
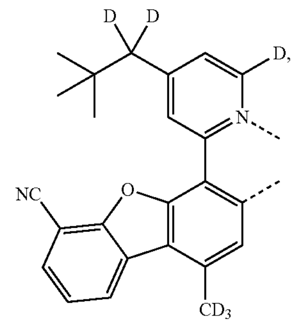
$L_{a337}$
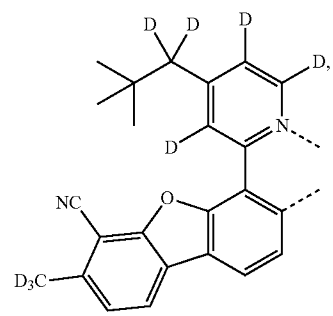
$L_{a338}$
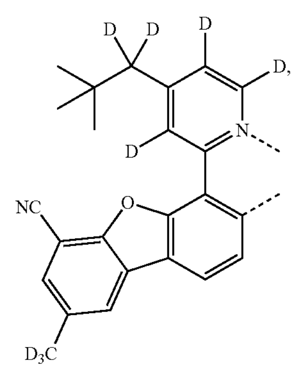
$L_{a339}$
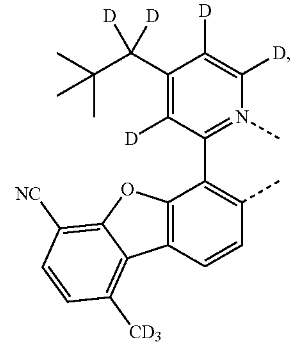

L_{a340}
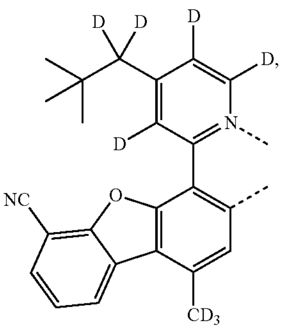
L_{a341}
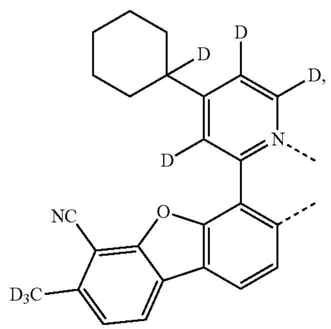
L_{a342}
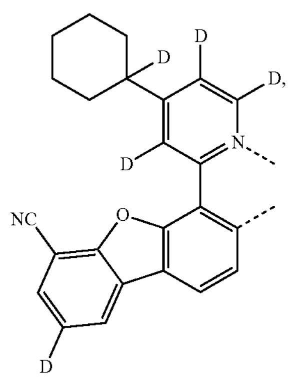
L_{a343}
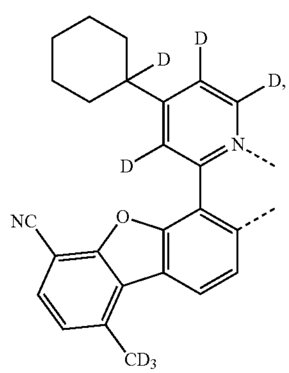
L_{a344}
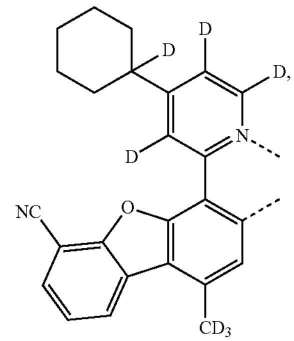
L_{a345}
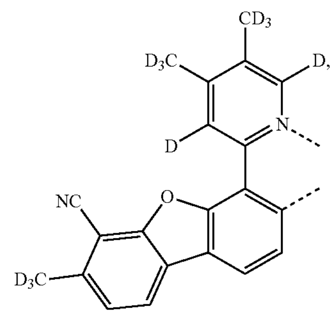
L_{a346}
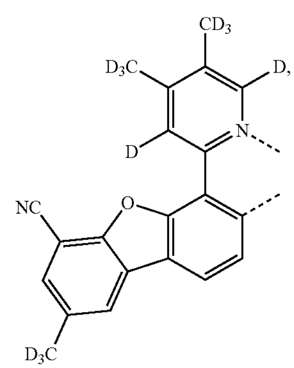
L_{a347}
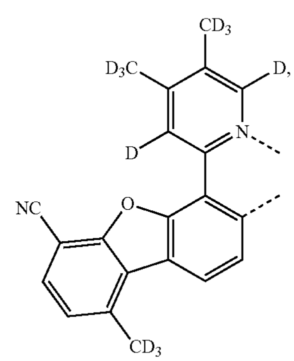

$L_{a348}$
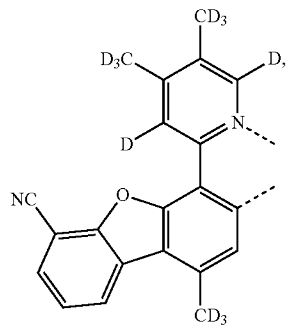
$L_{a349}$
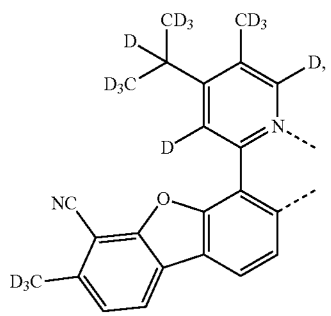
$L_{a350}$
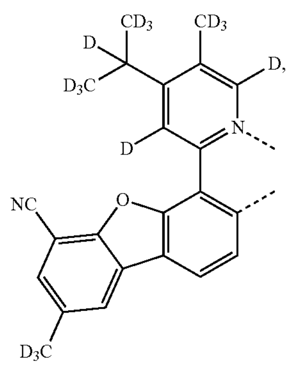
$L_{a351}$
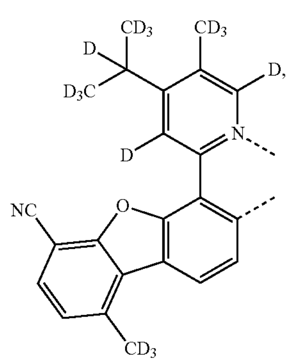
$L_{a352}$
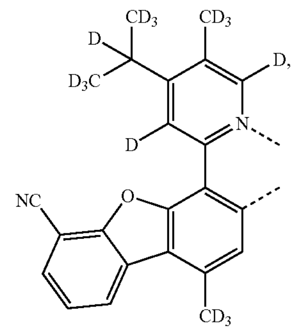
$L_{a353}$
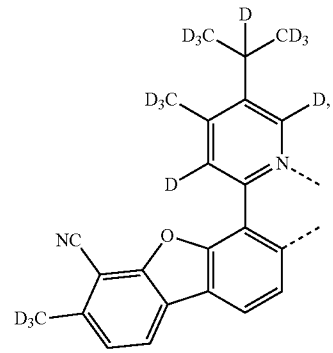
$L_{a354}$
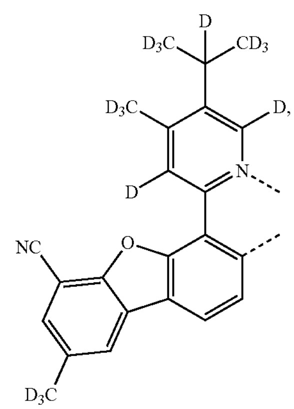
$L_{a355}$
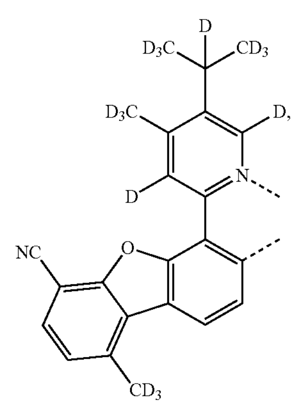

-continued
$L_{a356}$
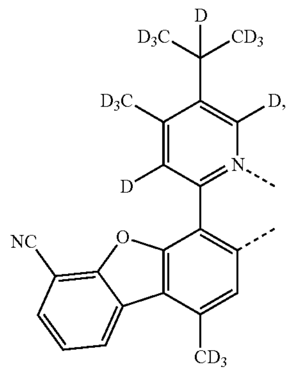
$L_{a357}$
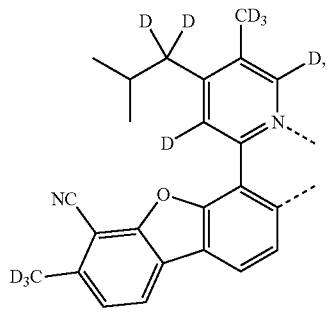
$L_{a358}$
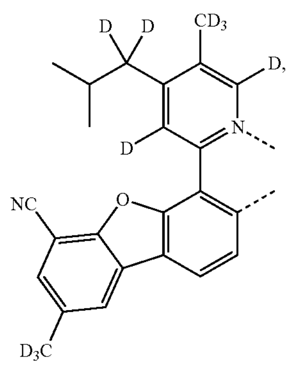
$L_{a359}$
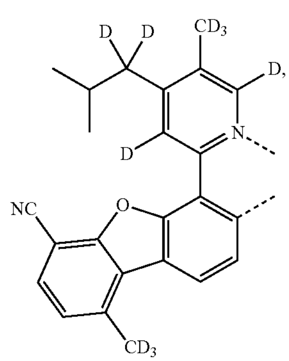
-continued
$L_{a360}$
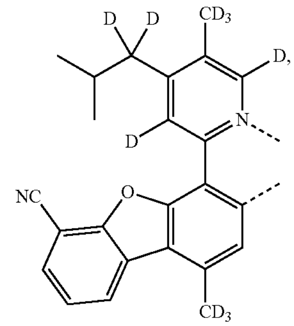
$L_{a361}$
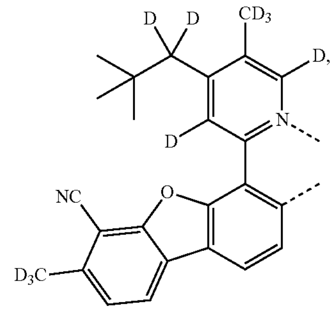
$L_{a362}$
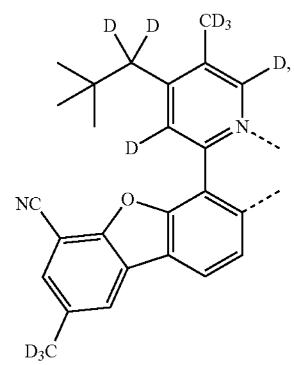
$L_{a363}$
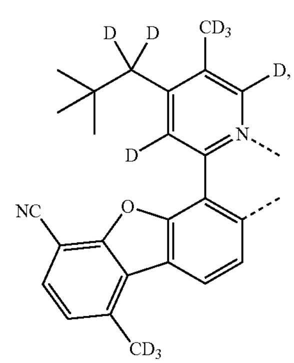

$L_{a364}$
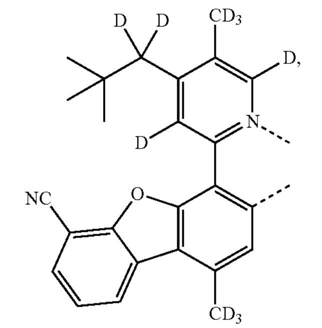
$L_{a365}$
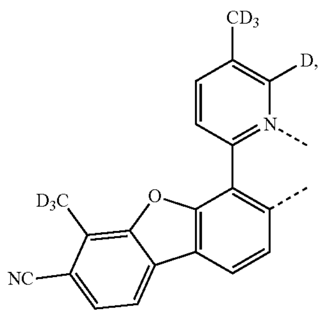
$L_{a366}$
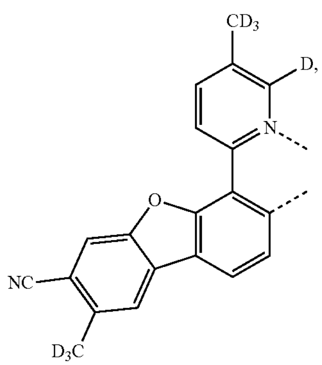
$L_{a367}$
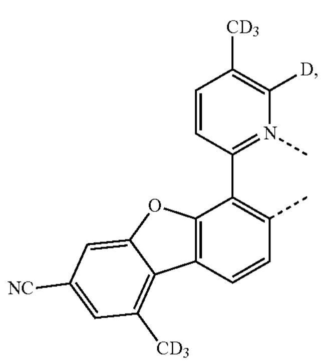
$L_{a368}$
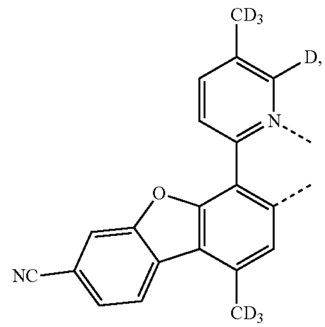
$L_{a369}$
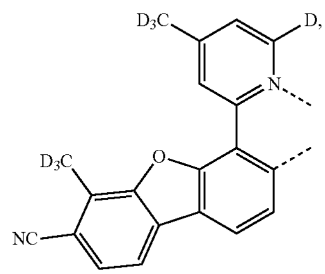
$L_{a370}$
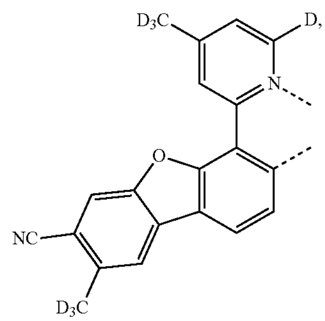
$L_{a371}$
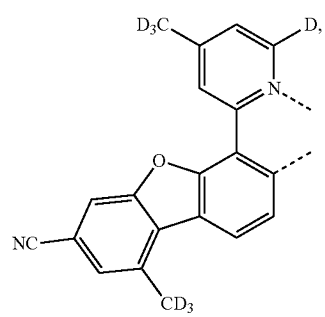
$L_{a372}$
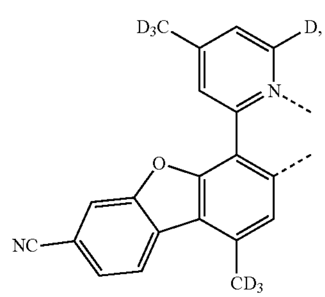

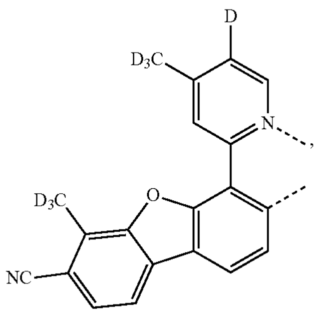
$L_{a373}$
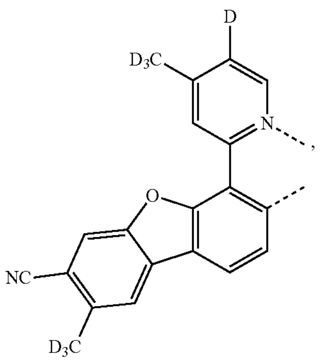
$L_{a374}$
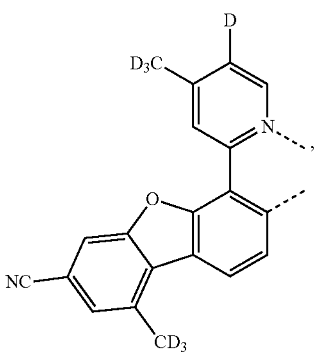
$L_{a375}$
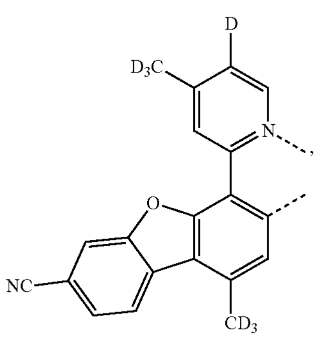
$L_{a376}$
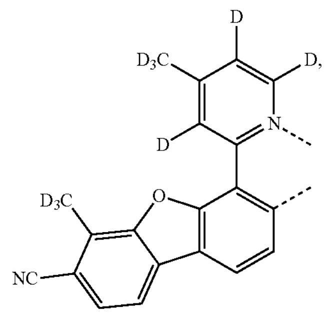
$L_{a377}$
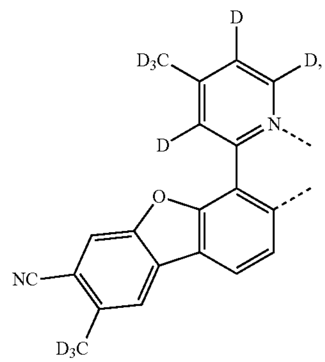
$L_{a378}$
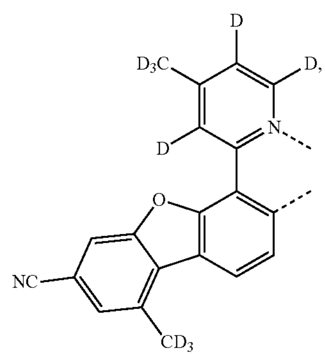
$L_{a379}$
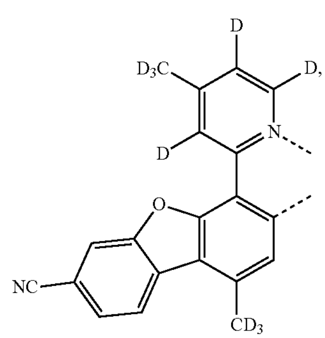
$L_{a380}$ -continued
$L_{a381}$
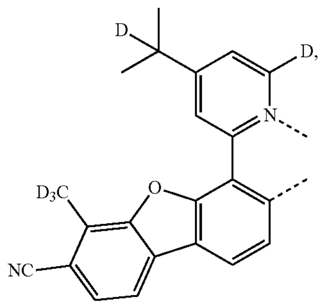
$L_{a382}$
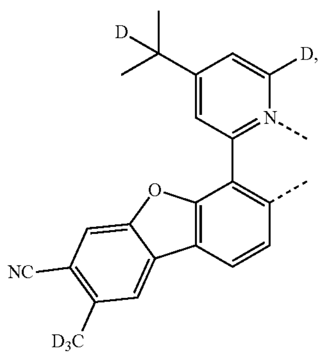
$L_{a383}$
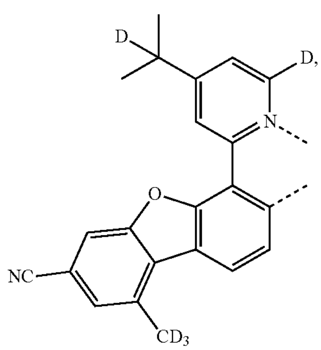
$L_{a384}$
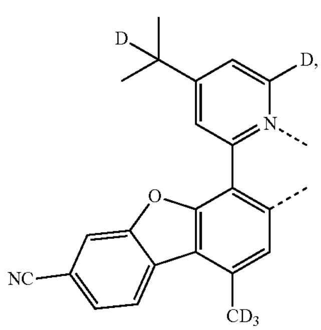
-continued
$L_{a385}$
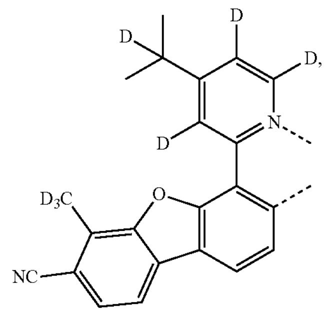
$L_{a386}$
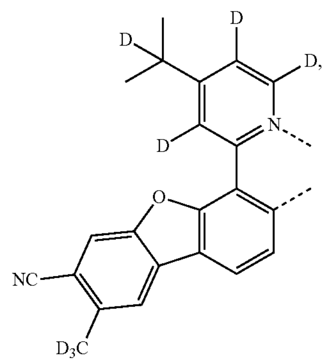
$L_{a387}$
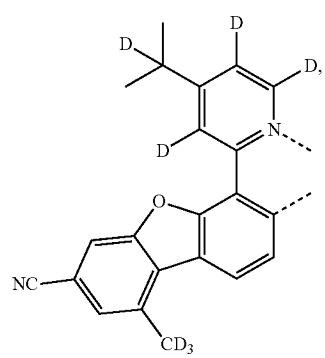
$L_{a388}$
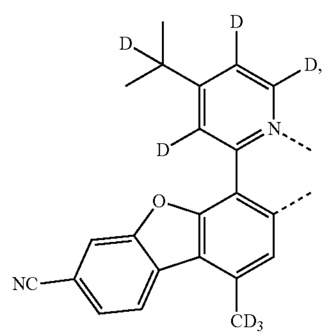

-continued
$L_{a389}$
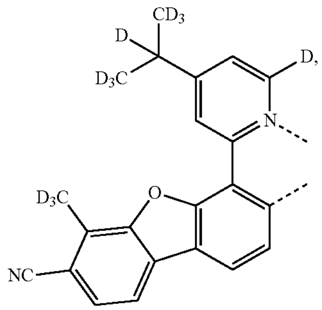
$L_{a390}$
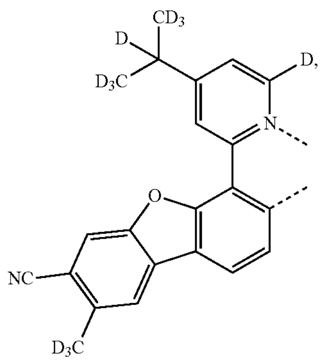
$L_{a391}$
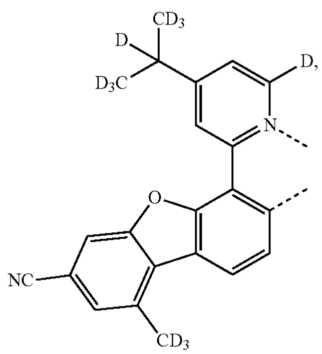
$L_{a392}$
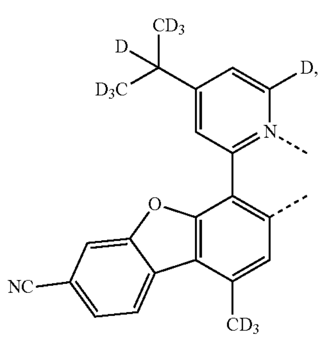
-continued
$L_{a393}$
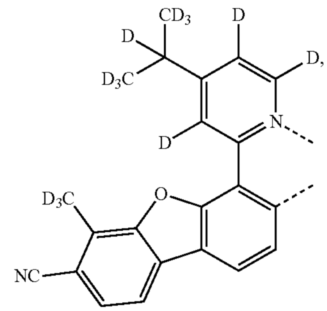
$L_{a394}$
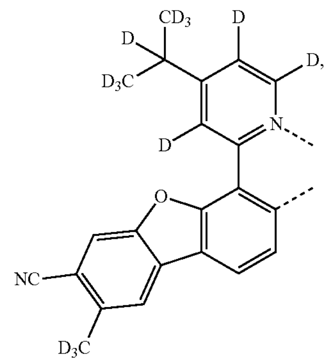
$L_{a395}$
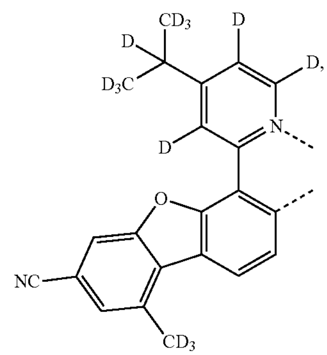
$L_{a396}$
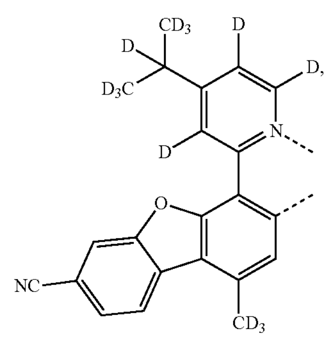

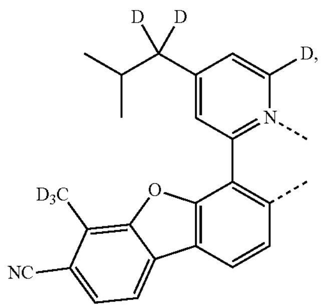
$L_{a397}$
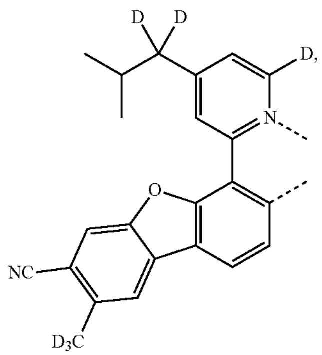
$L_{a398}$
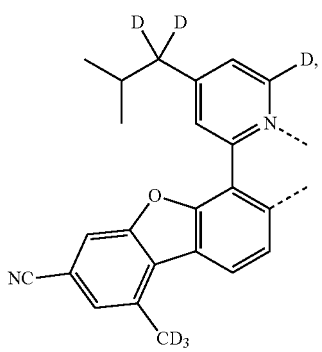
$L_{a399}$
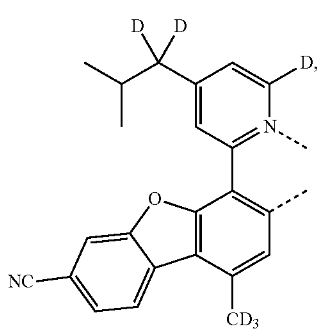
$L_{a400}$
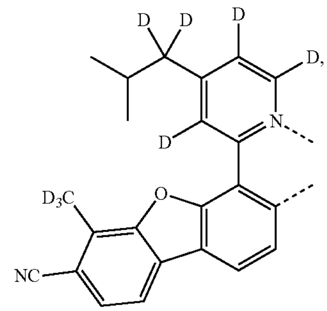
$L_{a401}$
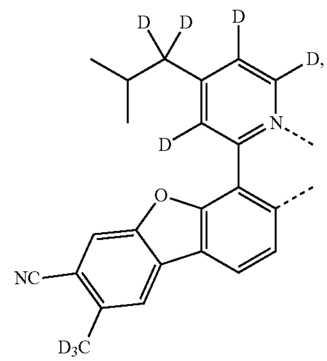
$L_{a402}$
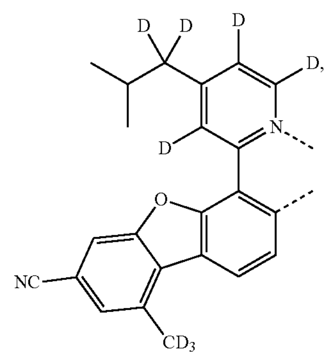
$L_{a403}$
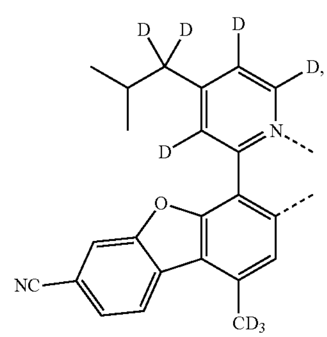
$L_{a404}$ -continued
$L_{a405}$
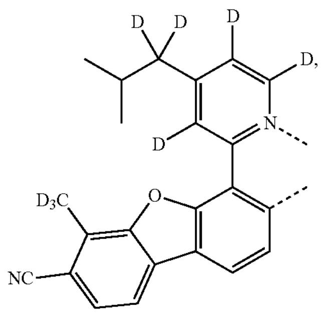
$L_{a406}$
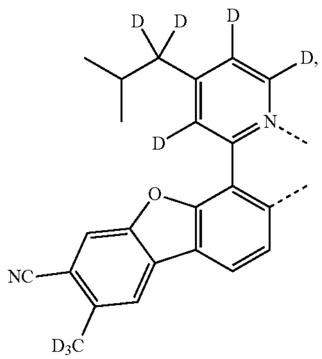
$L_{a407}$
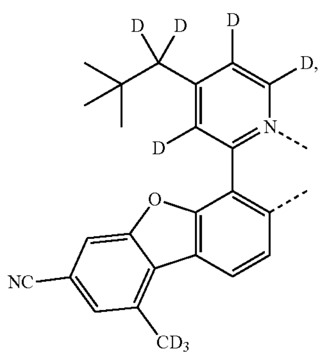
$L_{a408}$
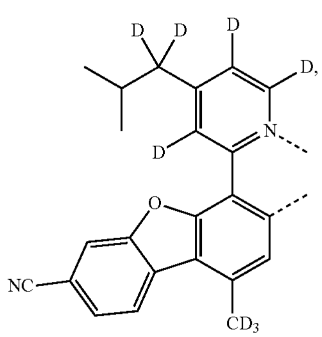
-continued
$L_{a409}$
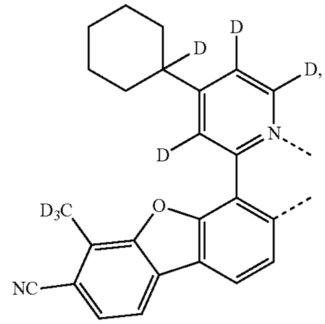
$L_{a410}$
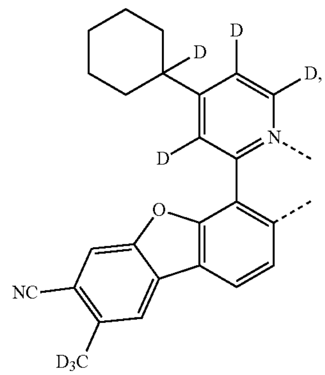
$L_{a411}$
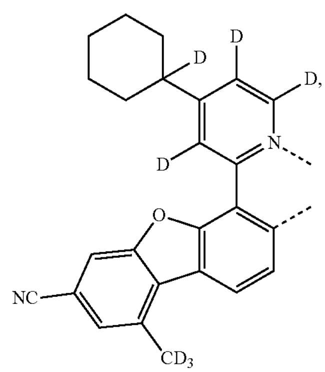
$L_{a412}$
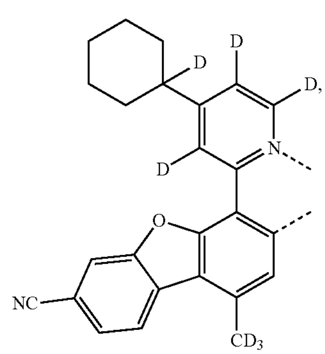

-continued
$L_{a413}$
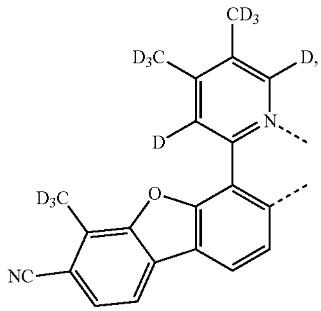
$L_{a414}$
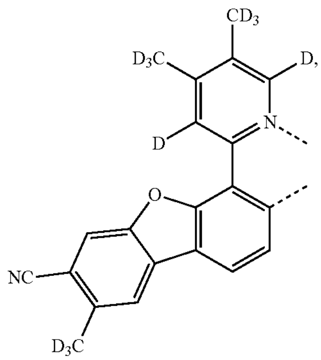
$L_{a415}$
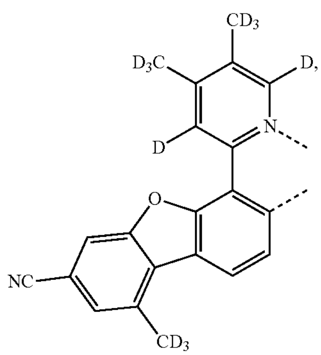
$L_{a416}$
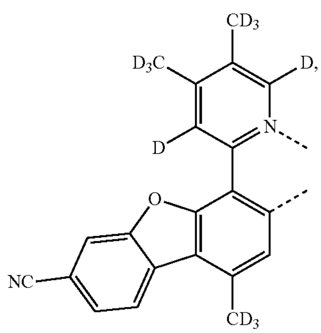
-continued
$L_{a417}$
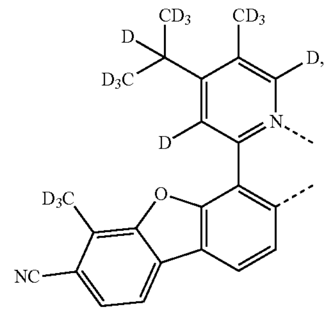
$L_{a418}$
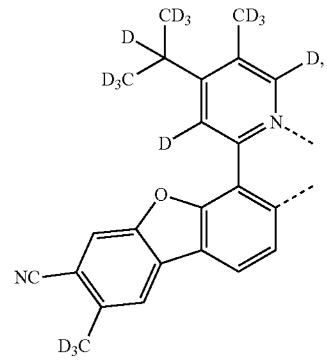
$L_{a419}$
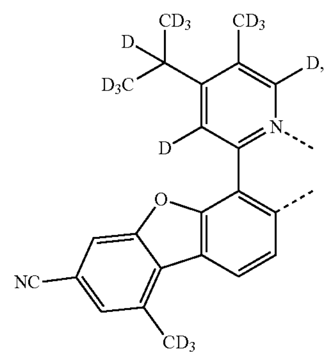
$L_{a420}$
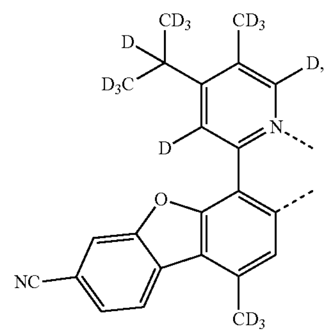

-continued
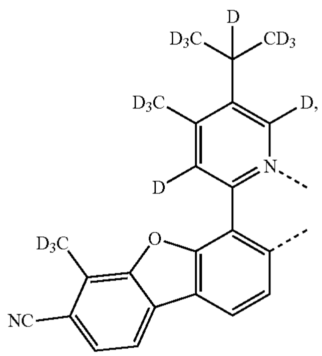
$L_{a421}$
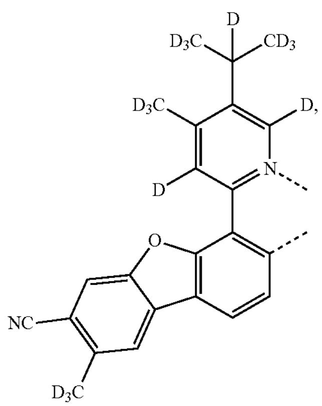
$L_{a422}$
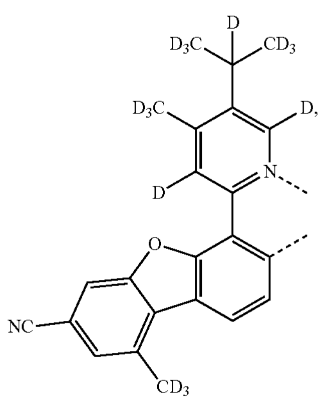
$L_{a423}$
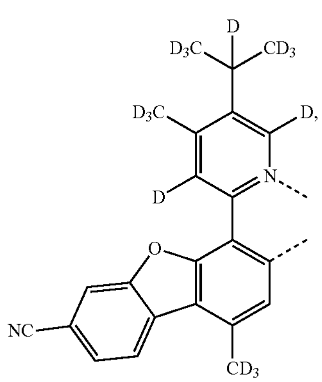
$L_{a424}$
-continued
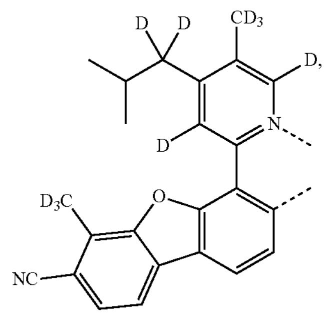
$L_{a425}$
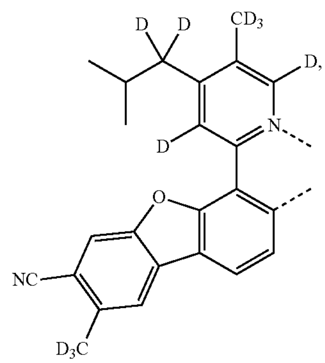
$L_{a426}$
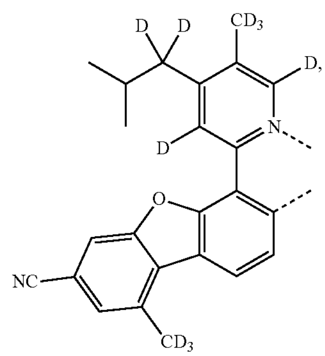
$L_{a427}$
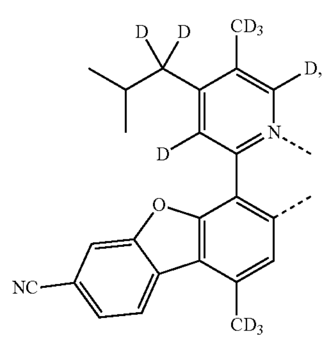
$L_{a428}$ $L_{a429}$
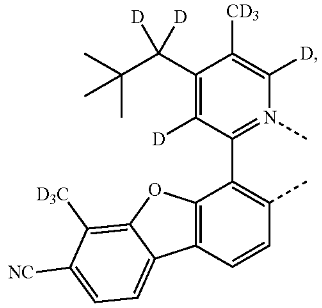
$L_{a430}$
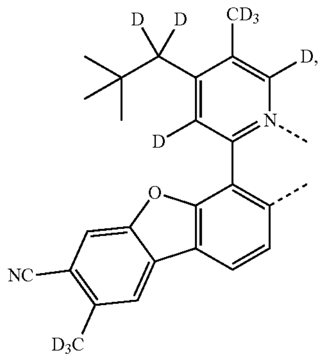
$L_{a431}$
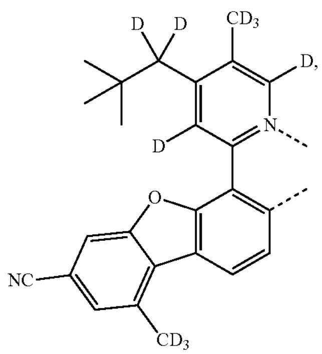
$L_{a432}$
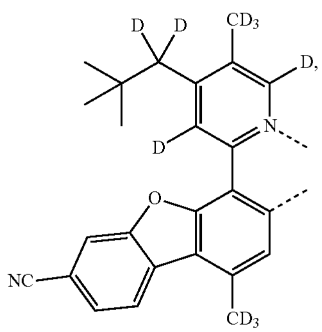
$L_{a433}$
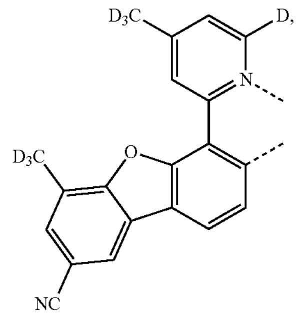
$L_{a434}$
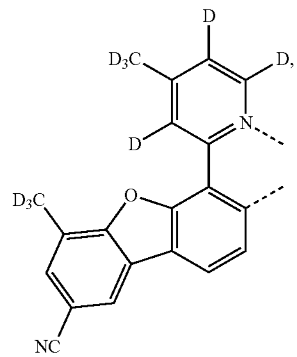
$L_{a435}$
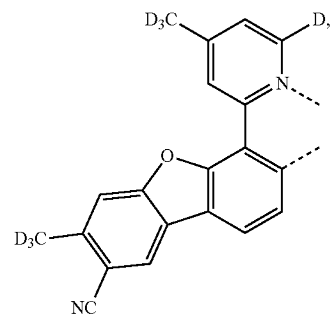
$L_{a436}$
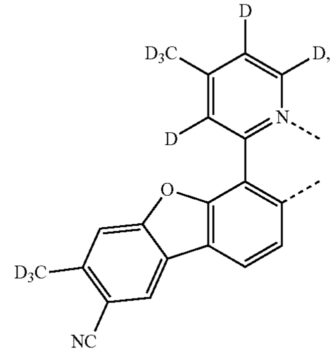

-continued
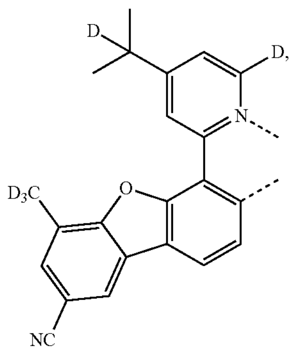
$L_{a437}$
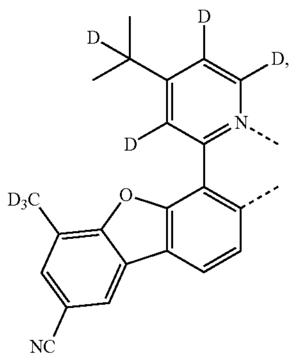
$L_{a438}$
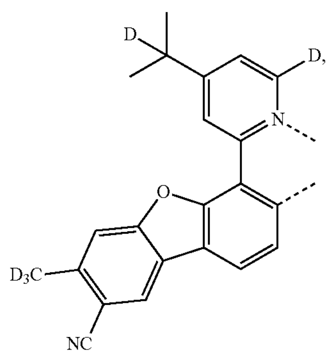
$L_{a439}$
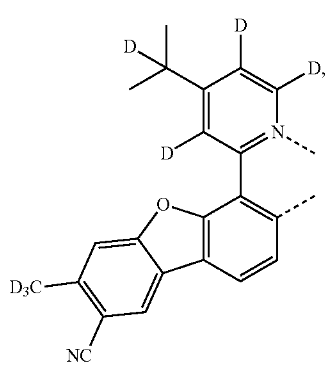
$L_{a440}$
-continued
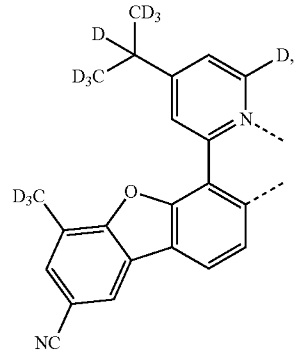
$L_{a441}$
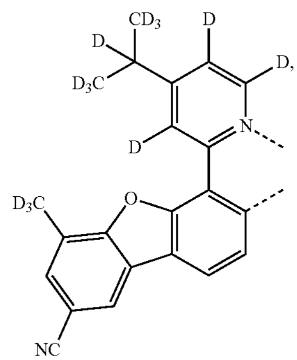
$L_{a442}$
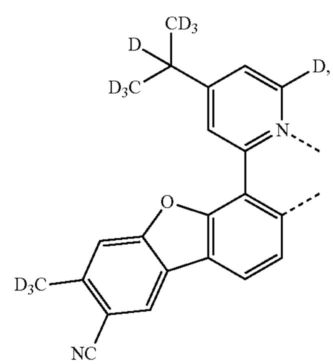
$L_{a443}$
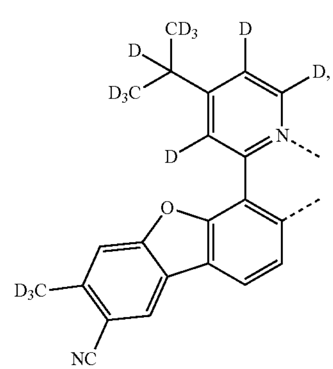
$L_{a444}$

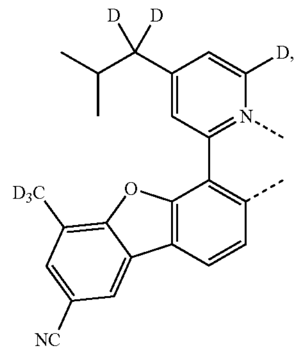
$L_{a445}$
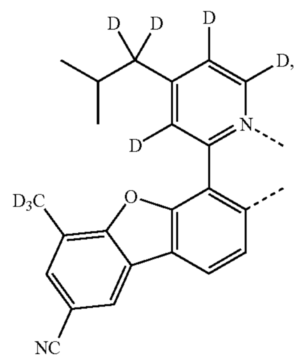
$L_{a446}$
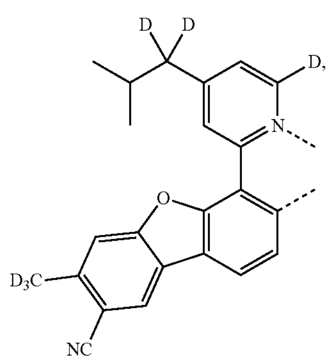
$L_{a447}$
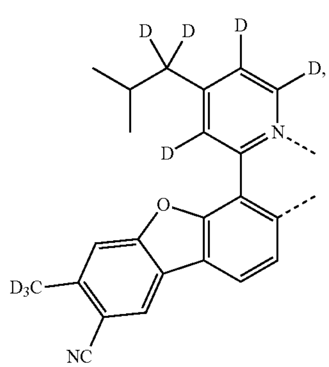
$L_{a448}$
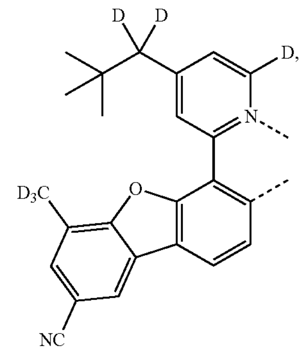
$L_{a449}$
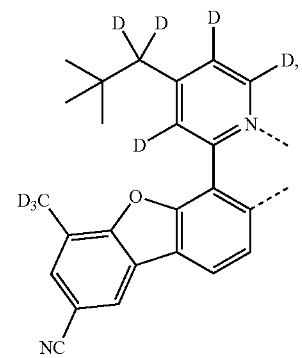
$L_{a450}$
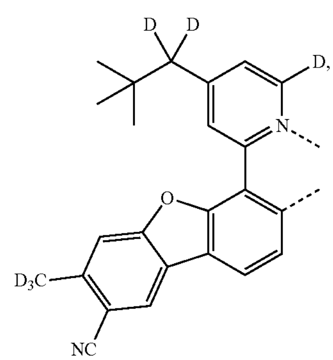
$L_{a451}$
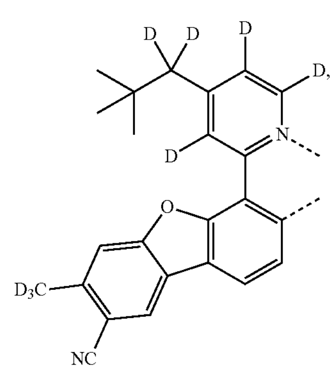
$L_{a452}$ -continued
$L_{a453}$
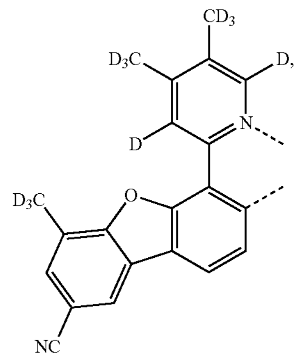
$L_{a454}$
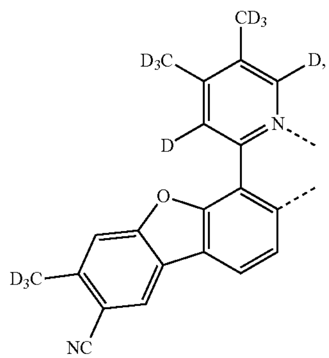
$L_{a455}$
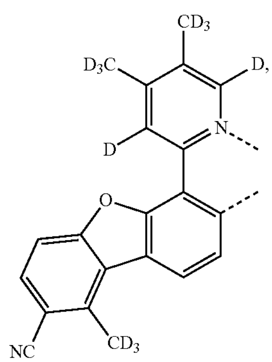
$L_{a456}$
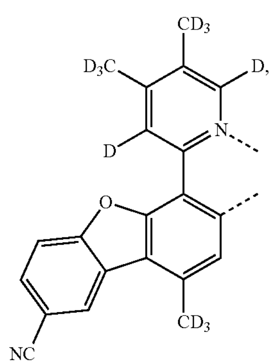
-continued
$L_{a457}$
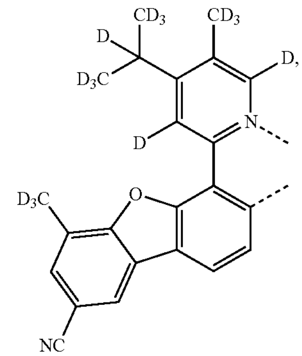
$L_{a458}$
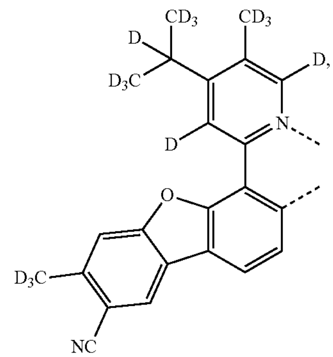
$L_{a459}$
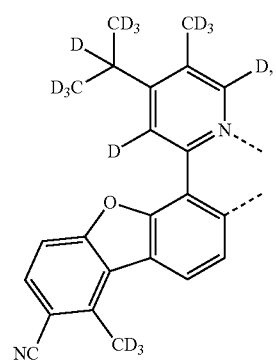
$L_{a460}$
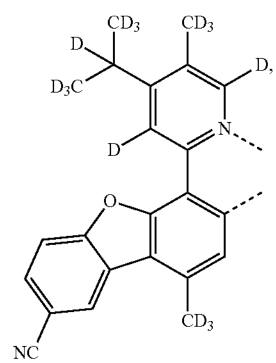

-continued
$L_{a461}$
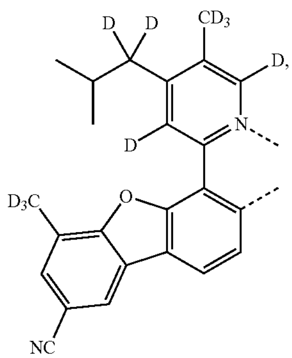
$L_{a462}$
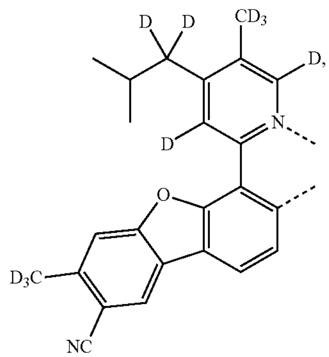
$L_{a463}$
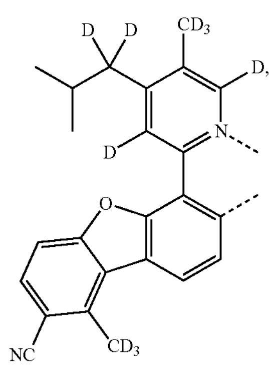
$L_{a464}$
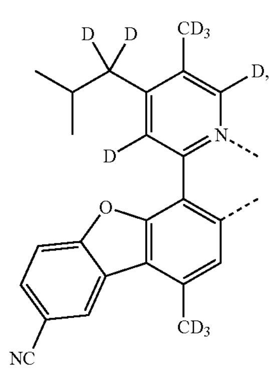
-continued
$L_{a465}$
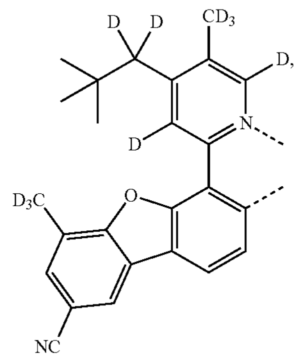
$L_{a466}$
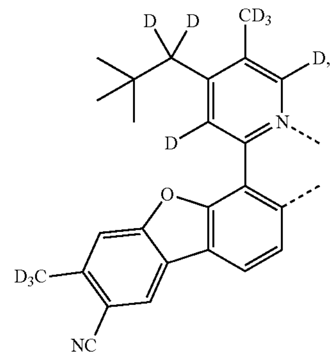
$L_{a467}$
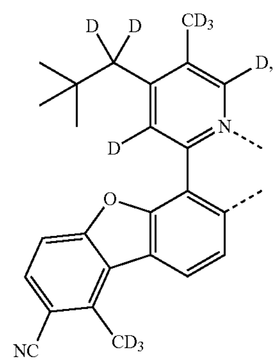
$L_{a468}$
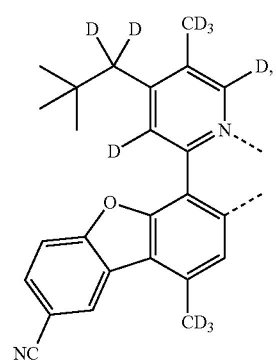

$L_{a469}$
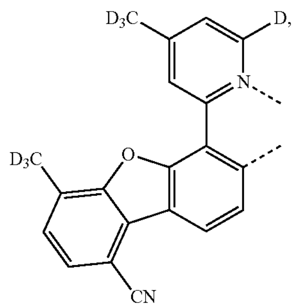
$L_{a470}$
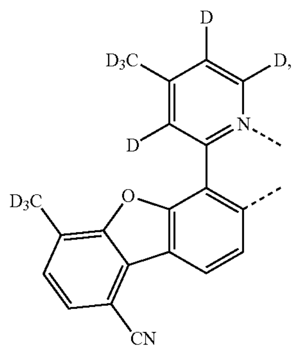
$L_{a471}$
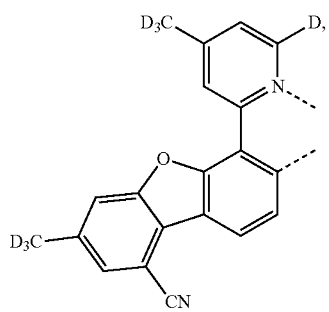
$L_{a472}$
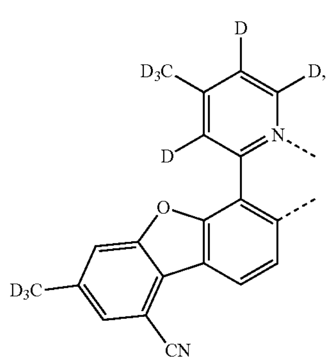
$L_{a473}$
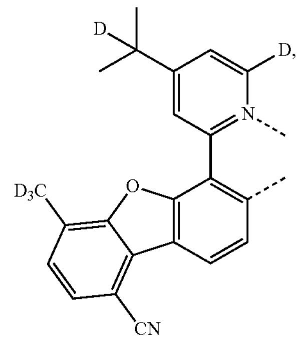
$L_{a474}$
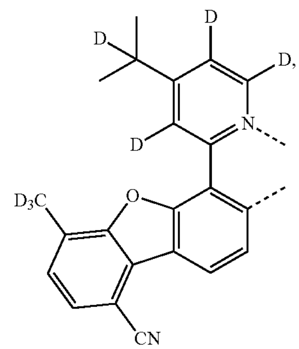
$L_{a475}$
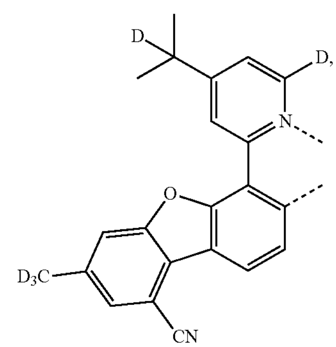
$L_{a476}$
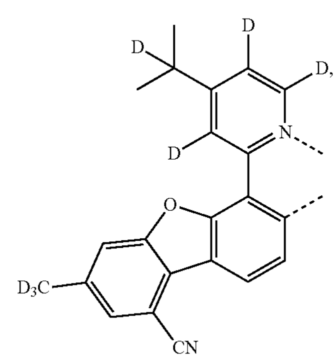

-continued
L$_{a477}$
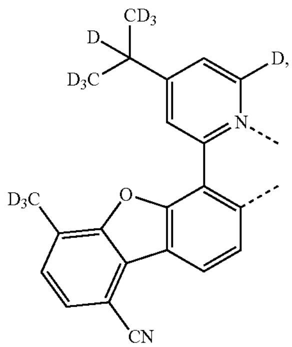
L$_{a478}$
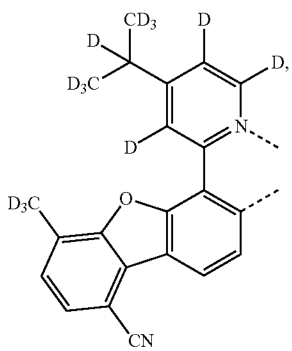
L$_{a479}$
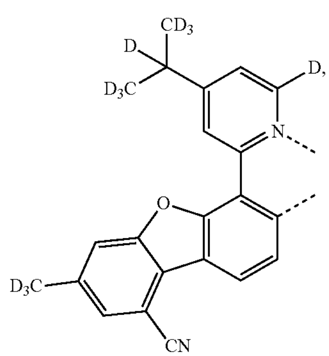
L$_{a480}$
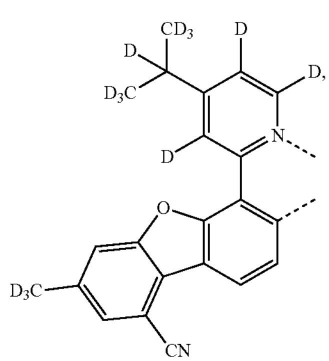
-continued
L$_{a481}$
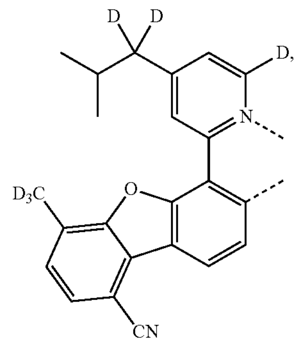
L$_{a482}$
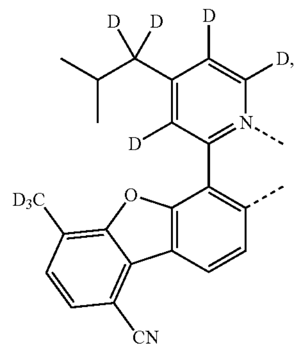
L$_{a483}$
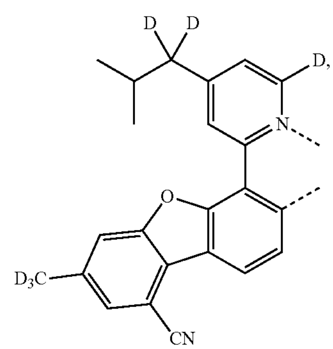
L$_{a484}$
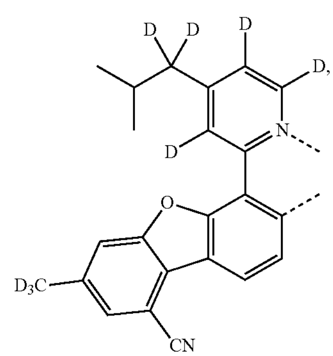

-continued
$L_{a485}$
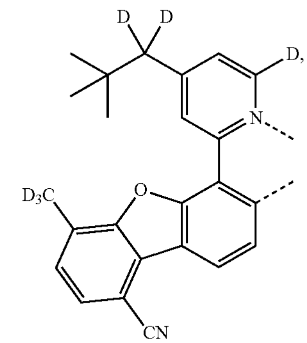
$L_{a486}$
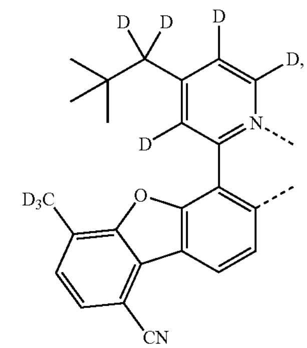
$L_{a487}$
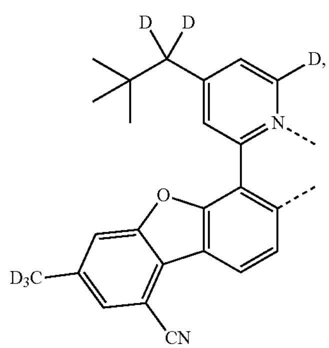
$L_{a488}$
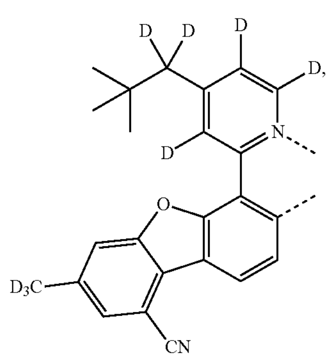
-continued
$L_{a489}$
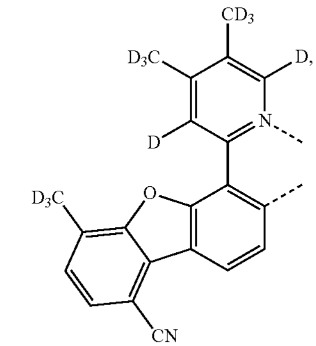
$L_{a490}$
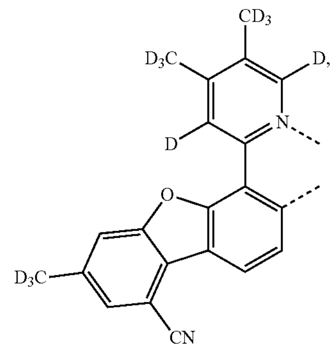
$L_{a491}$
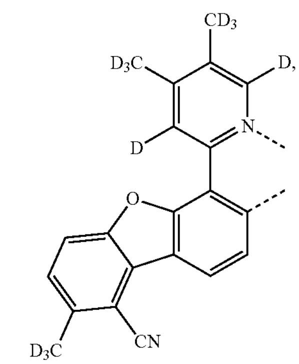
$L_{a492}$
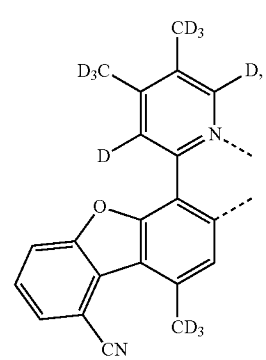

-continued
$L_{a493}$
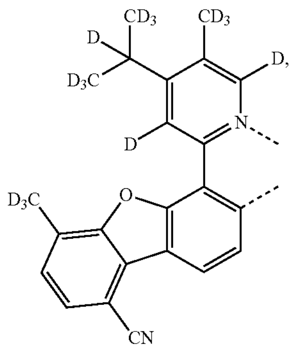
$L_{a494}$
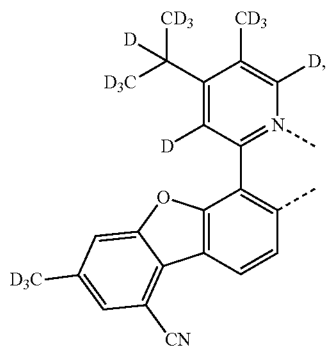
$L_{a495}$
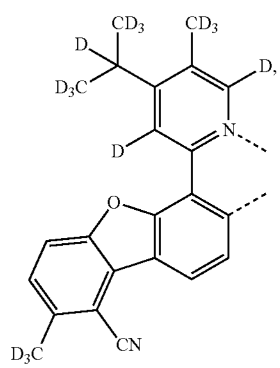
$L_{a496}$
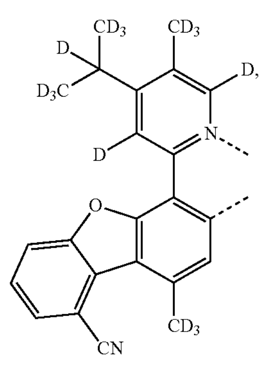
-continued
$L_{a497}$
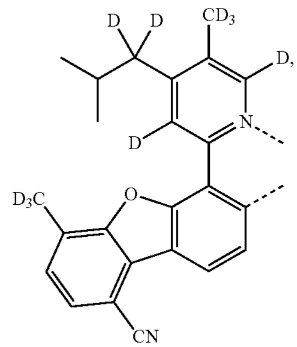
$L_{a498}$
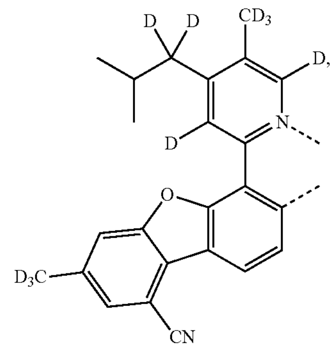
$L_{a499}$
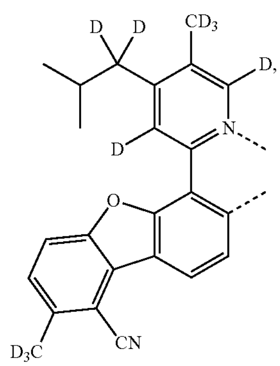
$L_{a500}$
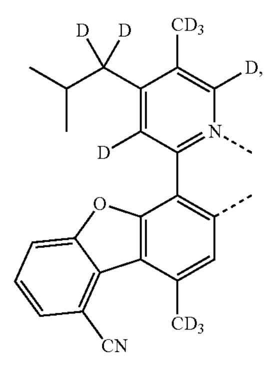

-continued
L$_{a501}$
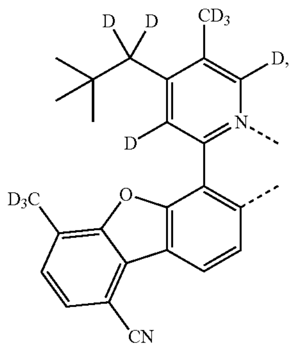
L$_{a502}$
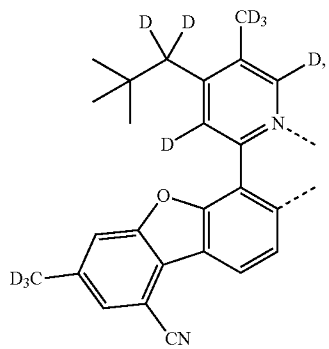
L$_{a503}$
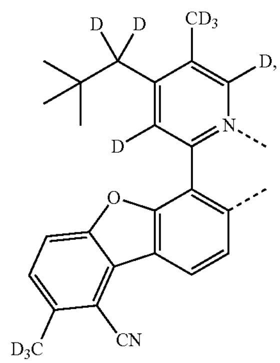
L$_{a504}$
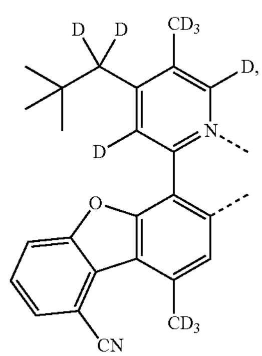
-continued
L$_{a505}$
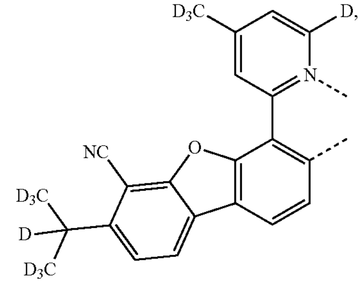
L$_{a506}$
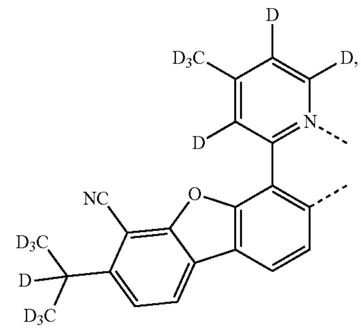
L$_{a507}$
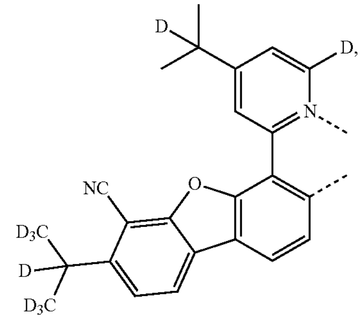
L$_{a508}$
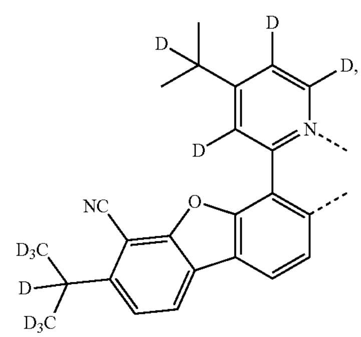
L$_{a509}$
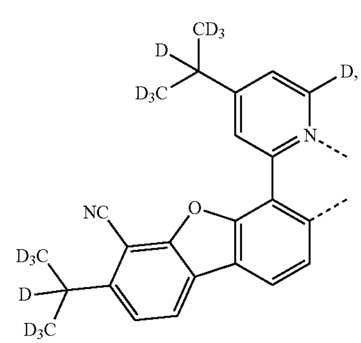

-continued
$L_{a510}$
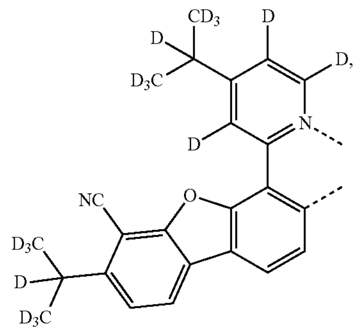
$L_{a511}$
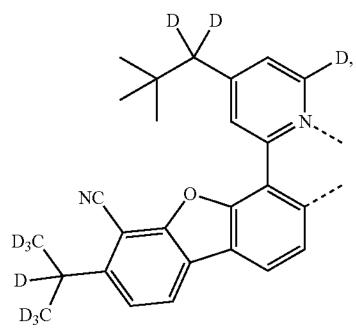
$L_{a512}$
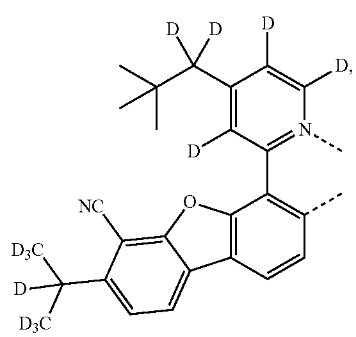
$L_{a513}$
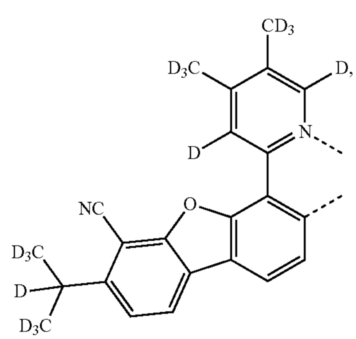
-continued
$L_{a514}$
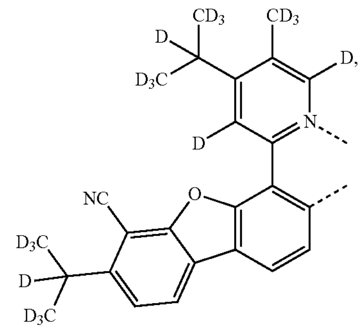
$L_{a515}$
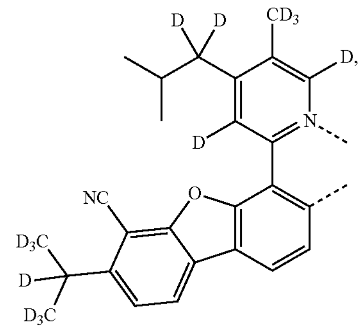
$L_{a516}$
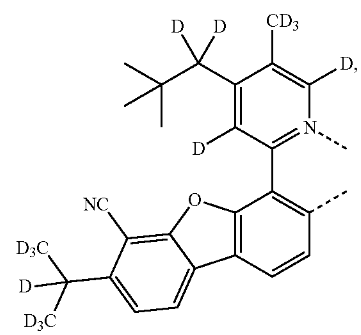
$L_{a517}$
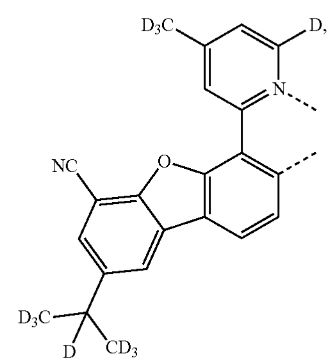

-continued
$L_{a518}$
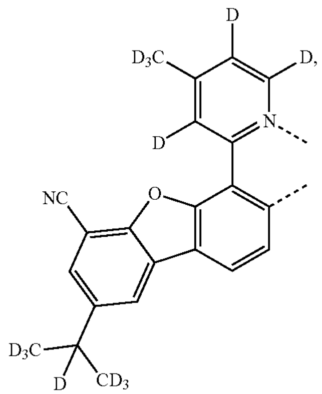
$L_{a519}$
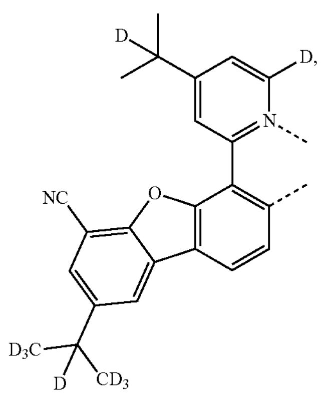
$L_{a520}$
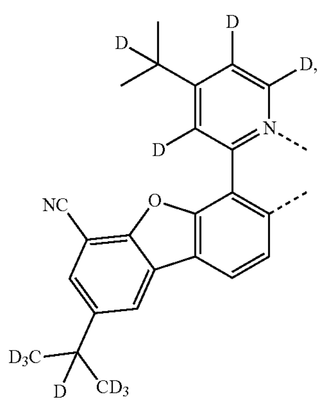
$L_{a521}$
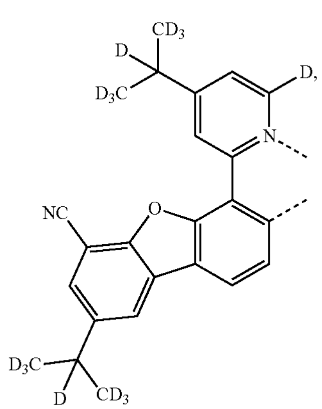
-continued
$L_{a522}$
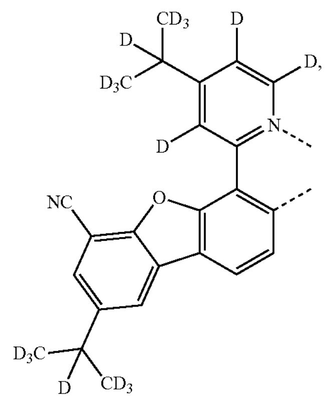
$L_{a523}$
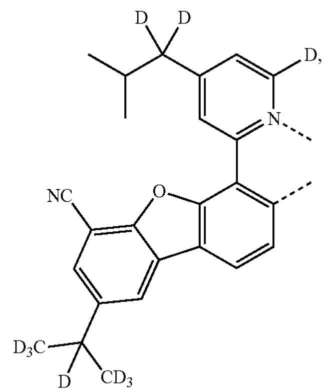
$L_{a524}$
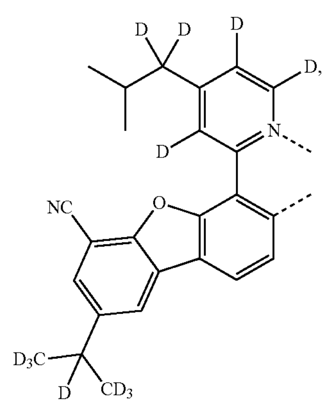
$L_{a525}$
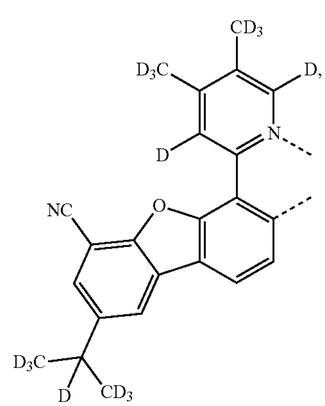

-continued
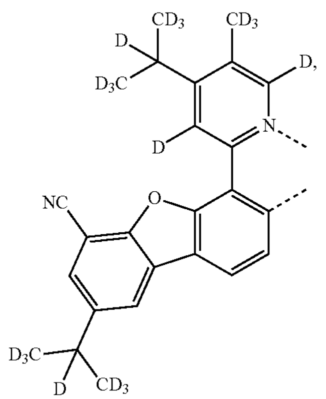
$L_{a526}$
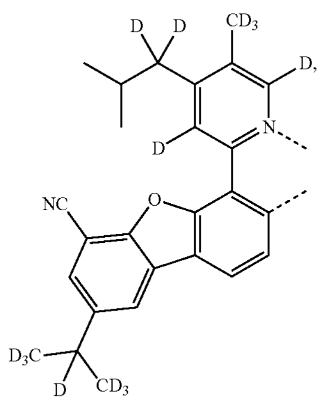
$L_{a527}$
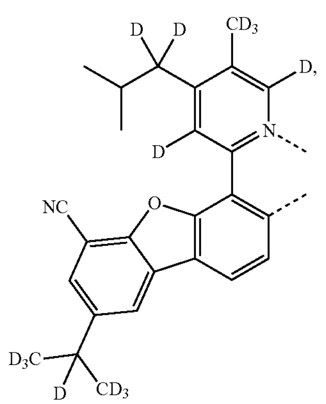
$L_{a528}$
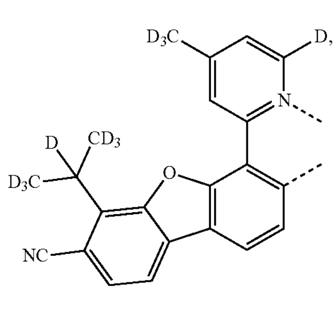
$L_{a529}$
-continued
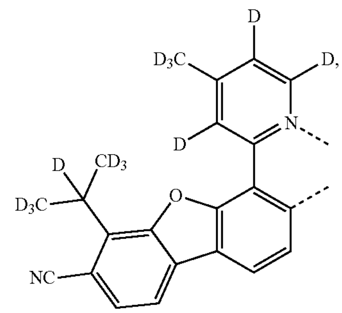
$L_{a530}$
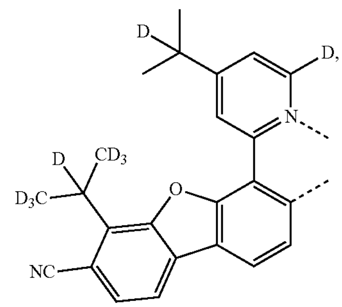
$L_{a531}$
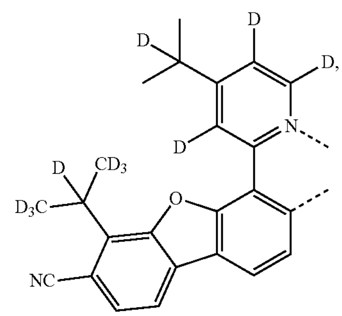
$L_{a532}$
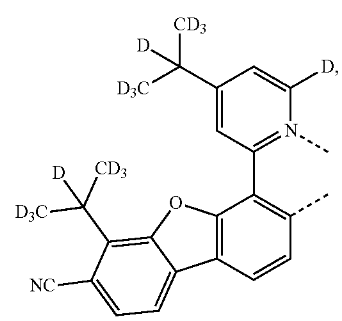
$L_{a533}$
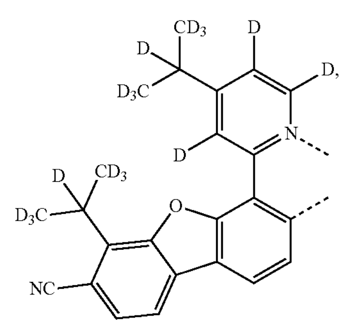
$L_{a534}$ -continued
$L_{a535}$
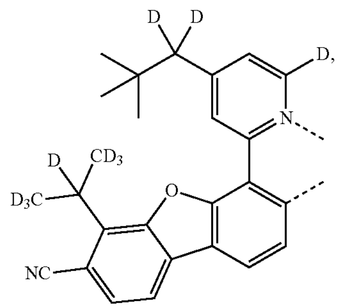
$L_{a536}$
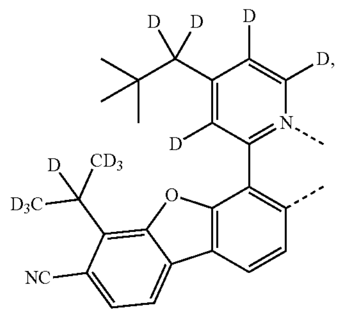
$L_{a537}$
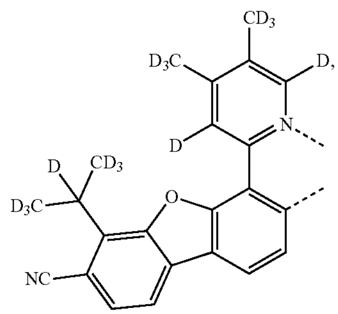
$L_{a538}$
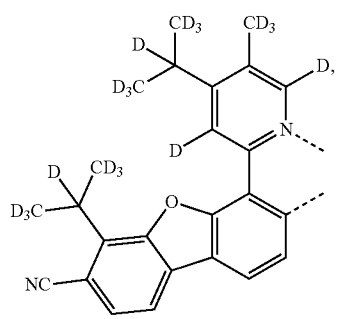
$L_{a539}$
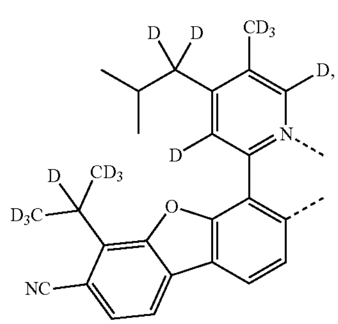
-continued
$L_{a540}$
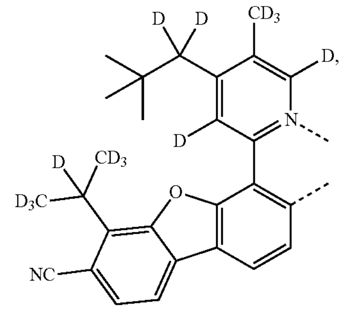
$L_{a541}$
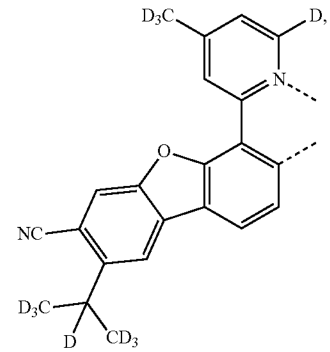
$L_{a542}$
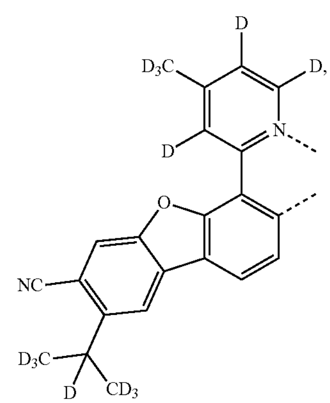
$L_{a543}$
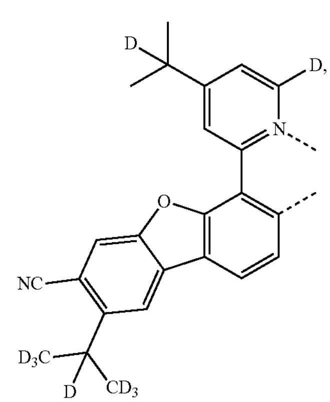

-continued
$L_{a544}$
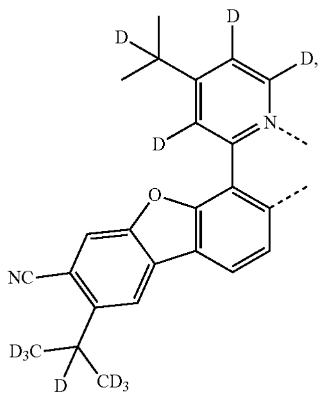
$L_{a545}$
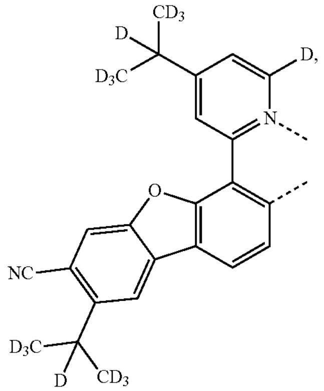
$L_{a546}$
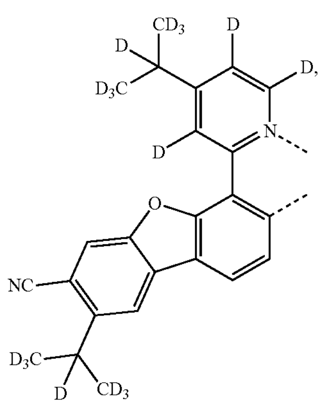
$L_{a547}$
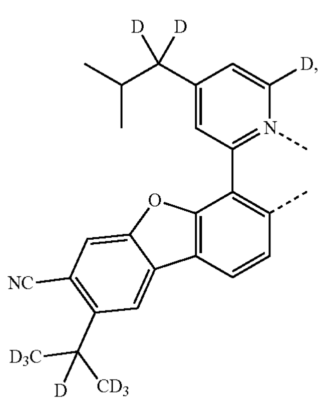
-continued
$L_{a548}$
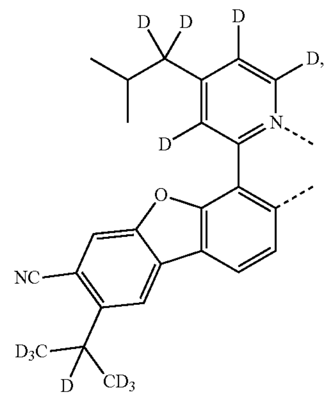
$L_{a549}$
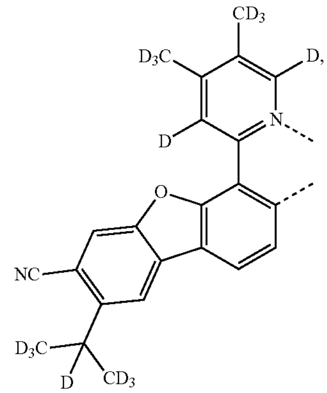
$L_{a550}$
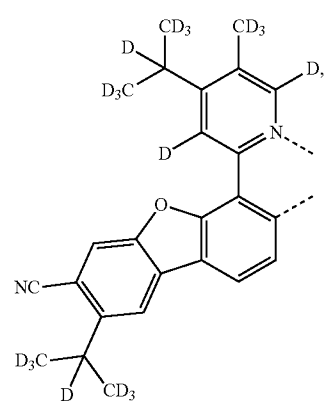
$L_{a551}$
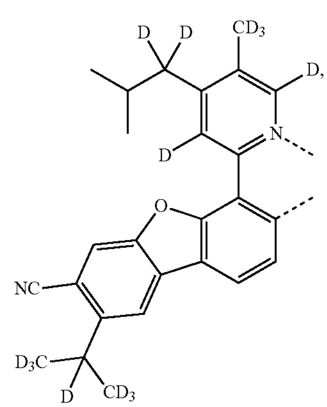

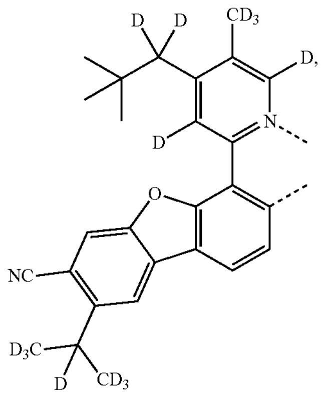
$L_{a552}$
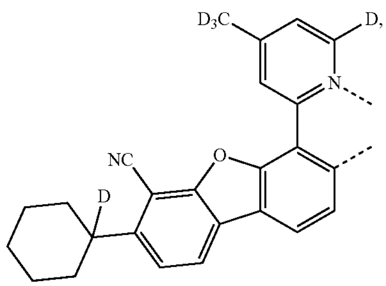
$L_{a553}$
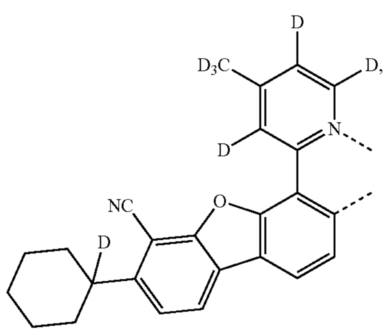
$L_{a554}$
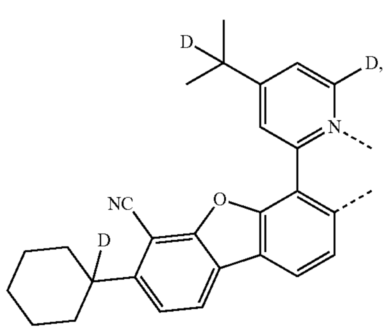
$L_{a555}$
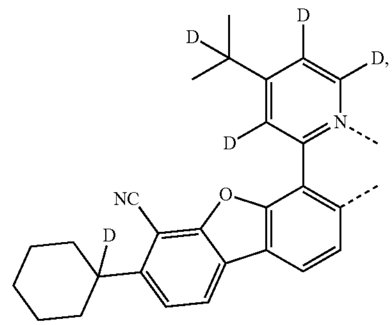
$L_{a556}$
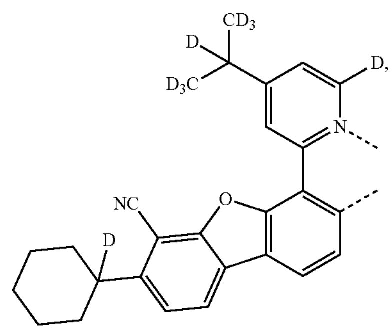
$L_{a557}$
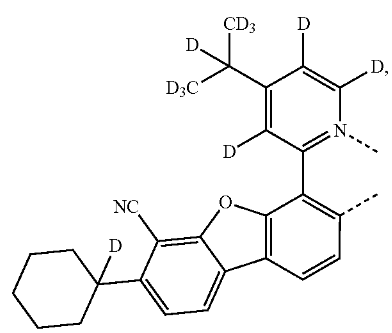
$L_{a558}$
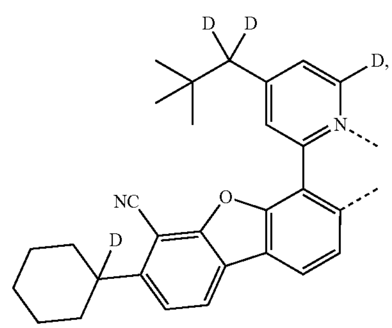
$L_{a559}$ -continued
L$_{a560}$
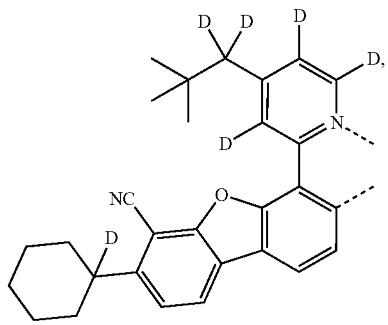
L$_{a561}$
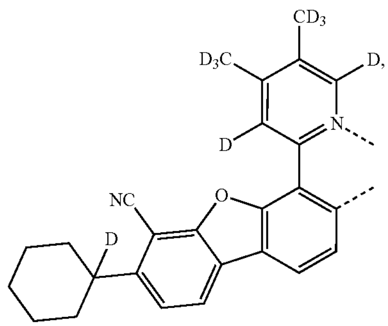
L$_{a562}$
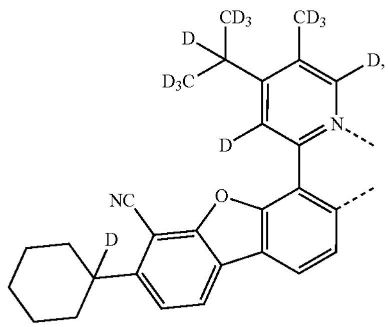
L$_{a563}$
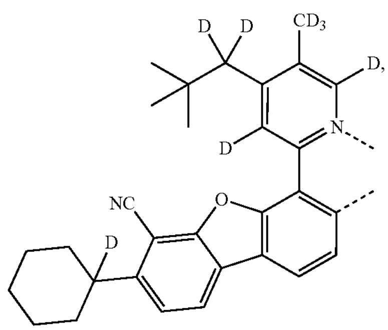
L$_{a564}$
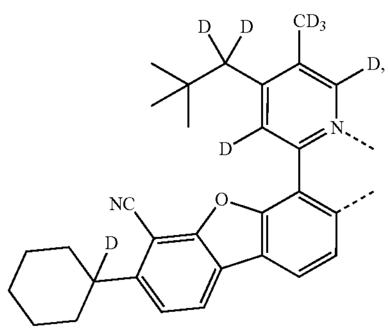
-continued
L$_{a565}$
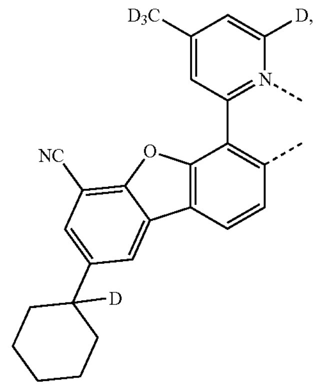
L$_{a566}$
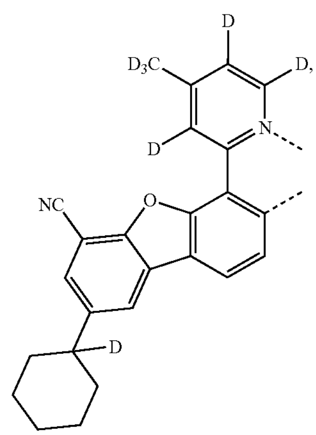
L$_{a567}$
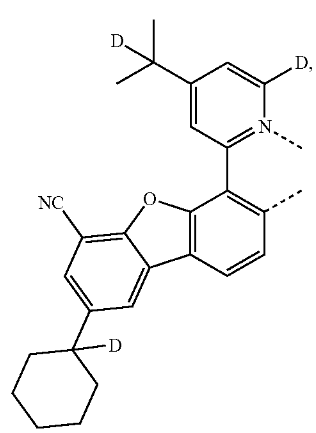

-continued
$L_{a568}$
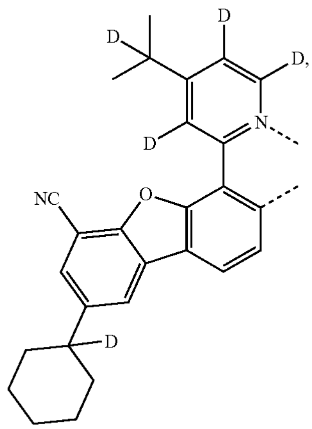
$L_{a569}$
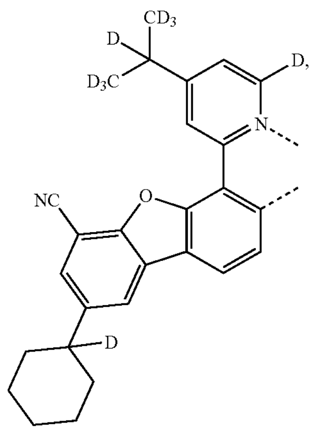
$L_{a570}$
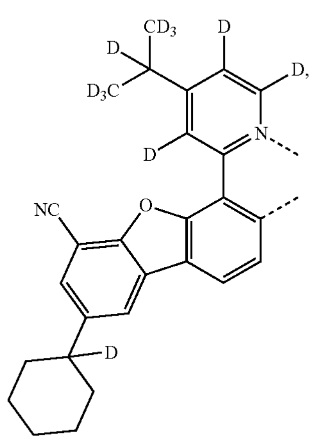
-continued
$L_{a571}$
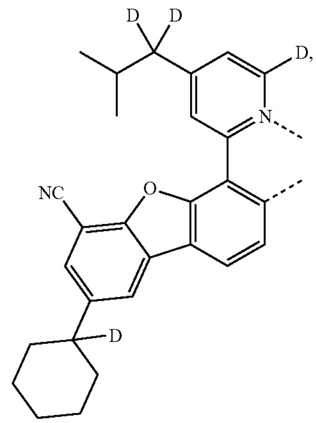
$L_{a572}$
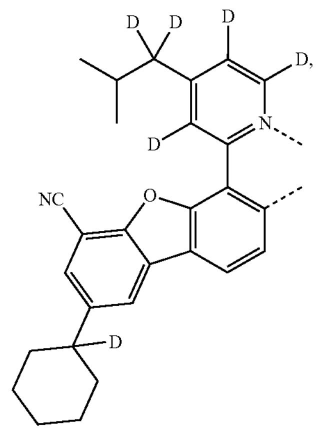
$L_{a573}$
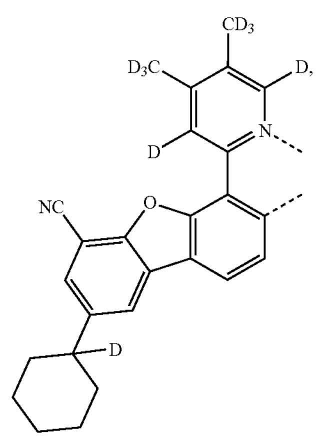

$L_{a574}$
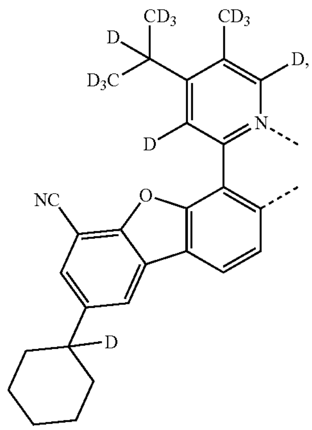
$L_{a575}$
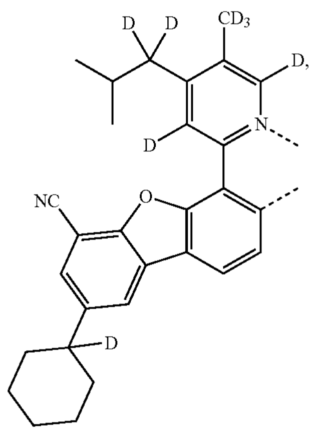
$L_{a576}$
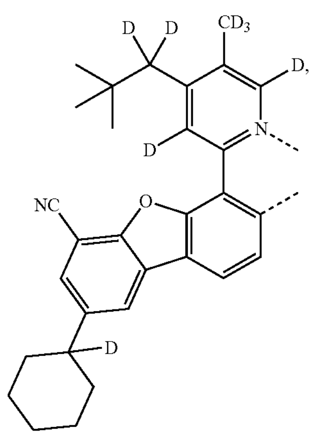
$L_{a577}$
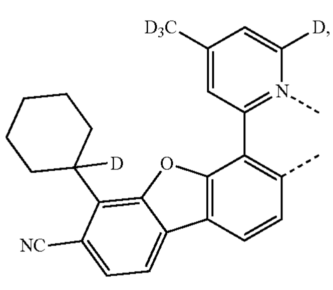
$L_{a578}$
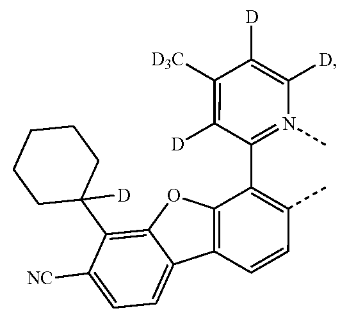
$L_{a579}$
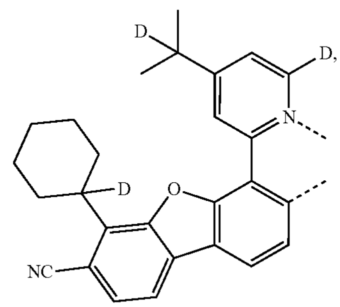
$L_{a580}$
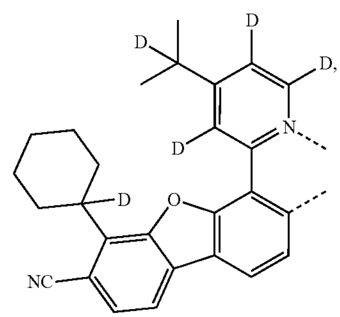
$L_{a581}$
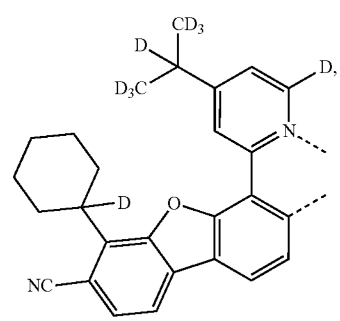
$L_{a582}$
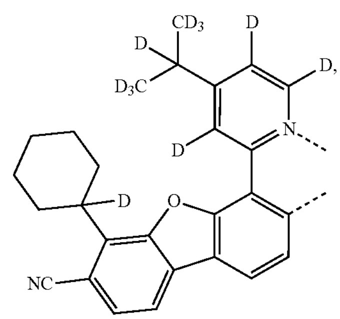

-continued
$L_{a583}$
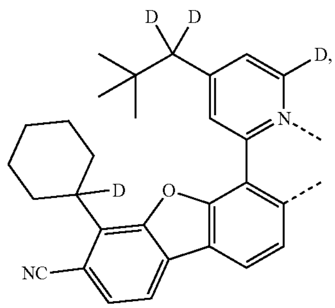
$L_{a584}$
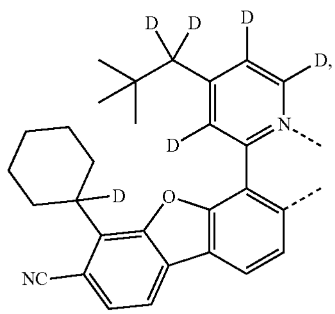
$L_{a585}$
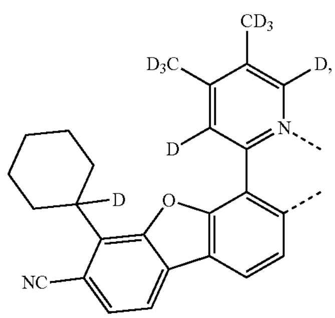
$L_{a586}$
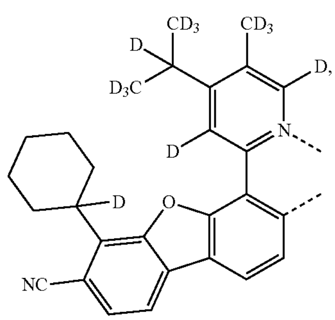
$L_{a587}$
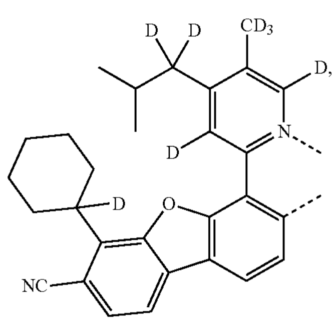
-continued
$L_{a588}$
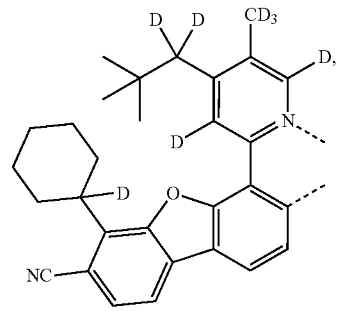
$L_{a589}$
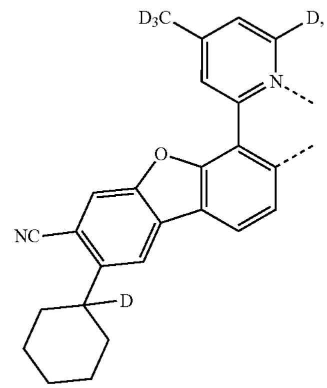
$L_{a590}$
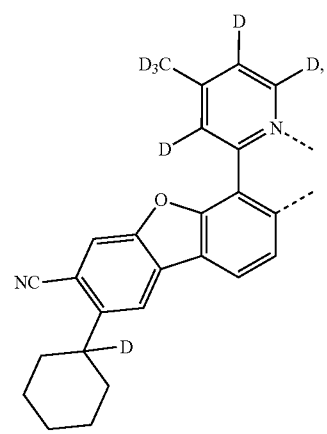
$L_{a591}$
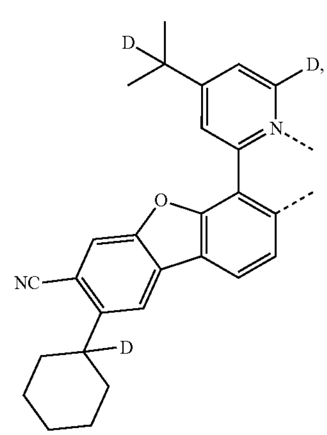

L$_{a592}$
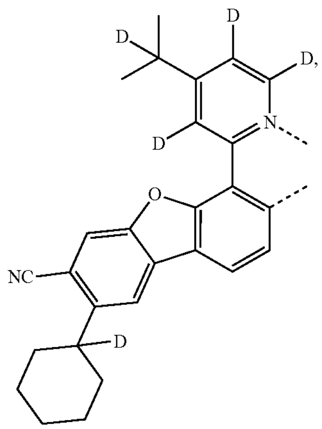
L$_{a593}$
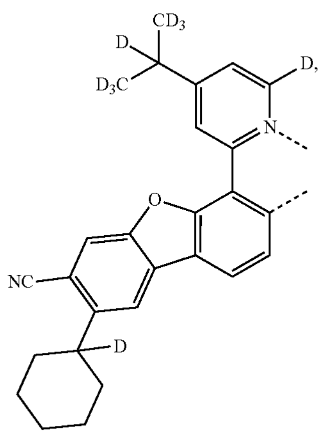
L$_{a594}$
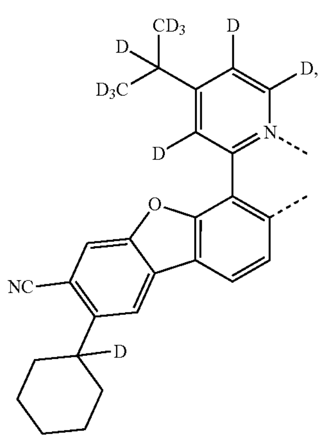
L$_{a595}$
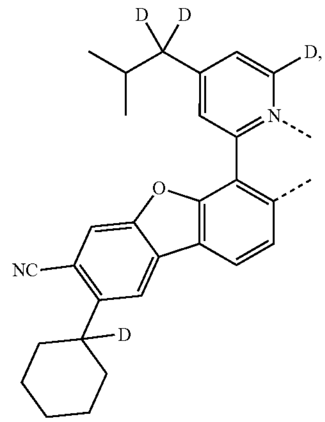
L$_{a596}$
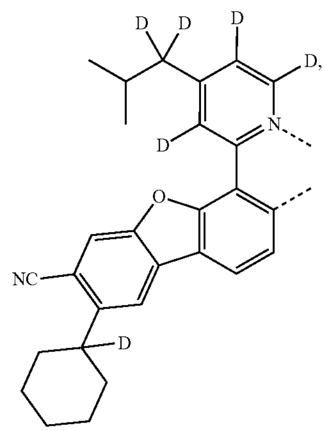
L$_{a597}$
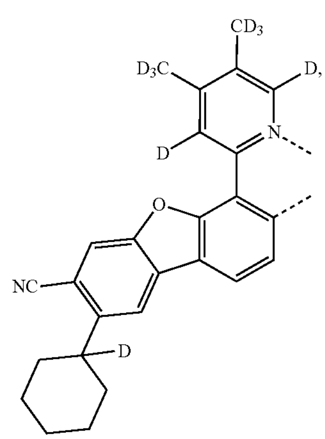

-continued
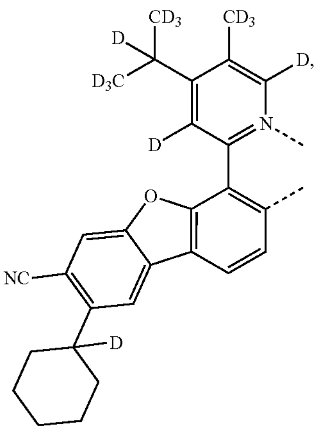
$L_{a598}$
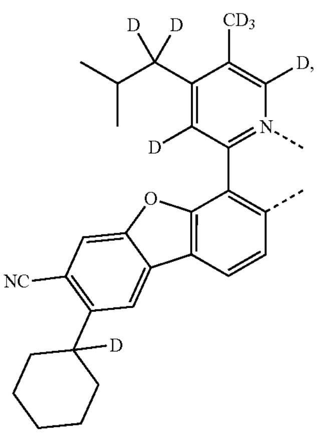
$L_{a599}$
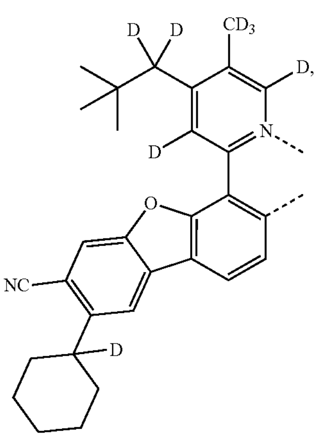
$L_{a600}$
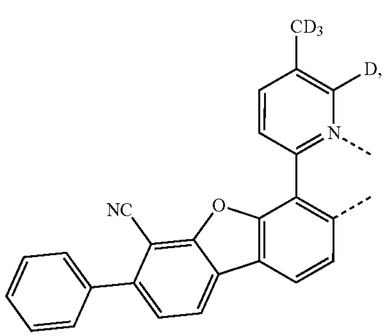
$L_{a601}$
-continued
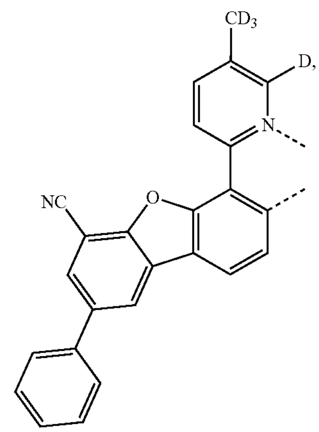
$L_{a602}$
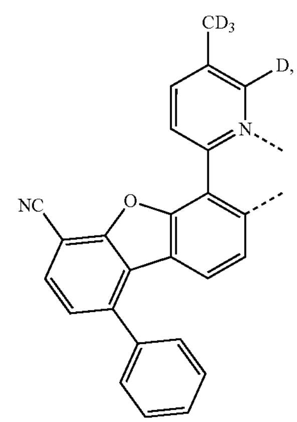
$L_{a603}$
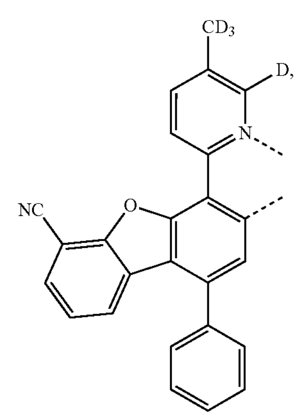
$L_{a604}$
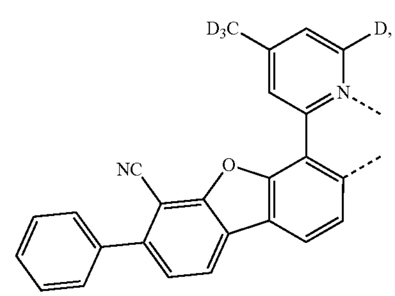
$L_{a605}$ -continued
$L_{a606}$
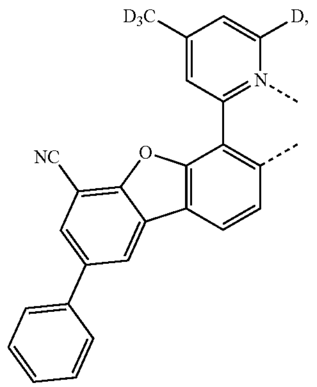
$L_{a607}$
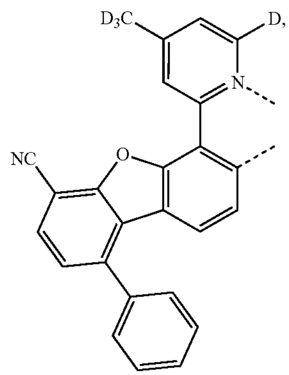
$L_{a608}$
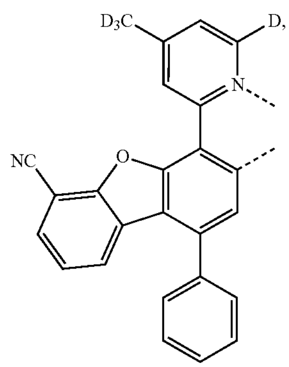
$L_{a609}$
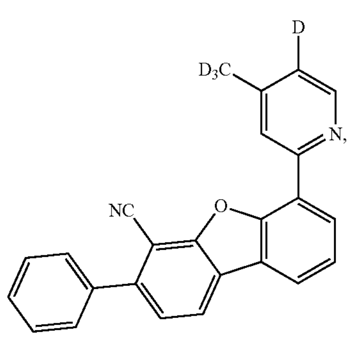
-continued
$L_{a610}$
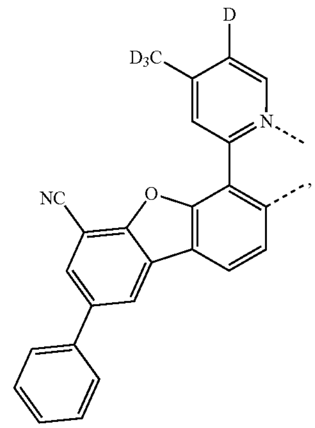
$L_{a611}$
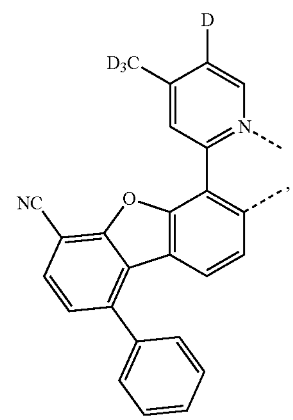
$L_{a612}$
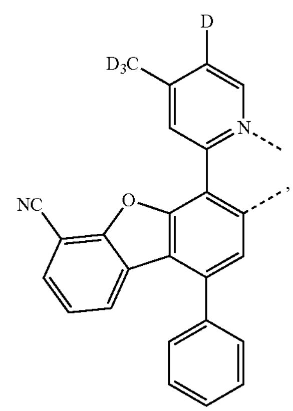
$L_{a613}$
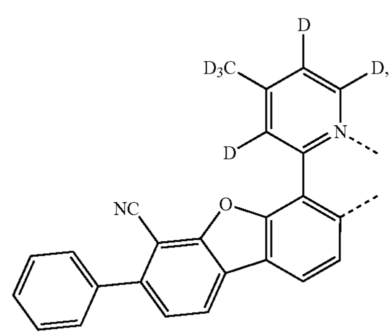

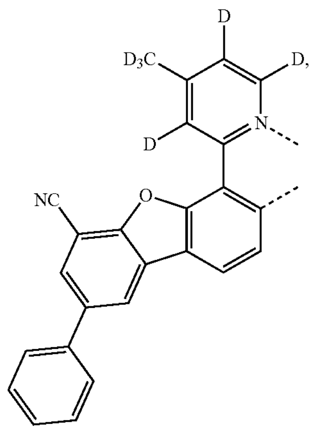
$L_{a614}$
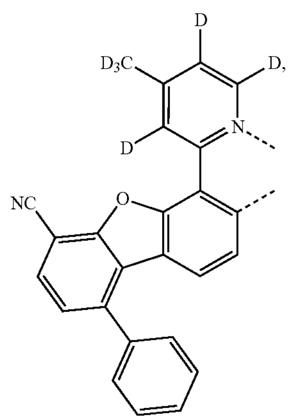
$L_{a615}$
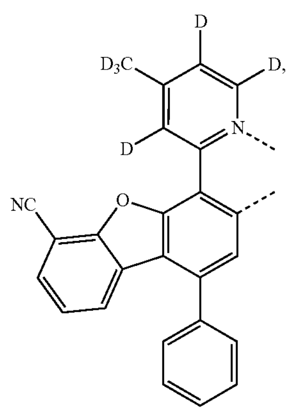
$L_{a616}$
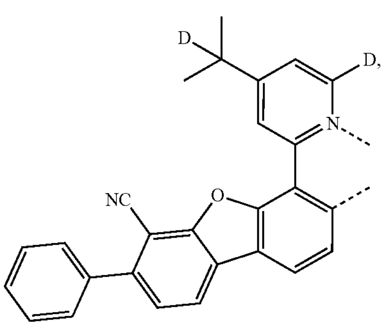
$L_{a617}$
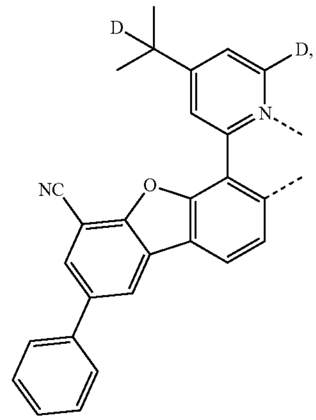
$L_{a618}$
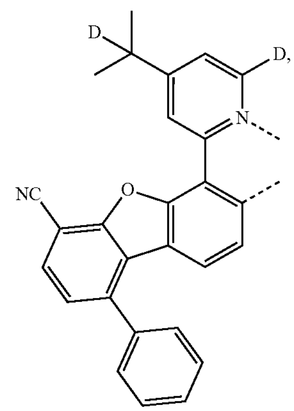
$L_{a619}$
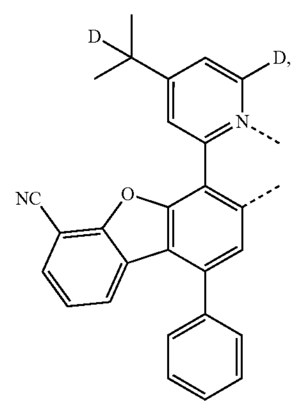
$L_{a620}$
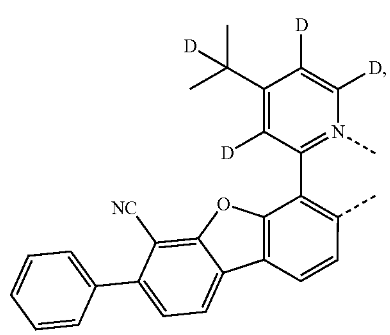
$L_{a621}$ $L_{a622}$
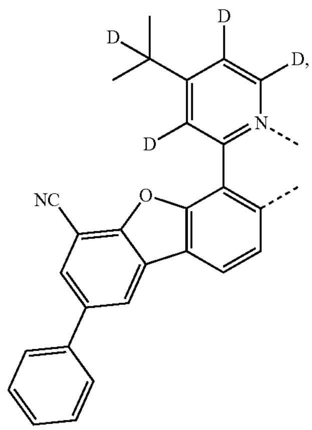
$L_{a623}$
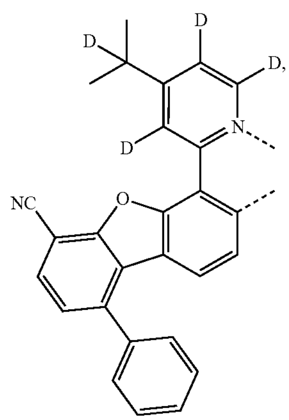
$L_{a624}$
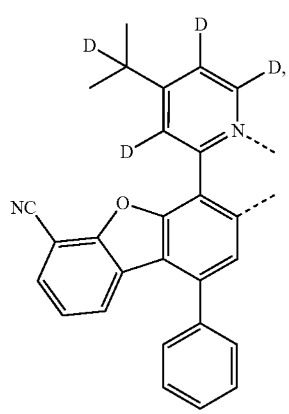
$L_{a625}$
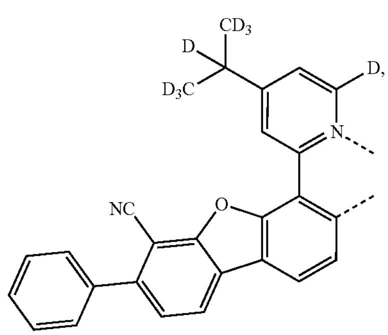
$L_{a626}$
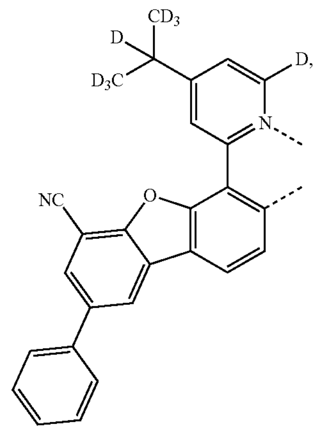
$L_{a627}$
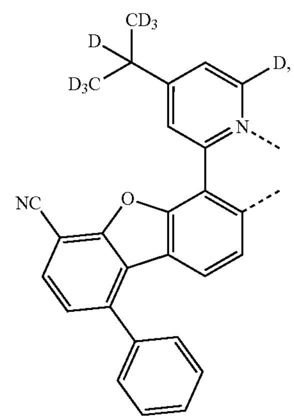
$L_{a628}$
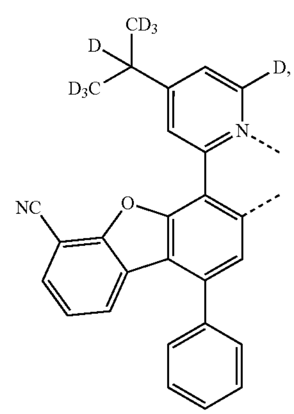
$L_{a629}$
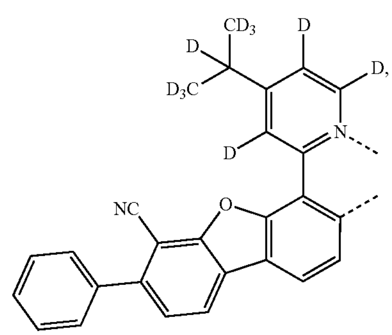

-continued
$L_{a630}$
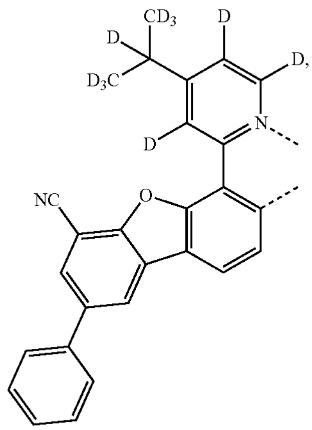
$L_{a631}$
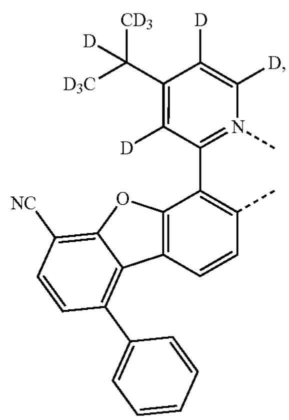
$L_{a632}$
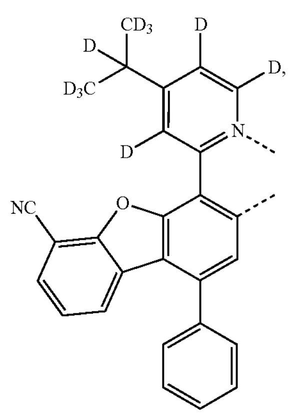
$L_{a633}$
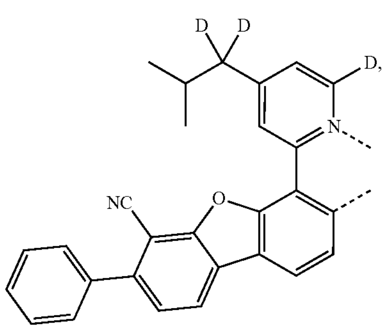
-continued
$L_{a634}$
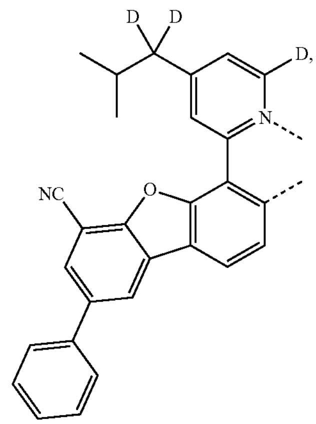
$L_{a635}$
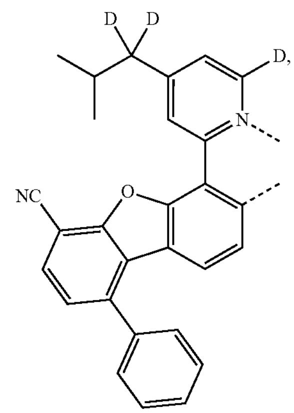
$L_{a636}$
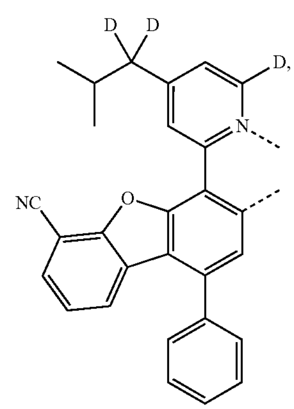
$L_{a637}$
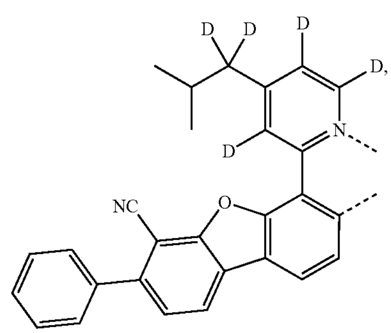

$L_{a638}$
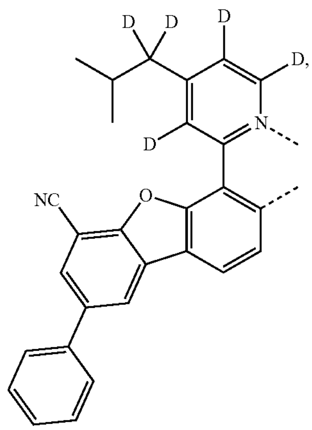
$L_{a639}$
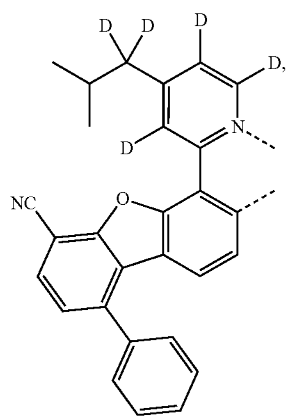
$L_{a640}$
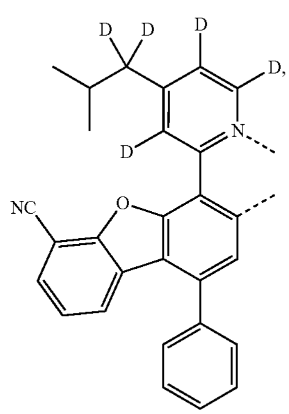
$L_{a641}$
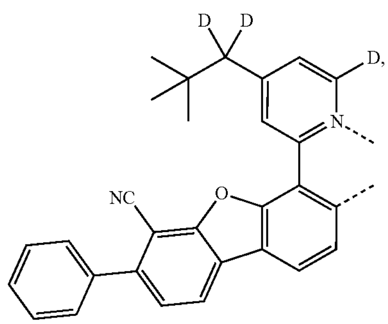
$L_{a642}$
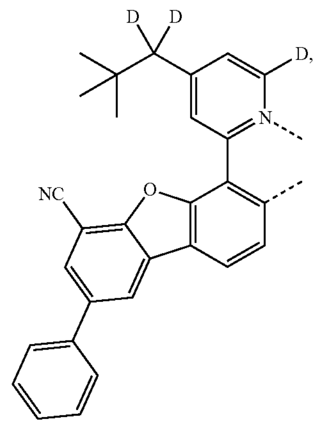
$L_{a643}$
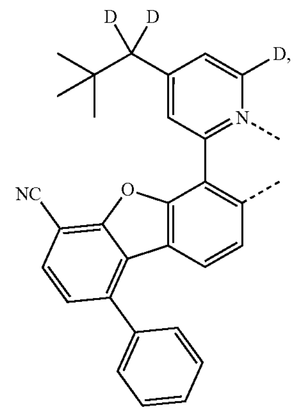
$L_{a644}$
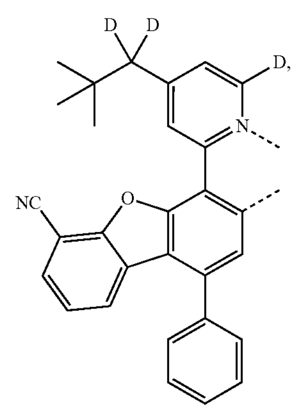
$L_{a645}$
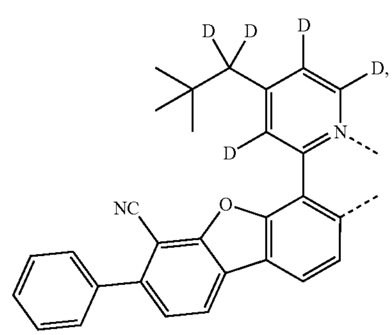

$L_{a646}$
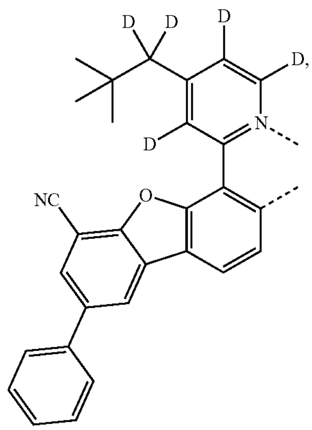
$L_{a647}$
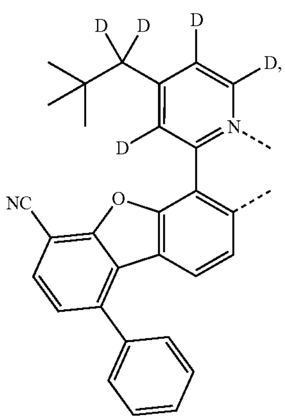
$L_{a648}$
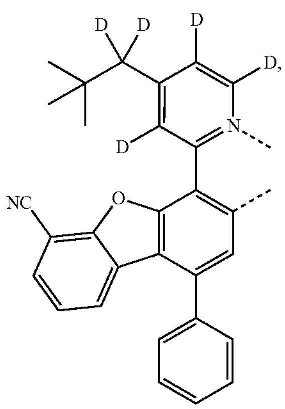
$L_{a649}$
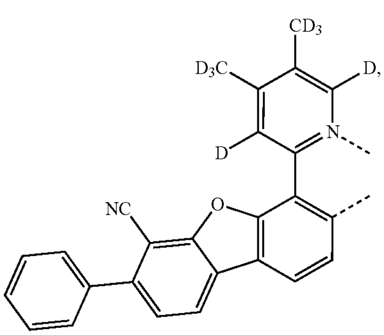
$L_{a650}$
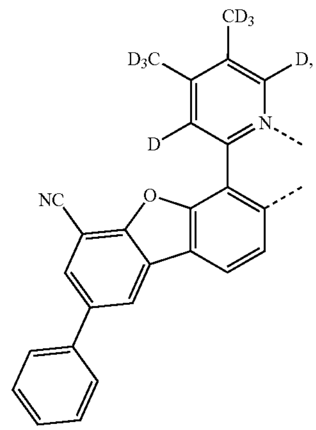
$L_{a651}$
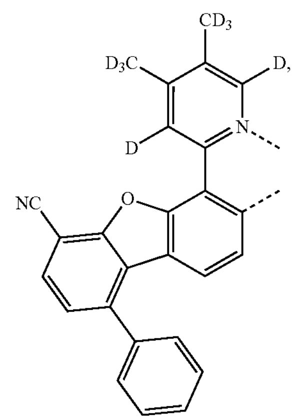
$L_{a652}$
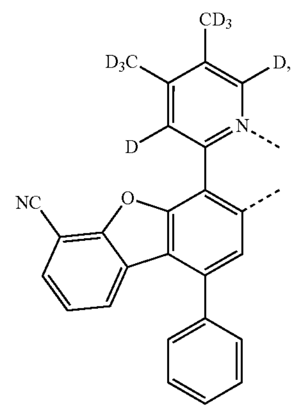
$L_{a653}$
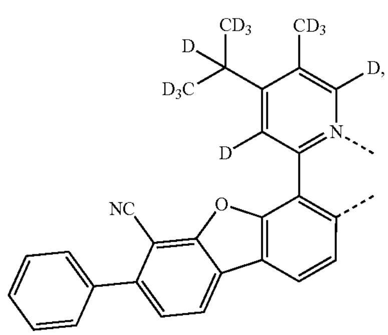

$L_{a654}$
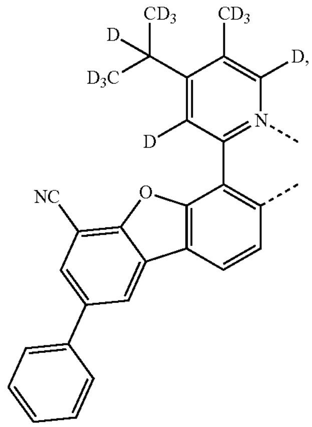
$L_{a655}$
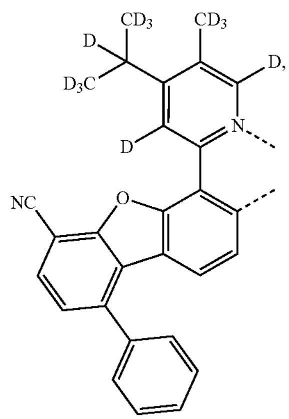
$L_{a656}$
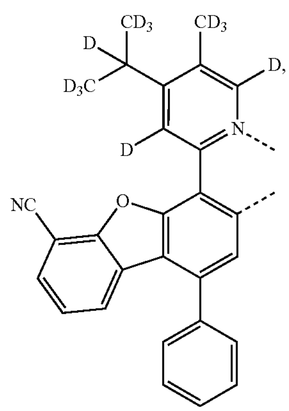
$L_{a657}$
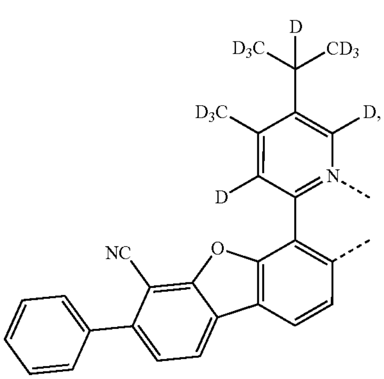
$L_{a658}$
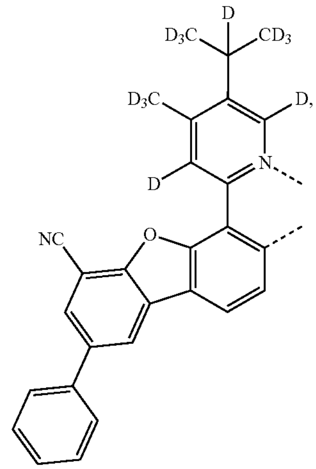
$L_{a659}$
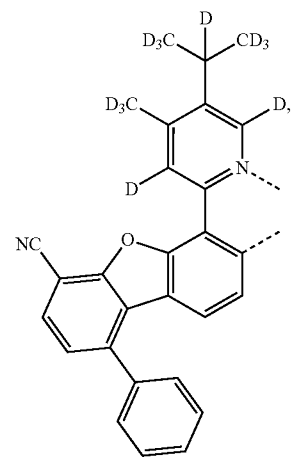
$L_{a660}$
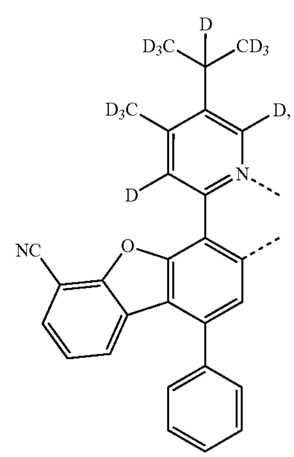

$L_{a661}$
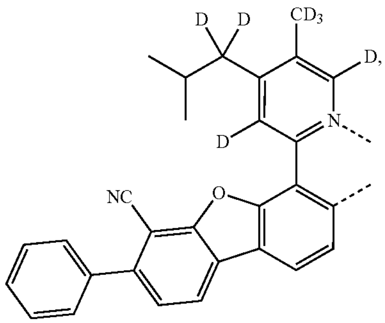
$L_{a662}$
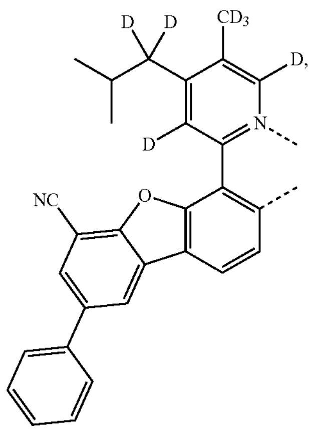
$L_{a663}$
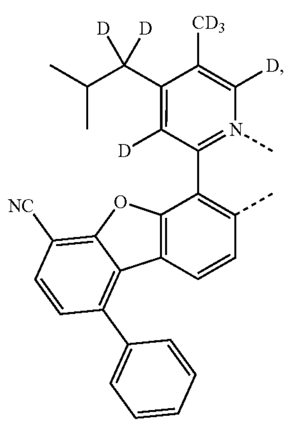
$L_{a664}$
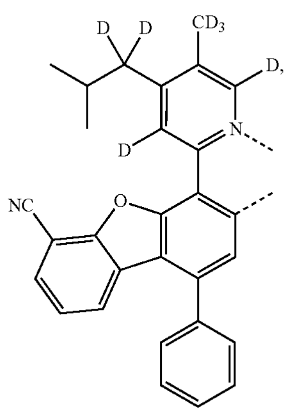
$L_{a665}$
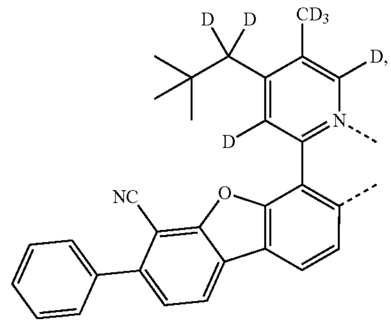
$L_{a666}$
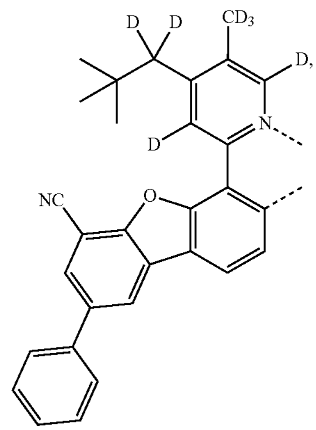
$L_{a667}$
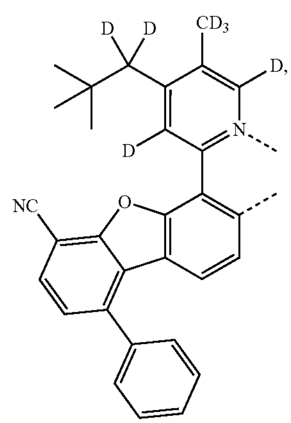
$L_{a668}$
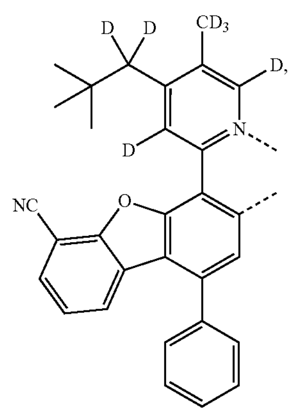

-continued
L$_{a669}$
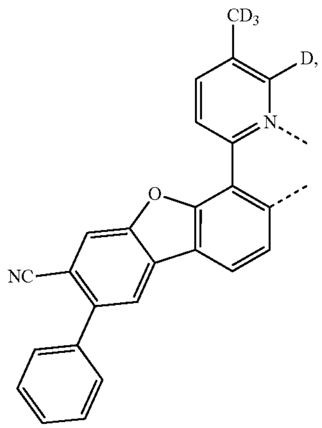
L$_{a670}$
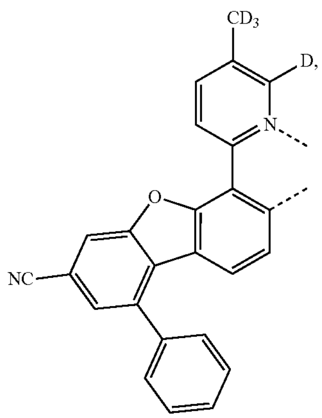
L$_{a671}$
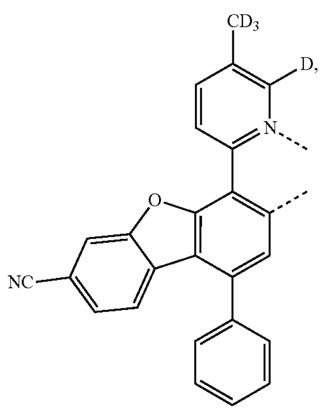
L$_{a672}$
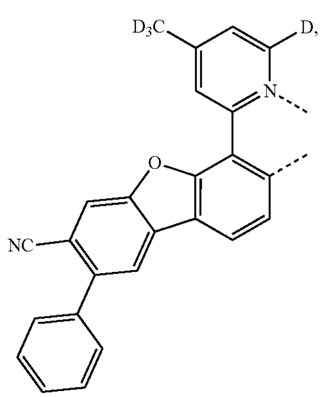
-continued
L$_{a673}$
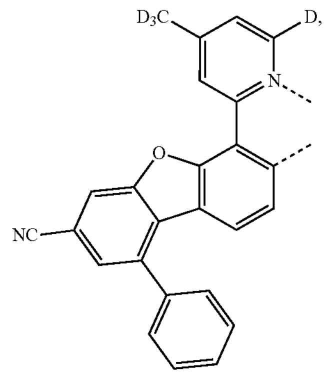
L$_{a674}$
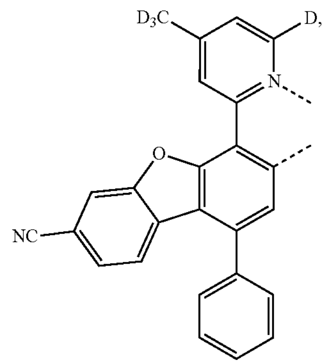
L$_{a675}$
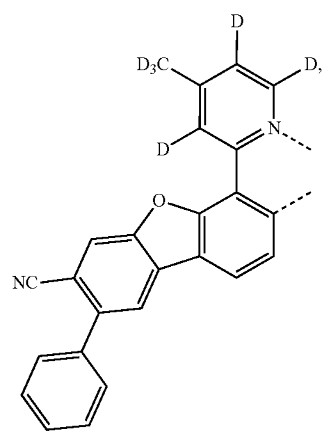
L$_{a676}$
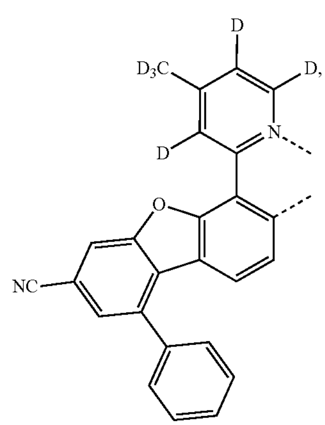

-continued
L_{a677}
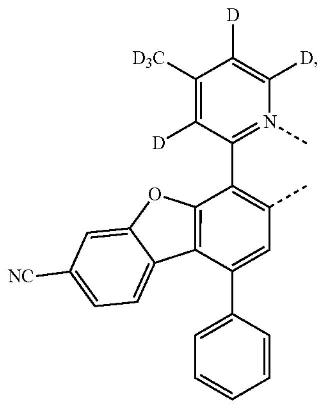
L_{a678}
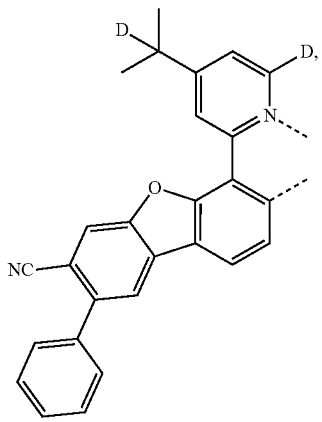
L_{a679}
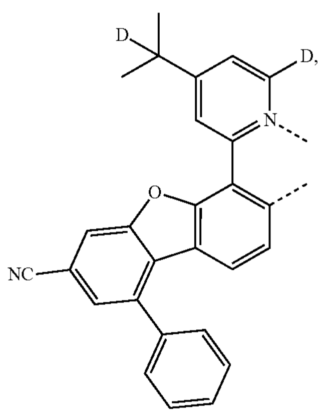
L_{a680}
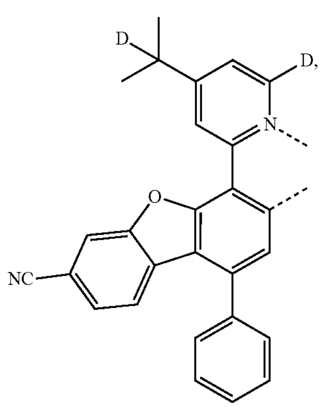
-continued
L_{a681}
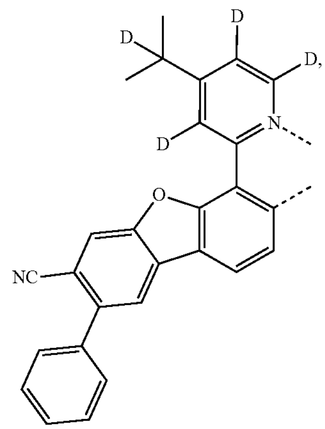
L_{a682}
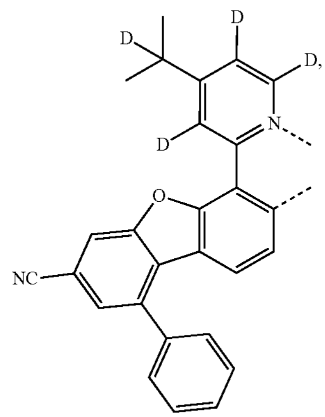
L_{a683}
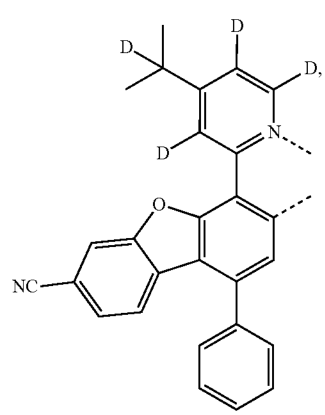

-continued
$L_{a684}$
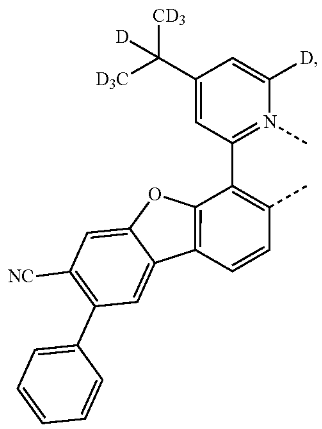
$L_{a685}$
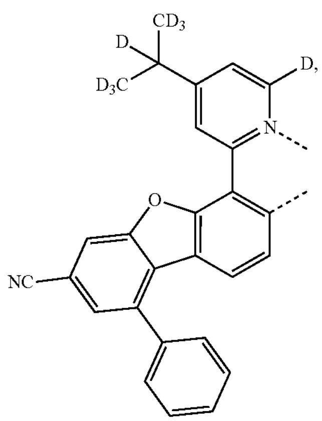
$L_{a686}$
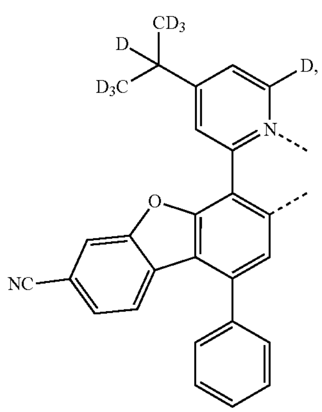
-continued
$L_{a687}$
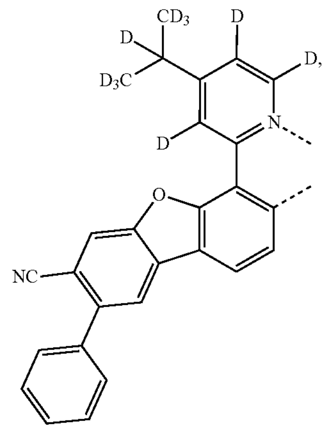
$L_{a688}$
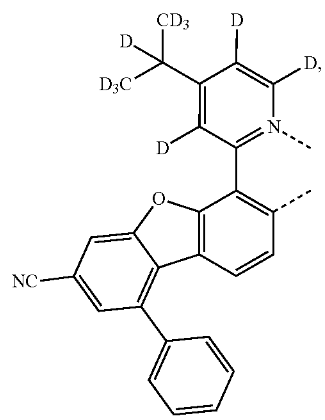
$L_{a689}$
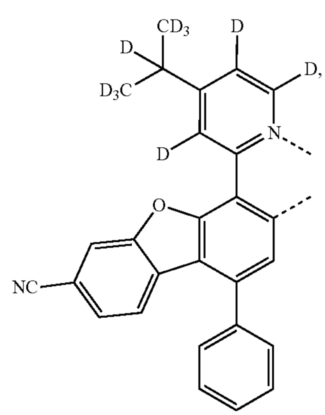

-continued
$L_{a690}$
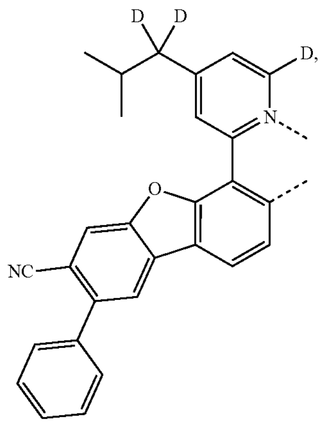
$L_{a691}$
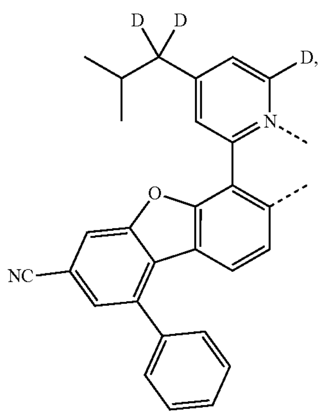
$L_{a692}$
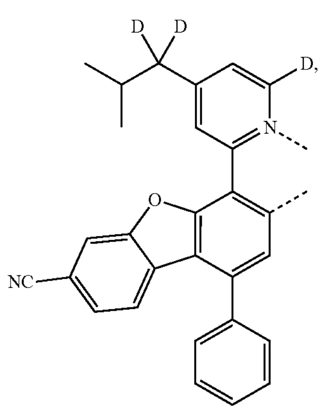
-continued
$L_{a693}$
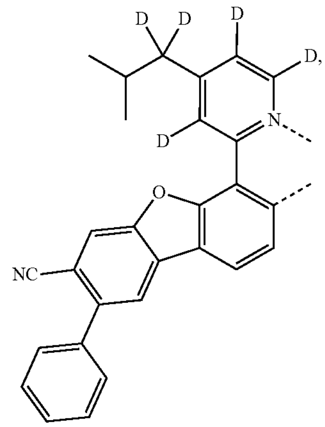
$L_{a694}$
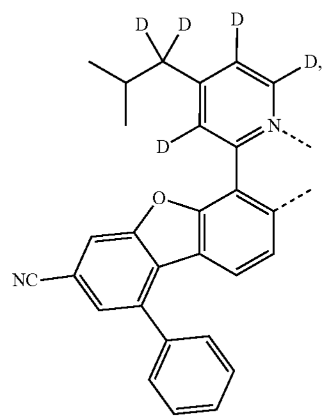
$L_{a695}$
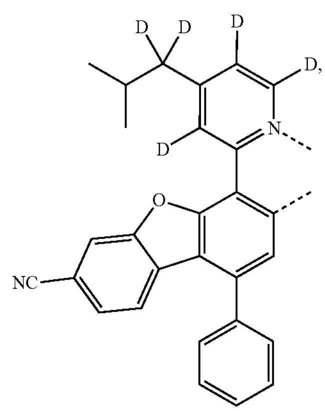

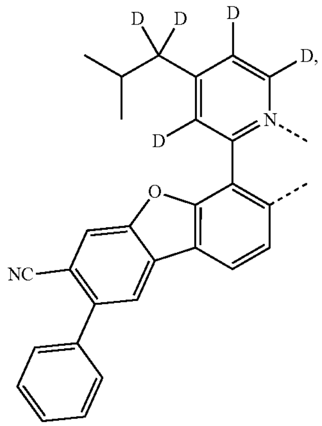
$L_{a696}$
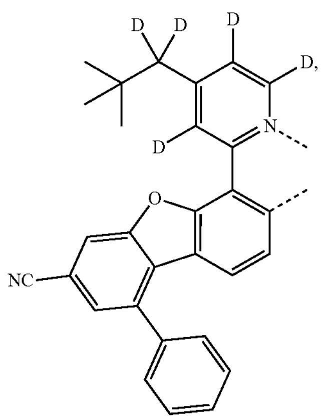
$L_{a697}$
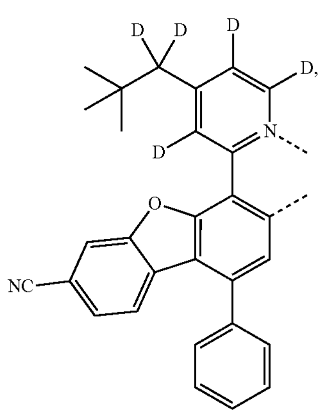
$L_{a698}$
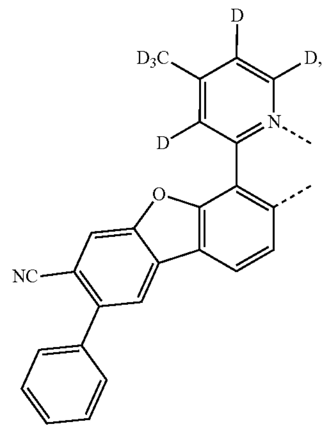
$L_{a699}$
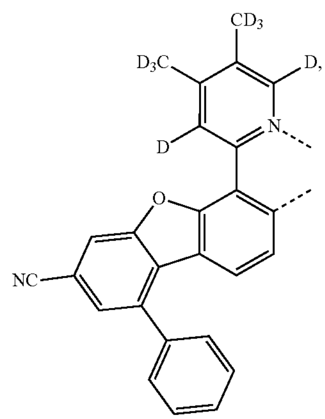
$L_{a700}$
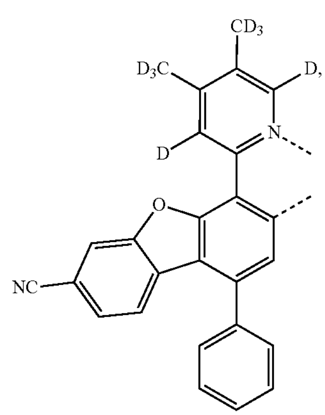
$L_{a701}$ $L_{a702}$
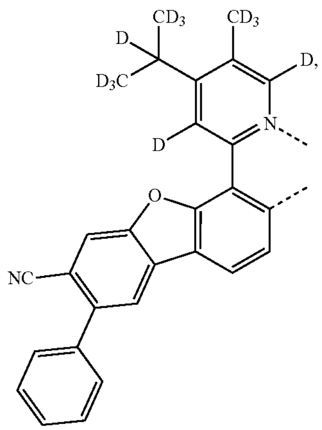
$L_{a703}$
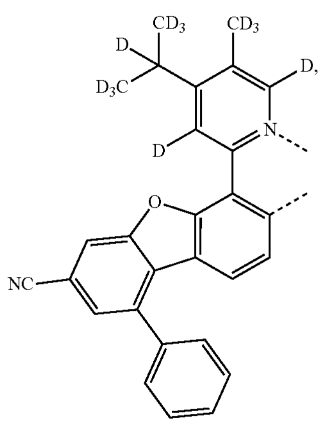
$L_{a704}$
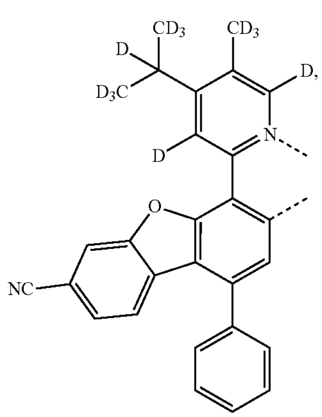
$L_{a705}$
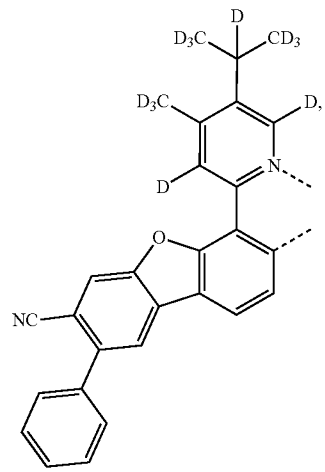
$L_{a706}$
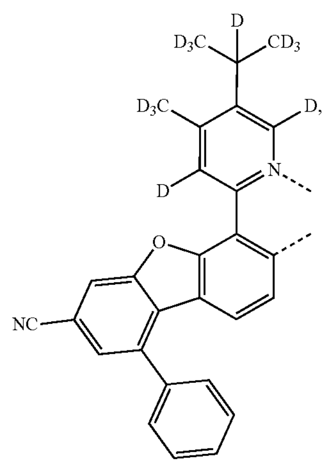
$L_{a707}$
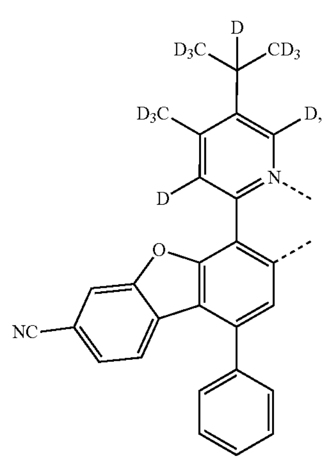

-continued
L$_{a708}$
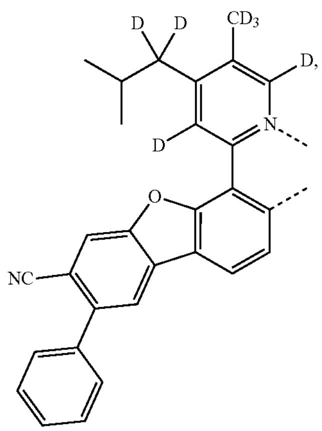
L$_{a709}$
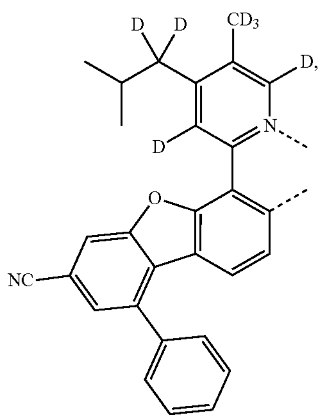
L$_{a710}$
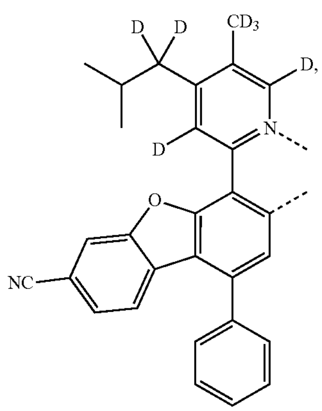
-continued
L$_{a711}$
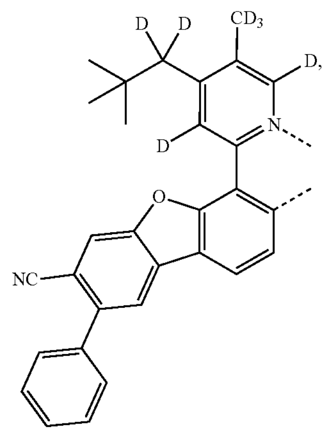
L$_{a712}$
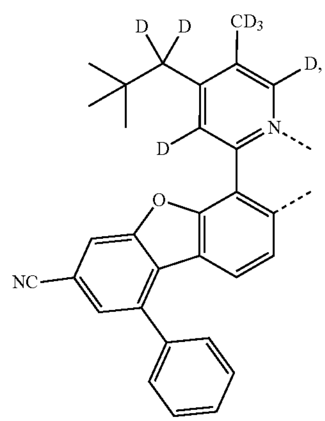
L$_{a713}$
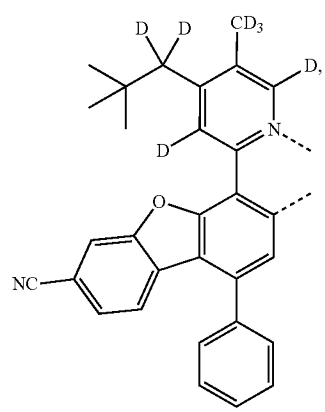
L$_{a714}$
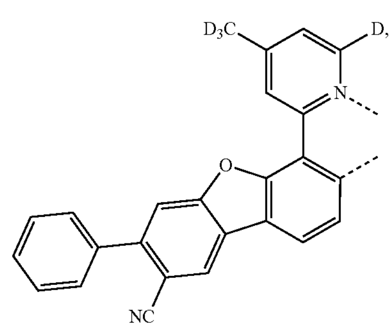

-continued
$L_{a715}$
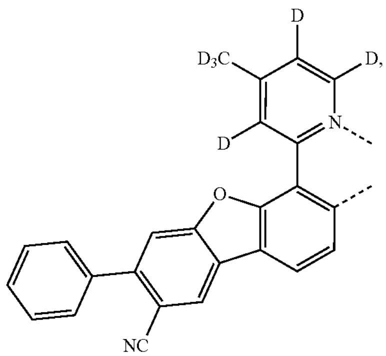
$L_{a716}$
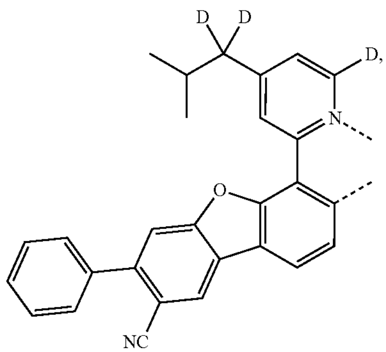
$L_{a717}$
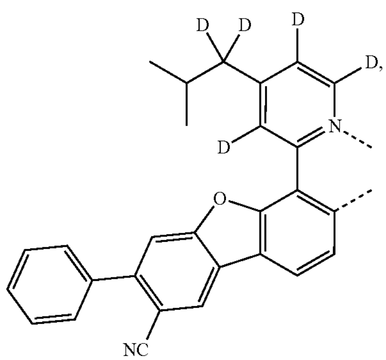
$L_{a718}$
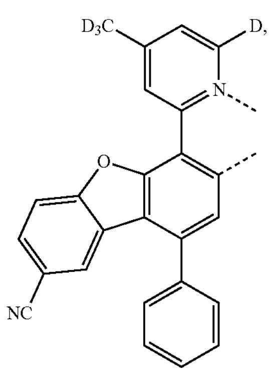
-continued
$L_{a719}$
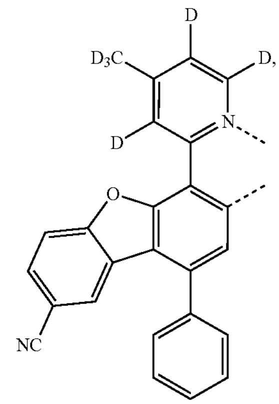
$L_{a720}$
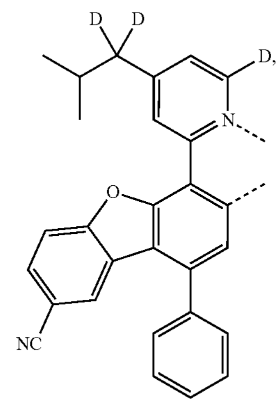
$L_{a721}$
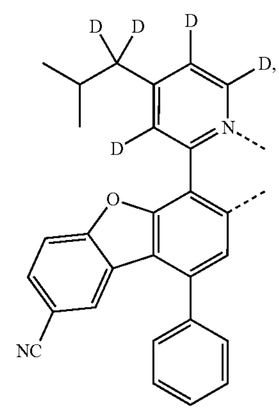
$L_{a722}$
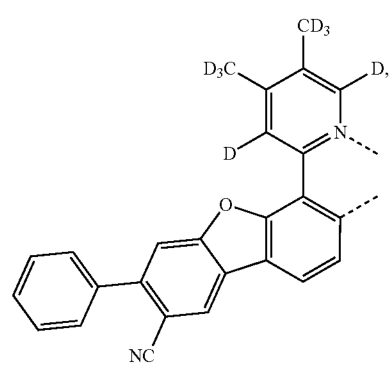

L$_{a723}$
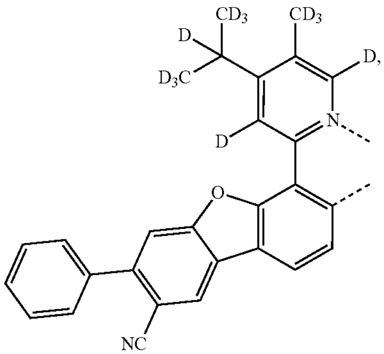
L$_{a724}$
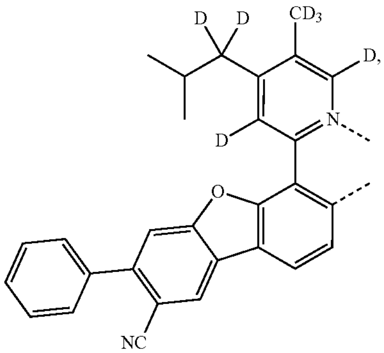
L$_{a725}$
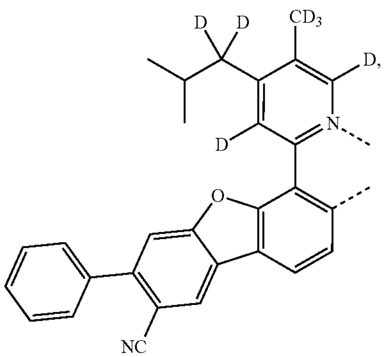
L$_{a726}$
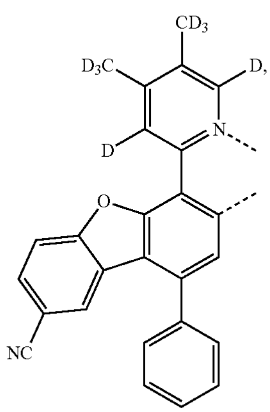
L$_{a727}$
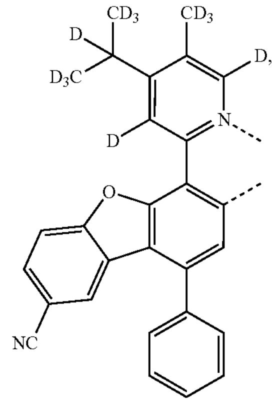
L$_{a728}$
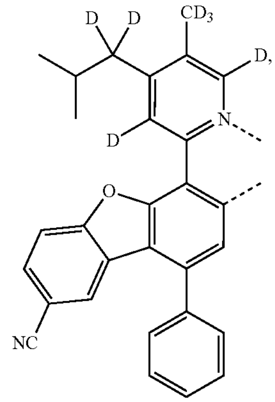
L$_{a729}$
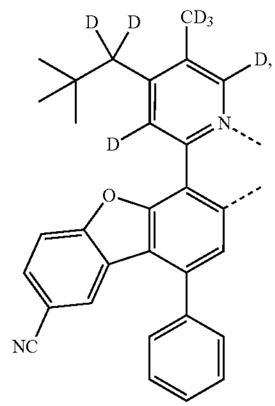
L$_{a730}$
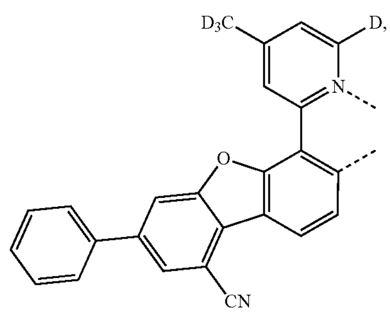

-continued
L$_{a731}$
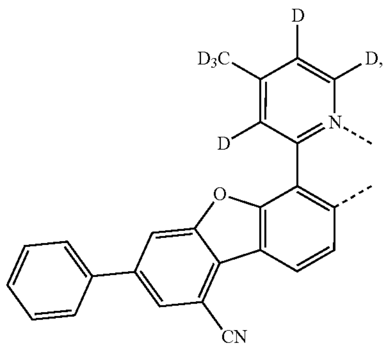
L$_{a732}$
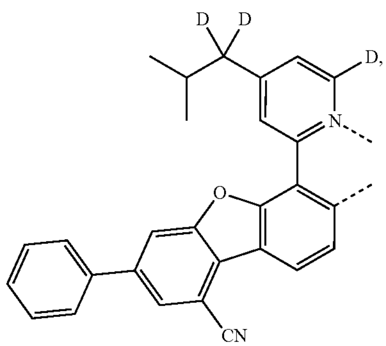
L$_{a733}$
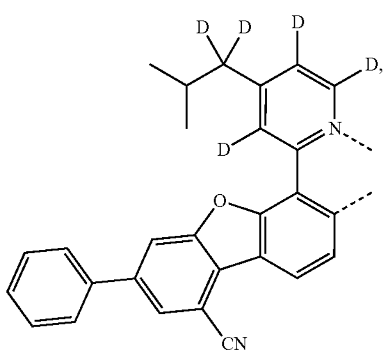
L$_{a734}$
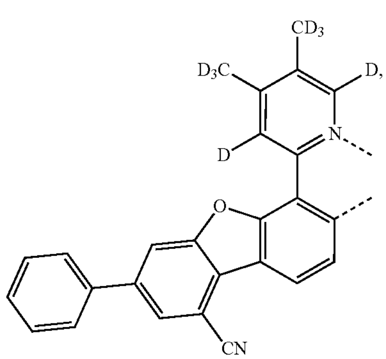
-continued
L$_{a735}$
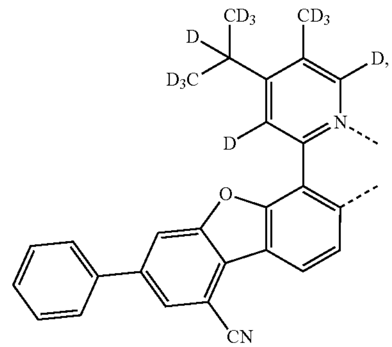
L$_{a736}$
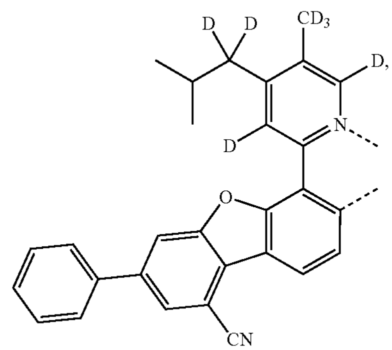
L$_{a737}$
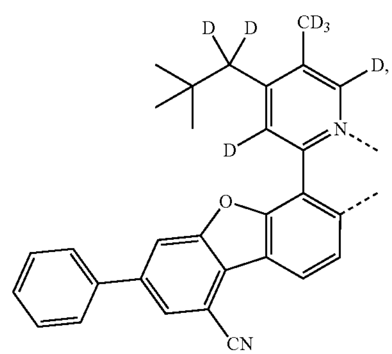
L$_{a738}$
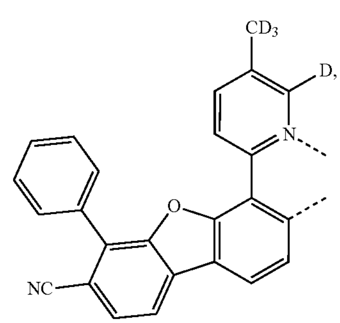

$L_{a739}$
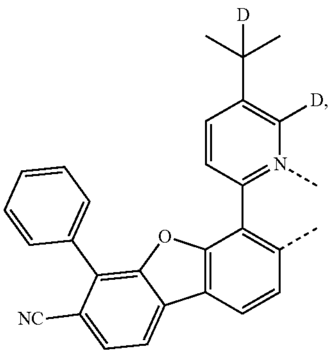
$L_{a740}$
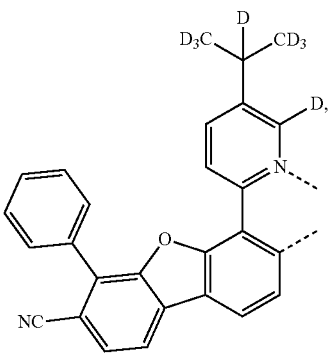
$L_{a741}$
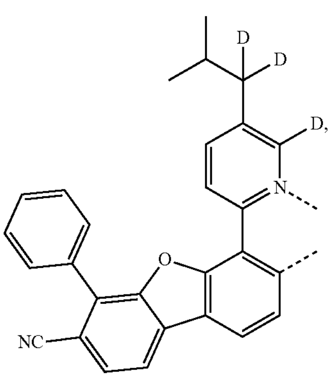
$L_{a742}$
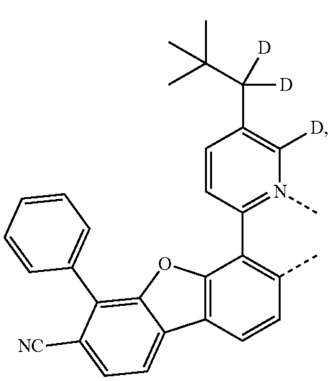
$L_{a743}$
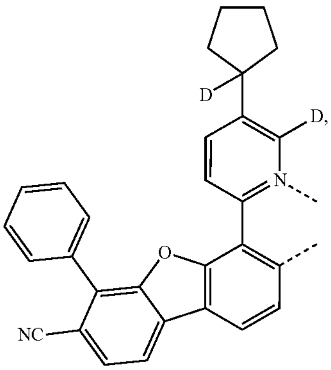
$L_{a744}$
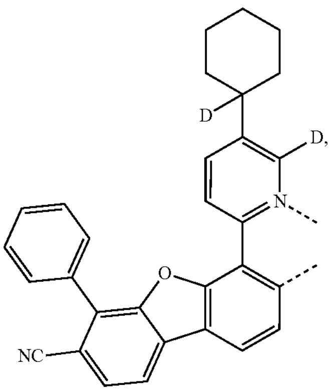
$L_{a745}$
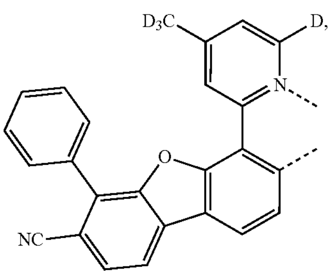
$L_{a746}$
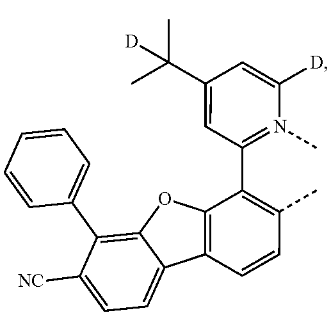

-continued
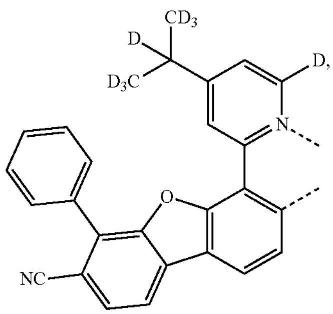
$L_{a747}$
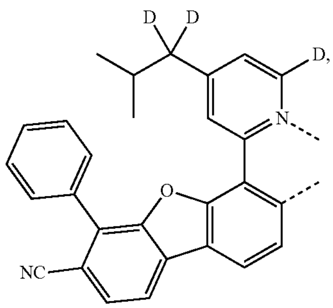
$L_{a748}$
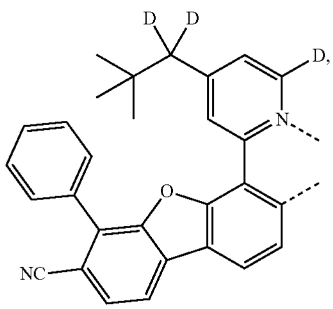
$L_{a749}$
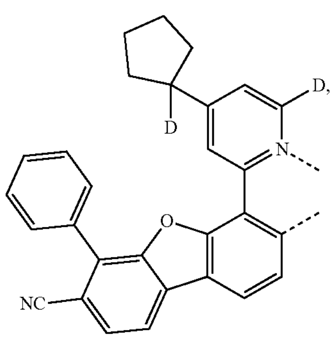
$L_{a750}$
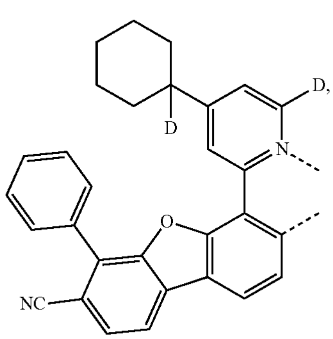
$L_{a751}$
-continued
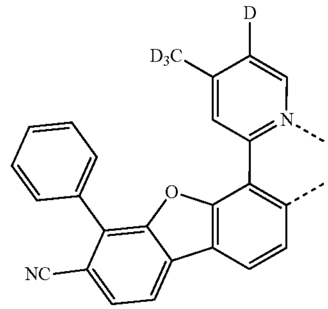
$L_{a752}$
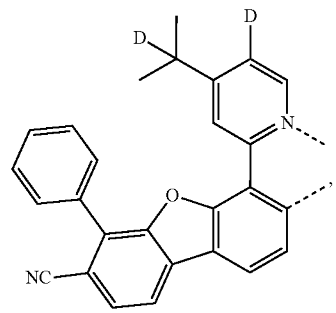
$L_{a753}$
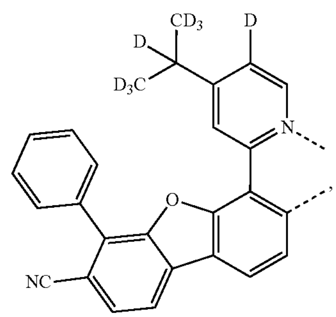
$L_{a754}$
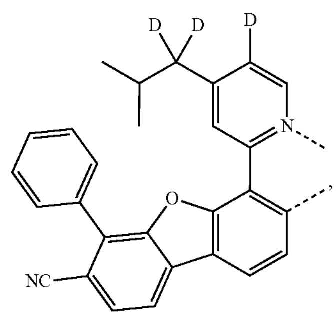
$L_{a755}$
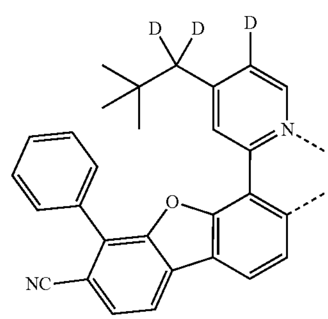
$L_{a756}$ $L_{a757}$
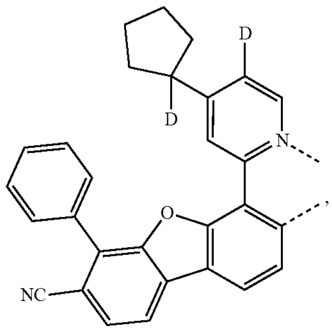
$L_{a758}$
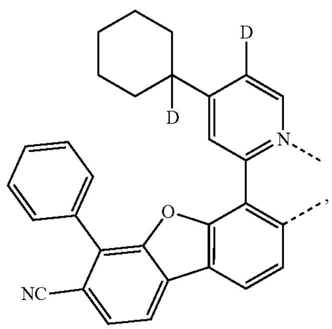
$L_{a759}$
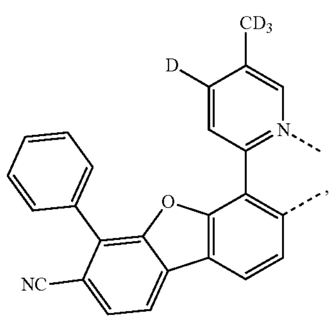
$L_{a760}$
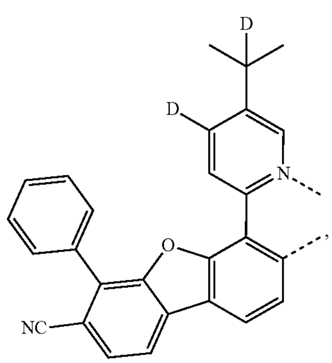
$L_{a761}$
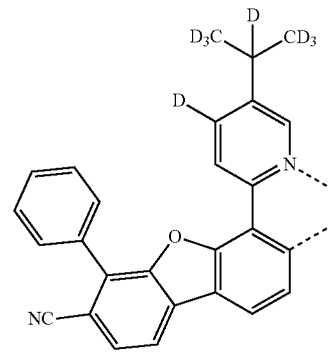
$L_{a762}$
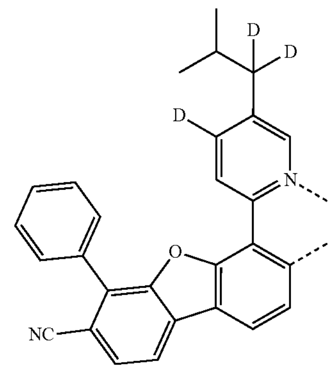
$L_{a763}$
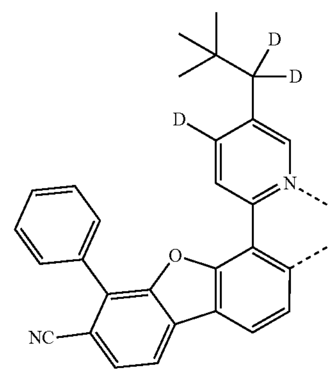
$L_{a764}$
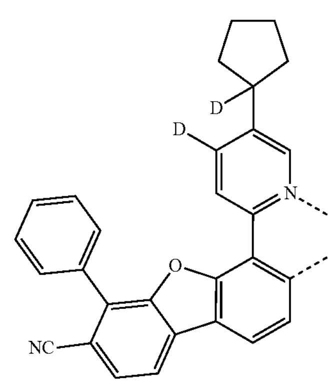

$L_{a765}$
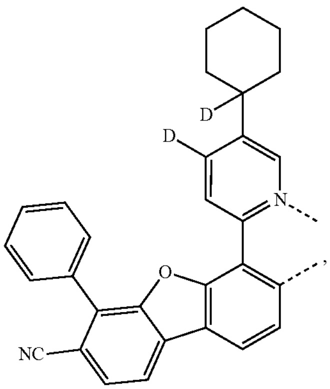
$L_{a766}$
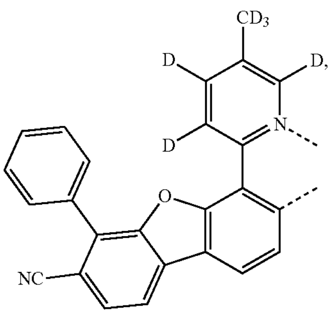
$L_{a767}$
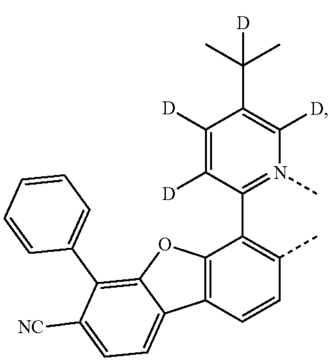
$L_{a768}$
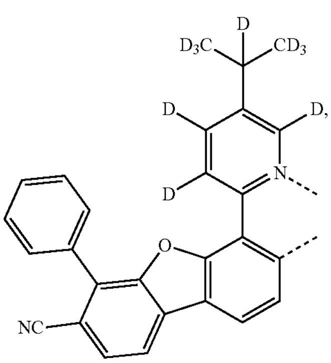
$L_{a769}$
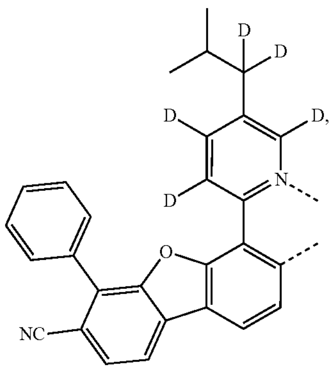
$L_{a770}$
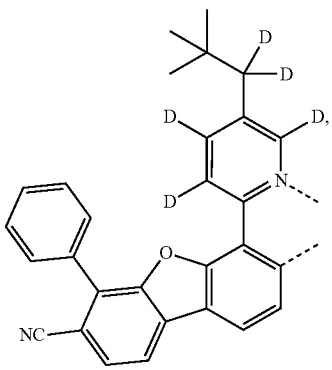
$L_{a771}$
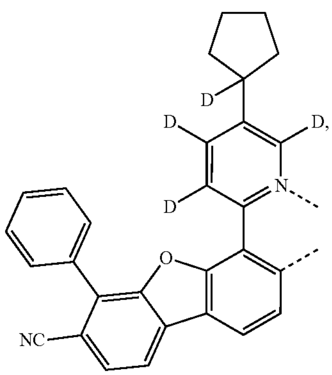
$L_{a772}$
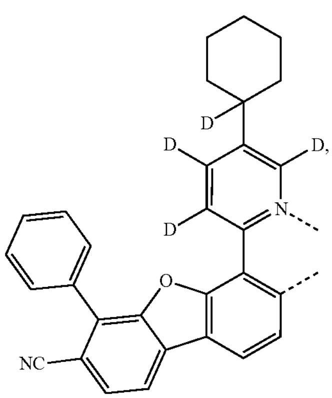

-continued
$L_{a773}$
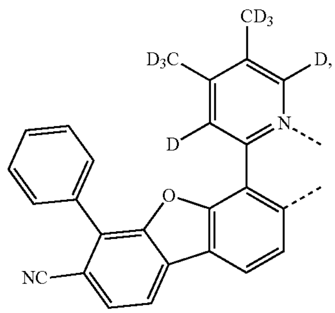
$L_{a774}$
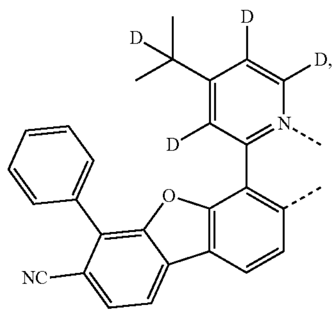
$L_{a775}$
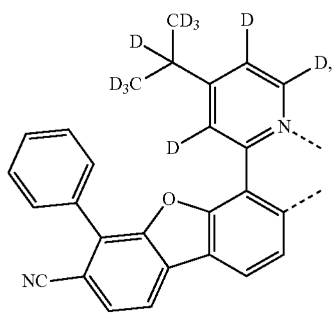
$L_{a776}$
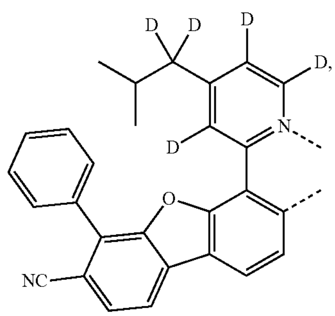
$L_{a777}$
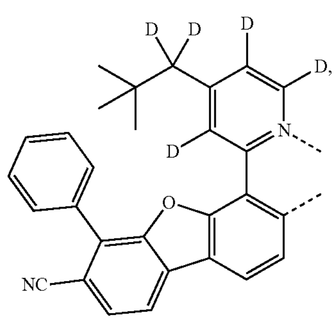
-continued
$L_{a778}$
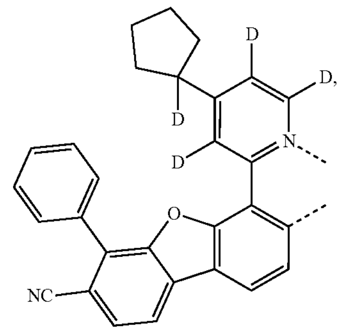
$L_{a779}$
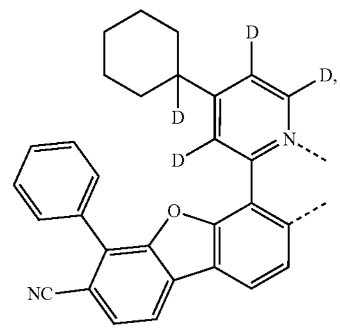
$L_{a780}$
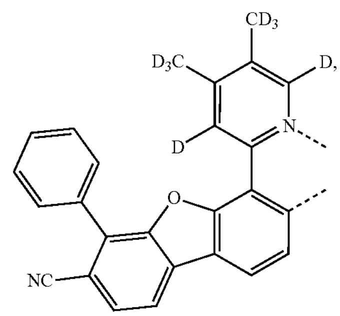
$L_{a781}$
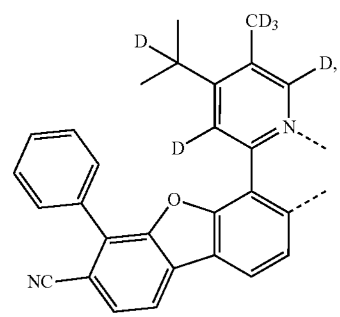
$L_{a782}$
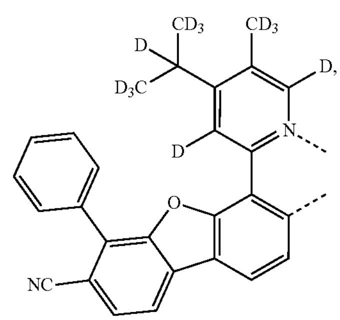

-continued
$L_{a783}$
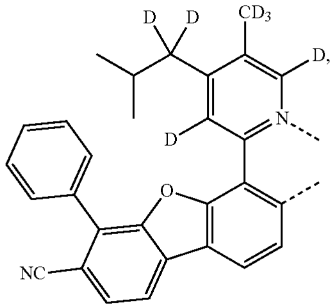
$L_{a784}$
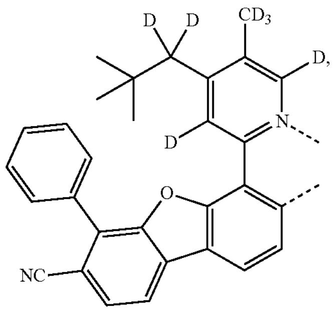
$L_{a785}$
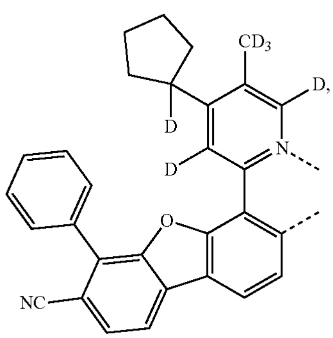
$L_{a786}$
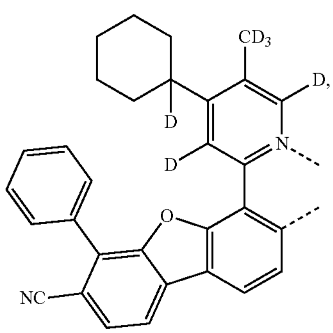
$L_{a787}$
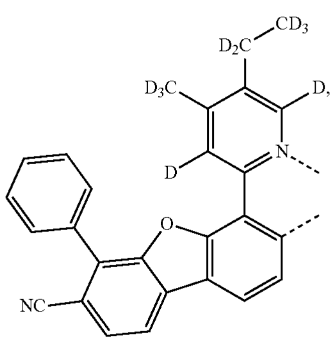
-continued
$L_{a788}$
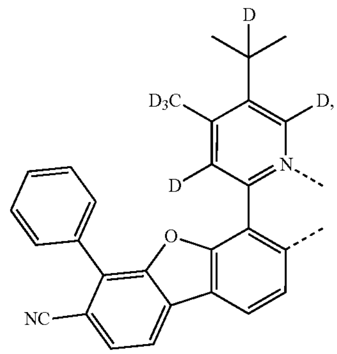
$L_{a789}$
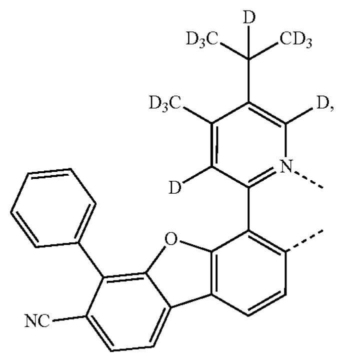
$L_{a790}$
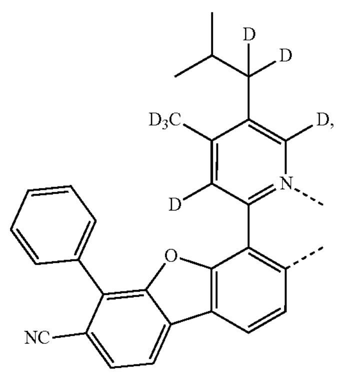
$L_{a791}$
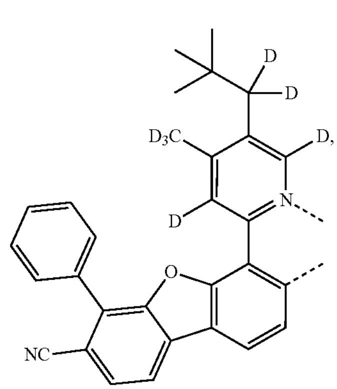

-continued
$L_{a792}$
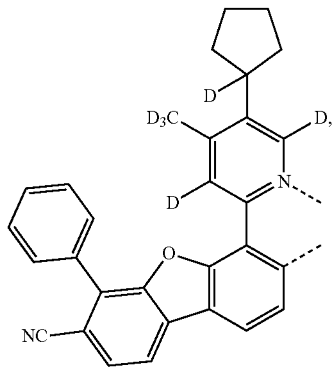
$L_{a793}$
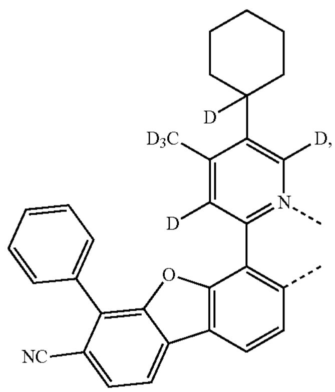
$L_{a794}$
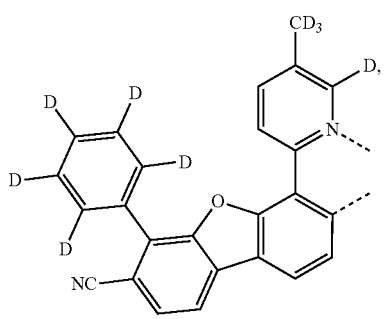
$L_{a795}$
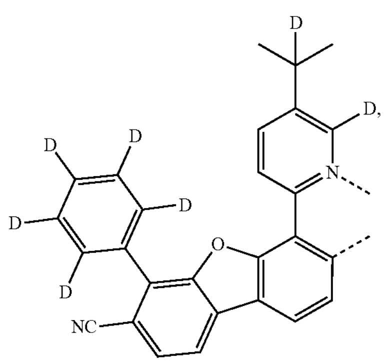
-continued
$L_{a796}$
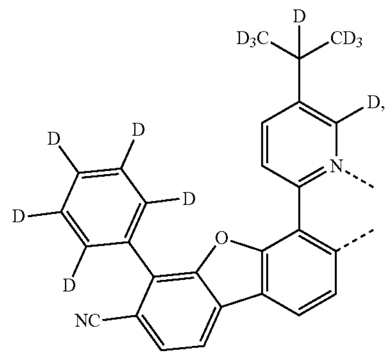
$L_{a797}$
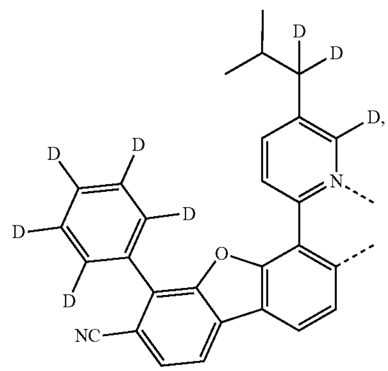
$L_{a798}$
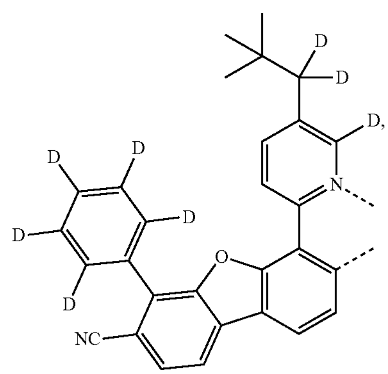
$L_{a799}$
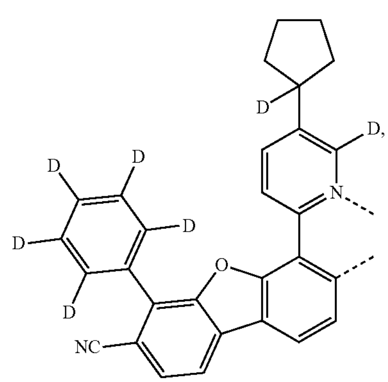

-continued
$L_{a800}$
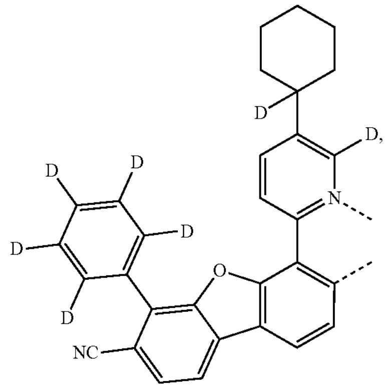
$L_{a801}$
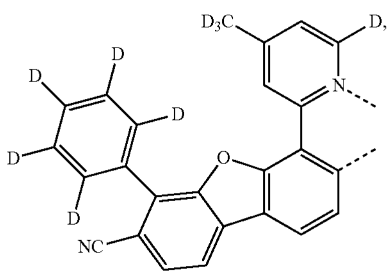
$L_{a802}$
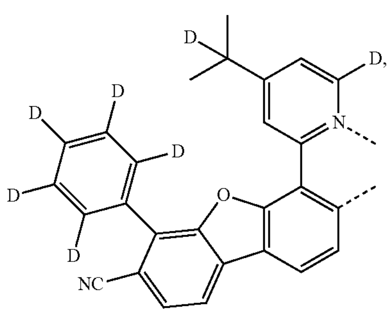
$L_{a803}$
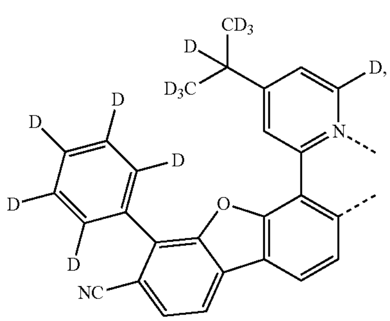
-continued
$L_{a804}$
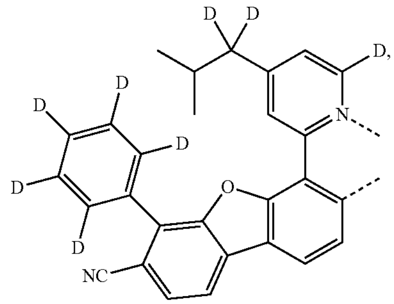
$L_{a805}$
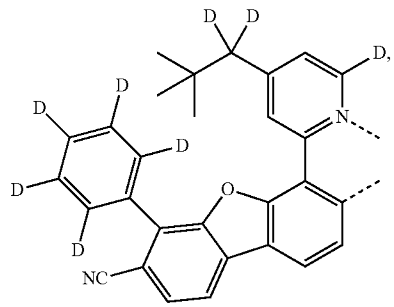
$L_{a806}$
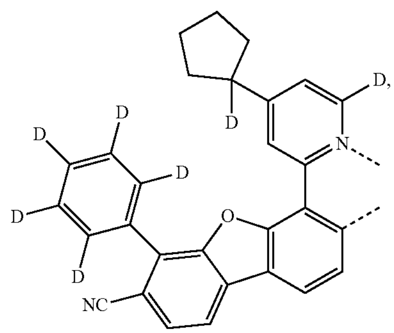
$L_{a807}$
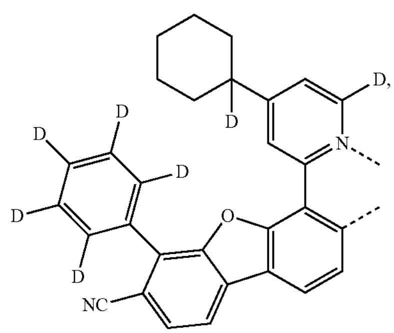
$L_{a808}$
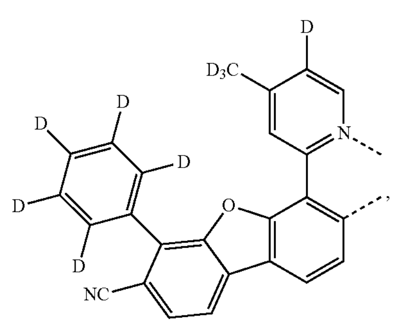

-continued
$L_{a809}$
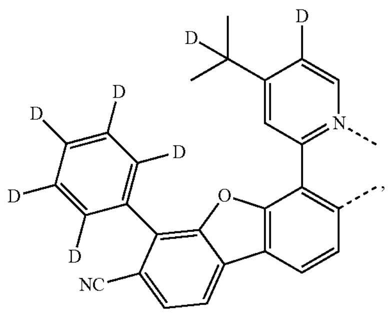
$L_{a810}$
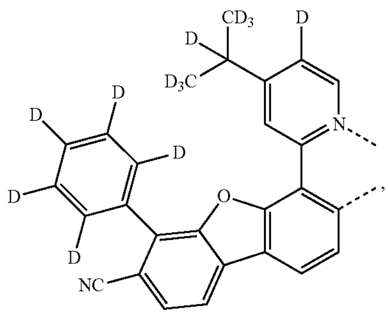
$L_{a811}$
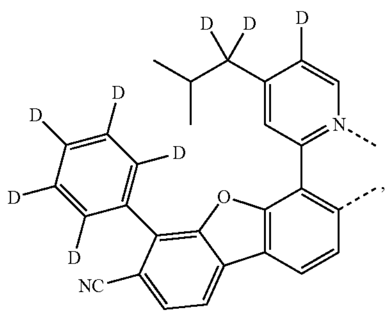
$L_{a812}$
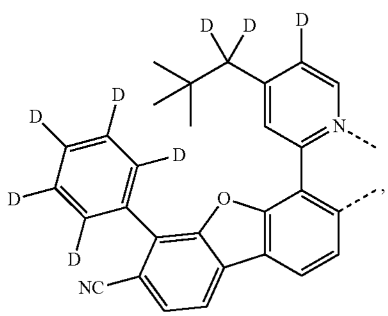
$L_{a813}$
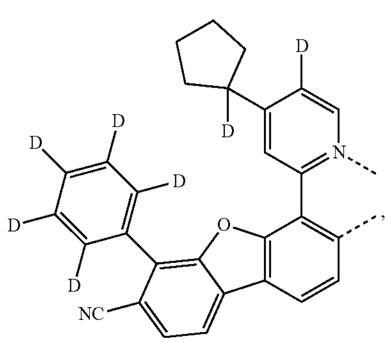
-continued
$L_{a814}$
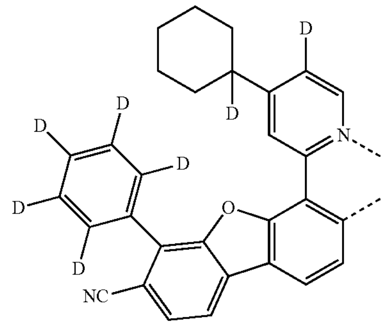
$L_{a815}$
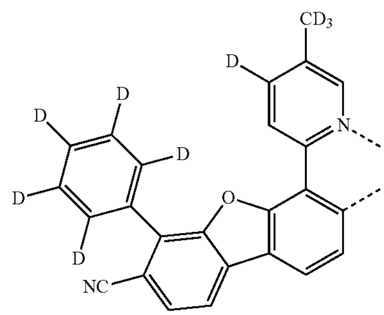
$L_{a816}$
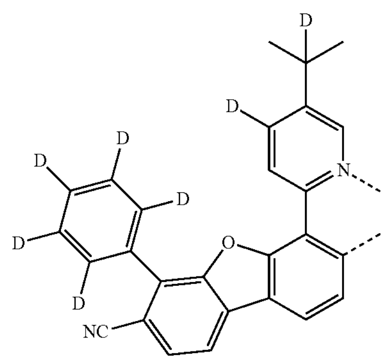
$L_{a817}$
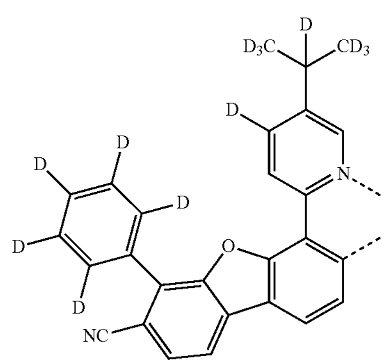

-continued
$L_{a818}$
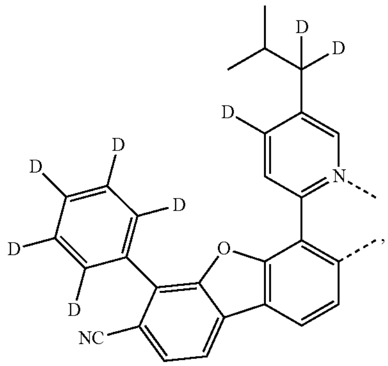
$L_{a819}$
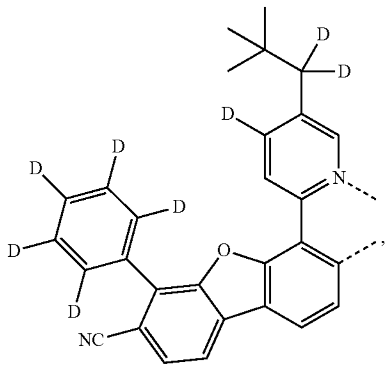
$L_{a820}$
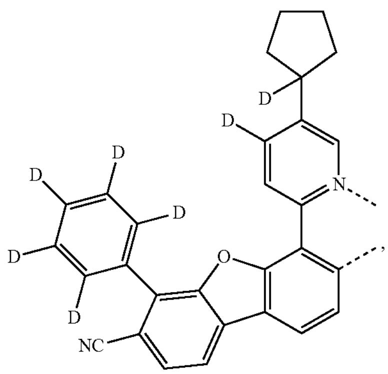
$L_{a821}$
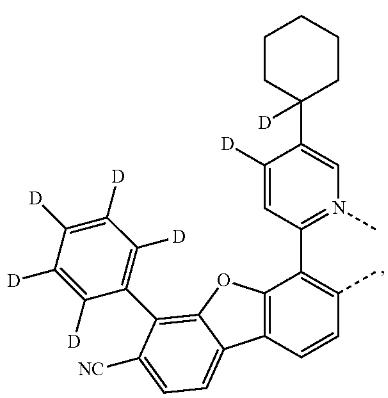
-continued
$L_{a822}$
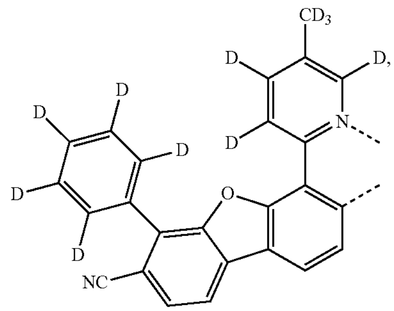
$L_{a823}$
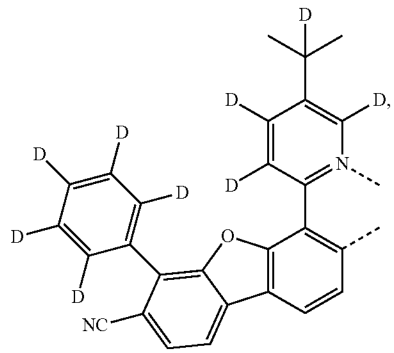
$L_{a824}$
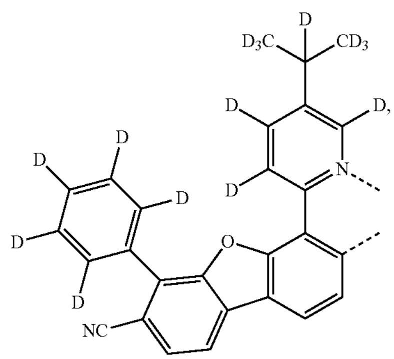
$L_{a825}$
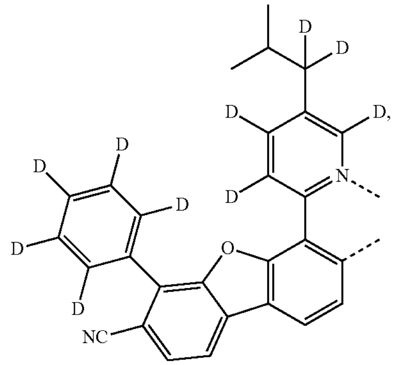

-continued
$L_{a826}$
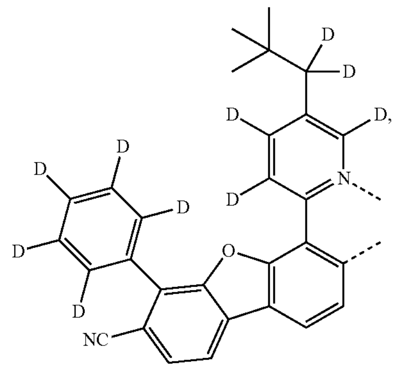
$L_{a827}$
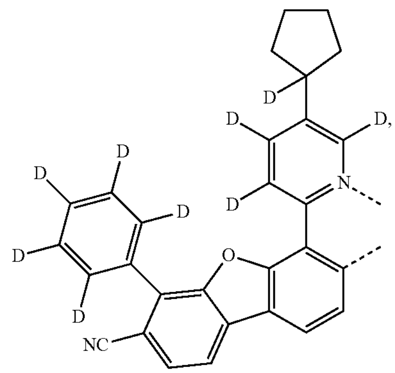
$L_{a828}$
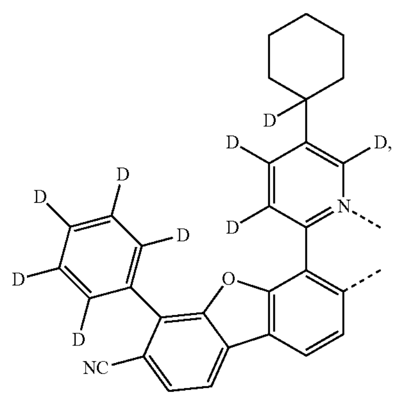
$L_{a829}$
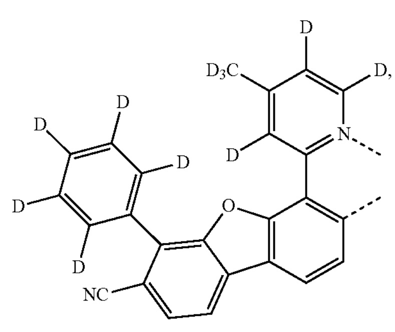
-continued
$L_{a830}$
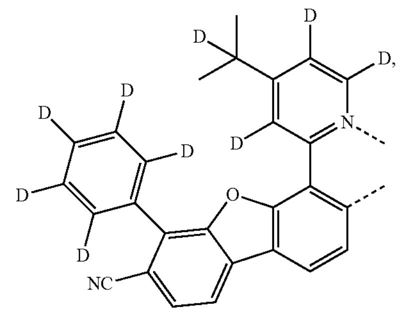
$L_{a831}$
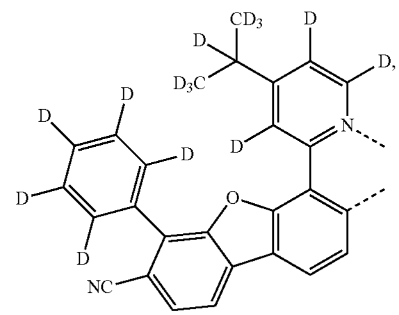
$L_{a832}$
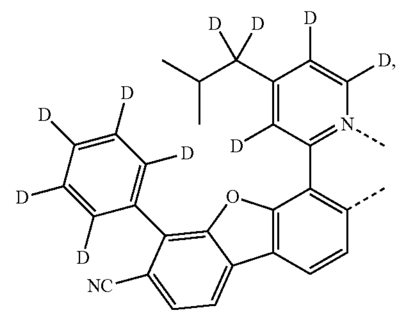
$L_{a833}$
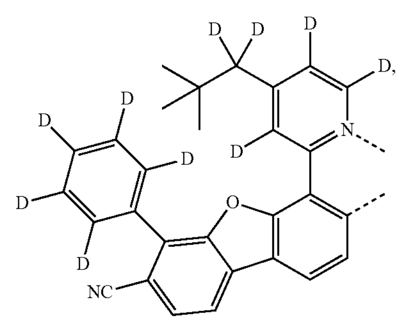
$L_{a834}$
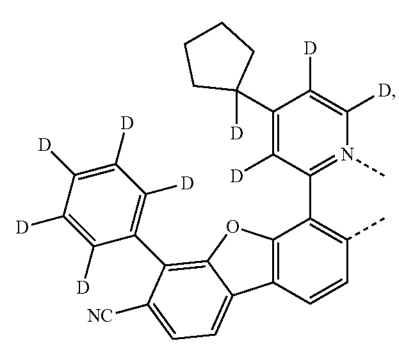

$L_{a835}$
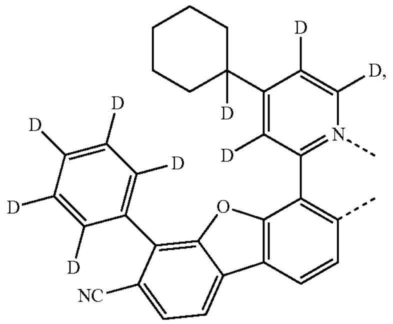
$L_{a836}$
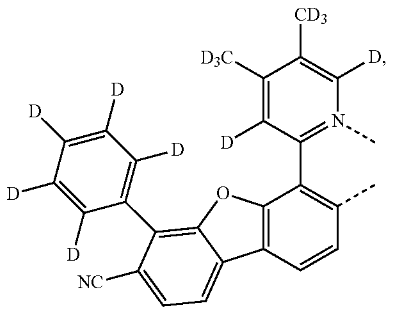
$L_{a837}$
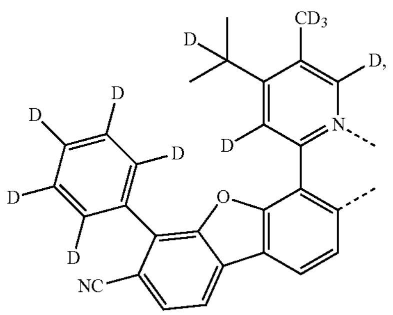
$L_{a838}$
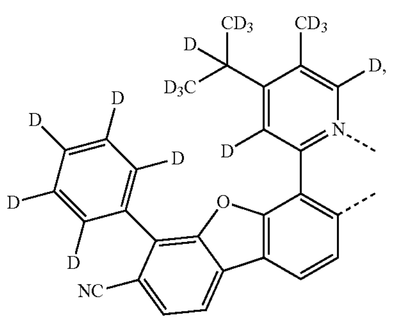
$L_{a839}$
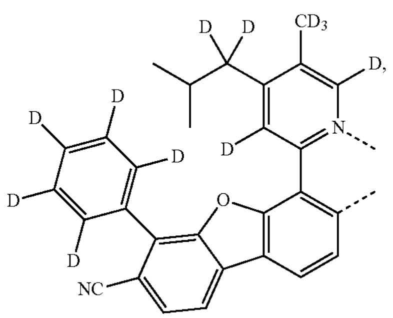
$L_{a840}$
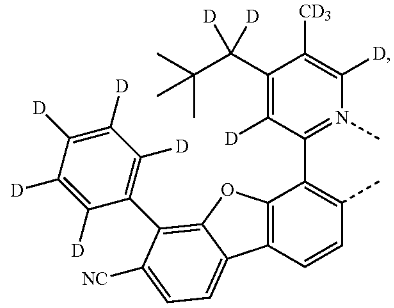
$L_{a841}$
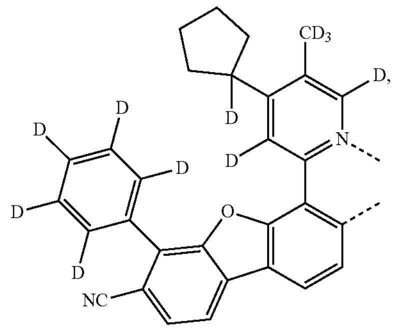
$L_{a842}$
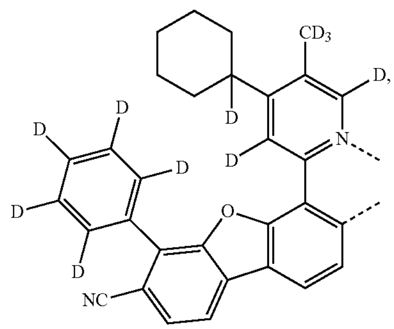
$L_{a843}$
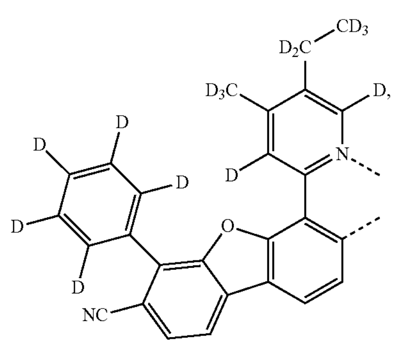

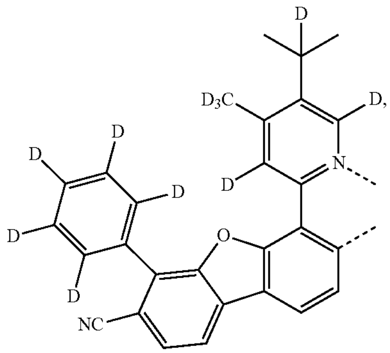
$L_{a844}$
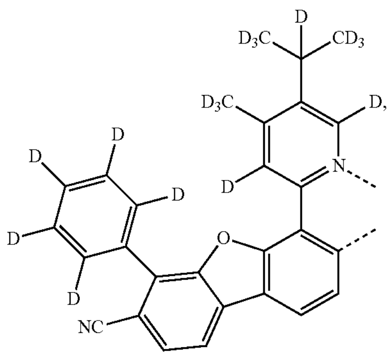
$L_{a845}$
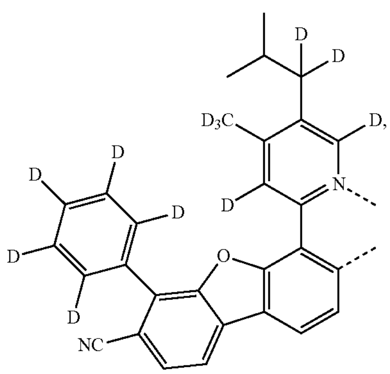
$L_{a846}$
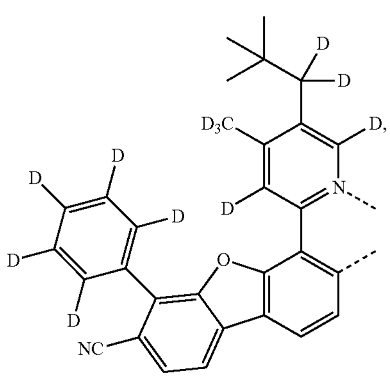
$L_{a847}$
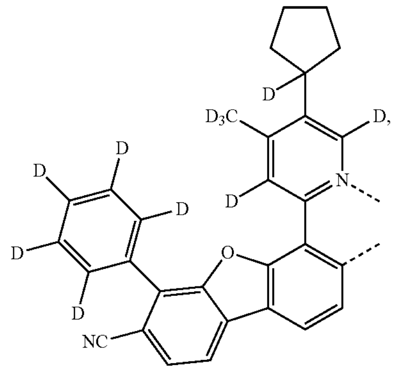
$L_{a848}$
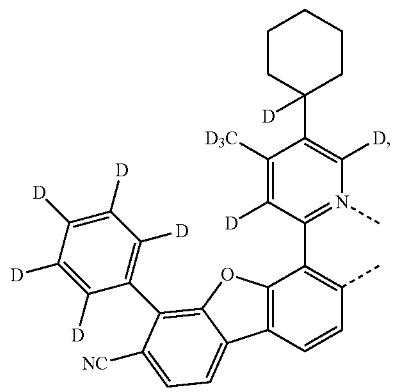
$L_{a849}$
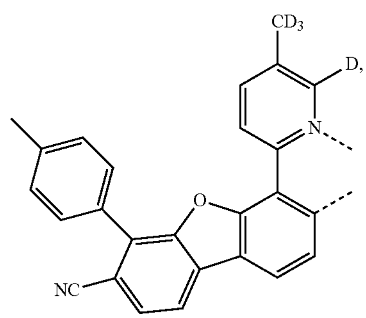
$L_{a850}$
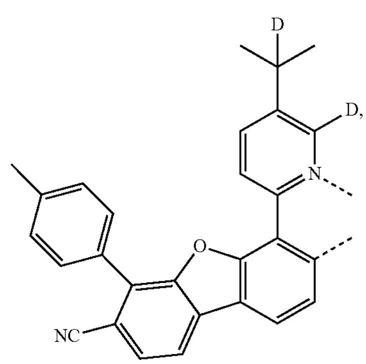
$L_{a851}$ $L_{a852}$
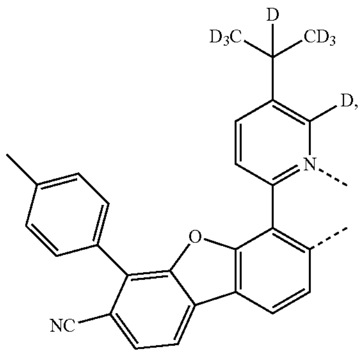
$L_{a853}$
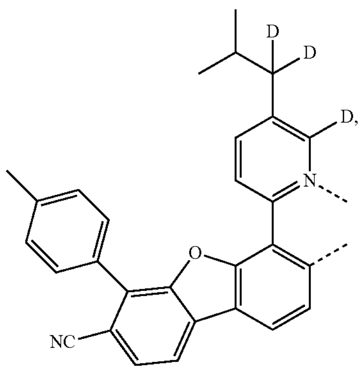
$L_{a854}$
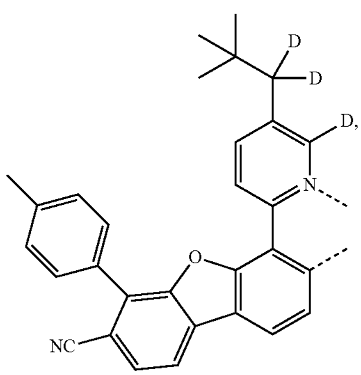
$L_{a855}$
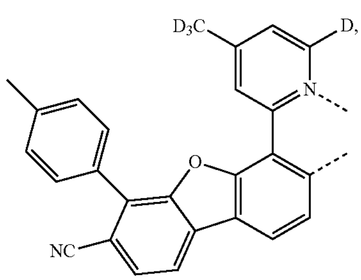
$L_{a856}$
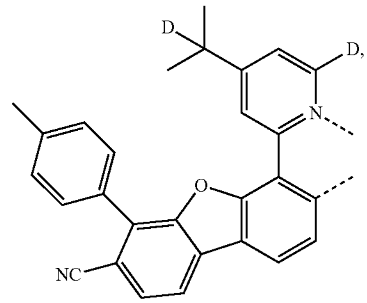
$L_{a857}$
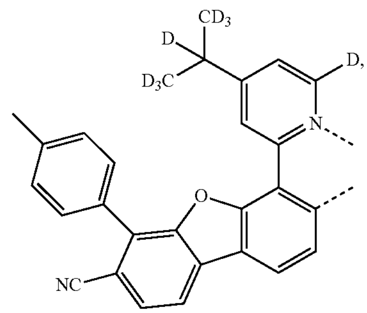
$L_{a858}$
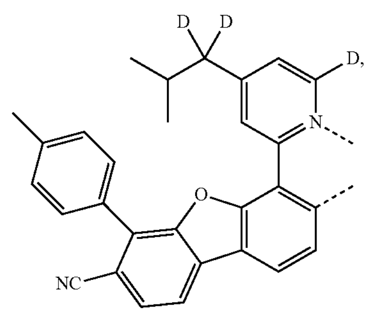
$L_{a859}$
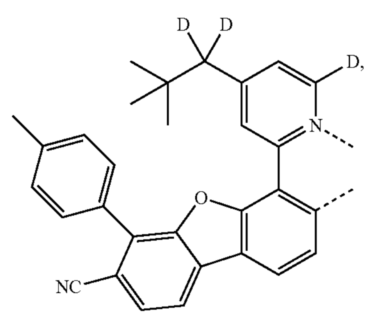
$L_{a860}$
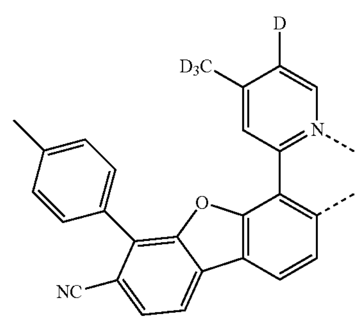

$L_{a861}$
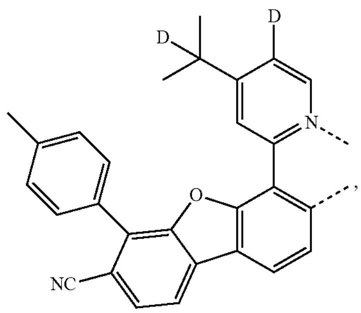
$L_{a862}$
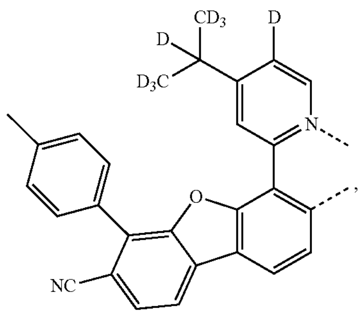
$L_{a863}$
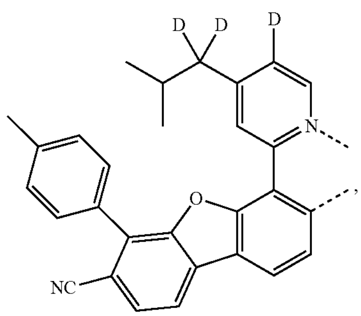
$L_{a864}$
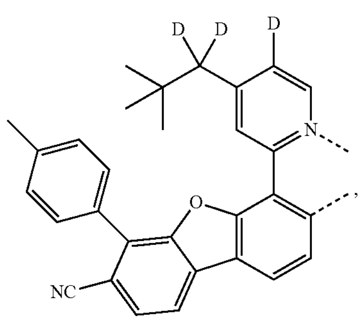
$L_{a865}$
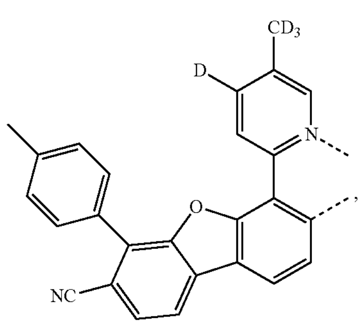
$L_{a866}$
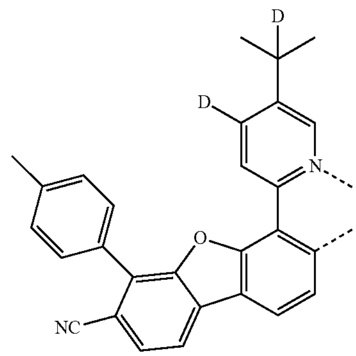
$L_{a867}$
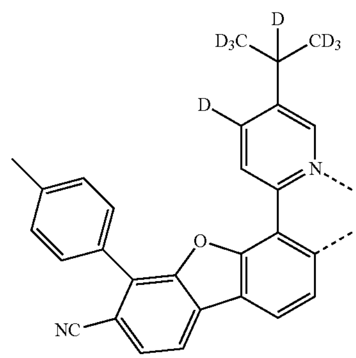
$L_{a868}$
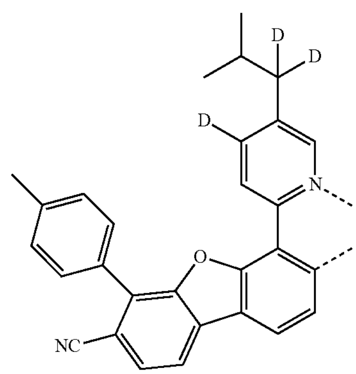
$L_{a869}$
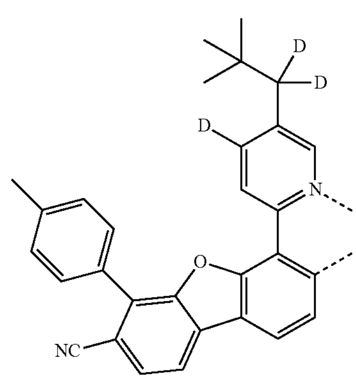

$L_{a870}$
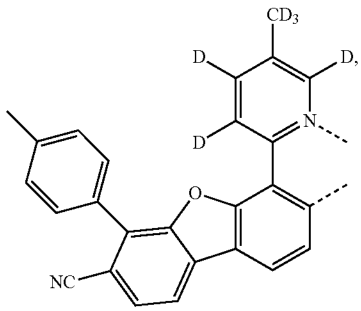
$L_{a871}$
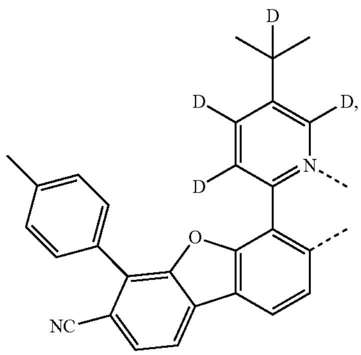
$L_{a872}$
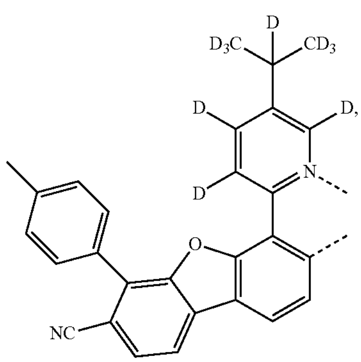
$L_{a873}$
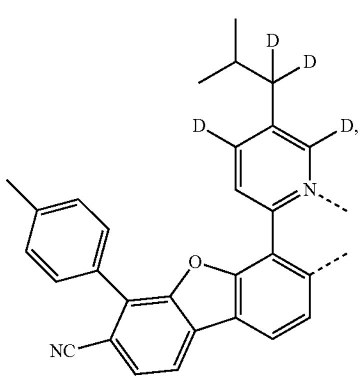
$L_{a874}$
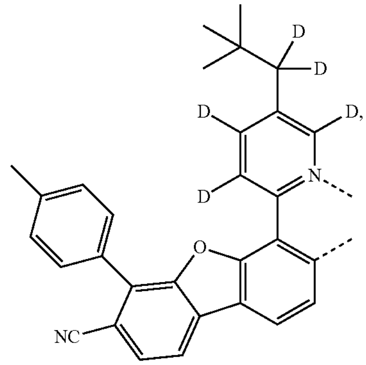
$L_{a875}$
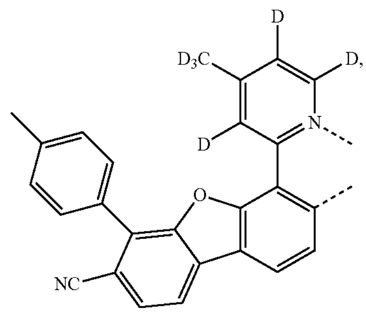
$L_{a876}$
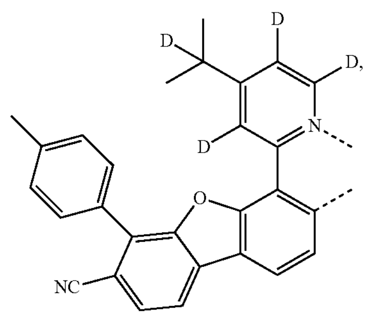
$L_{a877}$
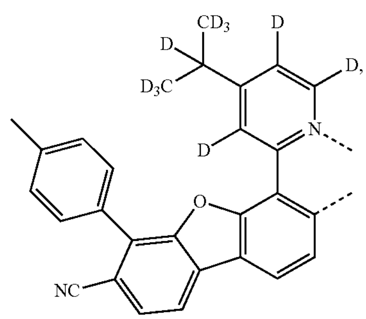
$L_{a878}$
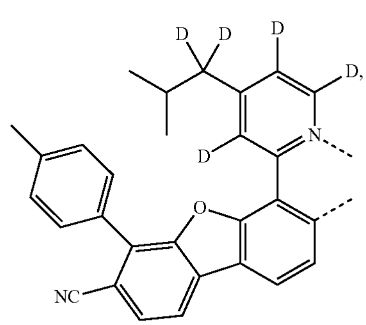

-continued
$L_{a879}$
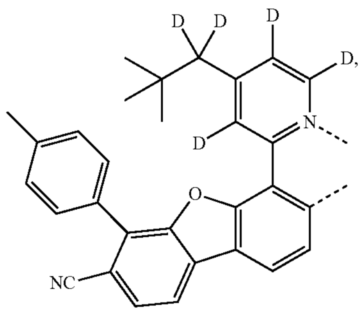
$L_{a880}$
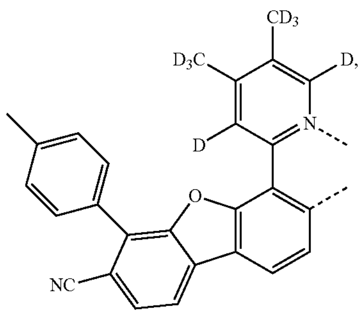
$L_{a881}$
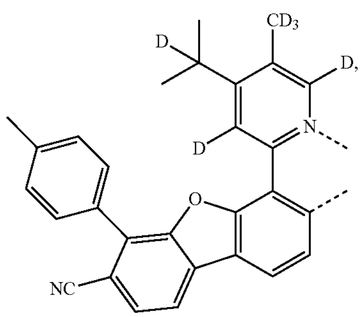
$L_{a882}$
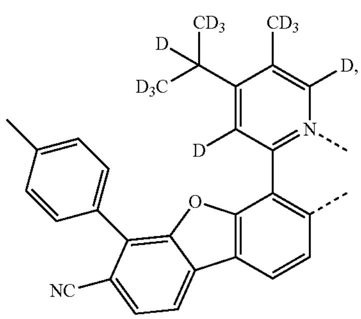
$L_{a883}$
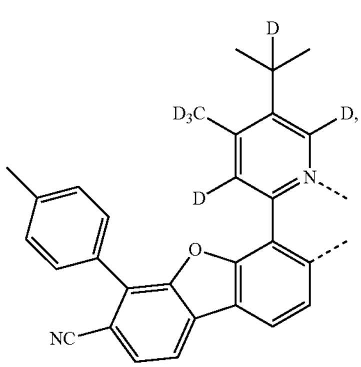
-continued
$L_{a884}$
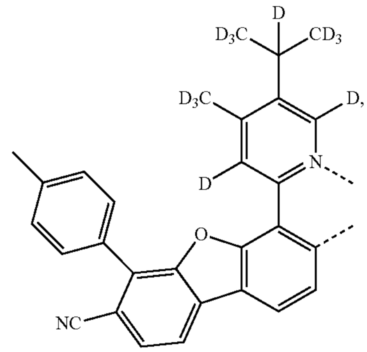
$L_{a885}$
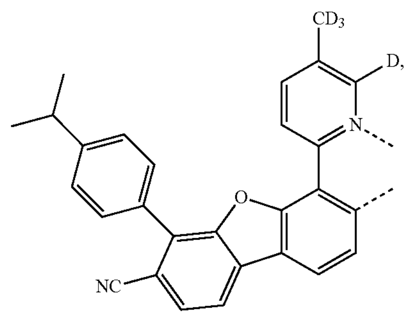
$L_{a886}$
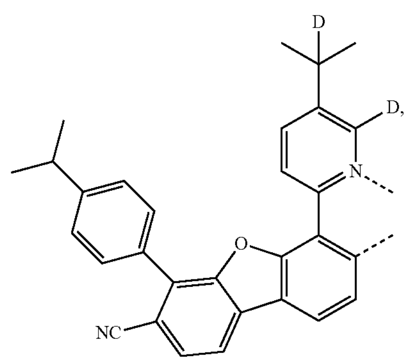
$L_{a887}$
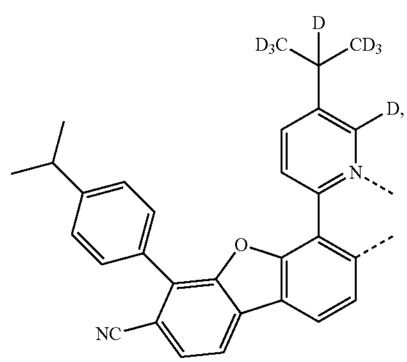

-continued
$L_{a888}$
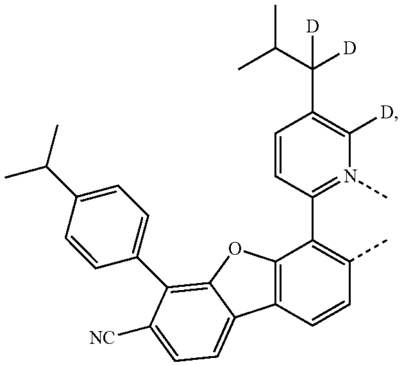
$L_{a889}$
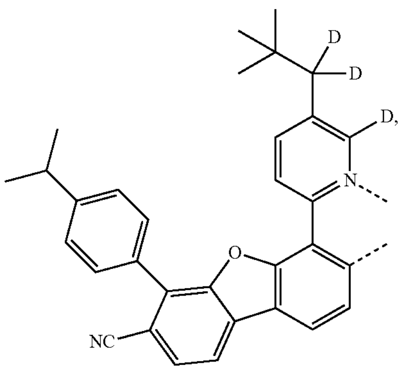
$L_{a890}$
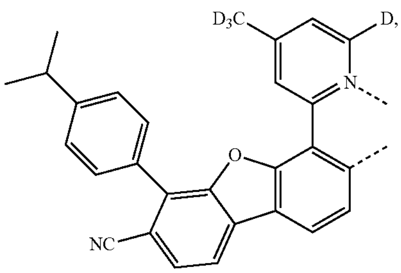
$L_{a891}$
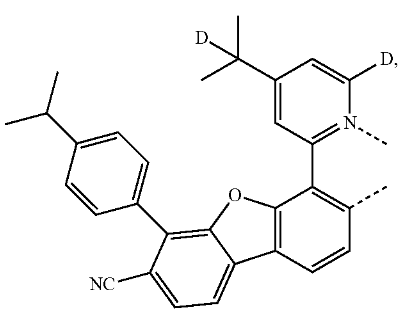
$L_{a892}$
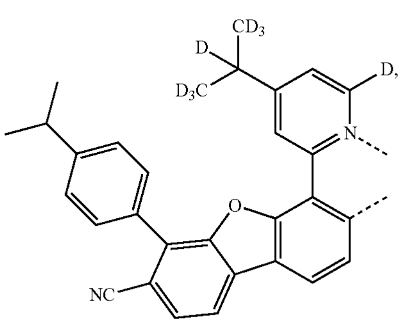
-continued
$L_{a893}$
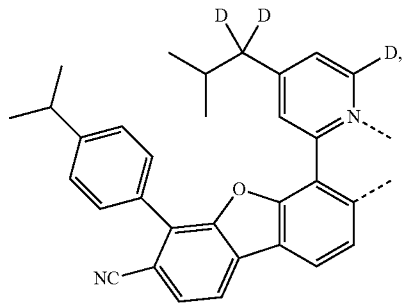
$L_{a894}$
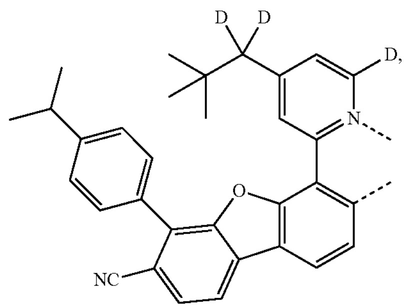
$L_{a895}$
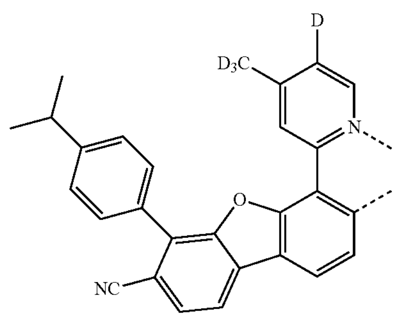
$L_{a896}$
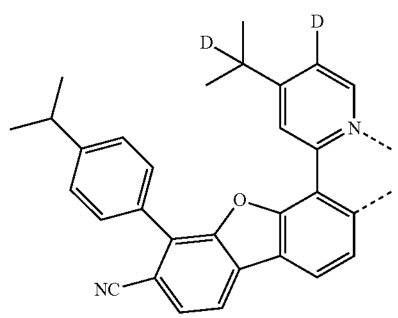
$L_{a897}$
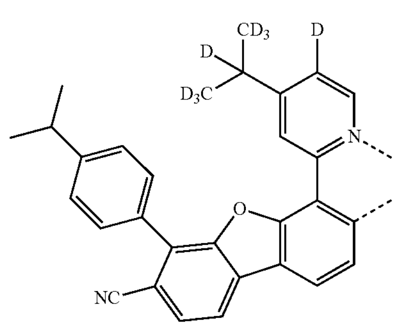

-continued
$L_{a898}$
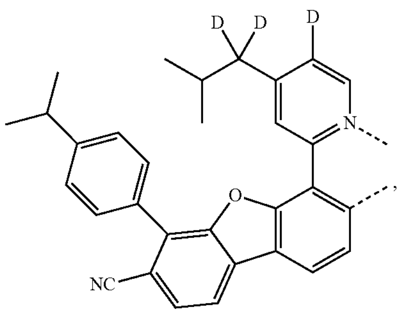
$L_{a899}$
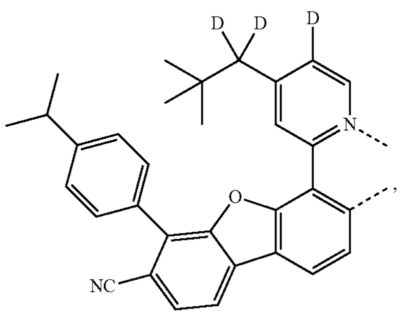
$L_{a900}$
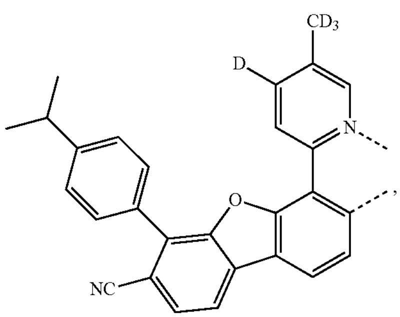
$L_{a901}$
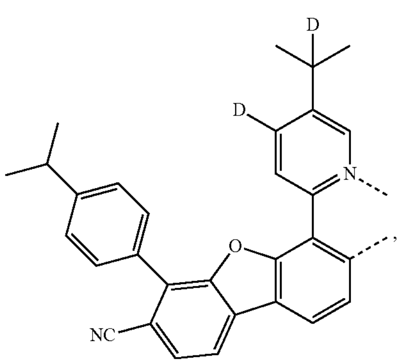
-continued
$L_{a902}$
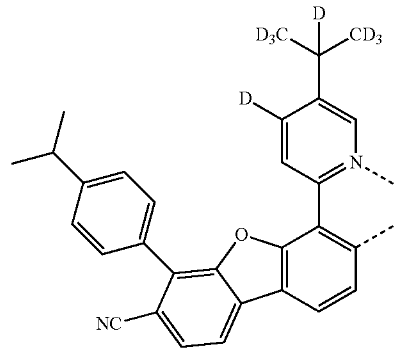
$L_{a903}$
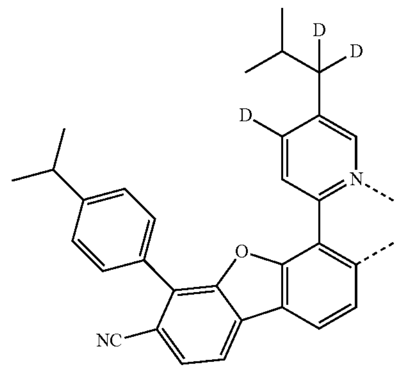
$L_{a904}$
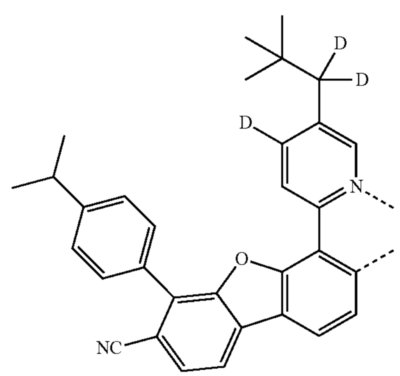
$L_{a905}$
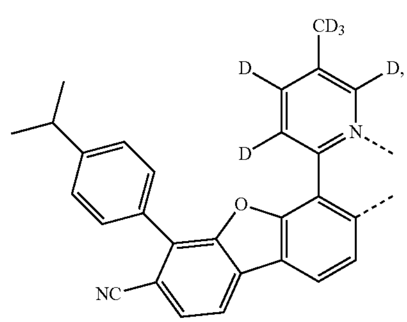

$L_{a906}$
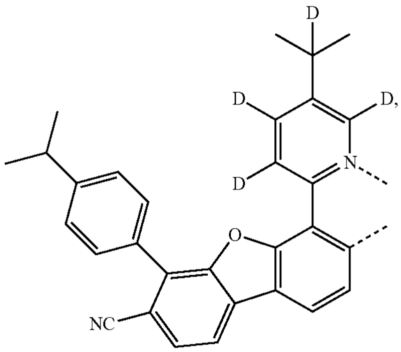
$L_{a907}$
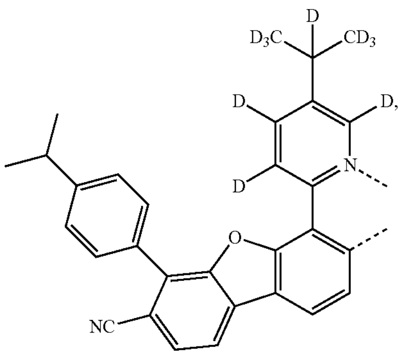
$L_{a908}$
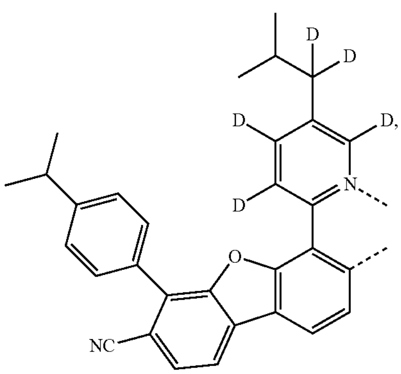
$L_{a909}$
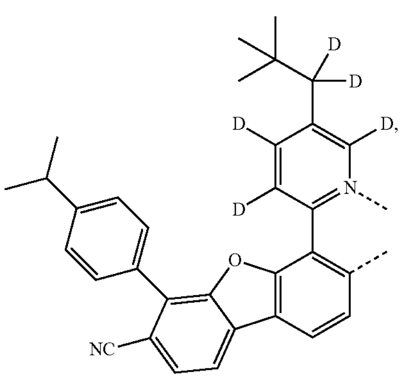
$L_{a910}$
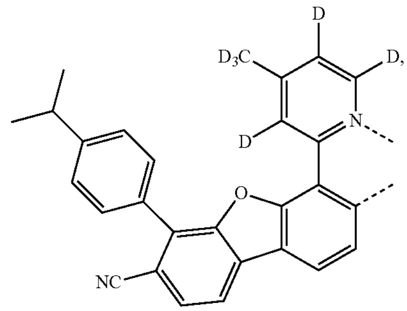
$L_{a911}$
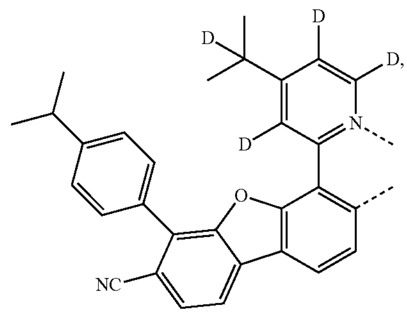
$L_{a912}$
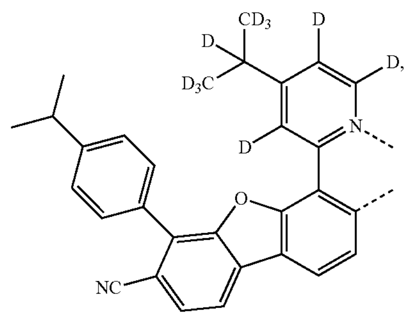
$L_{a913}$
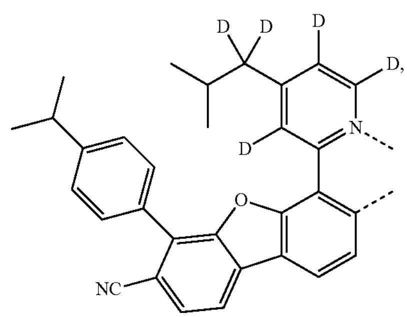
$L_{a914}$
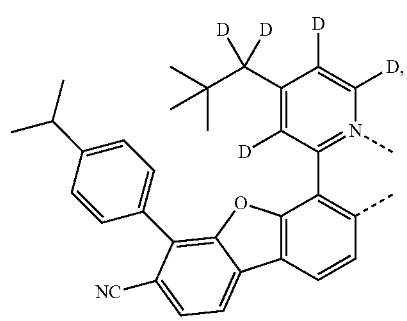

-continued
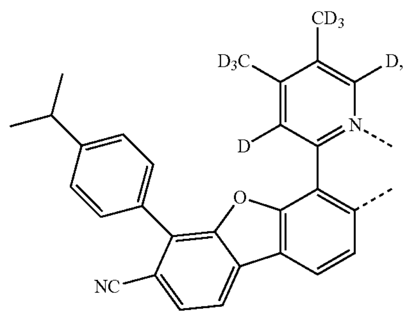
$L_{a915}$
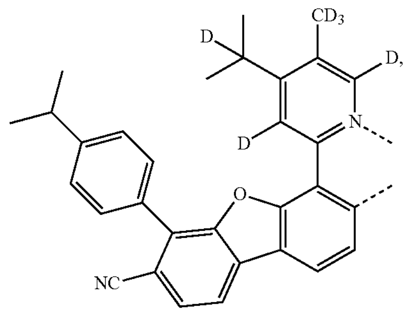
$L_{a916}$
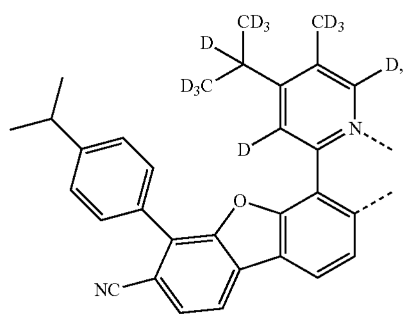
$L_{a917}$
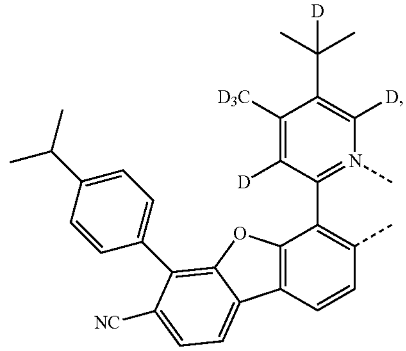
$L_{a918}$
-continued
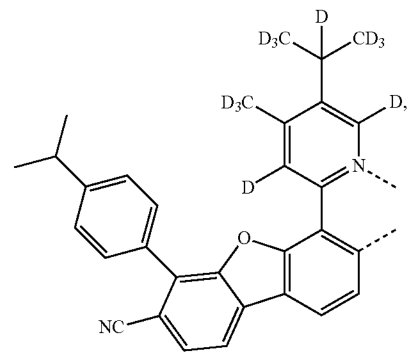
$L_{a919}$
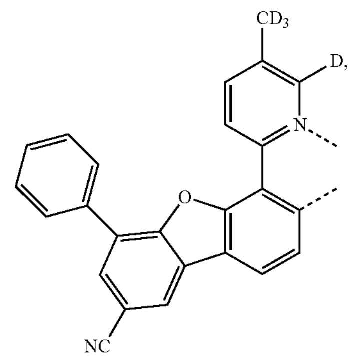
$L_{a920}$
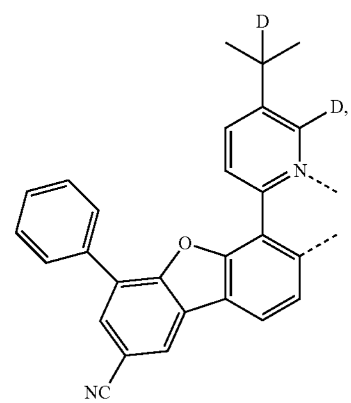
$L_{a921}$
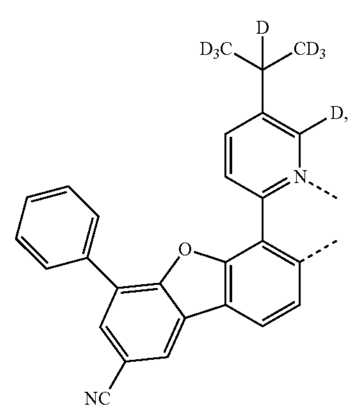
$L_{a922}$ -continued
La923
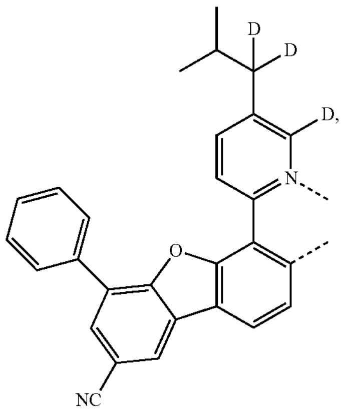
La924
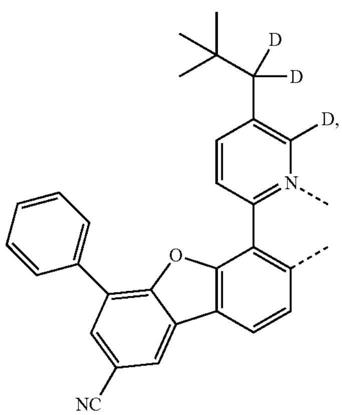
La925
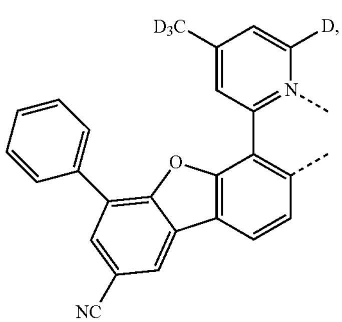
La926
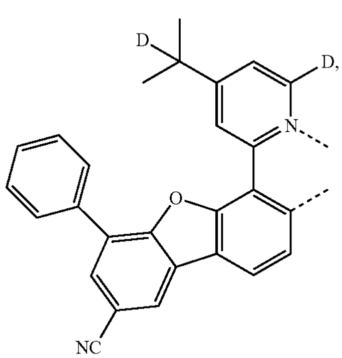
-continued
La927
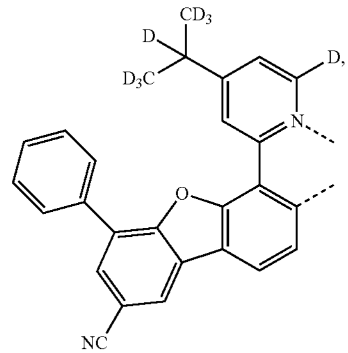
La928
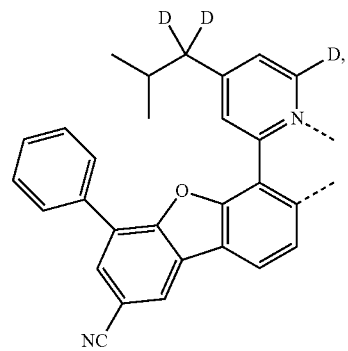
La929
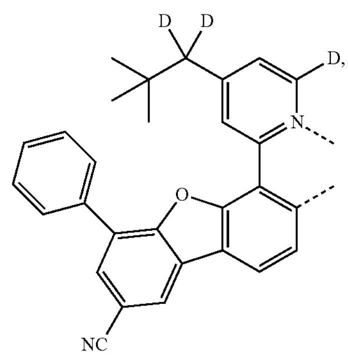
La930
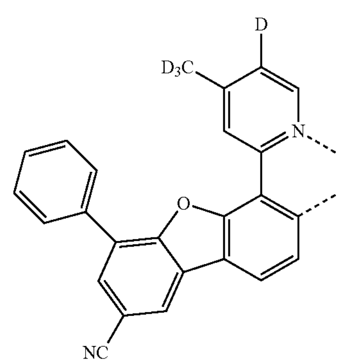

-continued
$L_{a931}$
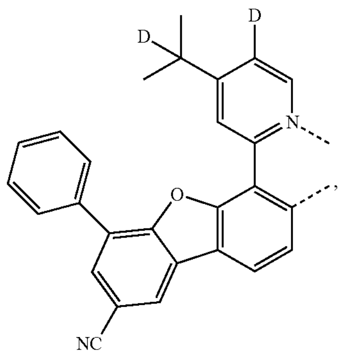
$L_{a932}$
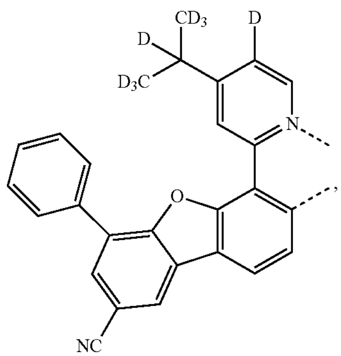
$L_{a933}$
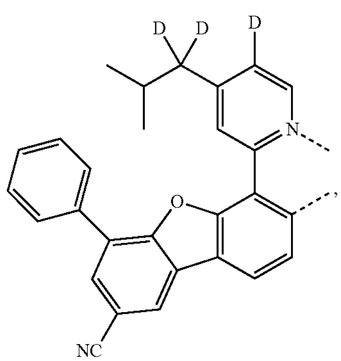
$L_{a934}$
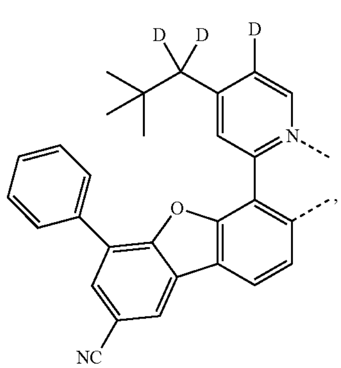
-continued
$L_{a935}$
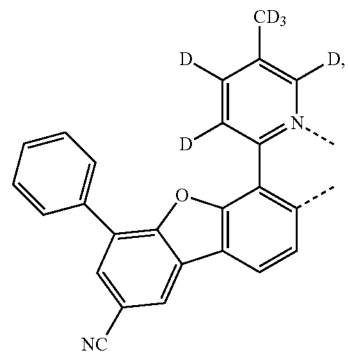
$L_{a936}$
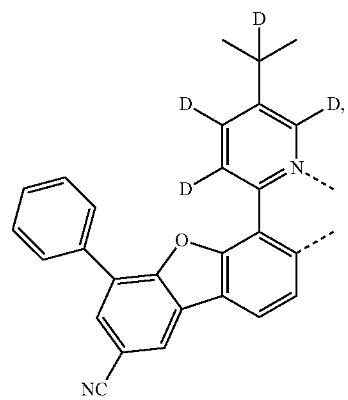
$L_{a937}$
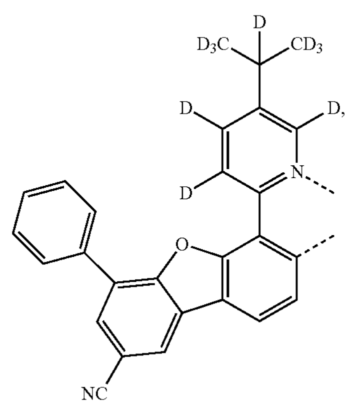
$L_{a938}$
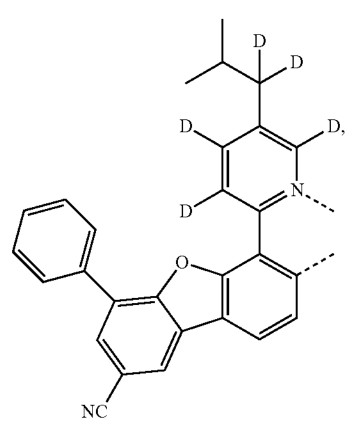

-continued
$L_{a939}$
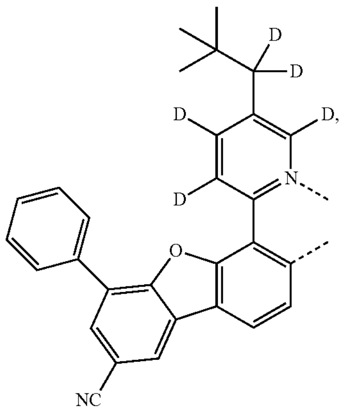
$L_{a940}$
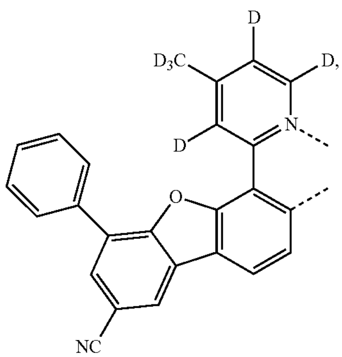
$L_{a941}$
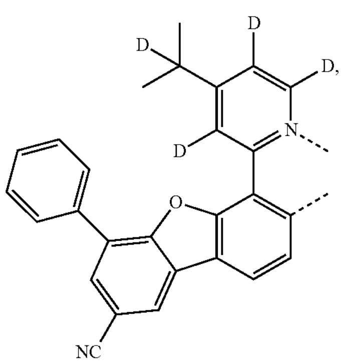
$L_{a942}$
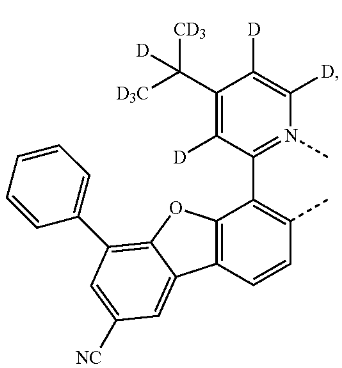
-continued
$L_{a943}$
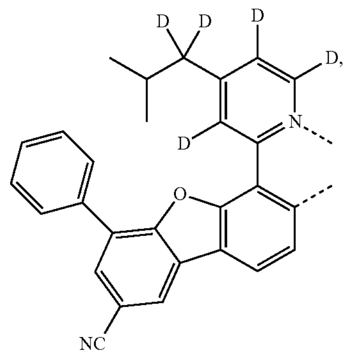
$L_{a944}$
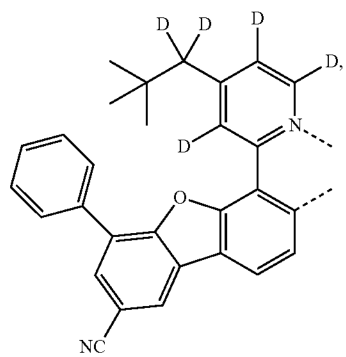
$L_{a945}$
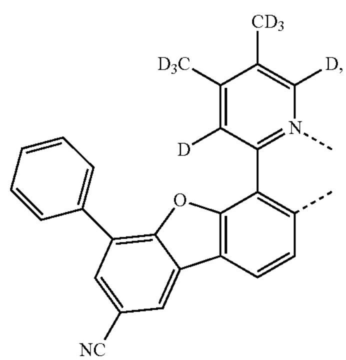
$L_{a946}$
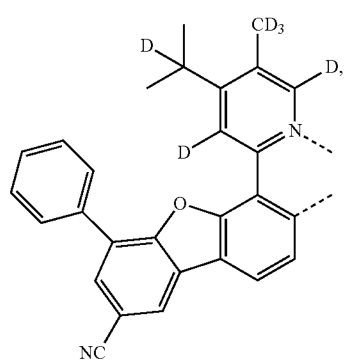

-continued
$L_{a947}$
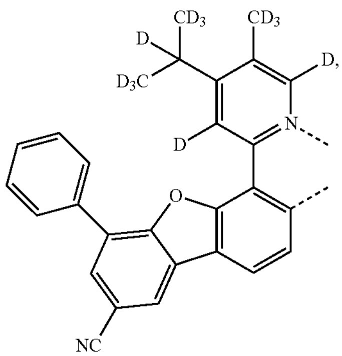
$L_{a948}$
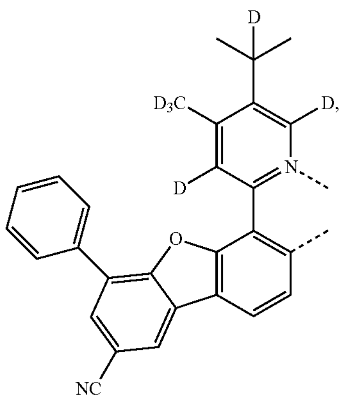
$L_{a949}$
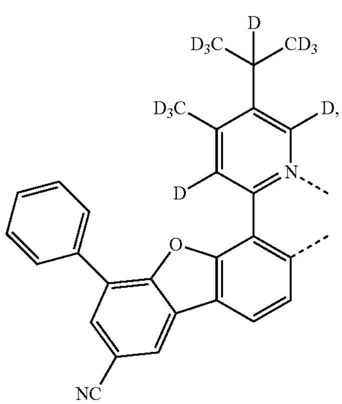
$L_{a950}$
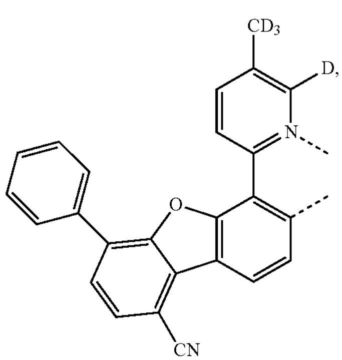
-continued
$L_{a951}$
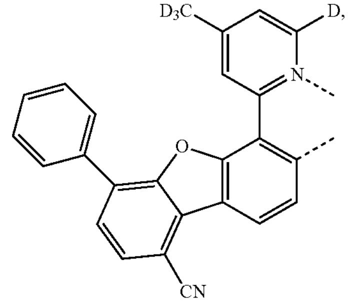
$L_{a952}$
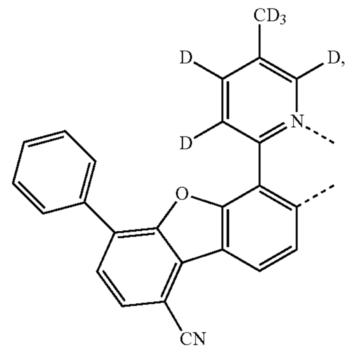
$L_{a953}$
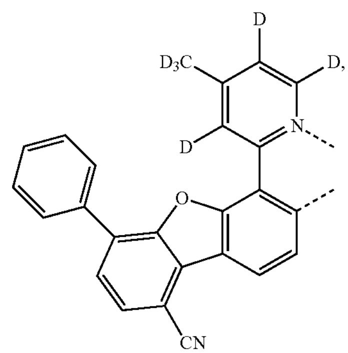
$L_{a954}$
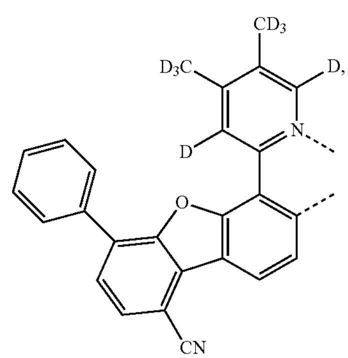
$L_{a955}$
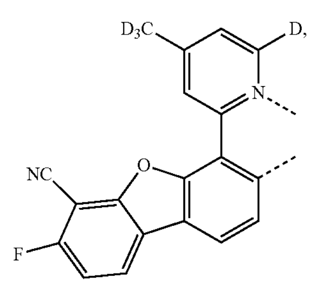

-continued
$L_{a956}$
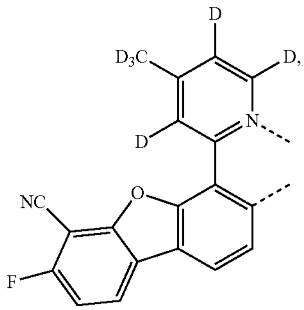
$L_{a957}$
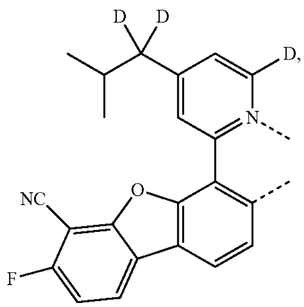
$L_{a958}$
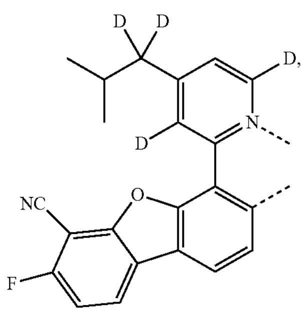
$L_{a959}$
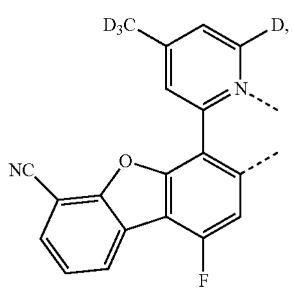
$L_{a960}$
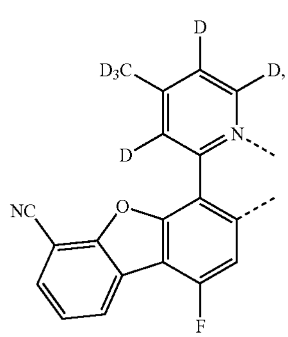
-continued
$L_{a961}$
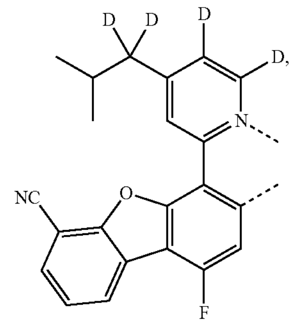
$L_{a962}$
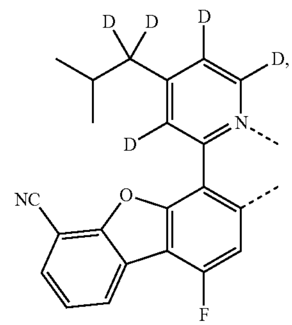
$L_{a963}$
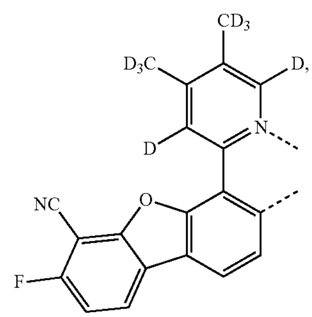
$L_{a964}$
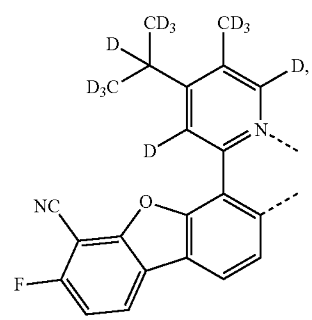
$L_{a965}$
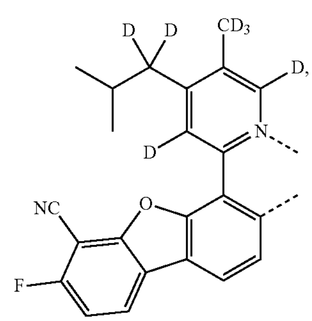

-continued
L$_{a966}$
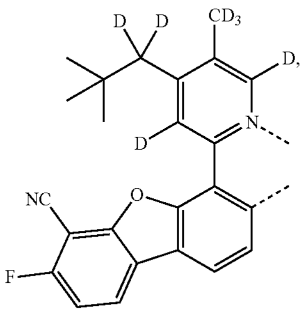
L$_{a967}$
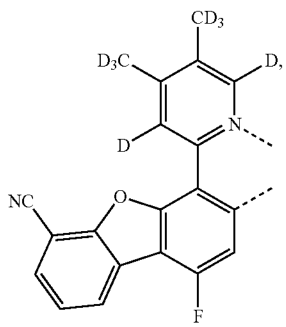
L$_{a968}$
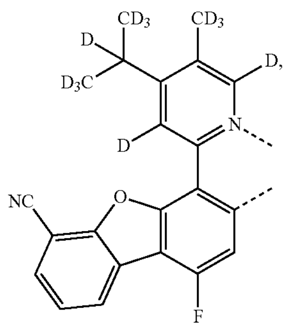
L$_{a969}$
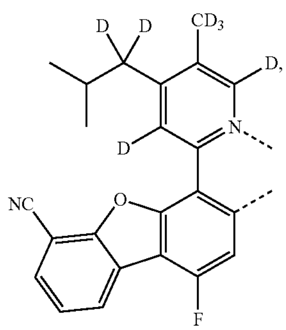
L$_{a970}$
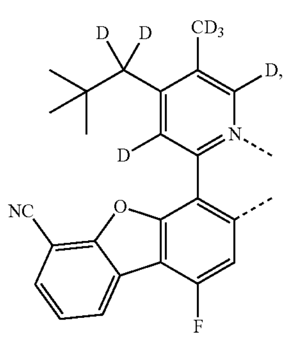
-continued
L$_{a971}$
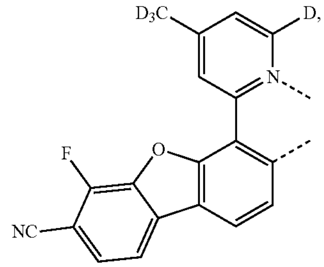
L$_{a972}$
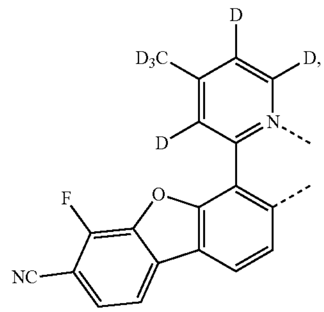
L$_{a973}$
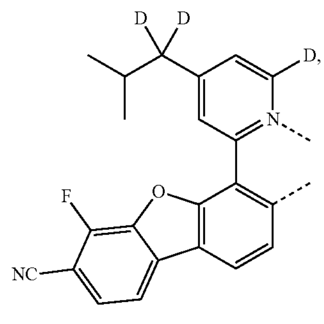
L$_{a974}$
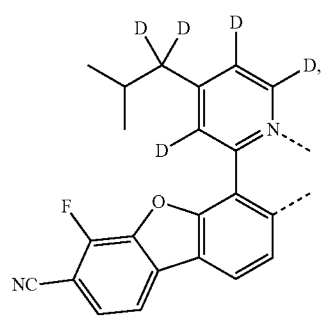
L$_{a975}$
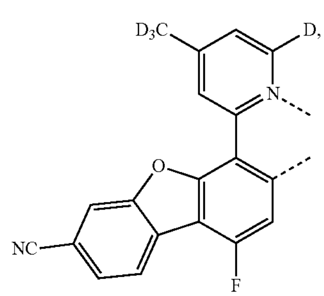

-continued
$L_{a976}$
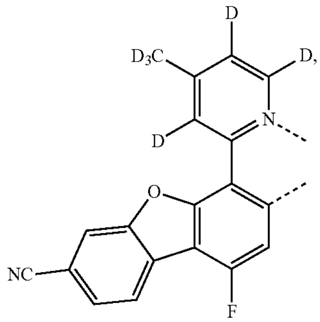
$L_{a977}$
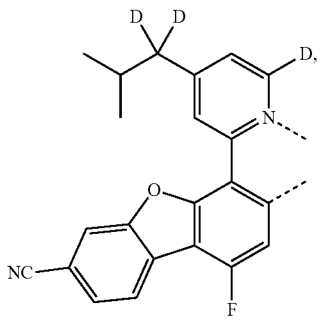
$L_{a978}$
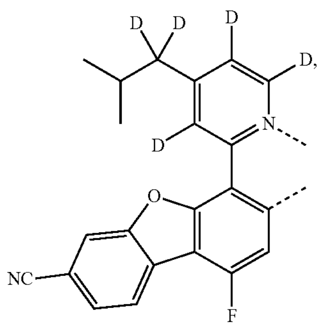
$L_{a979}$
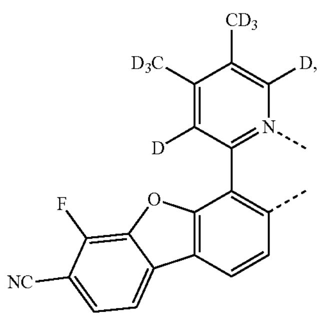
$L_{a980}$
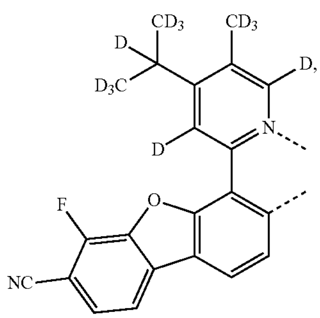
-continued
$L_{a981}$
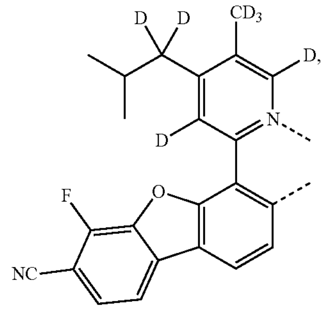
$L_{a982}$
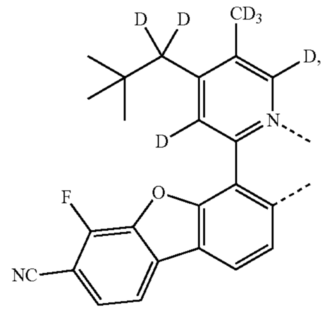
$L_{a983}$
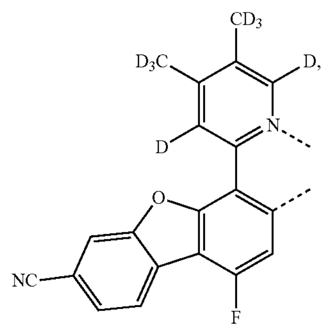
$L_{a984}$
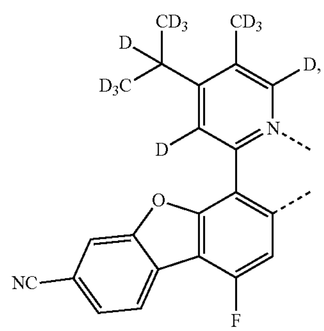
$L_{a985}$
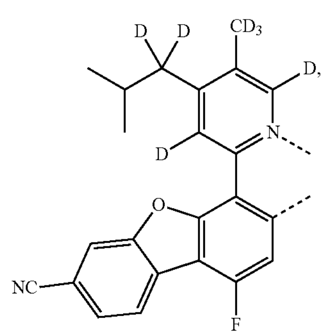

-continued
$L_{a986}$
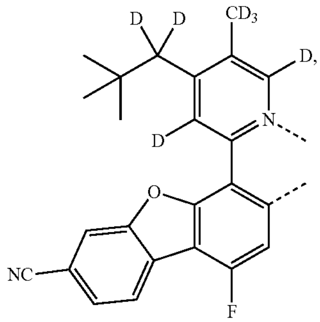
$L_{a987}$
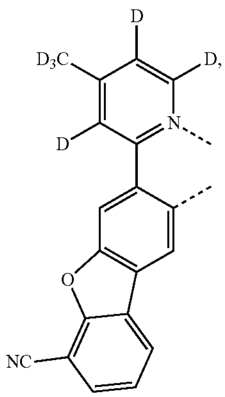
$L_{a988}$
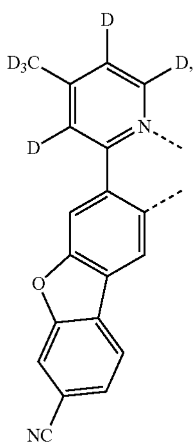
$L_{a989}$
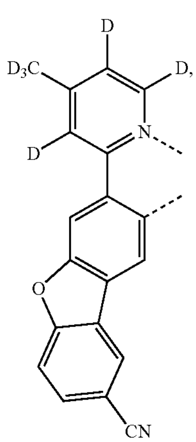
-continued
$L_{a990}$
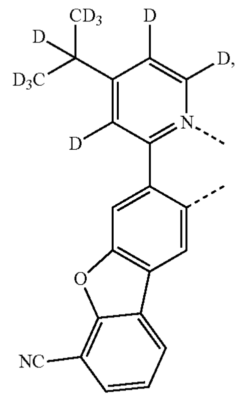
$L_{a991}$
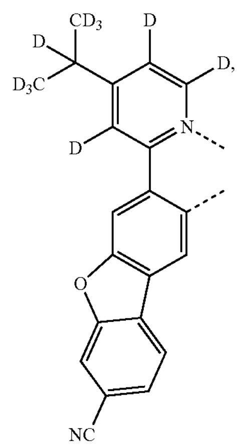
$L_{a992}$
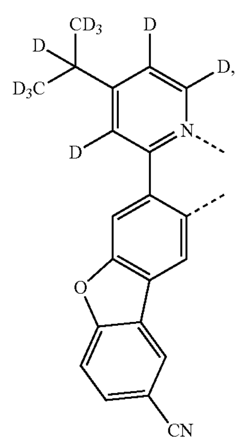

-continued
$L_{a993}$
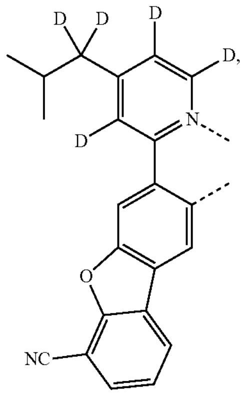
$L_{a994}$
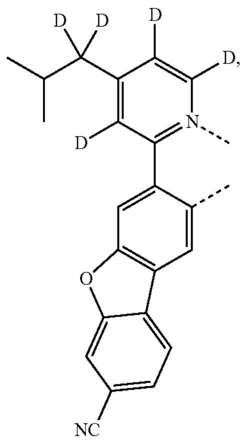
$L_{a995}$
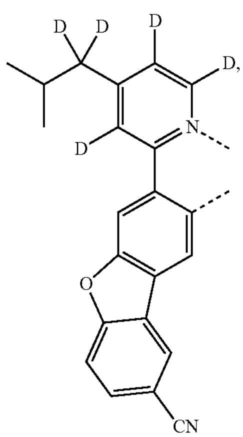
-continued
$L_{a996}$
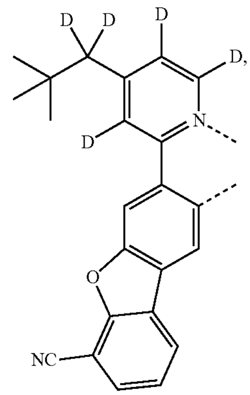
$L_{a997}$
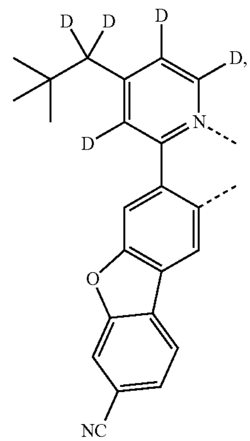
$L_{a998}$
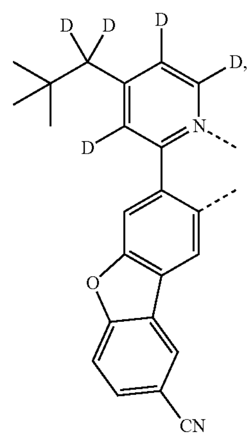

L$_{a999}$
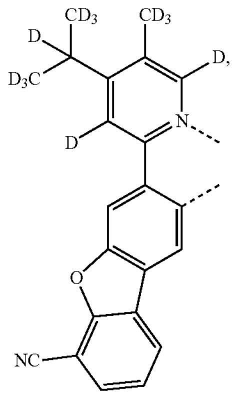
L$_{a1000}$
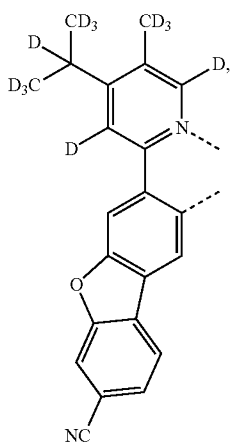
L$_{a1001}$
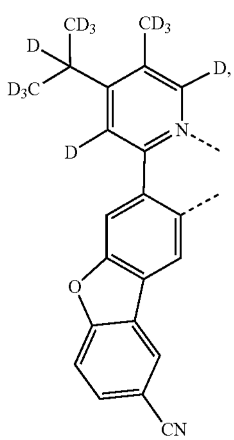
L$_{a1002}$
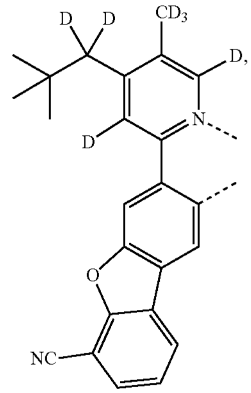
L$_{a1003}$
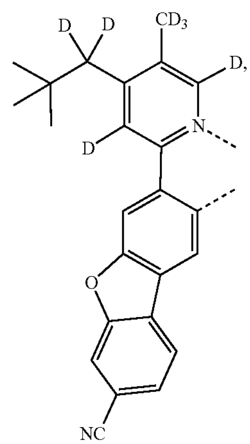
L$_{a1004}$
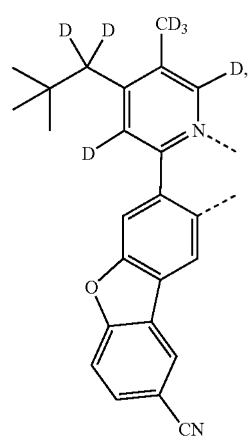

-continued
$L_{a1005}$
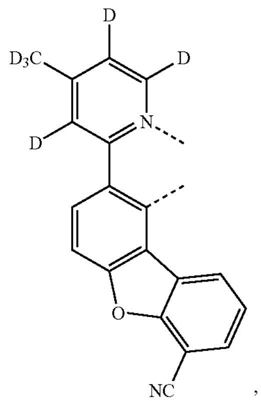
$L_{a1006}$
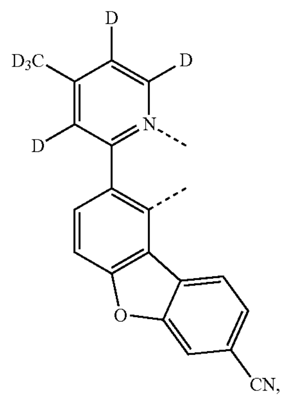
$L_{a1007}$
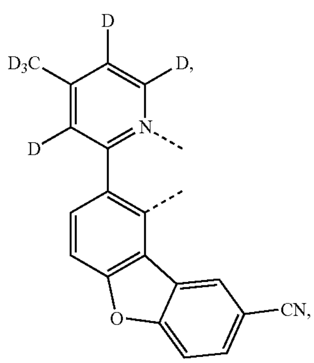
$L_{a1008}$
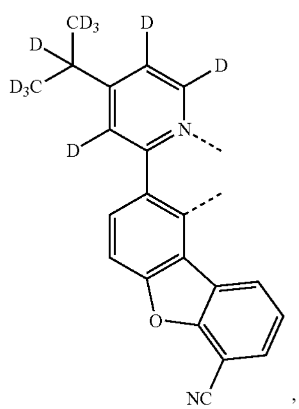
-continued
$L_{a1009}$
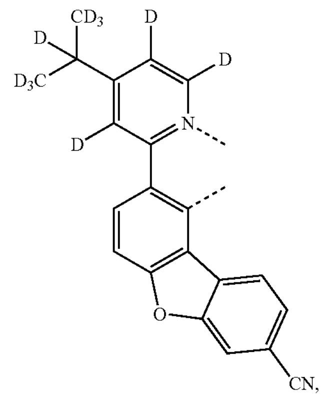
$L_{a1010}$
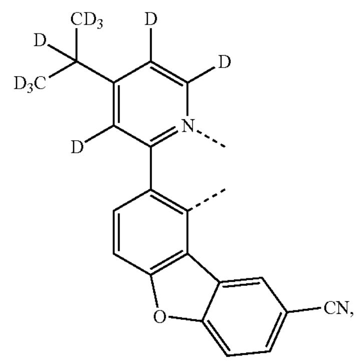
$L_{a1011}$
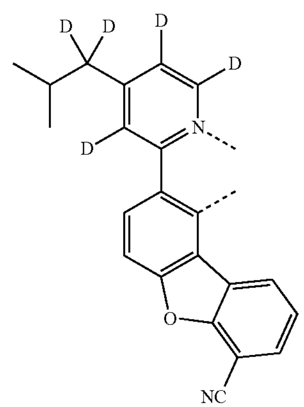
$L_{a1012}$
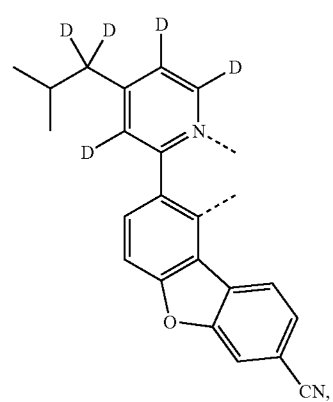

-continued
$L_{a1013}$
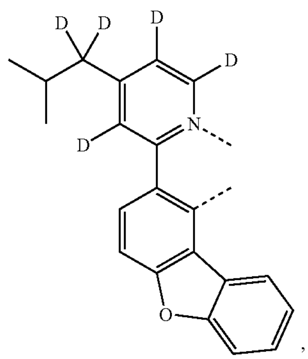
$L_{a1014}$
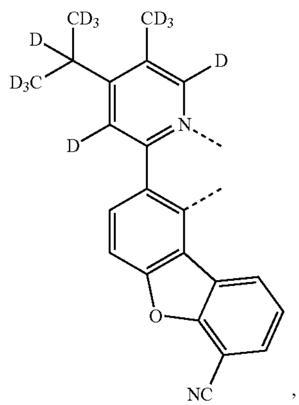
$L_{a1015}$
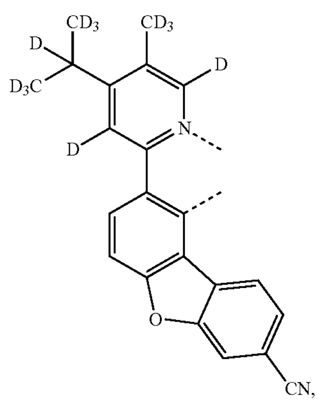
$L_{a1016}$
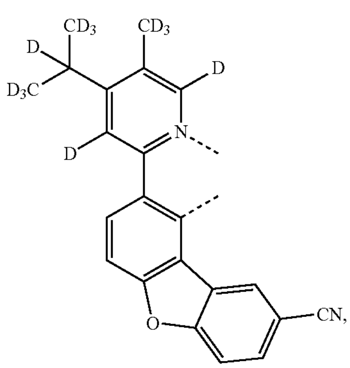
-continued
$L_{a1017}$
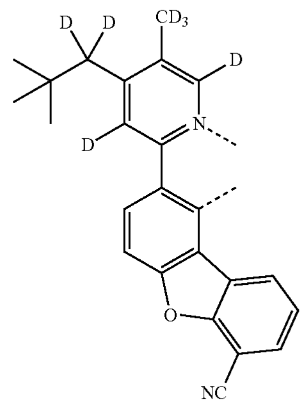
$L_{a1018}$
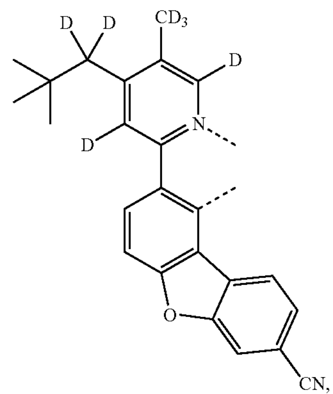
$L_{a1019}$
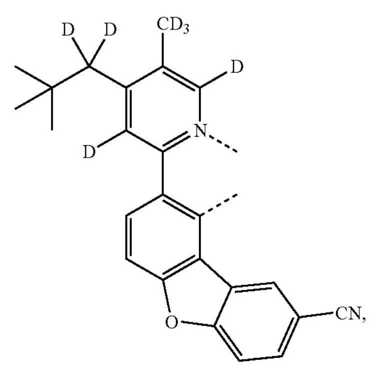
$L_{a1020}$
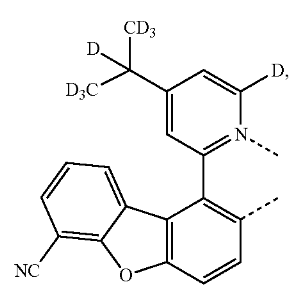

-continued
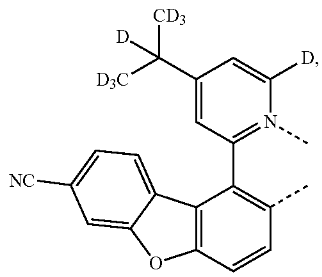
$L_{a1021}$
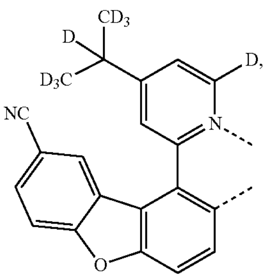
$L_{a1022}$
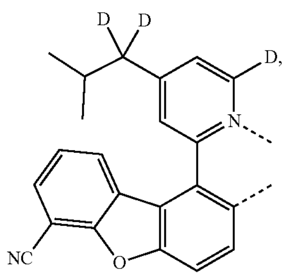
$L_{a1023}$
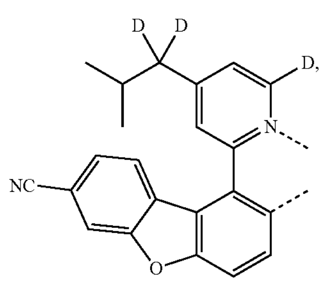
$L_{a1024}$
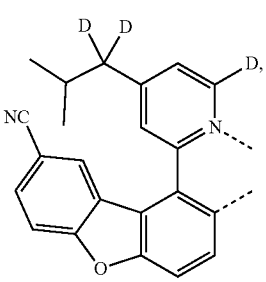
$L_{a1025}$
-continued
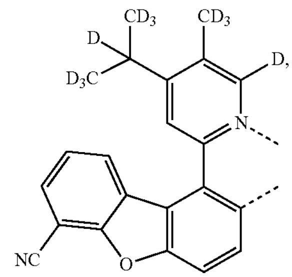
$L_{a1026}$
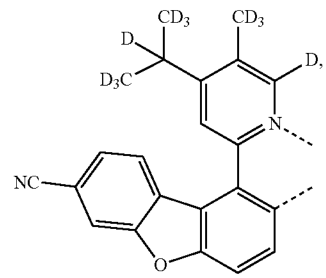
$L_{a1027}$
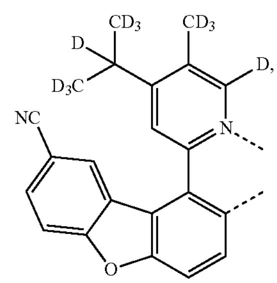
$L_{a1028}$
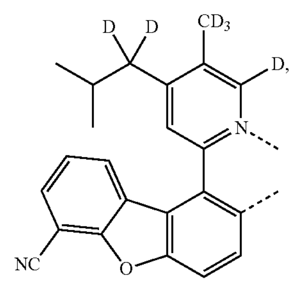
$L_{a1029}$
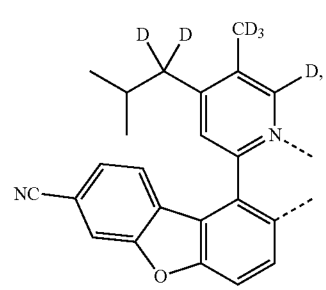
$L_{a1030}$ -continued
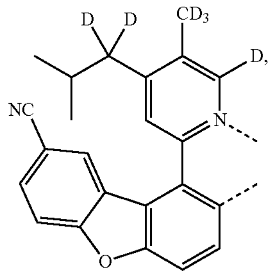
$L_{a1031}$
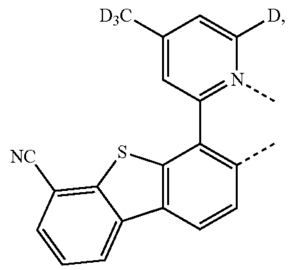
$L_{a1032}$
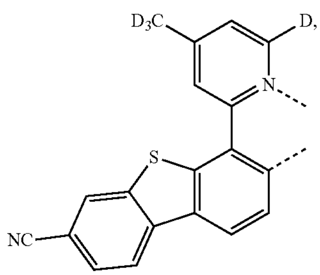
$L_{a1033}$
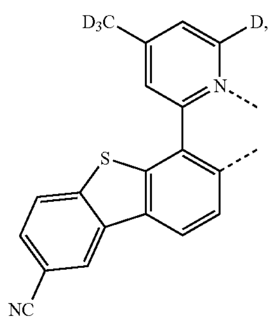
$L_{a1034}$
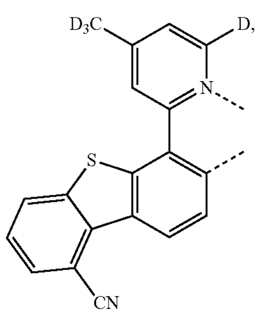
$L_{a1035}$
-continued
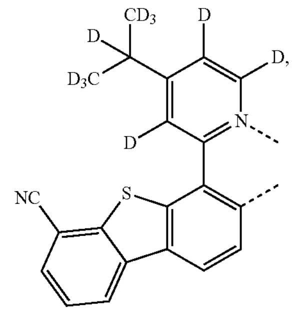
$L_{a1036}$
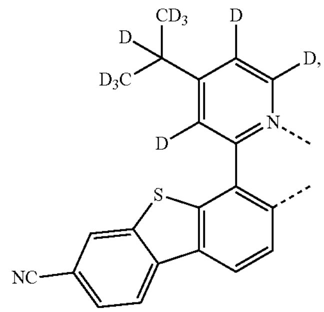
$L_{a1037}$
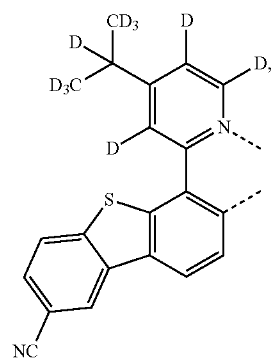
$L_{a1038}$
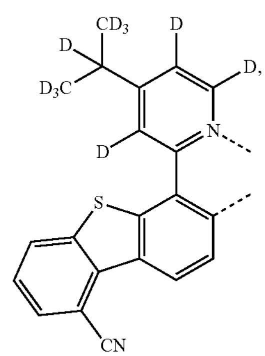
$L_{a1039}$
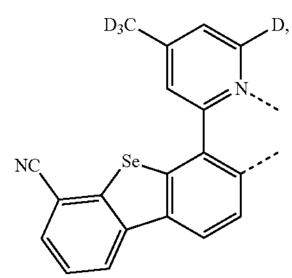
$L_{a1040}$ -continued
L$_{a1041}$
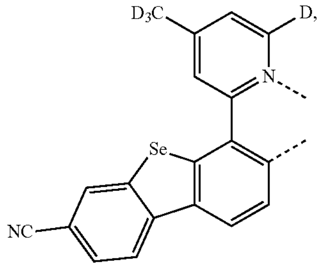
L$_{a1042}$
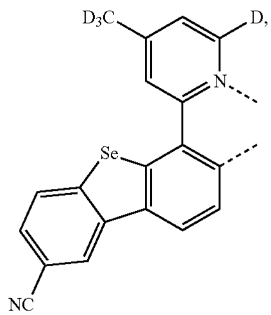
L$_{a1043}$
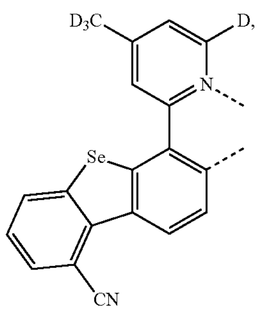
L$_{a1044}$
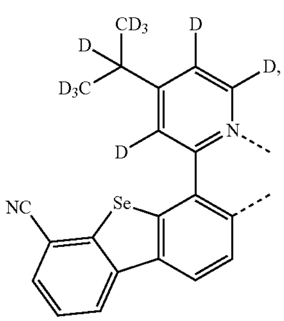
L$_{a1045}$
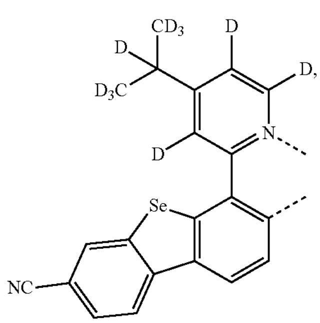
-continued
L$_{a1046}$
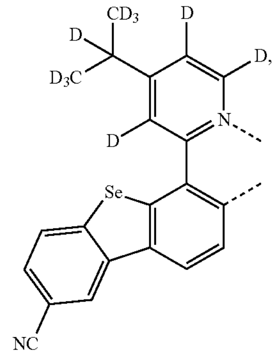
L$_{a1047}$
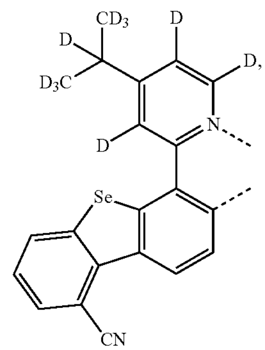
L$_{a1048}$
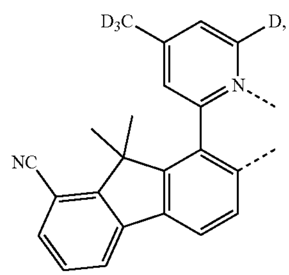
L$_{a1049}$
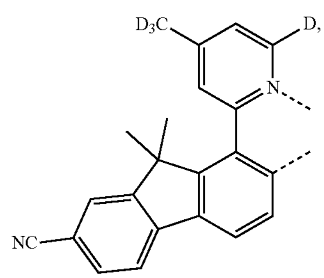
L$_{a1050}$
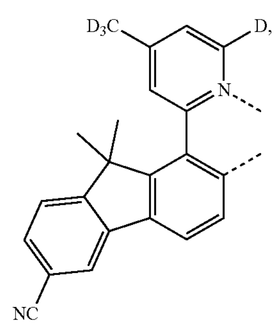

-continued
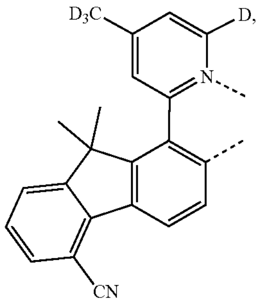
$L_{a1051}$
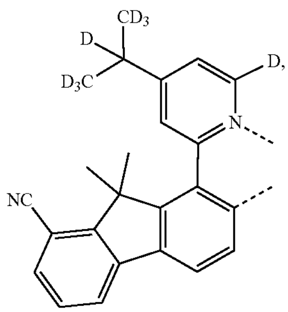
$L_{a1052}$
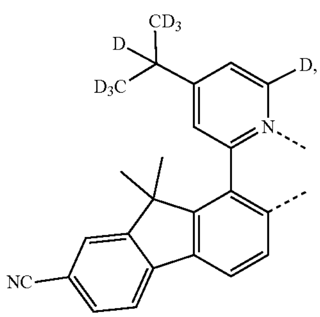
$L_{a1053}$
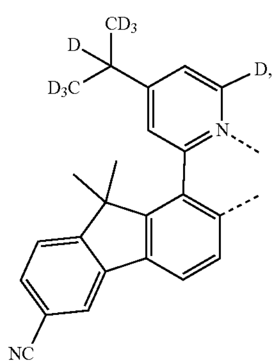
$L_{a1054}$
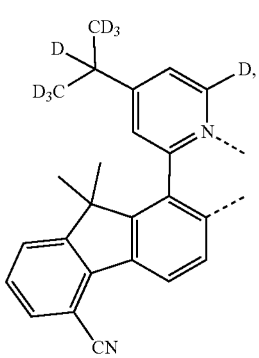
$L_{a1055}$
-continued
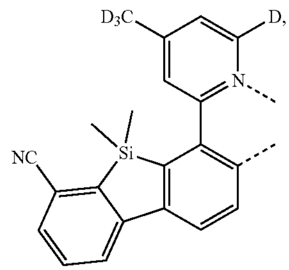
$L_{a1056}$
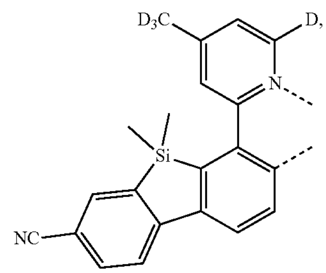
$L_{a1057}$
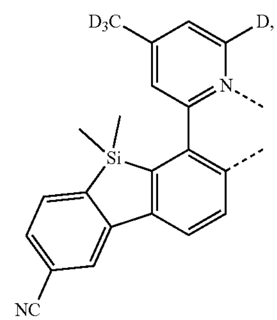
$L_{a1058}$
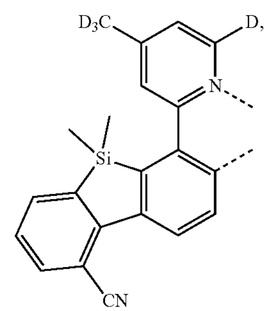
$L_{a1059}$
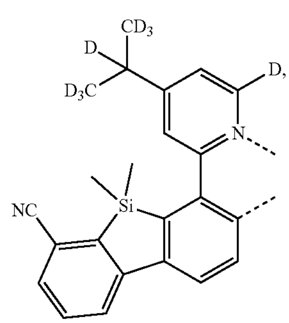
$L_{a1060}$ $L_{a1061}$
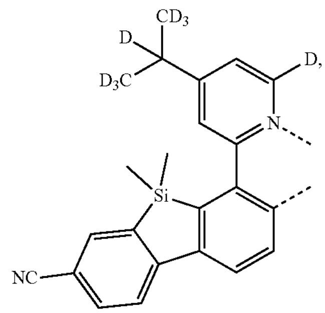
$L_{a1062}$
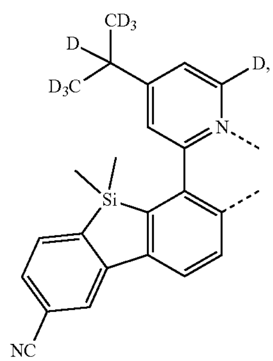
$L_{a1063}$
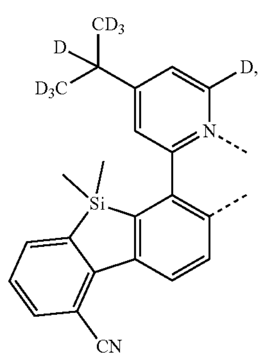
$L_{a1064}$
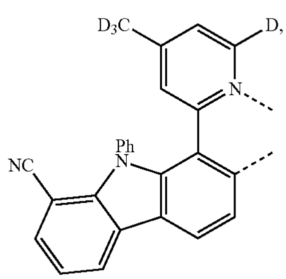
$L_{a1065}$
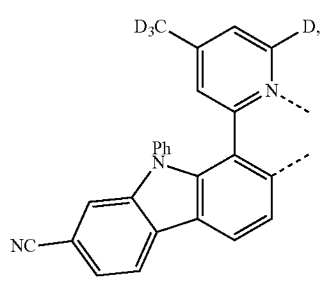
$L_{a1066}$
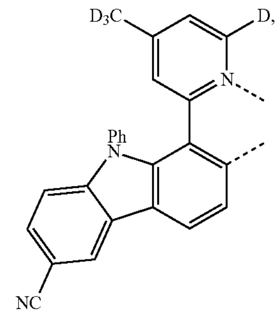
$L_{a1067}$
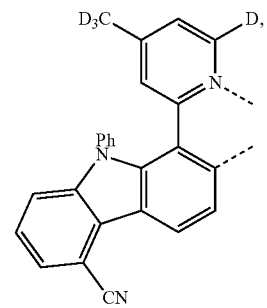
$L_{a1068}$
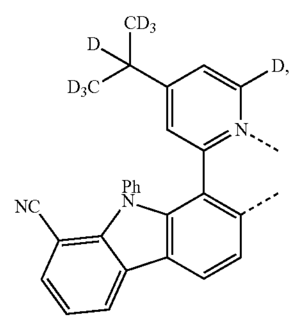
$L_{a1069}$
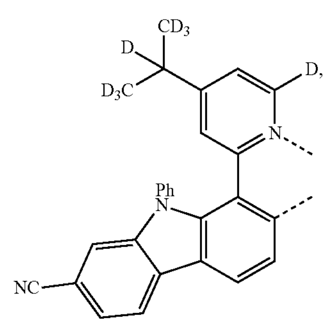
$L_{a1070}$
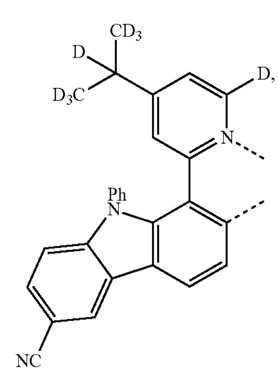

$L_{a1071}$
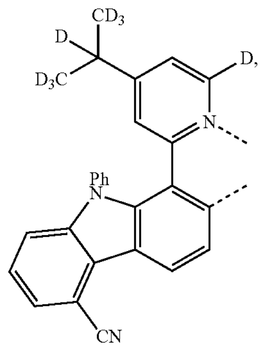
$L_{a1072}$
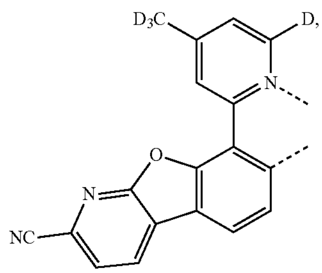
$L_{a1073}$
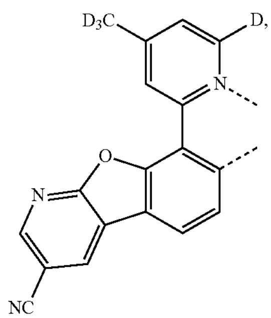
$L_{a1074}$
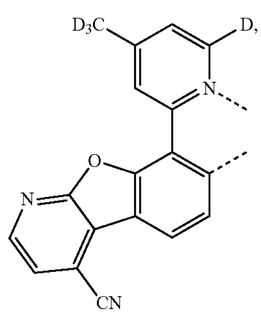
$L_{a1075}$
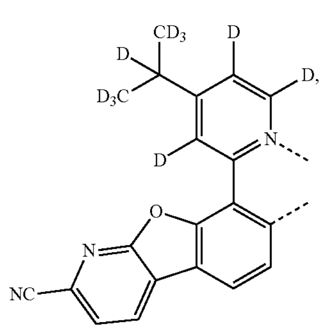
$L_{a1076}$
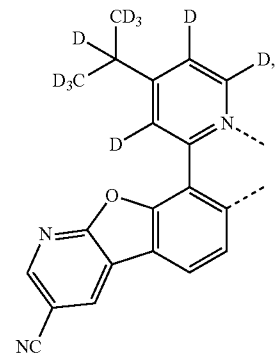
$L_{a1077}$
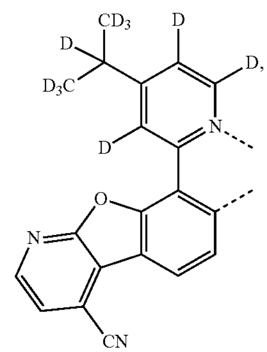
$L_{a1078}$
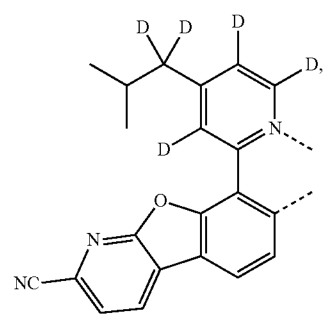
$L_{a1079}$
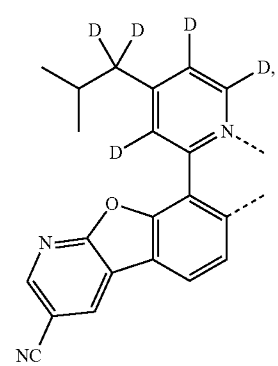

-continued
$L_{a1080}$
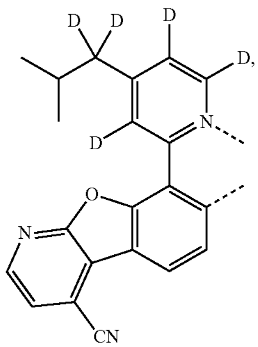
$L_{a1081}$
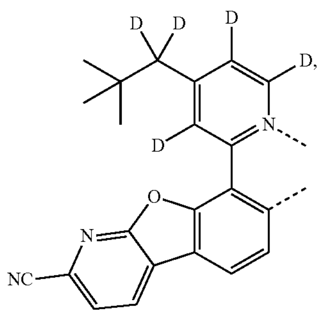
$L_{a1082}$
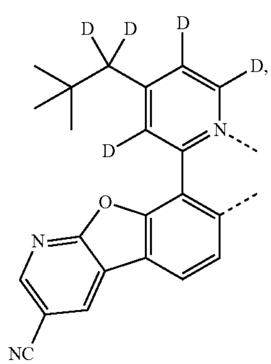
$L_{a1083}$
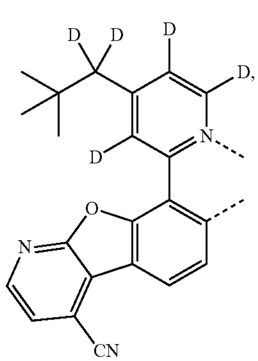
-continued
$L_{a1084}$
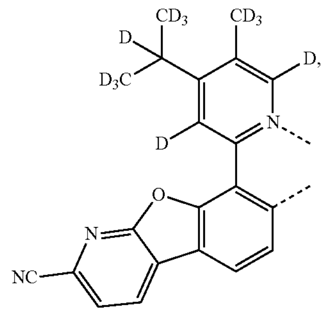
$L_{a1085}$
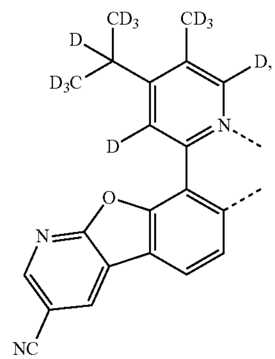
$L_{a1086}$
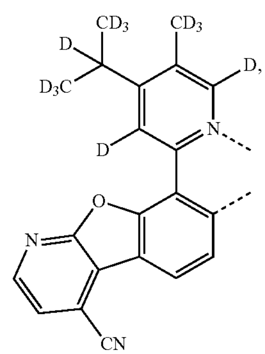
$L_{a1087}$
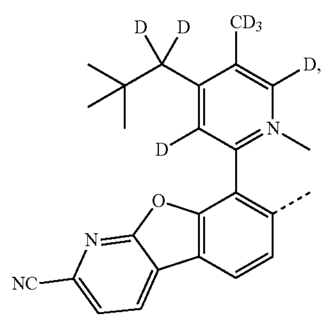

$L_{a1088}$
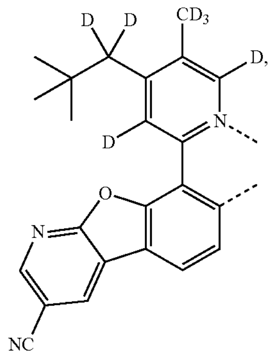
$L_{a1089}$
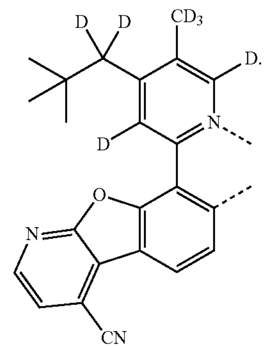
3. The metal complex of claim 2, wherein the ligand $L_b$ is, at each occurrence identically or differently, any one selected from the group consisting of:
$L_{b1}$
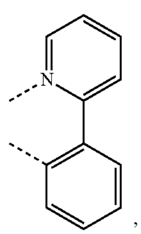
$L_{b2}$
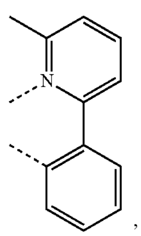
$L_{b3}$
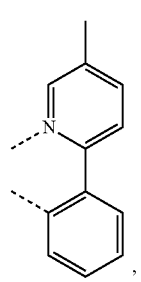
$L_{b4}$
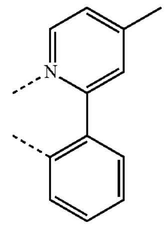
$L_{b5}$
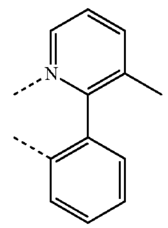
$L_{b6}$
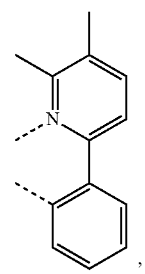
$L_{b7}$
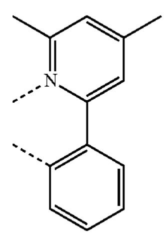
$L_{b8}$
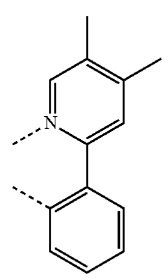
$L_{b9}$
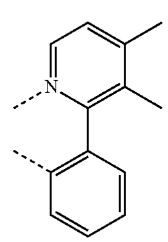

-continued
$L_{b10}$
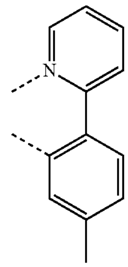
,
$L_{b11}$
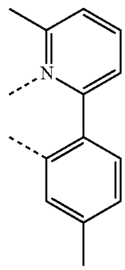
,
$L_{b12}$
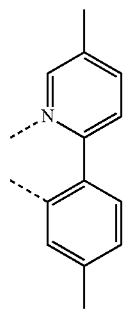
,
$L_{b13}$
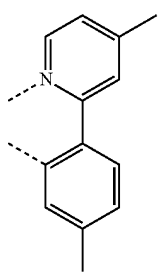
,
$L_{b14}$
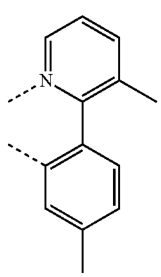
,
-continued
$L_{b15}$
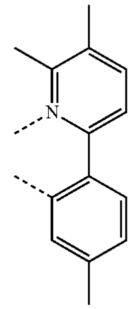
,
$L_{b16}$
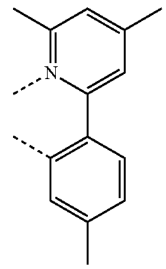
,
$L_{b17}$
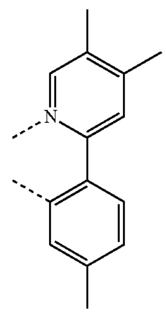
,
$L_{b18}$
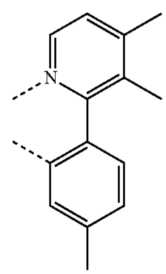
,
$L_{b19}$
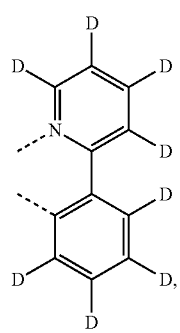

L$_{b20}$
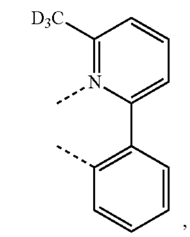
L$_{b21}$
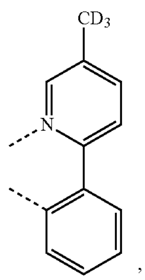
L$_{b22}$
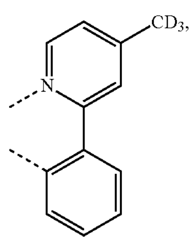
L$_{b23}$
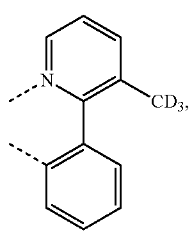
L$_{b24}$
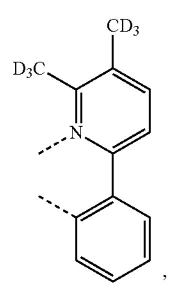
L$_{b25}$
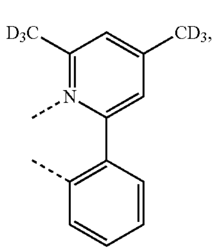
L$_{b26}$
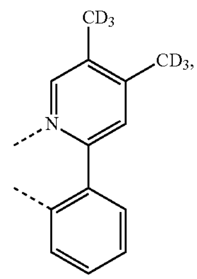
L$_{b27}$
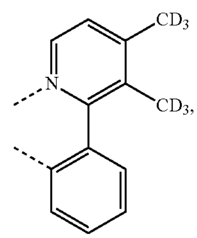
L$_{b28}$
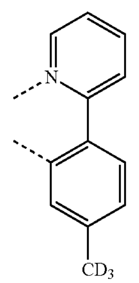
L$_{b29}$
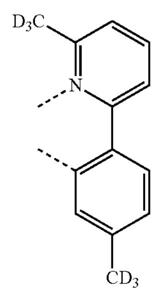
L$_{b30}$
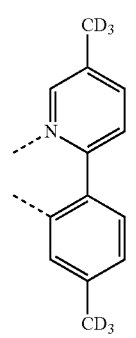

-continued
$L_{b31}$
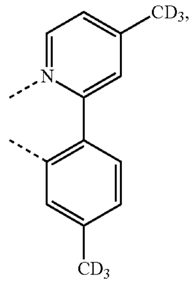
$L_{b32}$
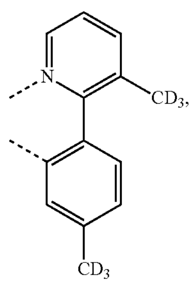
$L_{b33}$
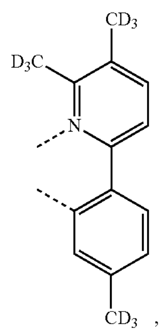
$L_{b34}$
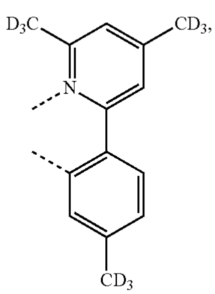
$L_{b35}$
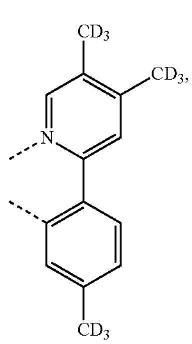
-continued
$L_{b36}$
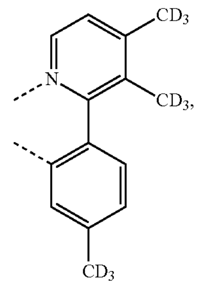
$L_{b37}$
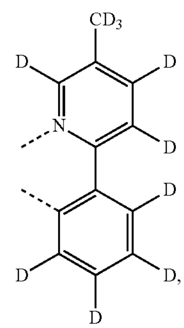
$L_{b38}$
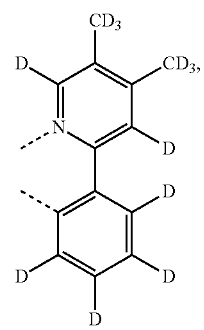
$L_{b39}$
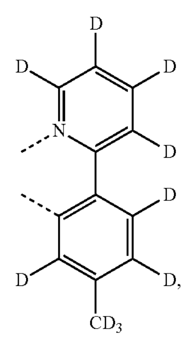
$L_{b40}$
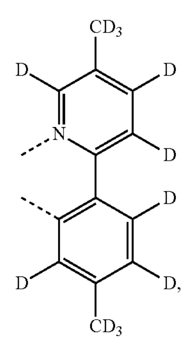

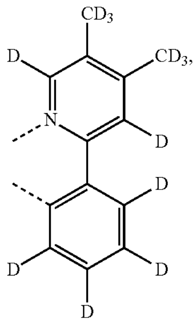
$L_{b41}$
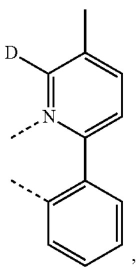
$L_{b42}$
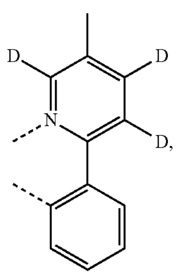
$L_{b43}$
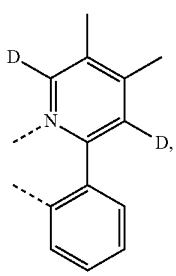
$L_{b44}$
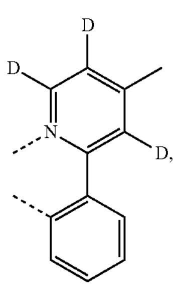
$L_{b45}$
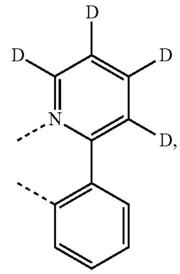
$L_{b46}$
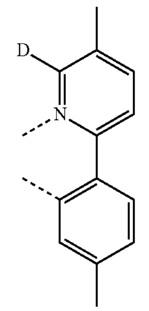
$L_{b47}$
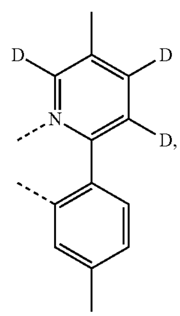
$L_{b48}$
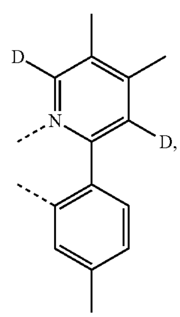
$L_{b49}$
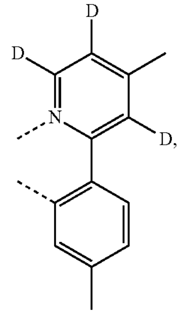
$L_{b50}$ -continued
$L_{b51}$
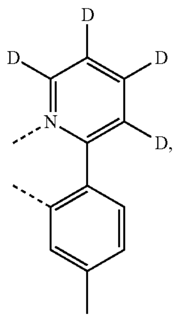
$L_{b52}$
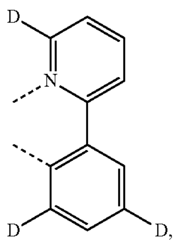
$L_{b53}$
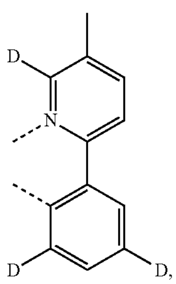
$L_{b54}$
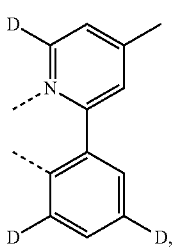
$L_{b55}$
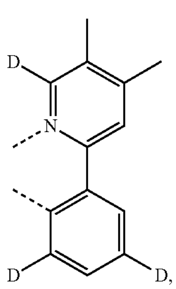
-continued
$L_{b56}$
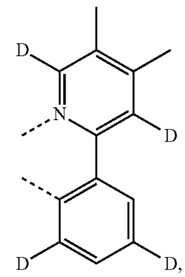
$L_{b57}$
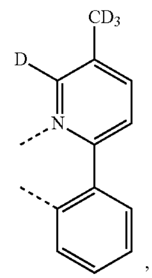
$L_{b58}$
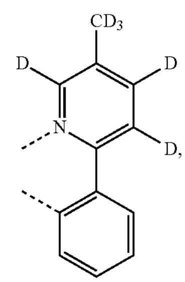
$L_{b59}$
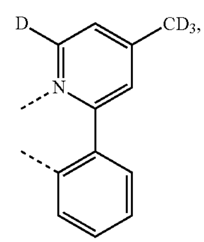
$L_{b60}$
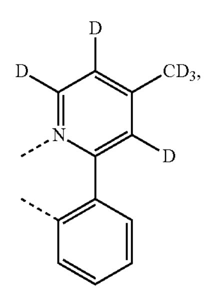

-continued
L$_{b61}$
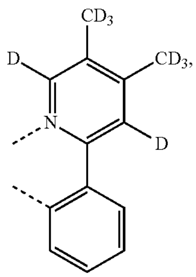
L$_{b62}$
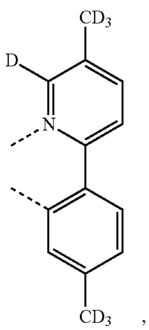
L$_{b63}$
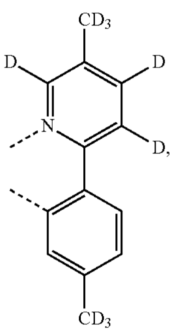
L$_{b64}$
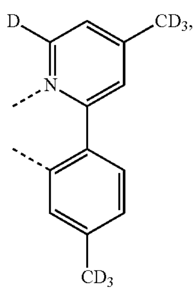
L$_{b65}$
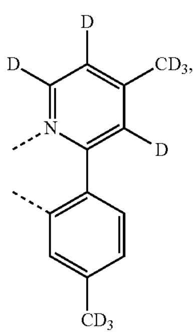
-continued
L$_{b66}$
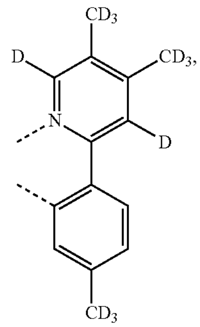
L$_{b67}$
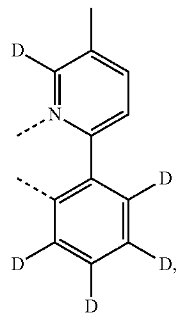
L$_{b68}$
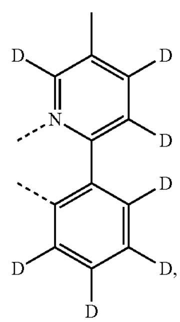
L$_{b69}$
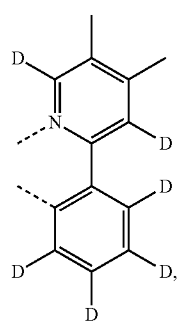
L$_{b70}$
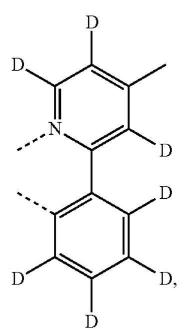

-continued
$L_{b71}$
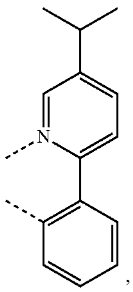
$L_{b72}$
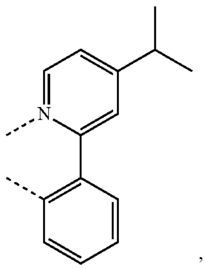
$L_{b73}$
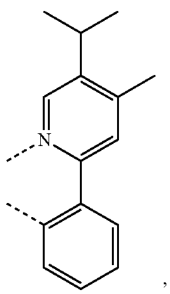
$L_{b74}$
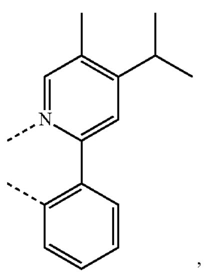
$L_{b75}$
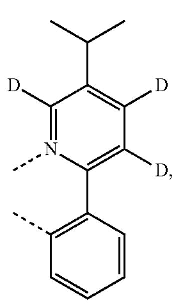
-continued
$L_{b76}$
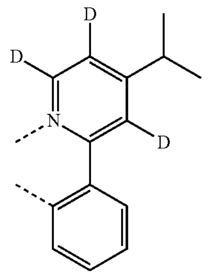
$L_{b77}$
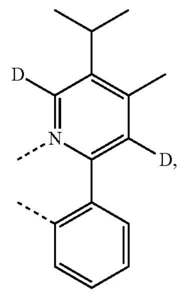
$L_{b78}$
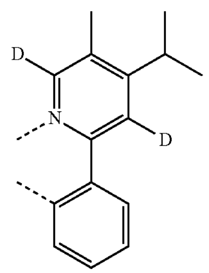
$L_{b79}$
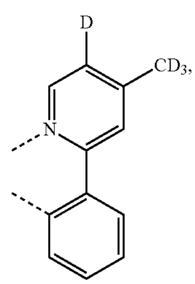
$L_{b80}$
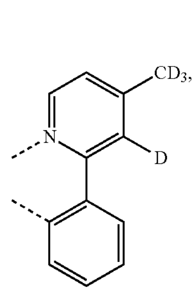

-continued
$L_{b81}$
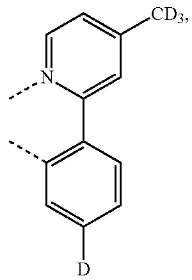
$L_{b82}$
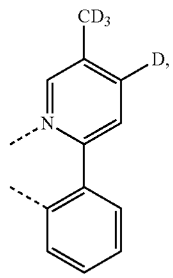
$L_{b83}$
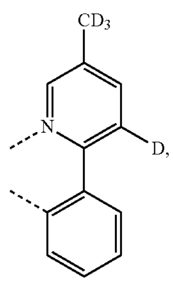
$L_{b84}$
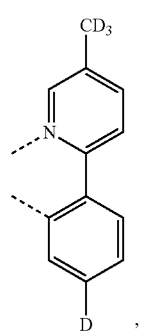
$L_{b85}$
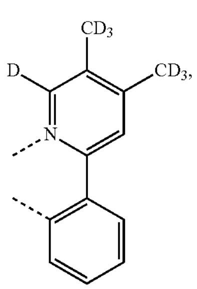
-continued
$L_{b86}$
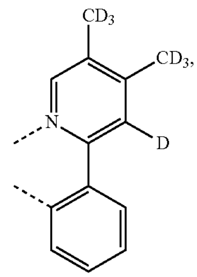
$L_{b87}$
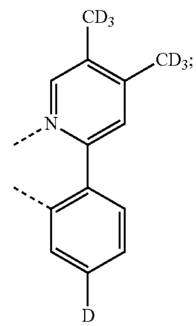
wherein the ligand $L_c$ is, at each occurrence identically or differently, any one selected from the group consisting of:
$L_{c1}$
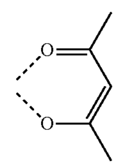
$L_{c2}$
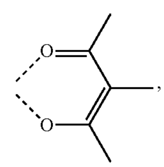
$L_{c3}$
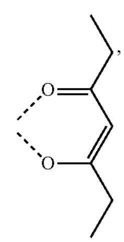
$L_{c4}$
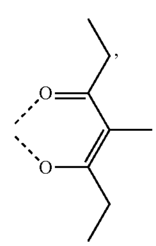

-continued
$L_{c5}$
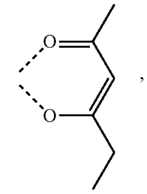
$L_{c6}$
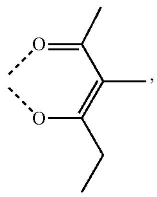
$L_{c7}$
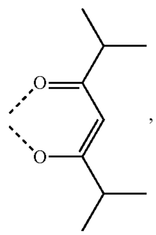
$L_{c8}$
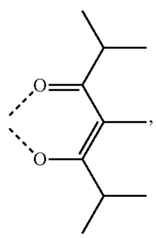
$L_{c9}$
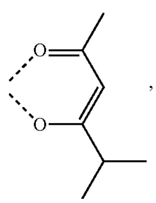
$L_{c10}$
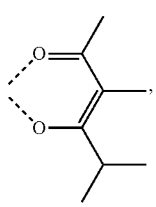
$L_{c11}$
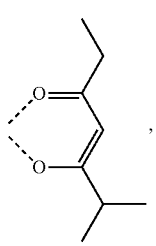
-continued
$L_{c12}$
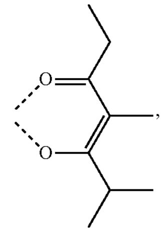
$L_{c13}$
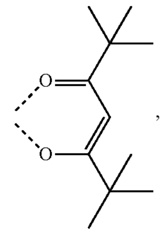
$L_{c14}$
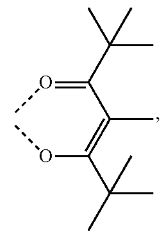
$L_{c15}$
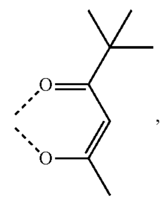
$L_{c16}$
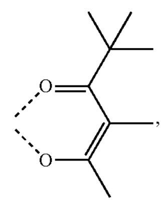
$L_{c17}$
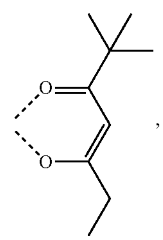
$L_{c18}$
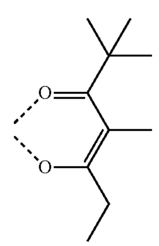

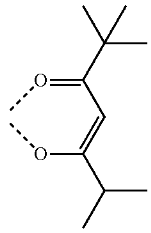
,
$L_{c19}$
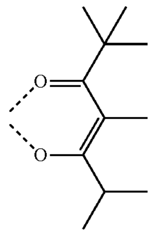
,
$L_{c20}$
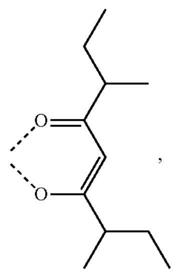
,
$L_{c21}$
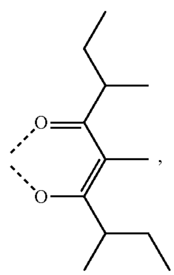
,
$L_{c22}$
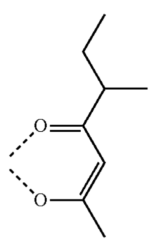
,
$L_{c23}$
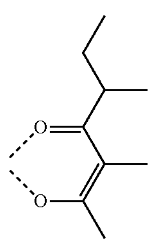
,
$L_{c24}$
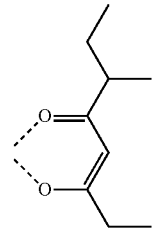
,
$L_{c25}$
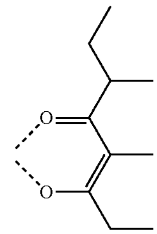
,
$L_{c26}$
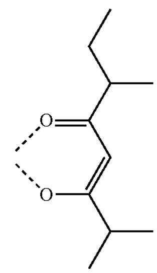
,
$L_{c27}$
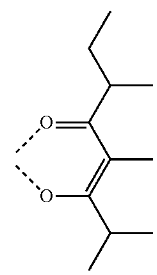
,
$L_{c28}$
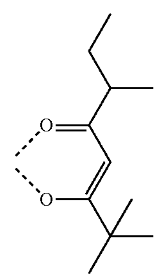
,
$L_{c29}$
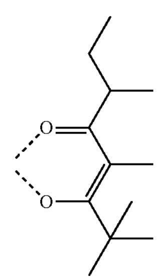
,
$L_{c30}$ -continued
$L_{c31}$
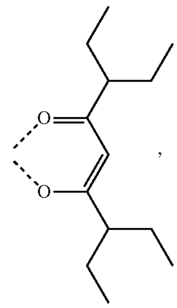
,
$L_{c32}$
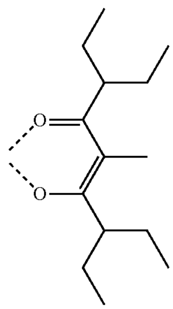
,
$L_{c33}$
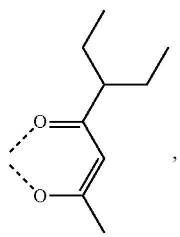
,
$L_{c34}$
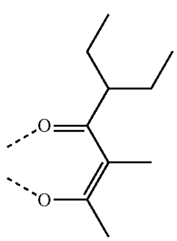
,
$L_{c35}$
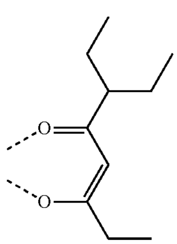
,
$L_{c36}$
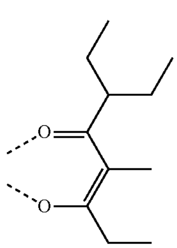
,
-continued
$L_{c37}$
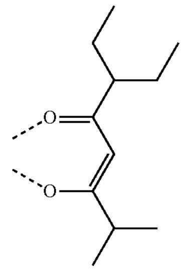
,
$L_{c38}$
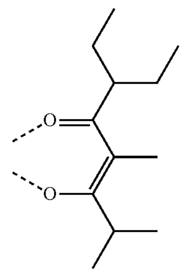
,
$L_{c39}$
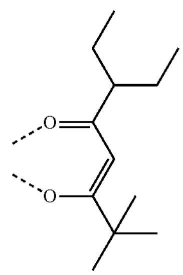
,
$L_{c40}$
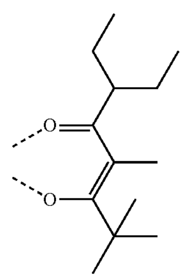
,
$L_{c41}$
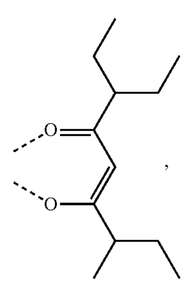
, $L_{c42}$
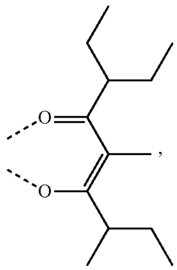
$L_{c43}$
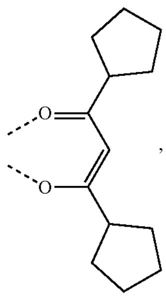
$L_{c44}$
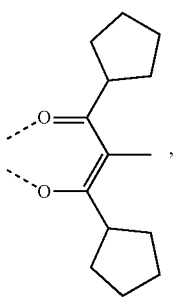
$L_{c45}$
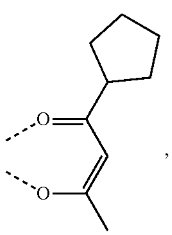
$L_{c46}$
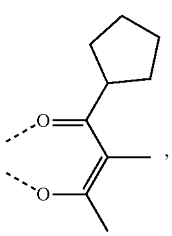
$L_{c47}$
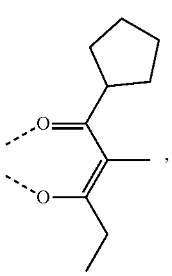
$L_{c48}$
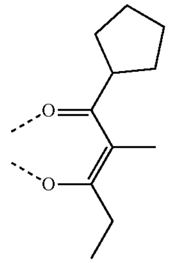
$L_{c49}$
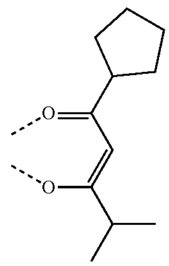
$L_{c50}$
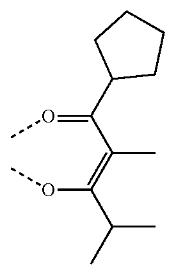
$L_{c51}$
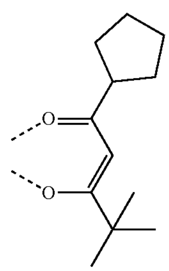
$L_{c52}$
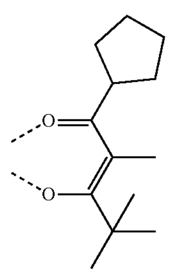
$L_{c53}$
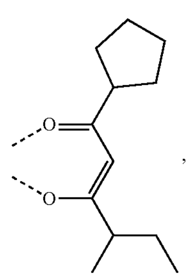

-continued
$L_{c54}$
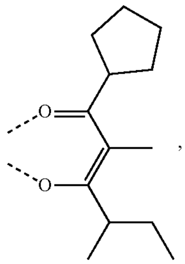
,
$L_{c55}$
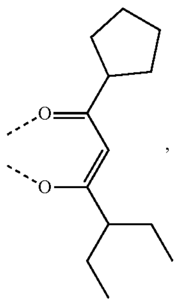
,
$L_{c56}$
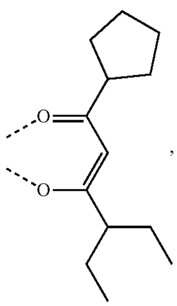
,
$L_{c57}$
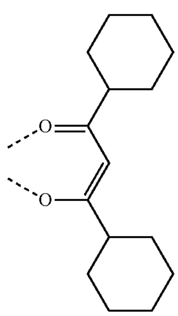
,
$L_{c58}$
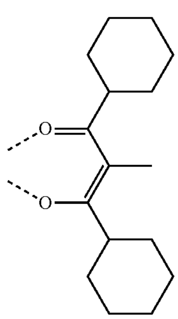
,
-continued
$L_{c59}$
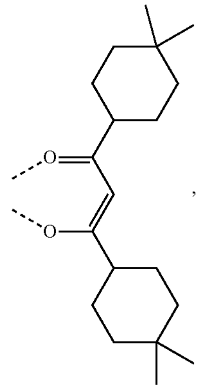
,
$L_{c60}$
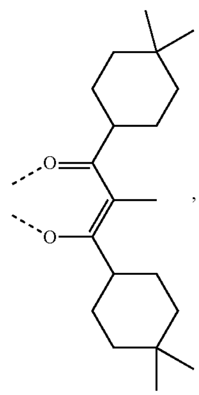
,
$L_{c61}$
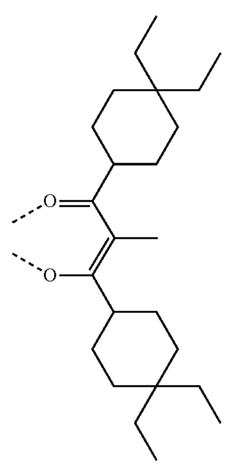
, -continued
$L_{c62}$
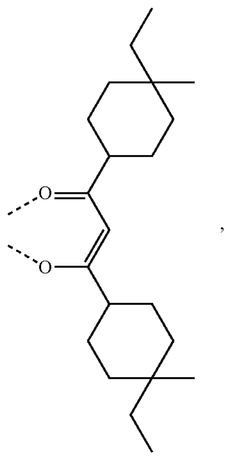
$L_{c63}$
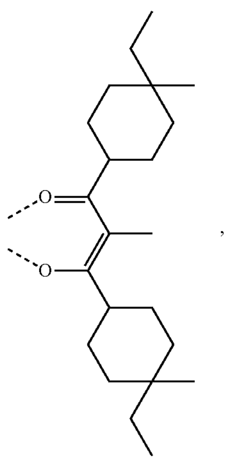
$L_{c64}$
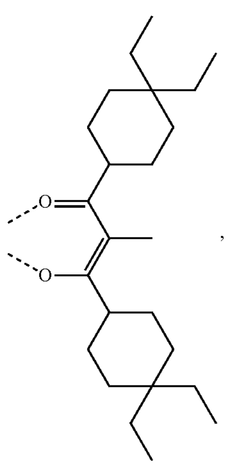
$L_{c65}$
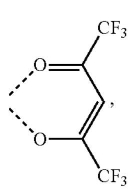
-continued
$L_{c66}$
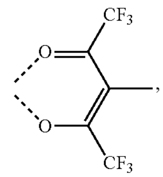
$L_{c67}$
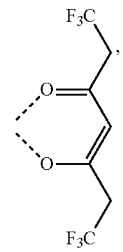
$L_{c68}$
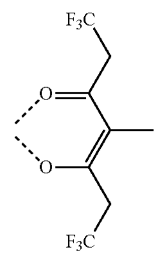
$L_{c69}$
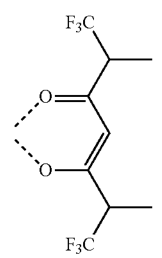
$L_{c70}$
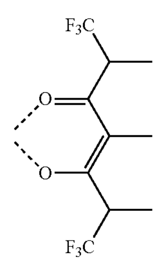
$L_{c71}$
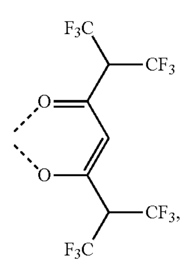

-continued
$L_{c72}$
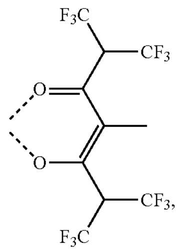
$L_{c73}$
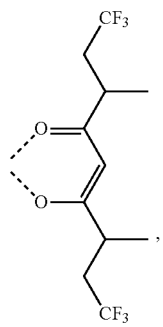
$L_{c74}$
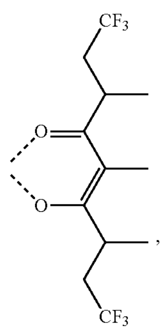
$L_{c75}$
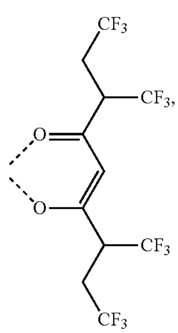
$L_{c76}$
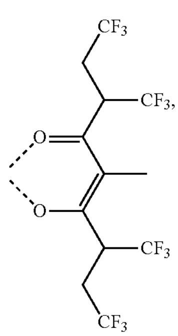
-continued
$L_{c77}$
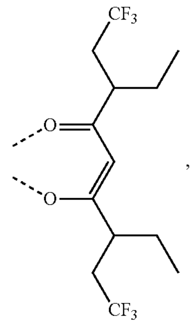
$L_{c78}$
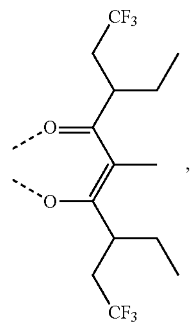
$L_{c79}$
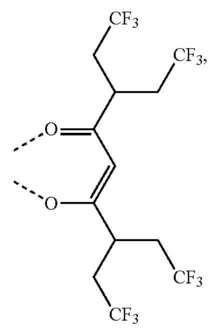
$L_{c80}$
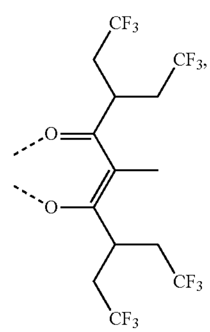
$L_{c81}$
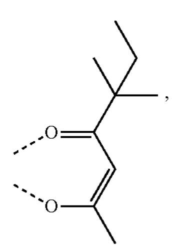

-continued
$L_{c82}$
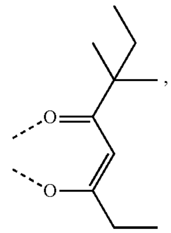
$L_{c83}$
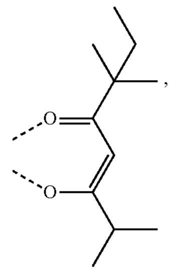
$L_{c84}$
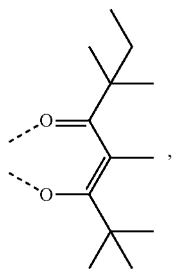
$L_{c85}$
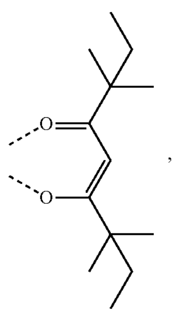
$L_{c86}$
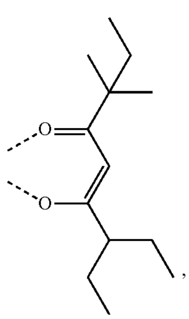
-continued
$L_{c87}$
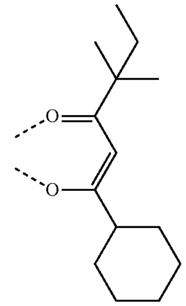
$L_{c88}$
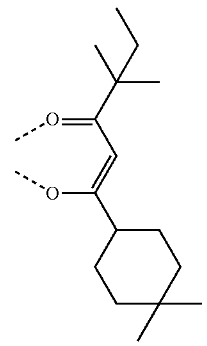
$L_{c89}$
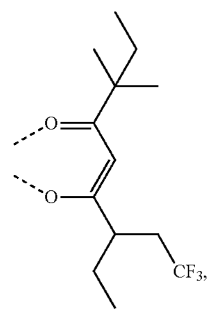
$L_{c90}$
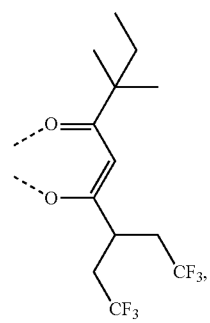
$L_{c91}$
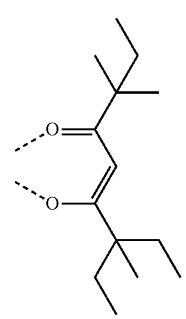

L$_{c92}$
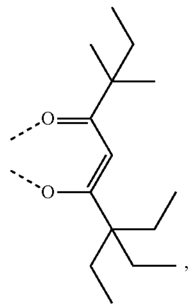
L$_{c93}$
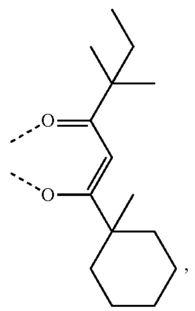
L$_{c94}$
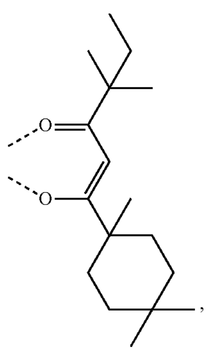
L$_{c95}$
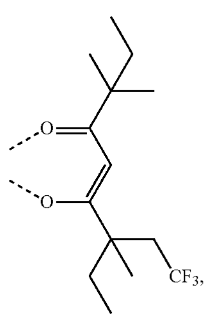
L$_{c96}$
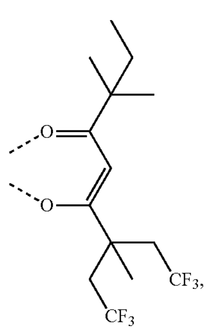
L$_{c97}$
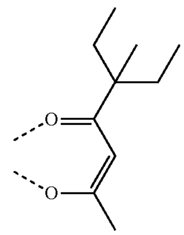
L$_{c98}$
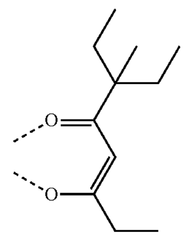
L$_{c99}$
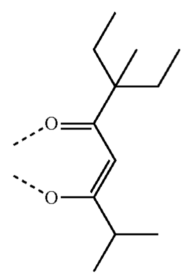
L$_{c100}$
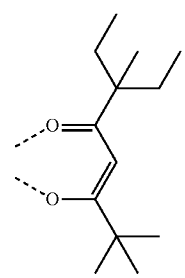
L$_{c101}$
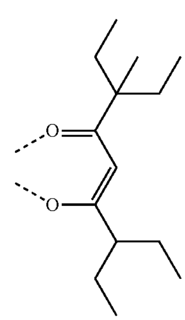

$L_{c102}$
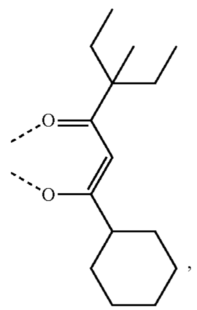
$L_{c103}$
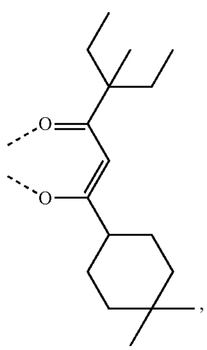
$L_{c104}$
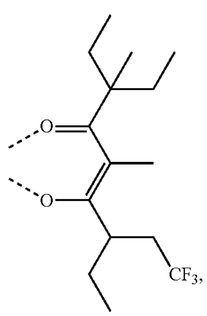
$L_{c105}$
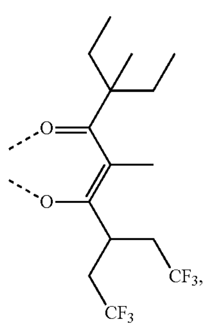
$L_{c106}$
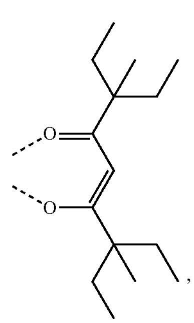
$L_{c107}$
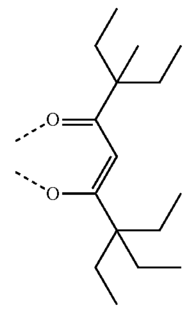
$L_{c108}$
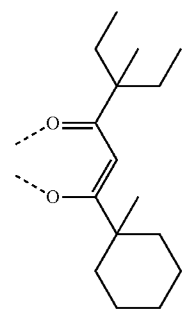
$L_{c109}$
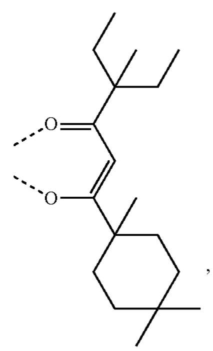
$L_{c110}$
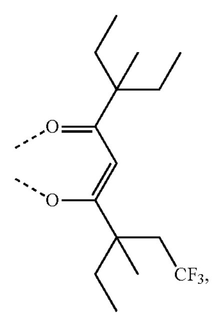
$L_{c111}$
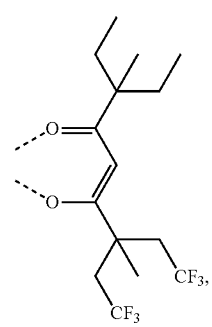

-continued
$L_{c112}$
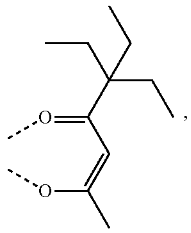
$L_{c113}$
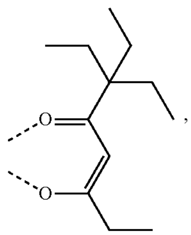
$L_{c114}$
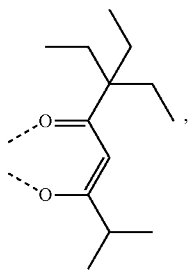
$L_{c115}$
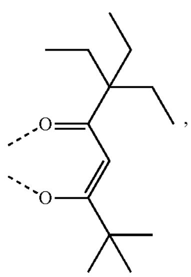
$L_{c116}$
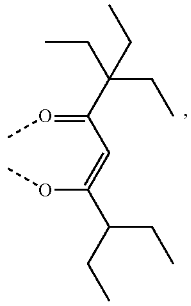
-continued
$L_{c117}$
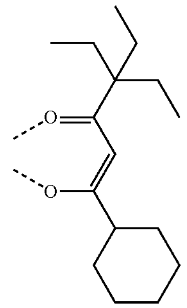
$L_{c118}$
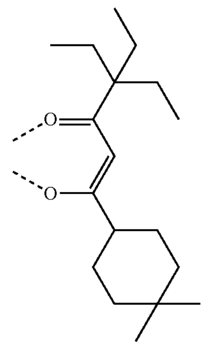
$L_{c119}$
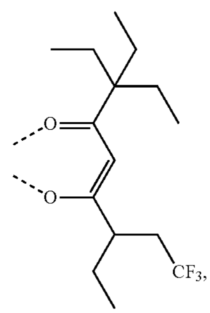
$L_{c120}$
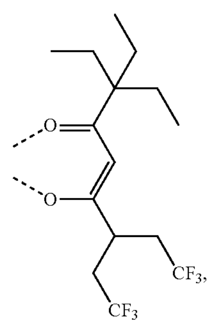
$L_{c121}$
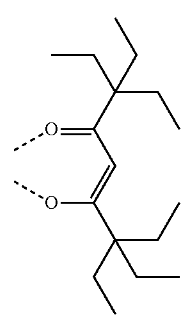

-continued
$L_{c122}$
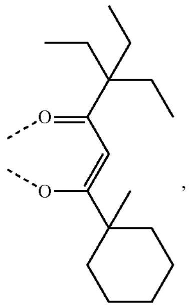
$L_{c123}$
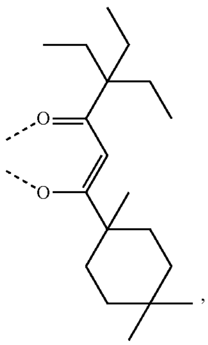
$L_{c124}$
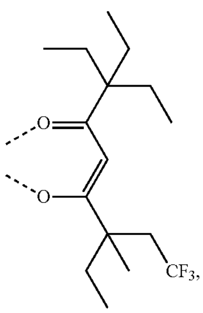
$L_{c125}$
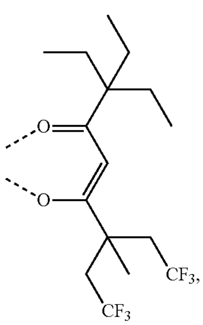
$L_{c126}$
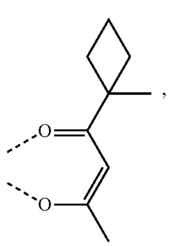
-continued
$L_{c127}$
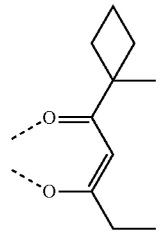
$L_{c128}$
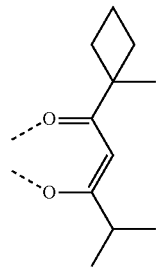
$L_{c129}$
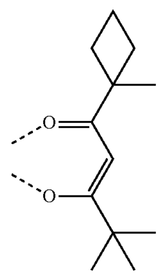
$L_{c130}$
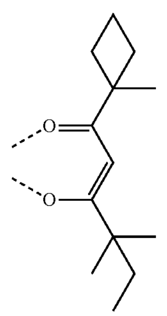
$L_{c131}$
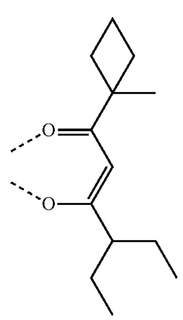

-continued
$L_{c132}$
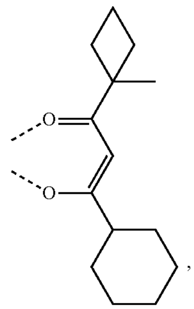
$L_{c133}$
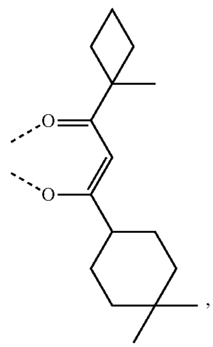
$L_{c134}$
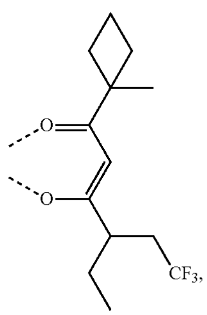
$L_{c135}$
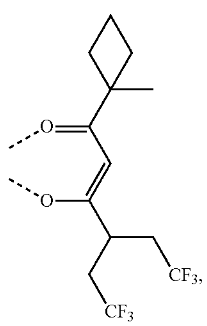
$L_{c136}$
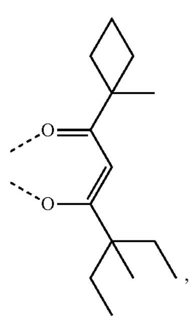
-continued
$L_{c137}$
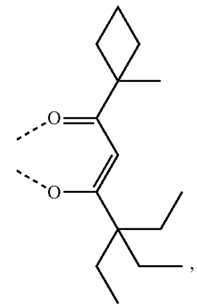
$L_{c138}$
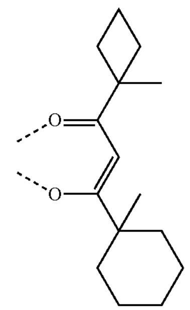
$L_{c139}$
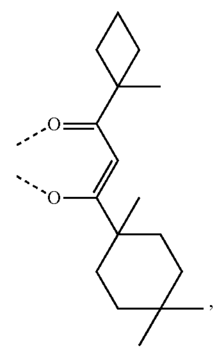
$L_{c140}$
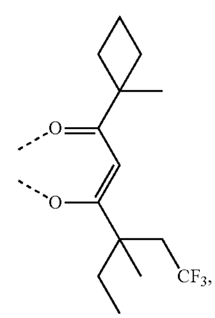
$L_{c141}$
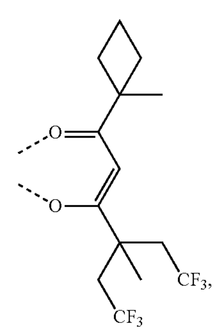

-continued
$L_{c142}$
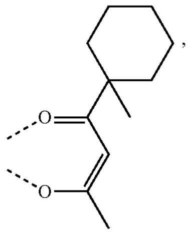
$L_{c143}$
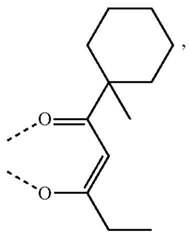
$L_{c144}$
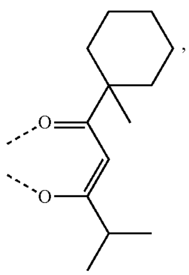
$L_{c145}$
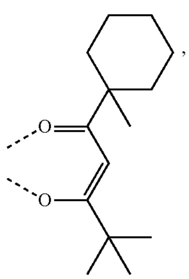
$L_{c146}$
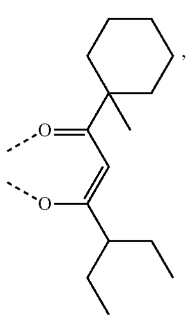
-continued
$L_{c147}$
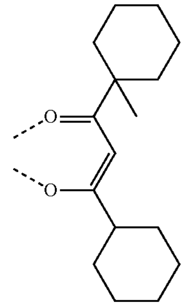
$L_{c148}$
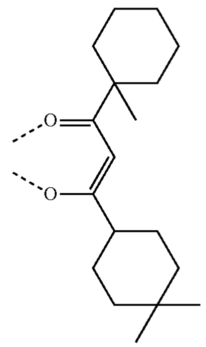
$L_{c149}$
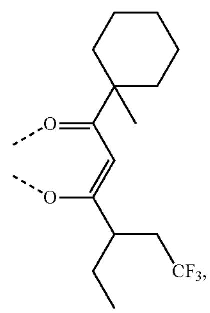
$L_{c150}$
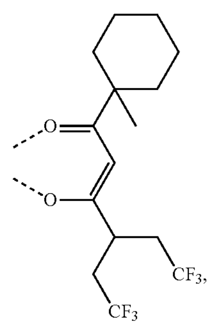
$L_{c151}$
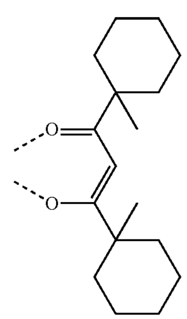

-continued
$L_{c152}$
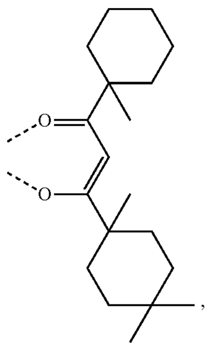
$L_{c153}$
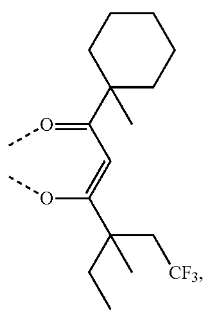
$L_{c154}$
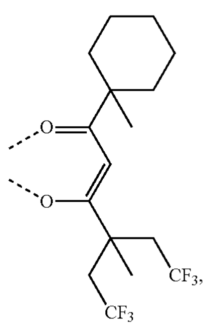
$L_{c155}$
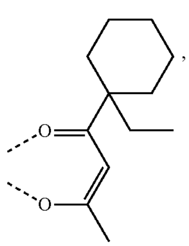
$L_{c156}$
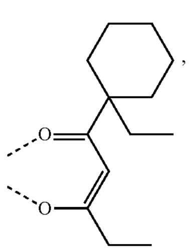
-continued
$L_{c157}$
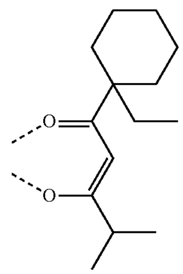
$L_{c158}$
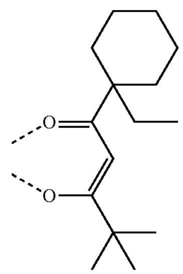
$L_{c159}$
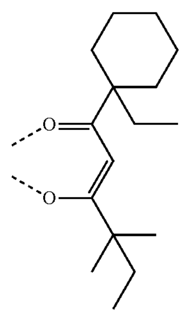
$L_{c160}$
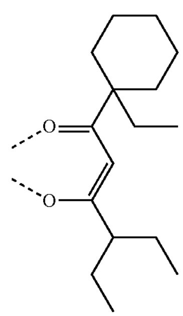
$L_{c161}$
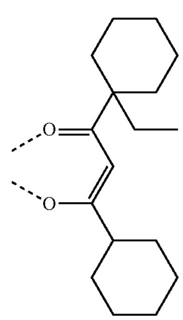

-continued
$L_{c162}$
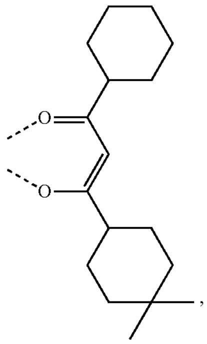
$L_{c163}$
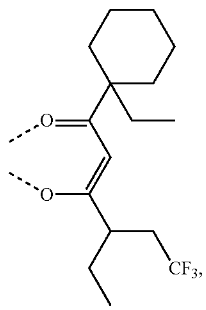
$L_{c164}$
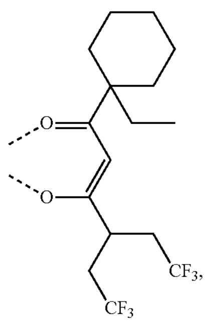
$L_{c165}$
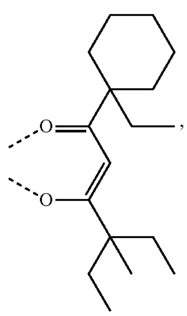
$L_{c166}$
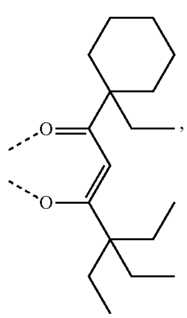
-continued
$L_{c167}$
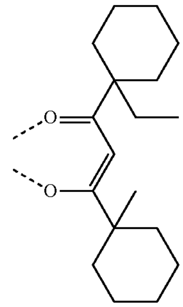
$L_{c168}$
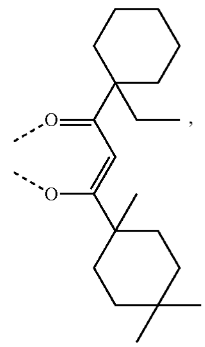
$L_{c169}$
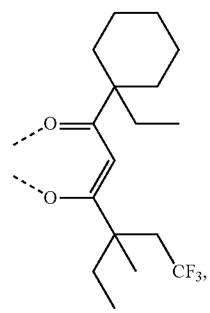
$L_{c170}$
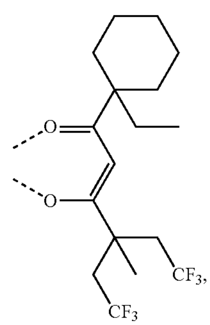
$L_{c171}$
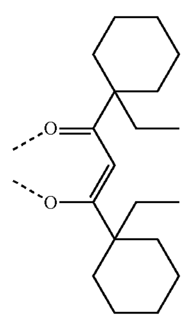

$L_{c172}$
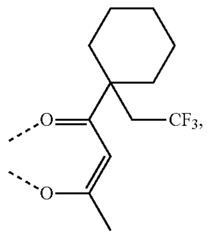
$L_{c173}$
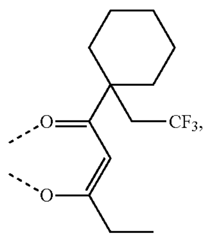
$L_{c174}$
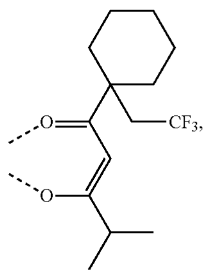
$L_{c175}$
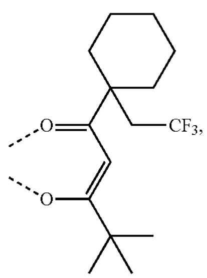
$L_{c176}$
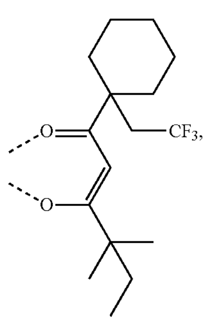
$L_{c177}$
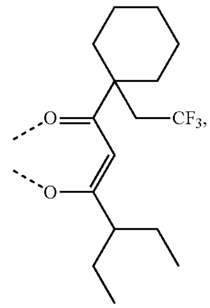
$L_{c178}$
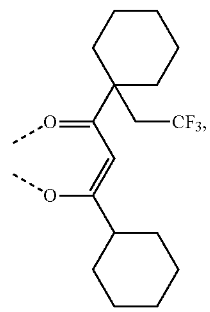
$L_{c179}$
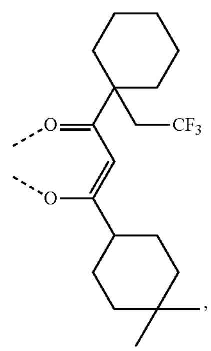
$L_{c180}$
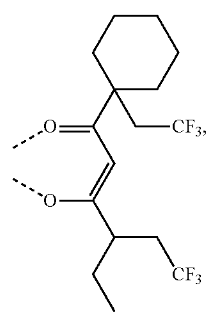
$L_{c181}$
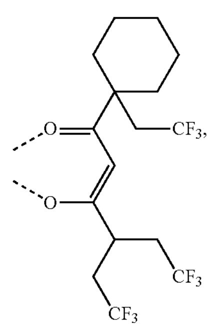

-continued
$L_{c182}$
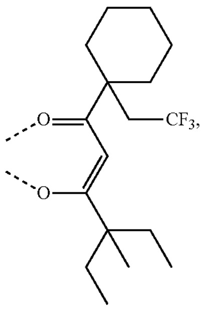
$L_{c183}$
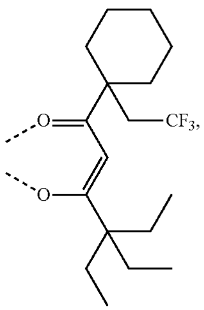
$L_{c184}$
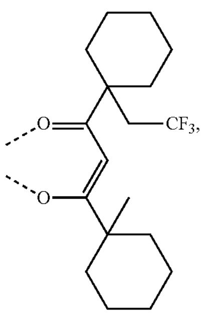
$L_{c185}$
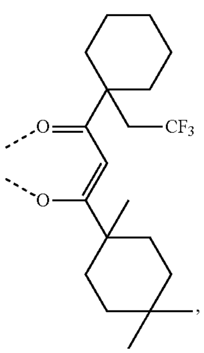
$L_{c186}$
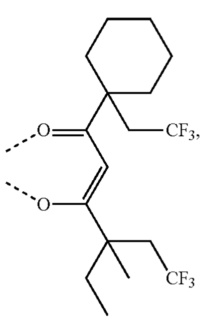
-continued
$L_{c187}$
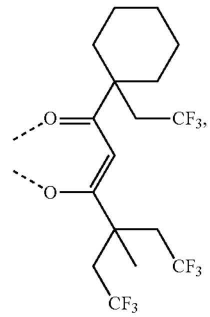
$L_{c188}$
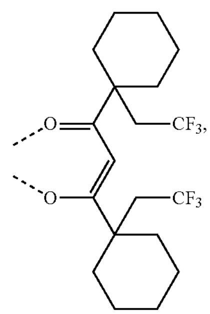
$L_{c189}$
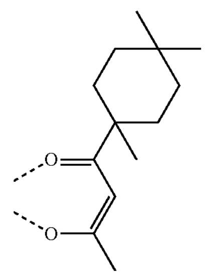
$L_{c190}$
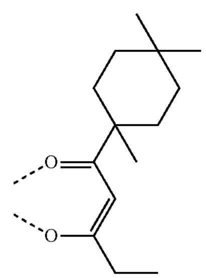
$L_{c191}$
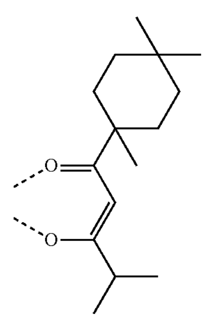

-continued
$L_{c192}$
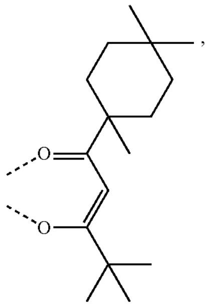
$L_{c193}$
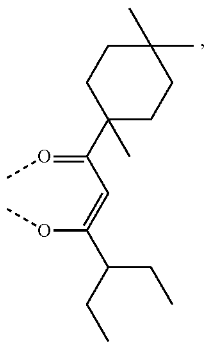
$L_{c194}$
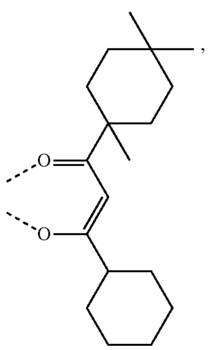
$L_{c195}$
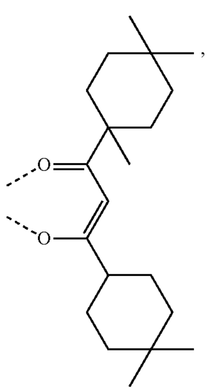
-continued
$L_{c196}$
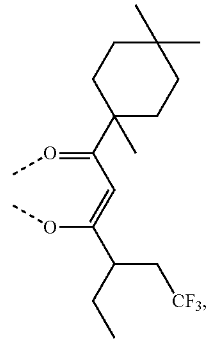
$L_{c197}$
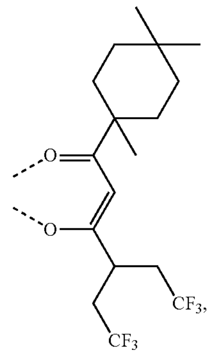
$L_{c198}$
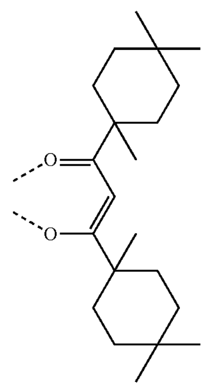
$L_{c199}$
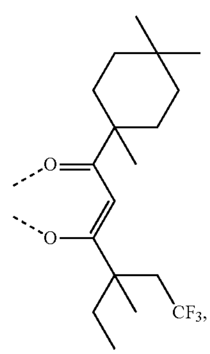

$L_{c200}$
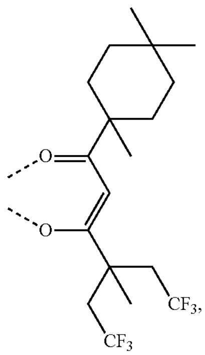
$L_{c201}$
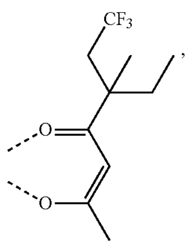
$L_{c202}$
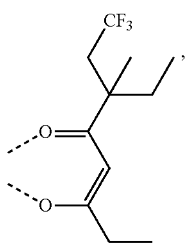
$L_{c203}$
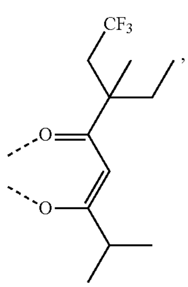
$L_{c204}$
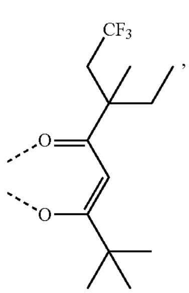
$L_{c205}$
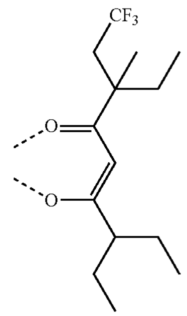
$L_{c206}$
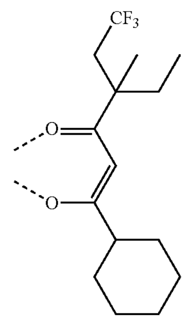
$L_{c207}$
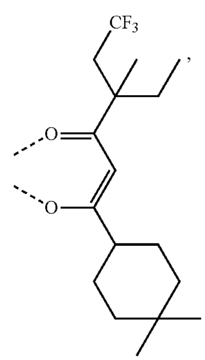
$L_{c208}$
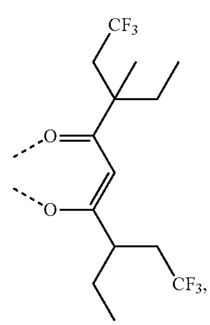
$L_{c209}$
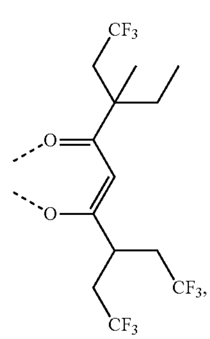

-continued
$L_{c210}$
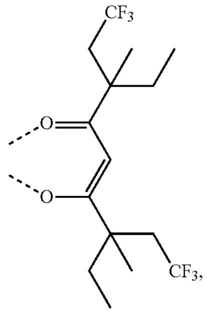
$L_{c211}$
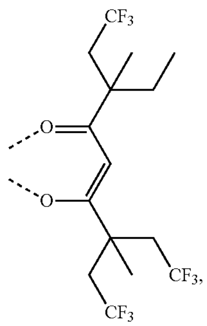
$L_{c212}$
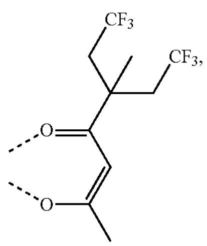
$L_{c213}$
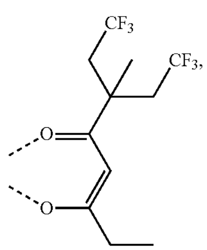
$L_{c214}$
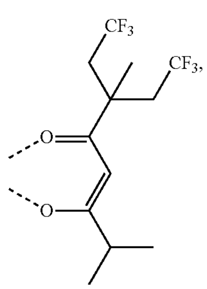
-continued
$L_{c215}$
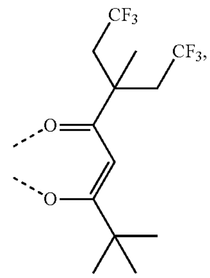
$L_{c216}$
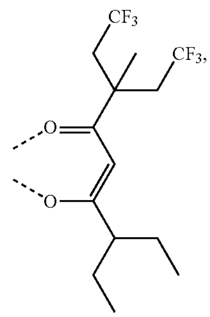
$L_{c217}$
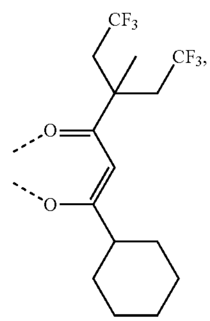
$L_{c218}$
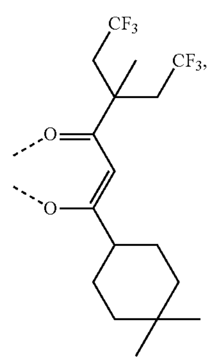
$L_{c219}$
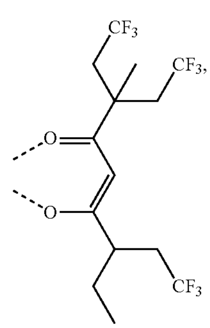

-continued
$L_{c220}$
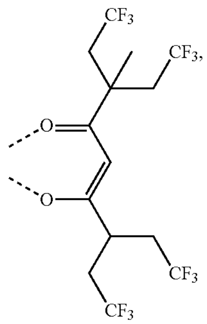
$L_{c221}$
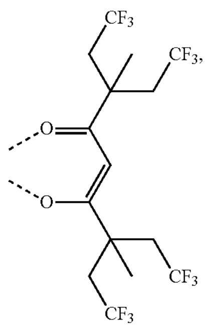
$L_{c222}$
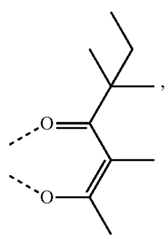
$L_{c2223}$
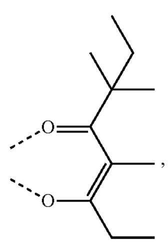
$L_{c224}$
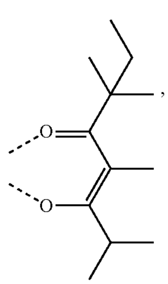
-continued
$L_{c225}$
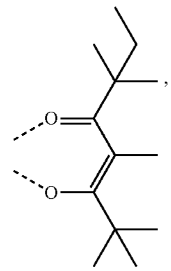
$L_{c226}$
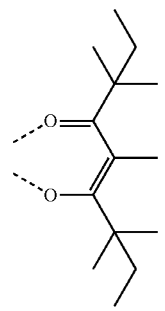
$L_{c227}$
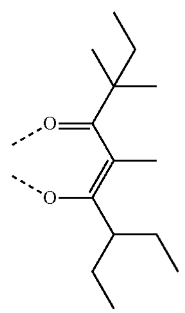
$L_{c228}$
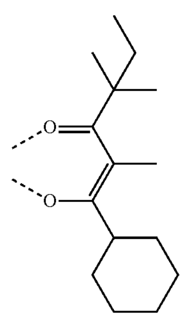
$L_{c229}$
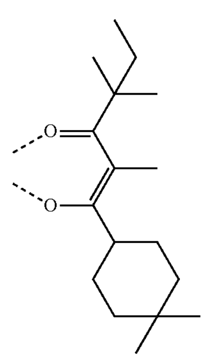

-continued
$L_{c2230}$
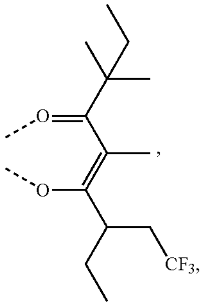
$L_{c231}$
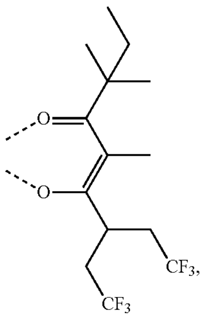
$L_{c232}$
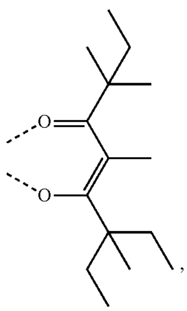
$L_{c233}$
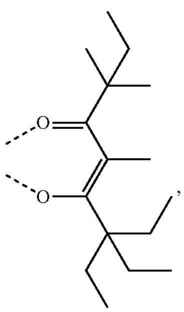
$L_{c234}$
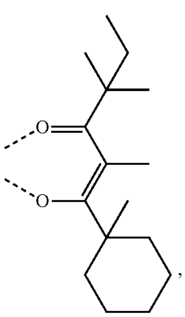
-continued
$L_{c235}$
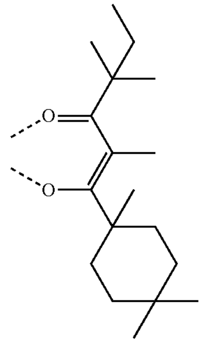
$L_{c2236}$
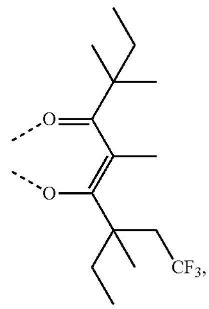
$L_{c237}$
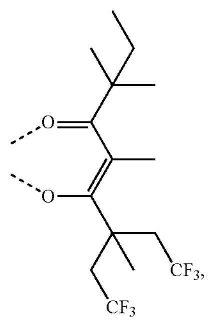
$L_{c238}$
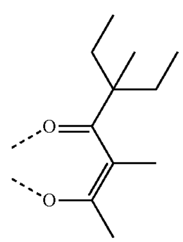
$L_{c239}$
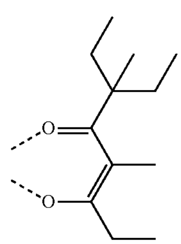

-continued
$L_{c240}$
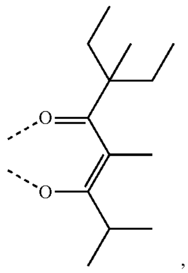
$L_{c241}$
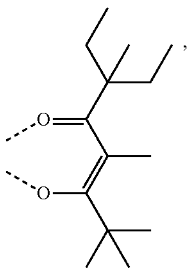
$L_{c242}$
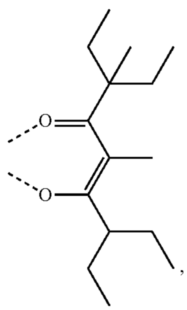
$L_{c243}$
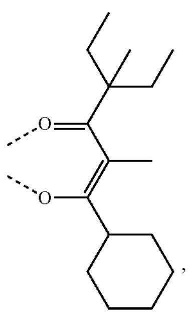
$L_{c244}$
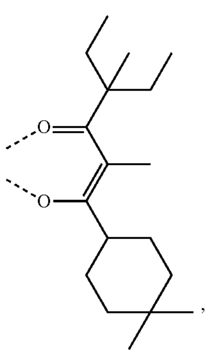
-continued
$L_{c245}$
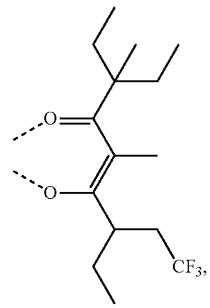
$L_{c246}$
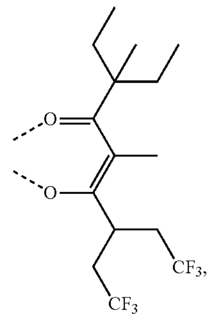
$L_{c247}$
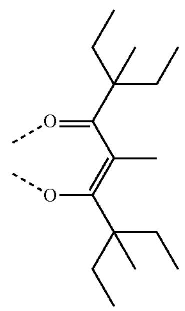
$L_{c248}$
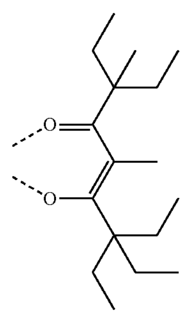
$L_{c249}$
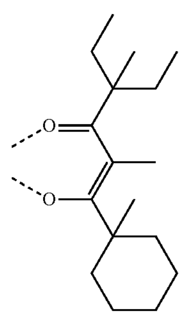

-continued
$L_{c250}$
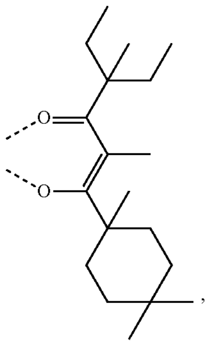
$L_{c251}$
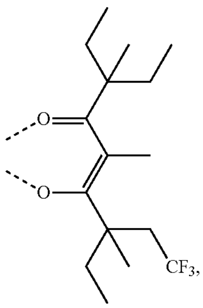
$L_{c252}$
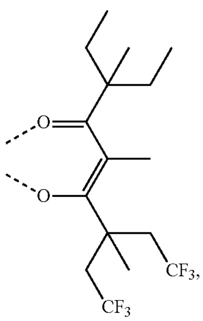
$L_{c253}$
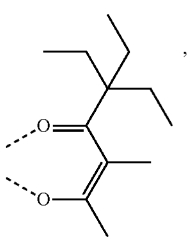
$L_{c254}$
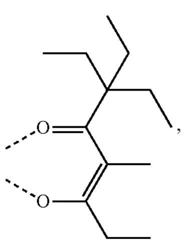
-continued
$L_{c255}$
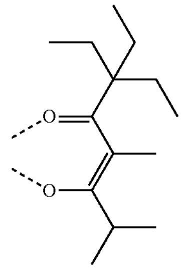
$L_{c256}$
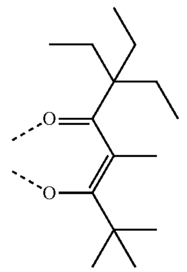
$L_{c257}$
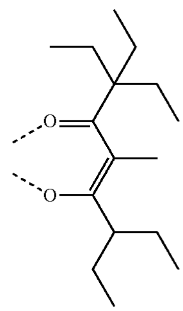
$L_{c258}$
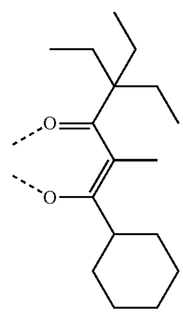
$L_{c259}$
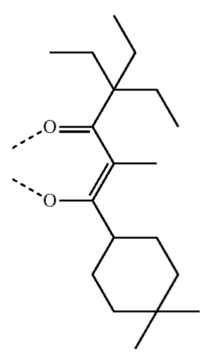

Lc260
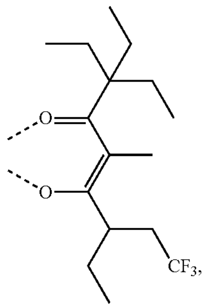
Lc261
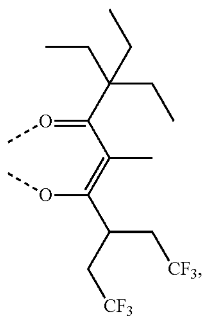
Lc262
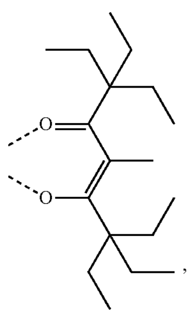
Lc263
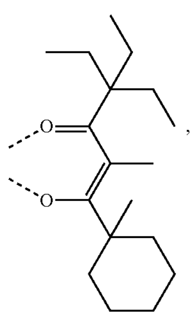
Lc264
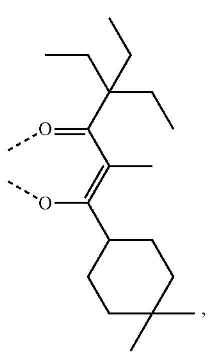
Lc265
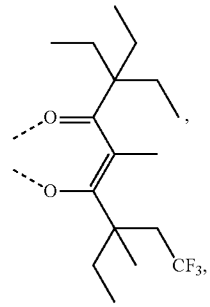
Lc266
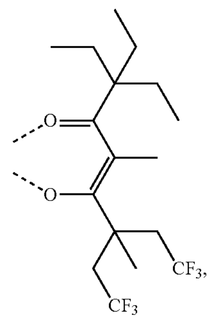
Lc267
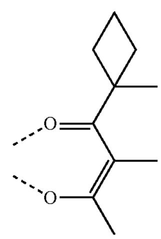
Lc268
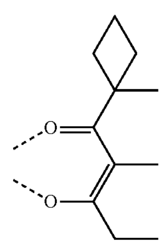
Lc269
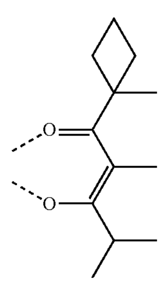

-continued
$L_{c270}$
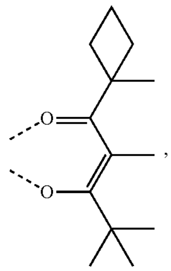
$L_{c271}$
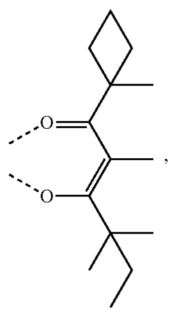
$L_{c272}$
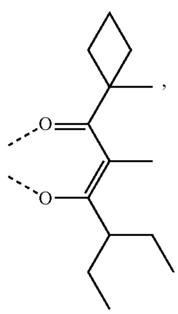
$L_{c273}$
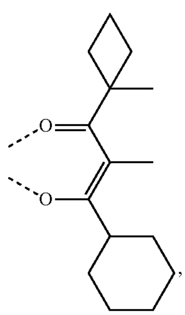
$L_{c274}$
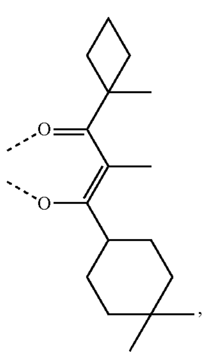
-continued
$L_{c275}$
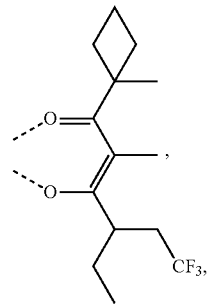
$L_{c276}$
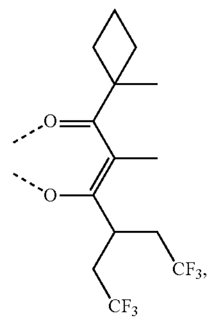
$L_{c277}$
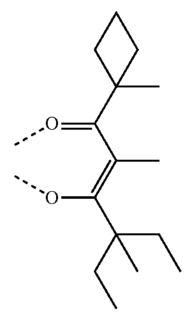
$L_{c278}$
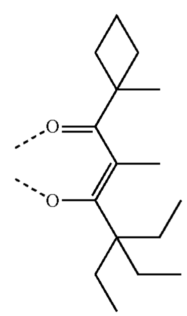
$L_{c279}$
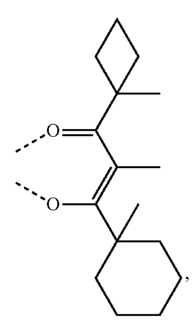

-continued
$L_{c280}$
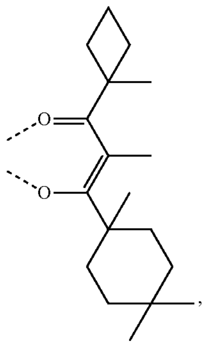
$L_{c281}$
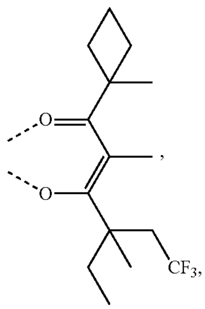
$L_{c282}$
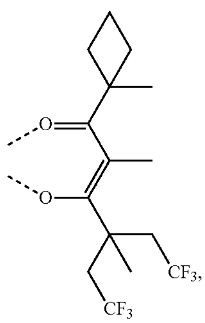
$L_{c283}$
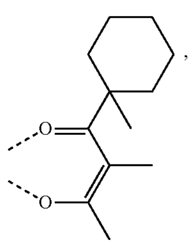
$L_{c284}$
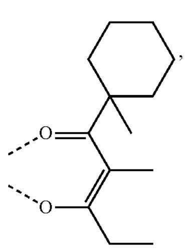
$L_{c285}$
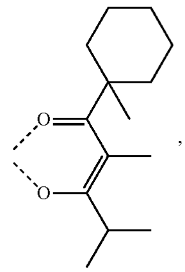
$L_{c286}$
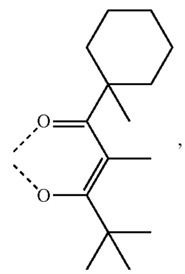
$L_{c287}$
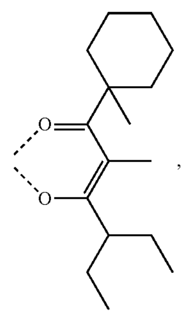
$L_{c288}$
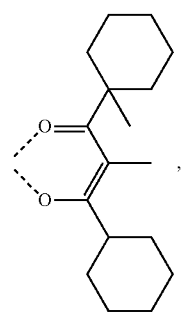
$L_{c289}$
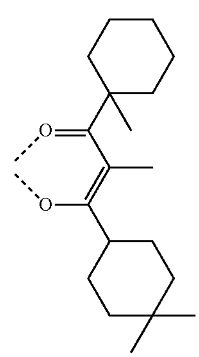

-continued
Lc290
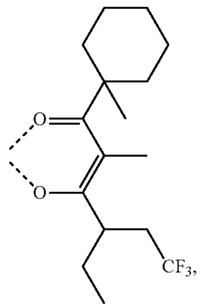
Lc291
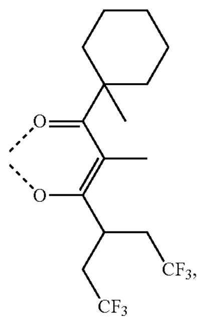
Lc292
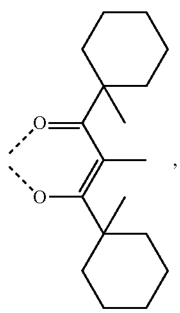
Lc293
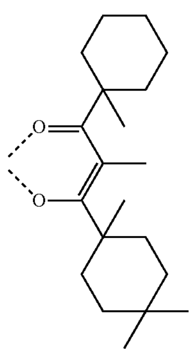
Lc294
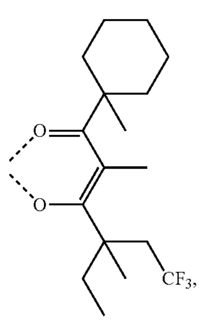
-continued
Lc295
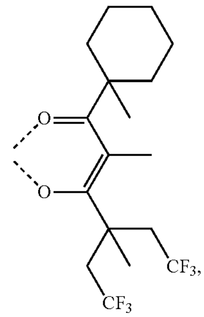
Lc296
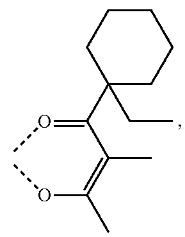
Lc297
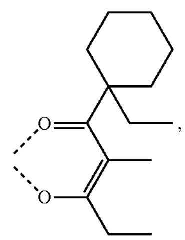
Lc298
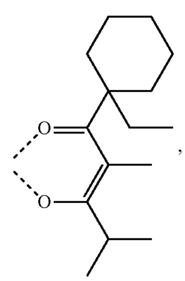
Lc299
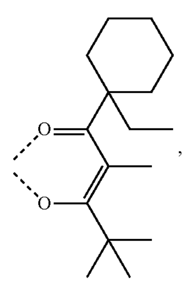

-continued
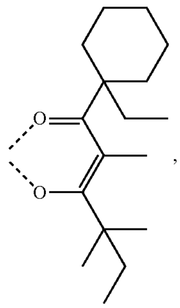
$L_{c300}$
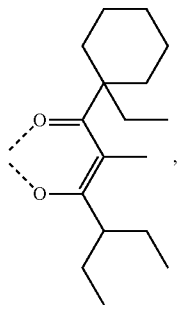
$L_{c301}$
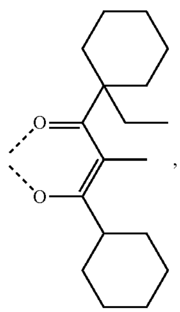
$L_{c302}$
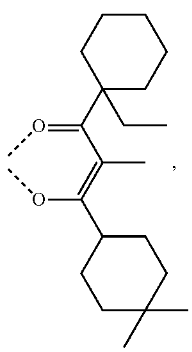
$L_{c303}$
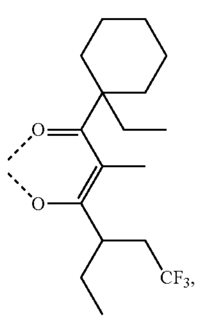
$L_{c304}$
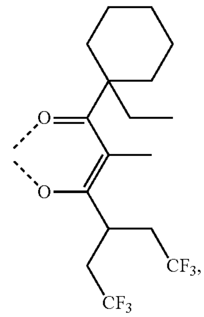
$L_{c305}$
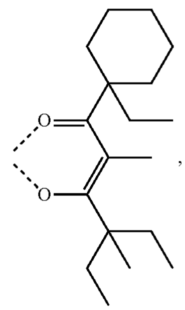
$L_{c306}$
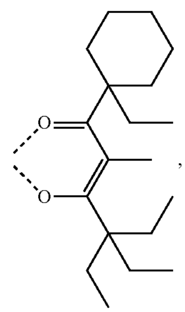
$L_{c307}$
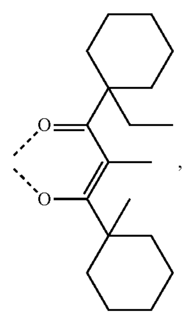
$L_{c308}$
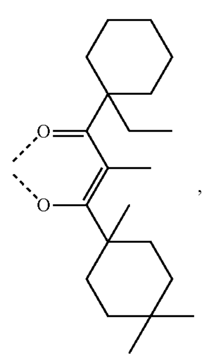
$L_{c309}$ -continued
$L_{c310}$
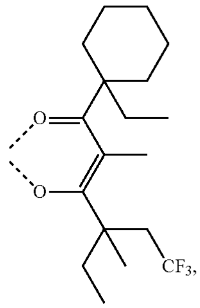
$L_{c311}$
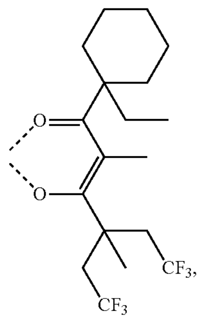
$L_{c312}$
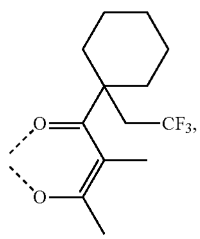
$L_{c313}$
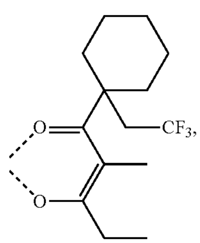
$L_{c314}$
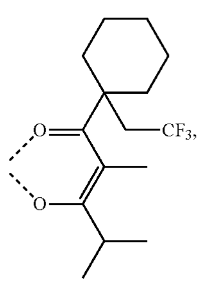
-continued
$L_{c315}$
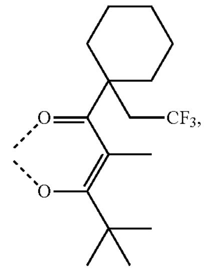
$L_{c316}$
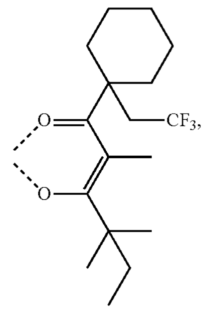
$L_{c317}$
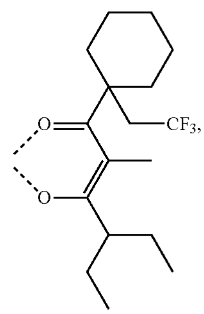
$L_{c318}$
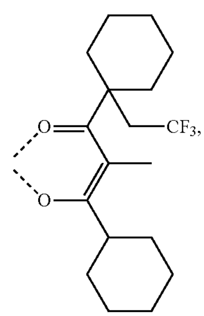
$L_{c319}$
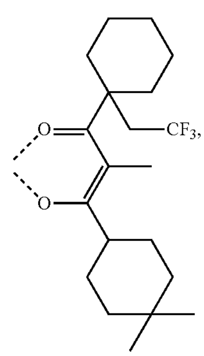

$L_{c320}$
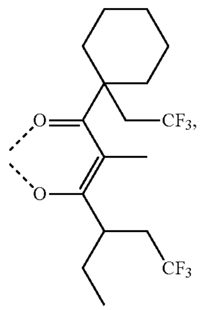
$L_{c321}$
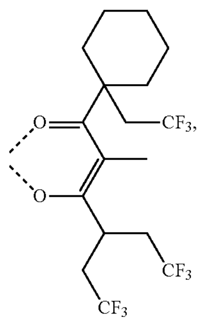
$L_{c322}$
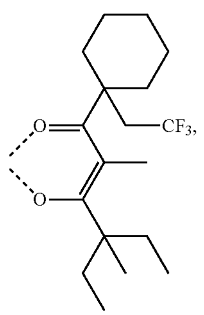
$L_{c323}$
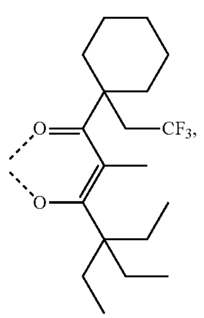
$L_{c324}$
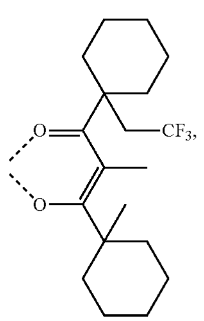
$L_{c325}$
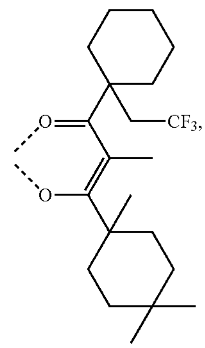
$L_{c326}$
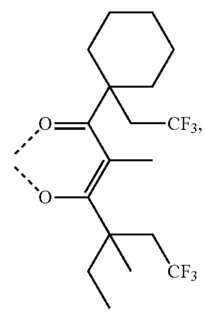
$L_{c327}$
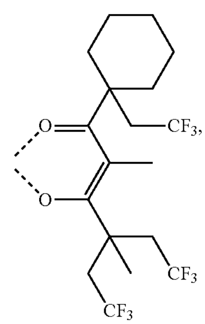
$L_{c328}$
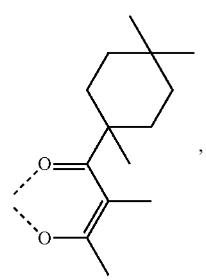
$L_{c329}$
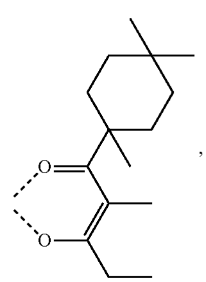

-continued
$L_{c330}$
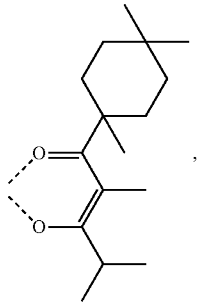
,
$L_{c331}$
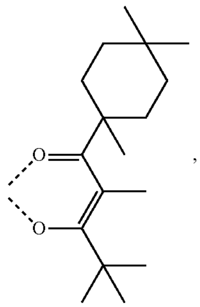
,
$L_{c332}$
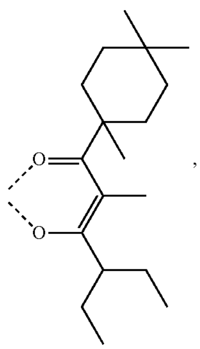
,
$L_{c333}$
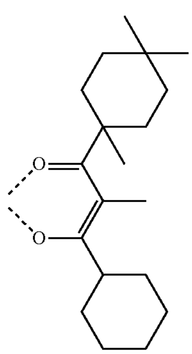
,
-continued
$L_{c334}$
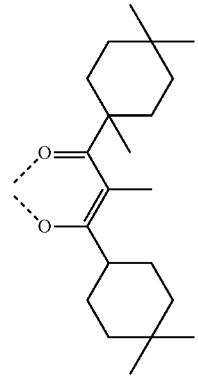
,
$L_{c335}$
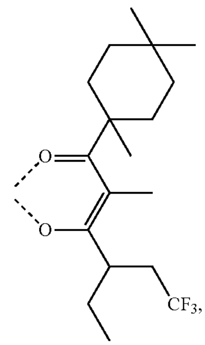
$L_{c336}$
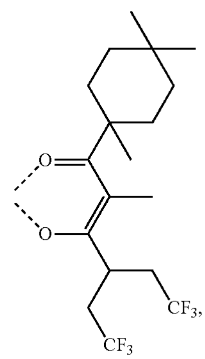
$L_{c337}$
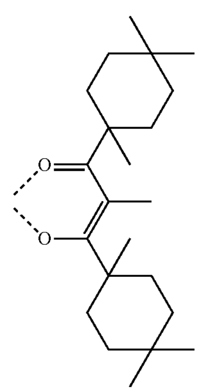
, -continued
$L_{c338}$
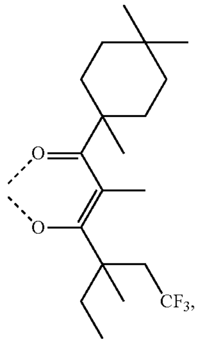
$L_{c339}$
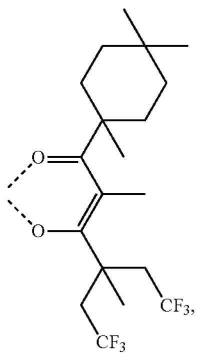
$L_{c340}$
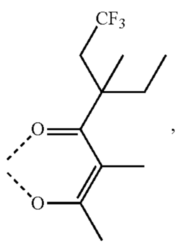
,
$L_{c341}$
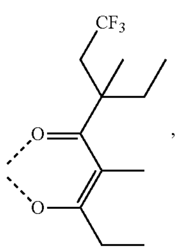
,
$L_{c342}$
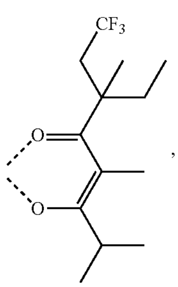
,
-continued
$L_{c343}$
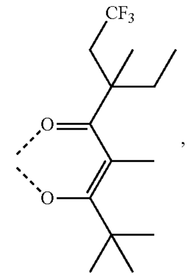
,
$L_{c344}$
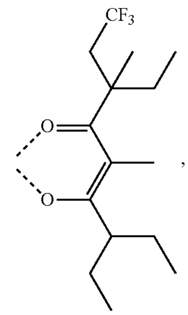
,
$L_{c345}$
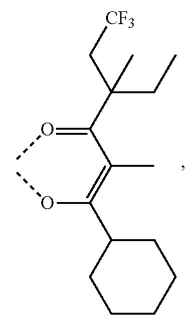
,
$L_{c346}$
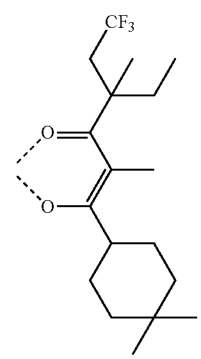
,
$L_{c347}$
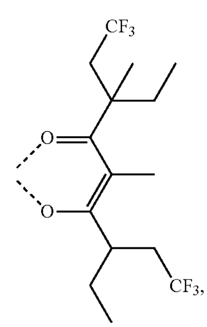

-continued
$L_{c348}$
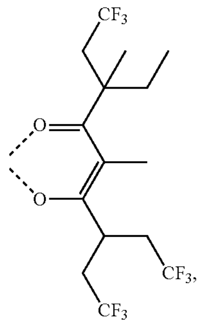
$L_{c349}$
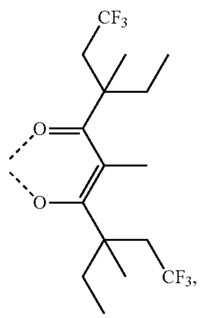
$L_{c350}$
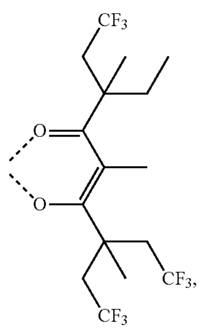
$L_{c351}$
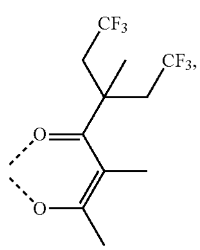
$L_{c352}$
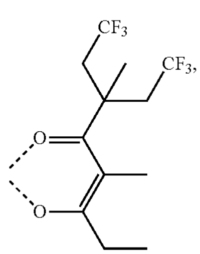
-continued
$L_{c353}$
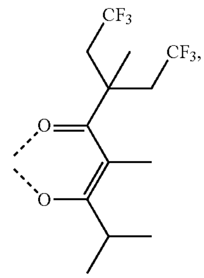
$L_{c354}$
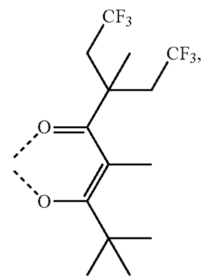
$L_{c355}$
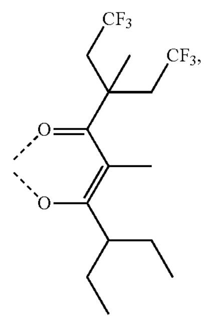
$L_{c356}$
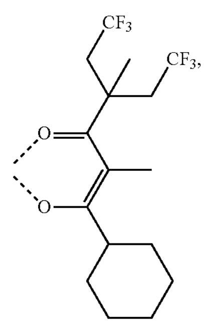
$L_{c357}$
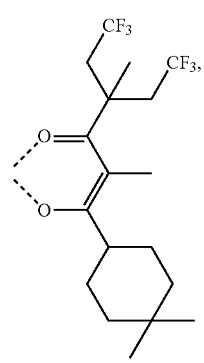

-continued $L_{c358}$

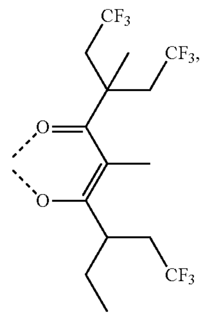

$L_{c359}$

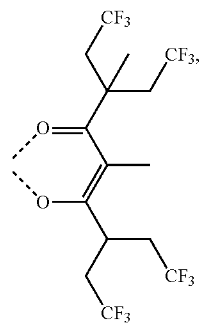

$L_{c360}$

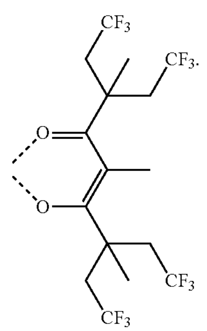

4. The metal complex of claim 3, having a structure represented by any one of $Ir(L_a)_2(L_b)$, $Ir(L_a)(L_b)_2$, $Ir(L_a)(L_b)(L_c)$, or $Ir(L_a)_2(L_c)$; wherein when the metal complex has the structure of $Ir(L_a)_2(L_b)$, $L_a$ is, at each occurrence identically or differently, any one or any two selected from the group consisting of $L_{a1}$ to $L_{a1089}$, and $L_b$ is any one selected from the group consisting of $L_{b1}$ to $L_{b87}$;

when the metal complex has the structure of $Ir(L_a)(L_b)_2$, $L_a$ is any one selected from the group consisting of $L_{a1}$ to $L_{a1089}$, and $L_b$ is, at each occurrence identically or differently, any one or any two selected from the group consisting of $L_{b1}$ to $L_{b87}$;

when the metal complex has the structure of $Ir(L_a)(L_b)(L_c)$, $L_a$ is any one selected from the group consisting of $L_{a1}$ to $L_{a1089}$, $L_b$ is any one selected from the group consisting of $L_{b1}$ to $L_{b87}$, and $L_c$ is any one selected from the group consisting of $L_{c1}$ to $L_{c360}$;

when the metal complex has the structure of $Ir(L_a)_2(L_c)$, $L_a$ is, at each occurrence identically or differently, any one or any two selected from the group consisting of $L_{a1}$ to $L_{a1089}$, and $L_c$ is any one selected from the group consisting of $L_{c1}$ to $L_{c360}$.

5. The metal complex of claim 4, the metal complex is selected from the group consisting of metal complex 1 to metal complex 530;

wherein metal complex 1 to metal complex 448 and metal complex 513 to metal complex 530 have the structure of $Ir(L_a)(L_b)_2$, wherein two $L_b$ are the same, and $L_a$ and $L_b$ separately correspond to structures listed in a following table:

| Metal Complex | $L_a$ | $L_b$ | Metal Complex | $L_a$ | $L_b$ |
|---|---|---|---|---|---|
| 1 | $L_{a9}$ | $L_{b1}$ | 2 | $L_{a10}$ | $L_{b1}$ |
| 3 | $L_{a11}$ | $L_{b1}$ | 4 | $L_{a12}$ | $L_{b1}$ |
| 5 | $L_{a13}$ | $L_{b1}$ | 6 | $L_{a14}$ | $L_{b1}$ |
| 7 | $L_{a15}$ | $L_{b1}$ | 8 | $L_{a16}$ | $L_{b1}$ |
| 9 | $L_{a17}$ | $L_{b1}$ | 10 | $L_{a18}$ | $L_{b1}$ |
| 11 | $L_{a33}$ | $L_{b1}$ | 12 | $L_{a34}$ | $L_{b1}$ |
| 13 | $L_{a37}$ | $L_{b1}$ | 14 | $L_{a38}$ | $L_{b1}$ |
| 15 | $L_{a41}$ | $L_{b1}$ | 16 | $L_{a42}$ | $L_{b1}$ |
| 17 | $L_{a45}$ | $L_{b1}$ | 18 | $L_{a46}$ | $L_{b1}$ |
| 19 | $L_{a49}$ | $L_{b1}$ | 20 | $L_{a50}$ | $L_{b1}$ |
| 21 | $L_{a53}$ | $L_{b1}$ | 22 | $L_{a54}$ | $L_{b1}$ |
| 23 | $L_{a61}$ | $L_{b1}$ | 24 | $L_{a62}$ | $L_{b1}$ |
| 25 | $L_{a65}$ | $L_{b1}$ | 26 | $L_{a66}$ | $L_{b1}$ |
| 27 | $L_{a73}$ | $L_{b1}$ | 28 | $L_{a74}$ | $L_{b1}$ |
| 29 | $L_{a77}$ | $L_{b1}$ | 30 | $L_{a78}$ | $L_{b1}$ |
| 31 | $L_{a85}$ | $L_{b1}$ | 32 | $L_{a105}$ | $L_{b1}$ |
| 33 | $L_{a133}$ | $L_{b1}$ | 34 | $L_{a145}$ | $L_{b1}$ |
| 35 | $L_{a157}$ | $L_{b1}$ | 36 | $L_{a181}$ | $L_{b1}$ |
| 37 | $L_{a201}$ | $L_{b1}$ | 38 | $L_{a217}$ | $L_{b1}$ |
| 39 | $L_{a297}$ | $L_{b1}$ | 40 | $L_{a305}$ | $L_{b1}$ |
| 41 | $L_{a321}$ | $L_{b1}$ | 42 | $L_{a345}$ | $L_{b1}$ |
| 43 | $L_{a357}$ | $L_{b1}$ | 44 | $L_{a361}$ | $L_{b1}$ |
| 45 | $L_{a369}$ | $L_{b1}$ | 46 | $L_{a373}$ | $L_{b1}$ |
| 47 | $L_{a377}$ | $L_{b1}$ | 48 | $L_{a393}$ | $L_{b1}$ |
| 49 | $L_{a413}$ | $L_{b1}$ | 50 | $L_{a425}$ | $L_{b1}$ |
| 51 | $L_{a505}$ | $L_{b1}$ | 52 | $L_{a510}$ | $L_{b1}$ |
| 53 | $L_{a513}$ | $L_{b1}$ | 54 | $L_{a515}$ | $L_{b1}$ |
| 55 | $L_{a534}$ | $L_{b1}$ | 56 | $L_{a537}$ | $L_{b1}$ |
| 57 | $L_{a629}$ | $L_{b1}$ | 58 | $L_{a653}$ | $L_{b1}$ |
| 59 | $L_{a661}$ | $L_{b1}$ | 60 | $L_{a665}$ | $L_{b1}$ |
| 61 | $L_{a775}$ | $L_{b1}$ | 62 | $L_{a782}$ | $L_{b1}$ |
| 63 | $L_{a836}$ | $L_{b1}$ | 64 | $L_{a838}$ | $L_{b1}$ |
| 65 | $L_{a9}$ | $L_{b3}$ | 66 | $L_{a10}$ | $L_{b3}$ |
| 67 | $L_{a11}$ | $L_{b3}$ | 68 | $L_{a12}$ | $L_{b3}$ |
| 69 | $L_{a13}$ | $L_{b3}$ | 70 | $L_{a14}$ | $L_{b3}$ |
| 71 | $L_{a15}$ | $L_{b3}$ | 72 | $L_{a16}$ | $L_{b3}$ |
| 73 | $L_{a17}$ | $L_{b3}$ | 74 | $L_{a18}$ | $L_{b3}$ |
| 75 | $L_{a33}$ | $L_{b3}$ | 76 | $L_{a34}$ | $L_{b3}$ |
| 77 | $L_{a37}$ | $L_{b3}$ | 78 | $L_{a38}$ | $L_{b3}$ |
| 79 | $L_{a41}$ | $L_{b3}$ | 80 | $L_{a42}$ | $L_{b3}$ |
| 81 | $L_{a45}$ | $L_{b3}$ | 82 | $L_{a46}$ | $L_{b3}$ |
| 83 | $L_{a49}$ | $L_{b3}$ | 84 | $L_{a50}$ | $L_{b3}$ |
| 85 | $L_{a53}$ | $L_{b3}$ | 86 | $L_{a54}$ | $L_{b3}$ |
| 87 | $L_{a61}$ | $L_{b3}$ | 88 | $L_{a62}$ | $L_{b3}$ |
| 89 | $L_{a65}$ | $L_{b3}$ | 90 | $L_{a66}$ | $L_{b3}$ |
| 91 | $L_{a73}$ | $L_{b3}$ | 92 | $L_{a74}$ | $L_{b3}$ |
| 93 | $L_{a77}$ | $L_{b3}$ | 94 | $L_{a78}$ | $L_{b3}$ |
| 95 | $L_{a85}$ | $L_{b3}$ | 96 | $L_{a105}$ | $L_{b3}$ |
| 97 | $L_{a133}$ | $L_{b3}$ | 98 | $L_{a145}$ | $L_{b3}$ |
| 99 | $L_{a157}$ | $L_{b3}$ | 100 | $L_{a181}$ | $L_{b3}$ |
| 101 | $L_{a201}$ | $L_{b3}$ | 102 | $L_{a217}$ | $L_{b3}$ |
| 103 | $L_{a297}$ | $L_{b3}$ | 104 | $L_{a305}$ | $L_{b3}$ |
| 105 | $L_{a321}$ | $L_{b3}$ | 106 | $L_{a345}$ | $L_{b3}$ |
| 107 | $L_{a357}$ | $L_{b3}$ | 108 | $L_{a361}$ | $L_{b3}$ |
| 109 | $L_{a369}$ | $L_{b3}$ | 110 | $L_{a373}$ | $L_{b3}$ |
| 111 | $L_{a377}$ | $L_{b3}$ | 112 | $L_{a393}$ | $L_{b3}$ |
| 113 | $L_{a413}$ | $L_{b3}$ | 114 | $L_{a425}$ | $L_{b3}$ |
| 115 | $L_{a505}$ | $L_{b3}$ | 116 | $L_{a510}$ | $L_{b3}$ |
| 117 | $La_{513}$ | $L_{b3}$ | 118 | $L_{a515}$ | $L_{b3}$ |
| 119 | $L_{a534}$ | $L_{b3}$ | 120 | $L_{a537}$ | $L_{b3}$ |
| 121 | $L_{a629}$ | $L_{b3}$ | 122 | $L_{a653}$ | $L_{b3}$ |
| 123 | $L_{a661}$ | $L_{b3}$ | 124 | $L_{a665}$ | $L_{b3}$ |
| 125 | $L_{a775}$ | $L_{b3}$ | 126 | $L_{a782}$ | $L_{b3}$ |
| 127 | $L_{a836}$ | $L_{b3}$ | 128 | $L_{a838}$ | $L_{b3}$ |
| 129 | $L_{a9}$ | $L_{b4}$ | 130 | $L_{a10}$ | $L_{b4}$ |
| 131 | $L_{a11}$ | $L_{b4}$ | 132 | $L_{a12}$ | $L_{b4}$ |
| 133 | $L_{a13}$ | $L_{b4}$ | 134 | $L_{a14}$ | $L_{b4}$ |
| 135 | $L_{a15}$ | $L_{b4}$ | 136 | $L_{a16}$ | $L_{b4}$ |
| 137 | $L_{a17}$ | $L_{b4}$ | 138 | $L_{a18}$ | $L_{b4}$ |
| 139 | $L_{a33}$ | $L_{b4}$ | 140 | $L_{a34}$ | $L_{b4}$ |
| 141 | $L_{a37}$ | $L_{b4}$ | 142 | $L_{a38}$ | $L_{b4}$ |

-continued

| Metal Complex | $L_a$ | $L_b$ | Metal Complex | $L_a$ | $L_b$ |
|---|---|---|---|---|---|
| 143 | $L_{a41}$ | $L_{b4}$ | 144 | $L_{a42}$ | $L_{b4}$ |
| 145 | $L_{a45}$ | $L_{b4}$ | 146 | $L_{a46}$ | $L_{b4}$ |
| 147 | $L_{a49}$ | $L_{b4}$ | 148 | $L_{a50}$ | $L_{b4}$ |
| 149 | $L_{a53}$ | $L_{b4}$ | 150 | $L_{a54}$ | $L_{b4}$ |
| 151 | $L_{a61}$ | $L_{b4}$ | 152 | $L_{a62}$ | $L_{b4}$ |
| 153 | $L_{a65}$ | $L_{b4}$ | 154 | $L_{a66}$ | $L_{b4}$ |
| 155 | $L_{a73}$ | $L_{b4}$ | 156 | $L_{a74}$ | $L_{b4}$ |
| 157 | $L_{a77}$ | $L_{b4}$ | 158 | $L_{a78}$ | $L_{b4}$ |
| 159 | $L_{a85}$ | $L_{b4}$ | 160 | $L_{a105}$ | $L_{b4}$ |
| 161 | $L_{a133}$ | $L_{b4}$ | 162 | $L_{a145}$ | $L_{b4}$ |
| 163 | $L_{a157}$ | $L_{b4}$ | 164 | $L_{a181}$ | $L_{b4}$ |
| 165 | $L_{a201}$ | $L_{b4}$ | 166 | $L_{a217}$ | $L_{b4}$ |
| 167 | $L_{a297}$ | $L_{b4}$ | 168 | $L_{a305}$ | $L_{b4}$ |
| 169 | $L_{a321}$ | $L_{b4}$ | 170 | $L_{a345}$ | $L_{b4}$ |
| 171 | $L_{a357}$ | $L_{b4}$ | 172 | $L_{a361}$ | $L_{b4}$ |
| 173 | $L_{a369}$ | $L_{b4}$ | 174 | $L_{a373}$ | $L_{b4}$ |
| 175 | $L_{a377}$ | $L_{b4}$ | 176 | $L_{a393}$ | $L_{b4}$ |
| 177 | $L_{a413}$ | $L_{b4}$ | 178 | $L_{a425}$ | $L_{b4}$ |
| 179 | $L_{a505}$ | $L_{b4}$ | 180 | $L_{a510}$ | $L_{b4}$ |
| 181 | $L_{a513}$ | $L_{b4}$ | 182 | $L_{a515}$ | $L_{b4}$ |
| 183 | $L_{a534}$ | $L_{b4}$ | 184 | $L_{a537}$ | $L_{b4}$ |
| 185 | $L_{a629}$ | $L_{b4}$ | 186 | $L_{a653}$ | $L_{b4}$ |
| 187 | $L_{a661}$ | $L_{b4}$ | 188 | $L_{a665}$ | $L_{b4}$ |
| 189 | $L_{a775}$ | $L_{b4}$ | 190 | $L_{a782}$ | $L_{b4}$ |
| 191 | $L_{a836}$ | $L_{b4}$ | 192 | $L_{a838}$ | $L_{b4}$ |
| 193 | $L_{a9}$ | $L_{b8}$ | 194 | $L_{a10}$ | $L_{b8}$ |
| 195 | $L_{a11}$ | $L_{b8}$ | 196 | $L_{a12}$ | $L_{b8}$ |
| 197 | $L_{a13}$ | $L_{b8}$ | 198 | $L_{a14}$ | $L_{b8}$ |
| 199 | $L_{a15}$ | $L_{b8}$ | 200 | $L_{a16}$ | $L_{b8}$ |
| 201 | $L_{a17}$ | $L_{b8}$ | 202 | $L_{a18}$ | $L_{b8}$ |
| 203 | $L_{a33}$ | $L_{b8}$ | 204 | $L_{a34}$ | $L_{b8}$ |
| 205 | $L_{a37}$ | $L_{b8}$ | 206 | $L_{a38}$ | $L_{b8}$ |
| 207 | $L_{a41}$ | $L_{b8}$ | 208 | $L_{a42}$ | $L_{b8}$ |
| 209 | $L_{a45}$ | $L_{b8}$ | 210 | $L_{a46}$ | $L_{b8}$ |
| 211 | $L_{a49}$ | $L_{b8}$ | 212 | $L_{a50}$ | $L_{b8}$ |
| 213 | $L_{a53}$ | $L_{b8}$ | 214 | $L_{a54}$ | $L_{b8}$ |
| 215 | $L_{a61}$ | $L_{b8}$ | 216 | $L_{a62}$ | $L_{b8}$ |
| 217 | $L_{a65}$ | $L_{b8}$ | 218 | $L_{a66}$ | $L_{b8}$ |
| 219 | $L_{a73}$ | $L_{b8}$ | 220 | $L_{a74}$ | $L_{b8}$ |
| 221 | $L_{a77}$ | $L_{b8}$ | 222 | $L_{a78}$ | $L_{b8}$ |
| 223 | $L_{a85}$ | $L_{b8}$ | 224 | $L_{a105}$ | $L_{b8}$ |
| 225 | $L_{a133}$ | $L_{b8}$ | 226 | $L_{a145}$ | $L_{b8}$ |
| 227 | $L_{a157}$ | $L_{b8}$ | 228 | $L_{a181}$ | $L_{b8}$ |
| 229 | $L_{a201}$ | $L_{b8}$ | 230 | $L_{a217}$ | $L_{b8}$ |
| 231 | $L_{a297}$ | $L_{b8}$ | 232 | $L_{a305}$ | $L_{b8}$ |
| 233 | $L_{a321}$ | $L_{b8}$ | 234 | $L_{a345}$ | $L_{b8}$ |
| 235 | $L_{a357}$ | $L_{b8}$ | 236 | $L_{a361}$ | $L_{b8}$ |
| 237 | $L_{a369}$ | $L_{b8}$ | 238 | $L_{a373}$ | $L_{b8}$ |
| 239 | $L_{a377}$ | $L_{b8}$ | 240 | $L_{a393}$ | $L_{b8}$ |
| 241 | $L_{a413}$ | $L_{b8}$ | 242 | $L_{a425}$ | $L_{b8}$ |
| 243 | $L_{a505}$ | $L_{b8}$ | 244 | $L_{a510}$ | $L_{b8}$ |
| 245 | $L_{a513}$ | $L_{b8}$ | 246 | $L_{a515}$ | $L_{b8}$ |
| 247 | $L_{a534}$ | $L_{b8}$ | 248 | $L_{a537}$ | $L_{b8}$ |
| 249 | $L_{a629}$ | $L_{b8}$ | 250 | $L_{a653}$ | $L_{b8}$ |
| 251 | $L_{a661}$ | $L_{b8}$ | 252 | $L_{a665}$ | $L_{b8}$ |
| 253 | $L_{a775}$ | $L_{b8}$ | 254 | $L_{a782}$ | $L_{b8}$ |
| 255 | $L_{a836}$ | $L_{b8}$ | 256 | $L_{a838}$ | $L_{b8}$ |
| 257 | $L_{a9}$ | $L_{b43}$ | 258 | $L_{a10}$ | $L_{b43}$ |
| 259 | $L_{a11}$ | $L_{b43}$ | 260 | $L_{a12}$ | $L_{b43}$ |
| 261 | $L_{a13}$ | $L_{b43}$ | 262 | $L_{a14}$ | $L_{b43}$ |
| 263 | $L_{a15}$ | $L_{b43}$ | 264 | $L_{a16}$ | $L_{b43}$ |
| 265 | $L_{a17}$ | $L_{b43}$ | 266 | $L_{a18}$ | $L_{b43}$ |
| 267 | $L_{a33}$ | $L_{b43}$ | 268 | $L_{a34}$ | $L_{b43}$ |
| 269 | $L_{a37}$ | $L_{b43}$ | 270 | $L_{a38}$ | $L_{b43}$ |
| 271 | $L_{a41}$ | $L_{b43}$ | 272 | $L_{a42}$ | $L_{b43}$ |
| 273 | $L_{a45}$ | $L_{b43}$ | 274 | $L_{a46}$ | $L_{b43}$ |
| 275 | $L_{a49}$ | $L_{b43}$ | 276 | $L_{a50}$ | $L_{b43}$ |
| 277 | $L_{a53}$ | $L_{b43}$ | 278 | $L_{a54}$ | $L_{b43}$ |
| 279 | $L_{a61}$ | $L_{b43}$ | 280 | $L_{a62}$ | $L_{b43}$ |
| 281 | $L_{a65}$ | $L_{b43}$ | 282 | $L_{a66}$ | $L_{b43}$ |
| 283 | $L_{a73}$ | $L_{b43}$ | 284 | $L_{a74}$ | $L_{b43}$ |
| 285 | $L_{a77}$ | $L_{b43}$ | 286 | $L_{a78}$ | $L_{b43}$ |
| 287 | $L_{a85}$ | $L_{b43}$ | 288 | $L_{a105}$ | $L_{b43}$ |
| 289 | $L_{a133}$ | $L_{b43}$ | 290 | $L_{a145}$ | $L_{b43}$ |
| 291 | $L_{a157}$ | $L_{b43}$ | 292 | $L_{a181}$ | $L_{b43}$ |
| 293 | $L_{a201}$ | $L_{b43}$ | 294 | $L_{a217}$ | $L_{b43}$ |

-continued

| Metal Complex | $L_a$ | $L_b$ | Metal Complex | $L_a$ | $L_b$ |
|---|---|---|---|---|---|
| 295 | $L_{a297}$ | $L_{b43}$ | 296 | $L_{a305}$ | $L_{b43}$ |
| 297 | $L_{a321}$ | $L_{b43}$ | 298 | $L_{a345}$ | $L_{b43}$ |
| 299 | $L_{a357}$ | $L_{b43}$ | 300 | $L_{a361}$ | $L_{b43}$ |
| 301 | $L_{a369}$ | $L_{b43}$ | 302 | $L_{a373}$ | $L_{b43}$ |
| 303 | $L_{a377}$ | $L_{b43}$ | 304 | $L_{a393}$ | $L_{b43}$ |
| 305 | $L_{a413}$ | $L_{b43}$ | 306 | $L_{a425}$ | $L_{b43}$ |
| 307 | $L_{a505}$ | $L_{b43}$ | 308 | $L_{a510}$ | $L_{b43}$ |
| 309 | $L_{a513}$ | $L_{b43}$ | 310 | $L_{a515}$ | $L_{b43}$ |
| 311 | $L_{a534}$ | $L_{b43}$ | 312 | $L_{a537}$ | $L_{b43}$ |
| 313 | $L_{a629}$ | $L_{b43}$ | 314 | $L_{a653}$ | $L_{b43}$ |
| 315 | $L_{a661}$ | $L_{b43}$ | 316 | $L_{a665}$ | $L_{b43}$ |
| 317 | $L_{a775}$ | $L_{b43}$ | 318 | $L_{a782}$ | $L_{b43}$ |
| 319 | $L_{a836}$ | $L_{b43}$ | 320 | $L_{a838}$ | $L_{b43}$ |
| 321 | $L_{a9}$ | $L_{b44}$ | 322 | $L_{a10}$ | $L_{b44}$ |
| 323 | $L_{a11}$ | $L_{b44}$ | 324 | $L_{a12}$ | $L_{b44}$ |
| 325 | $L_{a13}$ | $L_{b44}$ | 326 | $L_{a14}$ | $L_{b44}$ |
| 327 | $L_{a15}$ | $L_{b44}$ | 328 | $L_{a16}$ | $L_{b44}$ |
| 329 | $L_{a17}$ | $L_{b44}$ | 330 | $L_{a18}$ | $L_{b44}$ |
| 331 | $L_{a33}$ | $L_{b44}$ | 332 | $L_{a34}$ | $L_{b44}$ |
| 333 | $L_{a37}$ | $L_{b44}$ | 334 | $L_{a38}$ | $L_{b44}$ |
| 335 | $L_{a41}$ | $L_{b44}$ | 336 | $L_{a42}$ | $L_{b44}$ |
| 337 | $L_{a45}$ | $L_{b44}$ | 338 | $L_{a46}$ | $L_{b44}$ |
| 339 | $L_{a49}$ | $L_{b44}$ | 340 | $L_{a50}$ | $L_{b44}$ |
| 341 | $L_{a53}$ | $L_{b44}$ | 342 | $L_{a54}$ | $L_{b44}$ |
| 343 | $L_{a61}$ | $L_{b44}$ | 344 | $L_{a62}$ | $L_{b44}$ |
| 345 | $L_{a65}$ | $L_{b44}$ | 346 | $L_{a66}$ | $L_{b44}$ |
| 347 | $L_{a73}$ | $L_{b44}$ | 348 | $L_{a74}$ | $L_{b44}$ |
| 349 | $L_{a77}$ | $L_{b44}$ | 350 | $L_{a78}$ | $L_{b44}$ |
| 351 | $L_{a85}$ | $L_{b44}$ | 352 | $L_{a105}$ | $L_{b44}$ |
| 353 | $L_{a133}$ | $L_{b44}$ | 354 | $L_{a145}$ | $L_{b44}$ |
| 355 | $L_{a157}$ | $L_{b44}$ | 356 | $L_{a181}$ | $L_{b44}$ |
| 357 | $L_{a201}$ | $L_{b44}$ | 358 | $L_{a217}$ | $L_{b44}$ |
| 359 | $L_{a297}$ | $L_{b44}$ | 360 | $L_{a305}$ | $L_{b44}$ |
| 361 | $L_{a321}$ | $L_{b44}$ | 362 | $L_{a345}$ | $L_{b44}$ |
| 363 | $L_{a357}$ | $L_{b44}$ | 364 | $L_{a361}$ | $L_{b44}$ |
| 365 | $L_{a369}$ | $L_{b44}$ | 366 | $L_{a373}$ | $L_{b44}$ |
| 367 | $L_{a377}$ | $L_{b44}$ | 368 | $L_{a393}$ | $L_{b44}$ |
| 369 | $L_{a413}$ | $L_{b44}$ | 370 | $L_{a425}$ | $L_{b44}$ |
| 371 | $L_{a505}$ | $L_{b44}$ | 372 | $L_{a510}$ | $L_{b44}$ |
| 373 | $L_{a513}$ | $L_{b44}$ | 374 | $L_{a515}$ | $L_{b44}$ |
| 375 | $L_{a534}$ | $L_{b44}$ | 376 | $L_{a537}$ | $L_{b44}$ |
| 377 | $L_{a629}$ | $L_{b44}$ | 378 | $L_{a653}$ | $L_{b44}$ |
| 379 | $L_{a661}$ | $L_{b44}$ | 380 | $L_{a665}$ | $L_{b44}$ |
| 381 | $L_{a775}$ | $L_{b44}$ | 382 | $L_{a782}$ | $L_{b44}$ |
| 383 | $L_{a836}$ | $L_{b44}$ | 384 | $L_{a838}$ | $L_{b44}$ |
| 385 | $L_{a9}$ | $L_{b60}$ | 386 | $L_{a10}$ | $L_{b60}$ |
| 387 | $L_{a11}$ | $L_{b60}$ | 388 | $L_{a12}$ | $L_{b60}$ |
| 389 | $L_{a13}$ | $L_{b60}$ | 390 | $L_{a14}$ | $L_{b60}$ |
| 391 | $L_{a15}$ | $L_{b60}$ | 392 | $L_{a16}$ | $L_{b60}$ |
| 393 | $L_{a17}$ | $L_{b60}$ | 394 | $L_{a18}$ | $L_{b60}$ |
| 395 | $L_{a33}$ | $L_{b60}$ | 396 | $L_{a34}$ | $L_{b60}$ |
| 397 | $L_{a37}$ | $L_{b60}$ | 398 | $L_{a38}$ | $L_{b60}$ |
| 399 | $L_{a41}$ | $L_{b60}$ | 400 | $L_{a42}$ | $L_{b60}$ |
| 401 | $L_{a45}$ | $L_{b60}$ | 402 | $L_{a46}$ | $L_{b60}$ |
| 403 | $L_{a49}$ | $L_{b60}$ | 404 | $L_{a50}$ | $L_{b60}$ |
| 405 | $L_{a53}$ | $L_{b60}$ | 406 | $L_{a54}$ | $L_{b60}$ |
| 407 | $L_{a61}$ | $L_{b60}$ | 408 | $L_{a62}$ | $L_{b60}$ |
| 409 | $L_{a65}$ | $L_{b60}$ | 410 | $L_{a66}$ | $L_{b60}$ |
| 411 | $L_{a73}$ | $L_{b60}$ | 412 | $L_{a74}$ | $L_{b60}$ |
| 413 | $L_{a77}$ | $L_{b60}$ | 414 | $L_{a78}$ | $L_{b60}$ |
| 415 | $L_{a85}$ | $L_{b60}$ | 416 | $L_{a105}$ | $L_{b60}$ |
| 417 | $L_{a133}$ | $L_{b60}$ | 418 | $L_{a145}$ | $L_{b60}$ |
| 419 | $L_{a157}$ | $L_{b60}$ | 420 | $L_{a181}$ | $L_{b60}$ |
| 421 | $L_{a201}$ | $L_{b60}$ | 422 | $L_{a217}$ | $L_{b60}$ |
| 423 | $L_{a297}$ | $L_{b60}$ | 424 | $L_{a305}$ | $L_{b60}$ |
| 425 | $L_{a321}$ | $L_{b60}$ | 426 | $L_{a345}$ | $L_{b60}$ |
| 427 | $L_{a357}$ | $L_{b60}$ | 428 | $L_{a361}$ | $L_{b60}$ |
| 429 | $L_{a369}$ | $L_{b60}$ | 430 | $L_{a373}$ | $L_{b60}$ |
| 431 | $L_{a377}$ | $L_{b60}$ | 432 | $L_{a393}$ | $L_{b60}$ |
| 433 | $L_{a413}$ | $L_{b60}$ | 434 | $L_{a425}$ | $L_{b60}$ |
| 435 | $L_{a505}$ | $L_{b60}$ | 436 | $L_{a510}$ | $L_{b60}$ |
| 437 | $L_{a513}$ | $L_{b60}$ | 438 | $L_{a515}$ | $L_{b60}$ |
| 439 | $L_{a534}$ | $L_{b60}$ | 440 | $L_{a537}$ | $L_{b60}$ |
| 441 | $L_{a629}$ | $L_{b60}$ | 442 | $L_{a653}$ | $L_{b60}$ |
| 443 | $L_{a661}$ | $L_{b60}$ | 444 | $L_{a665}$ | $L_{b60}$ |
| 445 | $L_{a775}$ | $L_{b60}$ | 446 | $L_{a782}$ | $L_{b60}$ |

-continued

| Metal Complex | $L_a$ | $L_b$ | Metal Complex | $L_a$ | $L_b$ |
|---|---|---|---|---|---|
| 447 | $L_{a836}$ | $L_{b60}$ | 448 | $L_{a838}$ | $L_{b60}$ |
| 513 | $L_{a9}$ | $L_{b79}$ | 514 | $L_{a10}$ | $L_{b79}$ |
| 515 | $L_{a11}$ | $L_{b79}$ | 516 | $L_{a12}$ | $L_{b79}$ |
| 517 | $L_{a13}$ | $L_{b79}$ | 518 | $L_{a14}$ | $L_{b79}$ |
| 519 | $L_{a15}$ | $L_{b79}$ | 520 | $L_{a16}$ | $L_{b79}$ |
| 521 | $L_{a17}$ | $L_{b79}$ | 522 | $L_{a18}$ | $L_{b79}$ |
| 523 | $L_{a297}$ | $L_{b79}$ | 524 | $L_{a305}$ | $L_{b79}$ |
| 525 | $L_{a321}$ | $L_{b79}$ | 526 | $L_{a345}$ | $L_{b79}$ |
| 527 | $L_{a357}$ | $L_{b79}$ | 528 | $L_{a361}$ | $L_{b79}$ |
| 529 | $L_{a369}$ | $L_{b79}$ | 530 | $L_{a373}$ | $L_{b79}$ |

wherein metal complex 449 to metal complex 512 have the structure of $Ir(L_a)_2L_c$, wherein two $L_a$ are the same, and $L_a$ and $L_c$ separately correspond to structures listed in a following table:

| Metal Complex | $L_a$ | $L_c$ | Metal Complex | $L_a$ | $L_c$ |
|---|---|---|---|---|---|
| 449 | $L_{a9}$ | $L_{c1}$ | 450 | $L_{a10}$ | $L_{c1}$ |
| 451 | $L_{a11}$ | $L_{c1}$ | 452 | $L_{a12}$ | $L_{c1}$ |
| 453 | $L_{a13}$ | $L_{c1}$ | 454 | $L_{a14}$ | $L_{c1}$ |
| 455 | $L_{a15}$ | $L_{c1}$ | 456 | $L_{a16}$ | $L_{c1}$ |
| 457 | $L_{a21}$ | $L_{c1}$ | 458 | $L_{a22}$ | $L_{c1}$ |
| 459 | $L_{a33}$ | $L_{c1}$ | 460 | $L_{a34}$ | $L_{c1}$ |
| 461 | $L_{a37}$ | $L_{c1}$ | 462 | $L_{a38}$ | $L_{c1}$ |
| 463 | $L_{a41}$ | $L_{c1}$ | 464 | $L_{a42}$ | $L_{c1}$ |
| 465 | $L_{a45}$ | $L_{c1}$ | 466 | $L_{a46}$ | $L_{c1}$ |
| 467 | $L_{a49}$ | $L_{c1}$ | 468 | $L_{a50}$ | $L_{c1}$ |
| 469 | $L_{a53}$ | $L_{c1}$ | 470 | $L_{a54}$ | $L_{c1}$ |
| 471 | $L_{a61}$ | $L_{c1}$ | 472 | $L_{a62}$ | $L_{c1}$ |
| 473 | $L_{a65}$ | $L_{c1}$ | 474 | $L_{a66}$ | $L_{c1}$ |
| 475 | $L_{a73}$ | $L_{c1}$ | 476 | $L_{a74}$ | $L_{c1}$ |
| 477 | $L_{a77}$ | $L_{c1}$ | 478 | $L_{a78}$ | $L_{c1}$ |
| 479 | $L_{a85}$ | $L_{c1}$ | 480 | $L_{a105}$ | $L_{c1}$ |
| 481 | $L_{a133}$ | $L_{c1}$ | 482 | $L_{a145}$ | $L_{c1}$ |
| 483 | $L_{a157}$ | $L_{c1}$ | 484 | $L_{a181}$ | $L_{c1}$ |
| 485 | $L_{a201}$ | $L_{c1}$ | 486 | $L_{a217}$ | $L_{c1}$ |
| 487 | $L_{a297}$ | $L_{c1}$ | 488 | $L_{a305}$ | $L_{c1}$ |
| 489 | $L_{a321}$ | $L_{c31}$ | 490 | $L_{a345}$ | $L_{c31}$ |
| 491 | $L_{a357}$ | $L_{c31}$ | 492 | $L_{a361}$ | $L_{c31}$ |
| 493 | $L_{a369}$ | $L_{c31}$ | 494 | $L_{a373}$ | $L_{c31}$ |
| 495 | $L_{a377}$ | $L_{c31}$ | 496 | $L_{a393}$ | $L_{c31}$ |
| 497 | $L_{a413}$ | $L_{c31}$ | 498 | $L_{a425}$ | $L_{c31}$ |
| 499 | $L_{a505}$ | $L_{c31}$ | 500 | $L_{a510}$ | $L_{c31}$ |
| 501 | $L_{a513}$ | $L_{c31}$ | 502 | $L_{a515}$ | $L_{c31}$ |
| 503 | $L_{a534}$ | $L_{c31}$ | 504 | $L_{a537}$ | $L_{c31}$ |
| 505 | $L_{a629}$ | $L_{c31}$ | 506 | $L_{a653}$ | $L_{c31}$ |
| 507 | $L_{a661}$ | $L_{c31}$ | 508 | $L_{a665}$ | $L_{c31}$ |
| 509 | $L_{a775}$ | $L_{c31}$ | 510 | $L_{a782}$ | $L_{c31}$ |
| 511 | $L_{a836}$ | $L_{c31}$ | 512 | $L_{a838}$ | $L_{c31}$. |

6. The metal complex of claim 1, wherein $L_a$ has a structure represented by any one of Formula 1a to Formula 1d:

Formula 1a

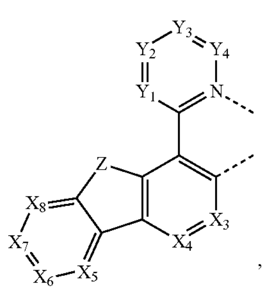

-continued

Formula 1b

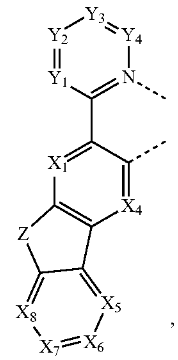

Formula 1c

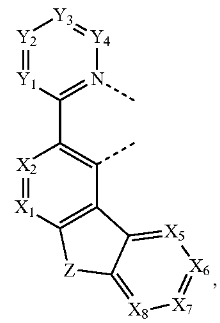

Formula 1d

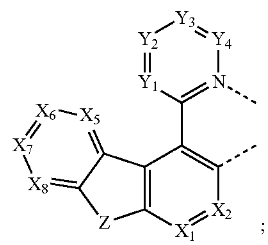

wherein Z, $X_1$ to $X_8$, and $Y_1$ to $Y_4$ have same definitions and scopes as those in claim 1.

7. The metal complex of claim 6, a general formula of $Ir(L_a)_m(L_b)_{3-m}$ and a structure represented by Formula 2:

Formula 2

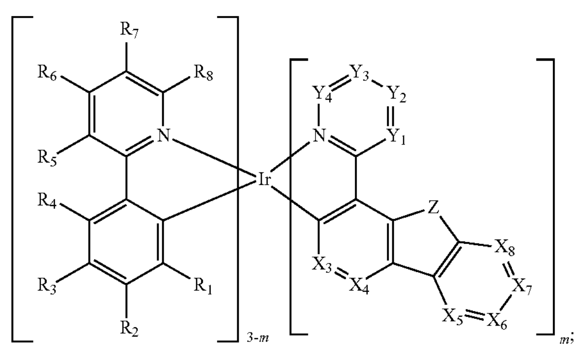

wherein, m is selected from 1 or 2; wherein when m is equal to 2, the two $L_a$ are the same or different;

when m is equal to 1, the two $L_b$ are the same or different;

Z is selected from the group consisting of O, S, Se, wherein when two R are present, the two R are the same or different;

$X_3$ to $X_8$ are, at each occurrence identically or differently, selected from $CR_x$ or N;

$Y_1$ to $Y_4$ are, at each occurrence identically or differently, selected from $CR_y$ or N;

at least one of $X_3$ to $X_8$ is selected from $CR_x$, and the $R_x$ is cyano;

at least two of $Y_1$ to $Y_4$ are selected from $CR_y$, and wherein at least one of the $R_y$ is deuterium, and at least one of the $R_y$ has a structure of $-L-R_d$;

L is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms, or combinations thereof, $R_d$ is, at each occurrence identically or differently, selected from substituted alkyl having 1 to 20 carbon atoms, substituted cycloalkyl having 3 to 20 ring carbon atoms, substituted heteroalkyl having 1 to 20 carbon atoms, a substituted heterocyclic group having 3 to 20 ring atoms, substituted arylalkyl having 7 to 30 carbon atoms, substituted alkoxy having 1 to 20 carbon atoms, substituted aryloxy having 6 to 30 carbon atoms, substituted alkenyl having 2 to 20 carbon atoms, substituted aryl having 6 to 30 carbon atoms, substituted heteroaryl having 3 to 30 carbon atoms, substituted alkylsilyl having 3 to 20 carbon atoms, substituted arylsilyl having 6 to 20 carbon atoms, substituted amino having 0 to 20 carbon atoms, or combinations thereof, the substitution in the above-mentioned group of $R_d$ contains at least one deuterium atom;

R, $R_x$, $R_y$, and $R_1$ to $R_8$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof, and adjacent substituents R, $R_x$, $R_y$, $R_1$ to $R_8$, L, and $R_d$ can be optionally joined to form a ring.

8. The metal complex of claim 7, $R_d$ is, at each occurrence identically or differently, selected from the group consisting of: substituted alkyl having 1 to 20 carbon atoms, substituted cycloalkyl having 3 to 20 ring carbon atoms, substituted aryl having 6 to 30 carbon atoms, substituted heteroaryl having 3 to 30 carbon atoms, and combinations thereof; and at least one substitution in the above groups of $R_d$ is a deuterium atom.

9. The metal complex of claim 8, when the carbon atom at a benzylic position in the deuterated group is a primary carbon atom, a secondary carbon atom, or a tertiary carbon atom, the benzylic position in the deuterated group is fully deuterated.

10. The metal complex of claim 4, $R_d$ is, at each occurrence identically or differently, selected from the group consisting of: $CD_3$, $CD_2CH_3$, $CD_2CD_3$, $CD(CH_3)_2$, $CD(CD_3)_2$, $CD_2CH(CH_3)_2$, $CD_2C(CH_3)_3$,

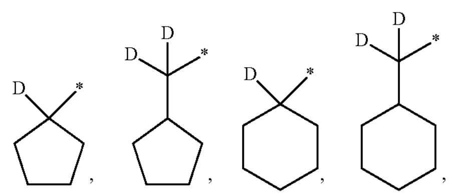

and combinations thereof.

11. The metal complex of claim 7, wherein Z is O.

12. The metal complex of claim 7, wherein $X_3$ to $X_8$ are, at each occurrence identically or differently, selected from $CR_x$.

13. The metal complex of claim 7, wherein $X_3$ to $X_8$ are, at each occurrence identically or differently, selected from $CR_x$ or N, and at least one of $X_3$ to $X_8$ is N.

14. The metal complex of claim 7, wherein at least two of $X_3$ to $X_8$ are selected from $CR_x$, and wherein at least one of the $R_x$ is cyano, and at least one of the $R_x$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

15. The metal complex of claim 7, wherein at least one of $X_5$ to $X_8$ is selected from $CR_x$, and the $R_x$ is cyano.

16. The metal complex of claim 7, wherein $Y_1$ to $Y_4$ are, at each occurrence identically or differently, selected from $CR_y$.

17. The metal complex of claim 7, wherein $Y_1$ to $Y_4$ are, at each occurrence identically or differently, selected from $CR_y$, or N, and at least one of $Y_1$ to $Y_4$ is N.

18. The metal complex of claim 7, wherein at least one of $Y_2$ to $Y_4$ is selected from $CR_y$, and the $R_y$ has a structure of $-L-R_d$.

19. The metal complex of claim 7, wherein L is, at each occurrence identically or differently, selected from a single bond, substituted or unsubstituted alkylene having 1 to 20 carbon atoms, substituted or unsubstituted cycloalkylene having 3 to 20 carbon atoms, or combinations thereof.

20. The metal complex of claim 8, wherein $R_d$ is, at each occurrence identically or differently, selected from the group consisting of: partially or fully deuterated alkyl having 1 to 20 carbon atoms, partially or fully deuterated cycloalkyl having 3 to 20 ring carbon atoms, and combinations thereof; and when a carbon atom at a benzylic position in the deuterated group is a primary carbon atom, a secondary carbon atom, or a tertiary carbon atom, the carbon atom at the benzylic position in the deuterated group is joined to at least one deuterium atom.

21. The metal complex of claim 7, wherein $Y_1$ to $Y_4$ are each independently selected from $CR_y$ or N, and the $R_y$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, a cyano group, a hydroxyl group, a sulfanyl group, and combinations thereof.

22. The metal complex of claim 7, wherein $X_3$ to $X_8$ are, at each occurrence identically or differently, selected from $CR_x$ or N, and the $R_x$ is, at each occurrence identically or differently, selected from the group consisting of: hydrogen, deuterium, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof, and when the $R_x$ is selected from substituted alkyl having 1 to 20 carbon atoms or substituted cycloalkyl having 3 to 20 ring carbon atoms, the substituent in the alkyl and cycloalkyl is selected from the group consisting of: unsubstituted alkyl having 1 to 20 carbon atoms, unsubstituted cycloalkyl having 3 to 20 ring carbon atoms, unsubstituted heteroalkyl having 1 to 20 carbon atoms, an unsubstituted heterocyclic group having 3 to 20 ring atoms, unsubstituted arylalkyl having 7 to 30 carbon atoms, unsubstituted alkoxy having 1 to 20 carbon atoms, unsubstituted aryloxy having 6 to 30 carbon atoms, unsubstituted alkenyl having 2 to 20 carbon atoms, unsubstituted alkynyl having 2 to 20 carbon atoms, unsubstituted aryl having 6 to 30 carbon atoms, unsubstituted heteroaryl having 3 to 30 carbon atoms, unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof, and adjacent substituents $R_x$ are not joined to form a ring.

23. The metal complex of claim 7, wherein at least one or two of $R_1$ to $R_8$ is(are), at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

24. The metal complex of claim 7, wherein one, two, three, or all of $R_2$, $R_3$, $R_6$, and $R_7$ is(are), at each occurrence identically or differently, selected from the group consisting of: deuterium, fluorine, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, and combinations thereof.

25. The metal complex of claim 7, wherein $X_8$ is N.

26. The metal complex of claim 7, wherein at least two of $X_3$ to $X_8$ are selected from $CR_x$, and wherein at least one of the $R_x$ is cyano, and at least one of the $R_x$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, and combinations thereof.

27. The metal complex of claim 7, wherein at least one of $X_6$ to $X_8$ is selected from $CR_x$, and the $R_x$ is cyano.

28. The metal complex of claim 7, wherein $X_7$ or $X_8$ is selected from $CR_x$, and the $R_x$ is cyano.

29. The metal complex of claim 7, wherein $Y_3$ is N.

30. The metal complex of claim 7, wherein $Y_2$ and/or $Y_3$ are(is) selected from $CR_y$, and the $R_y$ has a structure of $-L-R_d$.

31. The metal complex of claim 7, wherein $Y_2$ and/or $Y_3$ are(is) selected from $CR_y$, and the $R_y$ has a structure of $-L-R_d$;

and $Y_1$ and/or $Y_4$ are(is) selected from $CR_y$, and the $R_y$ is deuterium.

32. The metal complex of claim 7, wherein $R_d$ is, at each occurrence identically or differently, selected from the group consisting of: partially or fully deuterated alkyl having 1 to 20 carbon atoms, partially or fully deuterated cycloalkyl having 3 to 20 ring carbon atoms, and combinations thereof.

33. The metal complex of claim 7, at least one of $Y_1$ to $Y_2$ is selected from $CR_y$, and the $R_y$ is, at each occurrence identically or differently, selected from the group consisting of: hydrogen, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, a cyano group, a hydroxyl group, a sulfanyl group, and combinations thereof.

34. The metal complex of claim 7, two, three, or all of $R_2$, $R_3$, $R_6$, and $R_7$ is(are), at each occurrence identically or differently, selected from the group consisting of: deuterium, methyl, ethyl, propyl, isopropyl, n-butyl, isobutyl, t-butyl, cyclopentyl, cyclohexyl, and combinations thereof, optionally, hydrogen in the above groups can be partially or fully deuterated.

35. An electroluminescent device, comprising:

an anode, a cathode, and an organic layer disposed between the anode and the cathode, wherein the organic layer comprises the metal complex of claim 1.

36. The electroluminescent device of claim 35, wherein the organic layer is a light-emitting layer, and the metal complex is a light-emitting material.

37. The electroluminescent device of claim 36, wherein the light-emitting layer further comprises at least one host compound.

38. The metal complex of claim 1, wherein

M is, at each occurrence identically or differently, selected from Pt or Ir;

$L_b$ and $L_c$ are, at each occurrence identically or differently selected from the group consisting of:

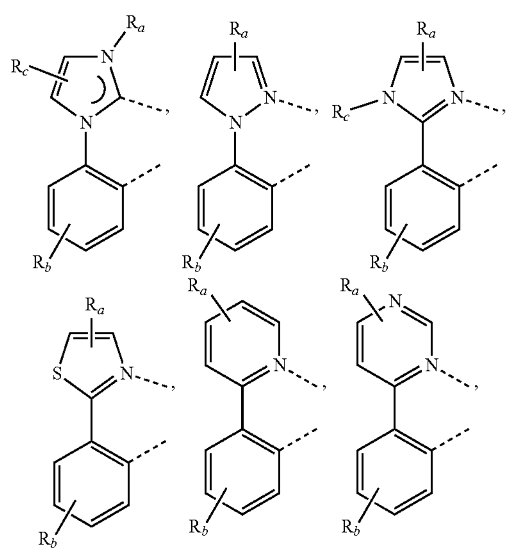

-continued

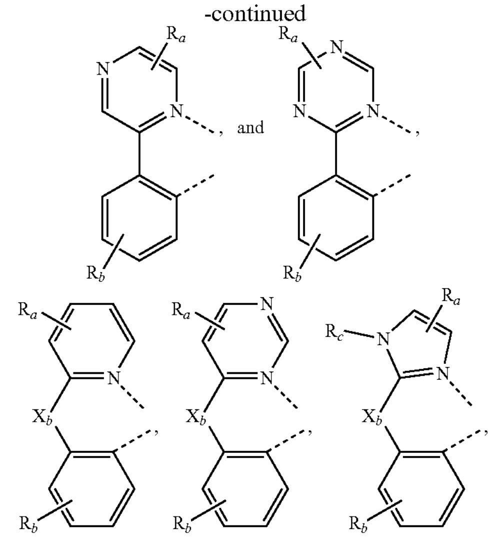

wherein, $R_a$ and $R_b$ are, at each occurrence identically or differently, represent mono-substitution, multi-substitution, or non-substitution;

$R_a$ and $R_b$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof, and in structures of $L_b$ and $L_c$, adjacent substituents $R_a$ and $R_b$ can be optionally joined to form a ring.

39. A compound formulation, comprising the metal complex of claim 1.

* * * * *